United States Patent
Lee et al.

(10) Patent No.: US 11,233,176 B2
(45) Date of Patent: Jan. 25, 2022

(54) SEMICONDUCTOR DEVICE AND SEMICONDUCTOR DEVICE PACKAGE

(71) Applicant: SUZHOU LEKIN SEMICONDUCTOR CO., LTD., Taicang (CN)

(72) Inventors: Chang Hyeong Lee, Seoul (KR); Gyu Hyeong Bak, Seoul (KR); Yong Seon Song, Seoul (KR); Byung Yeon Choi, Seoul (KR); Sung Min Hwang, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 83 days.

(21) Appl. No.: 16/492,069

(22) PCT Filed: Jan. 18, 2018

(86) PCT No.: PCT/KR2018/000839
§ 371 (c)(1),
(2) Date: Sep. 6, 2019

(87) PCT Pub. No.: WO2018/164371
PCT Pub. Date: Sep. 13, 2018

(65) Prior Publication Data
US 2021/0135059 A1   May 6, 2021

(30) Foreign Application Priority Data

Mar. 8, 2017 (KR) .................. 10-2017-0029302
Mar. 8, 2017 (KR) .................. 10-2017-0029305

(51) Int. Cl.
*H01L 33/46* (2010.01)
*H01L 33/38* (2010.01)
(Continued)

(52) U.S. Cl.
CPC ............ *H01L 33/46* (2013.01); *H01L 33/387* (2013.01); *H01L 33/62* (2013.01); *F21K 9/232* (2016.08);
(Continued)

(58) Field of Classification Search
CPC ....... H01L 33/46; H01L 33/387; H01L 33/62; H01L 2933/0016; H01L 2933/0025;
(Continued)

(56) References Cited

U.S. PATENT DOCUMENTS

2002/0121637 A1  9/2002 Ito
2007/0241345 A1  10/2007 Huang
(Continued)

FOREIGN PATENT DOCUMENTS

JP    2001-44498 A    2/2001
JP    2005-302747 A   10/2005
(Continued)

OTHER PUBLICATIONS

International Search Report for PCT/KR2018/000839 (PCT/ISA/210) dated May 4, 2018.

*Primary Examiner* — Kevin Quarterman
(74) *Attorney, Agent, or Firm* — Birch, Stewart, Kolasch & Birch, LLP

(57) ABSTRACT

A semiconductor device according to an embodiment may include a light emitting structure, a first electrode, a second electrode, a first insulating reflective layer, a second insulating reflective layer, a first bonding pad, and a second bonding pad. The light emitting structure may include a first conductivity type semiconductor layer and a second conductivity type semiconductor layer. The first insulating reflective layer may be disposed on the first electrode and the second electrode, and may include a first opening exposing an upper surface of the first electrode. The second insulating
(Continued)

reflective layer may be disposed on the first electrode and the second electrode, and disposed spaced apart from the first insulating reflective layer, and may include a second opening exposing an upper surface of the second electrode. The first bonding pad may be electrically connected to the first electrode through the first opening. The second bonding pad may be electrically connected to the second electrode through the second opening.

19 Claims, 94 Drawing Sheets

(51) Int. Cl.
  *H01L 33/62* (2010.01)
  *F21K 9/232* (2016.01)
  *F21K 9/68* (2016.01)
  *F21Y 115/10* (2016.01)

(52) U.S. Cl.
  CPC ............. *F21K 9/68* (2016.08); *F21Y 2115/10* (2016.08); *H01L 2933/0016* (2013.01); *H01L 2933/0025* (2013.01); *H01L 2933/0066* (2013.01)

(58) Field of Classification Search
  CPC . H01L 2933/0066; H01L 33/10; H01L 33/36; H01L 33/48; F21K 9/232; F21K 9/68; F21Y 2115/10
  See application file for complete search history.

(56) References Cited

U.S. PATENT DOCUMENTS

| | | | | |
|---|---|---|---|---|
| 2014/0048825 | A1* | 2/2014 | Hsieh | H01L 33/62 |
| | | | | 257/88 |
| 2015/0155426 | A1* | 6/2015 | Jeon | H01L 33/44 |
| | | | | 438/29 |
| 2016/0240759 | A1* | 8/2016 | Chae | H01L 33/36 |
| 2017/0170364 | A1* | 6/2017 | Jeon | H01L 33/46 |
| 2019/0051801 | A1* | 2/2019 | Seo | H01L 33/382 |

FOREIGN PATENT DOCUMENTS

| | | |
|---|---|---|
| JP | 2007-288192 A | 11/2007 |
| JP | 2009-164423 A | 7/2009 |
| JP | 2011-66053 A | 3/2011 |
| JP | 2012-138499 A | 7/2012 |
| JP | 2016-111179 A | 6/2016 |
| KR | 10-2010-0047219 A | 5/2010 |
| KR | 10-1362081 B1 | 2/2014 |
| KR | 10-2014-0089804 A | 7/2014 |
| KR | 10-2016-0081787 A | 7/2016 |

* cited by examiner

[FIG. 1]
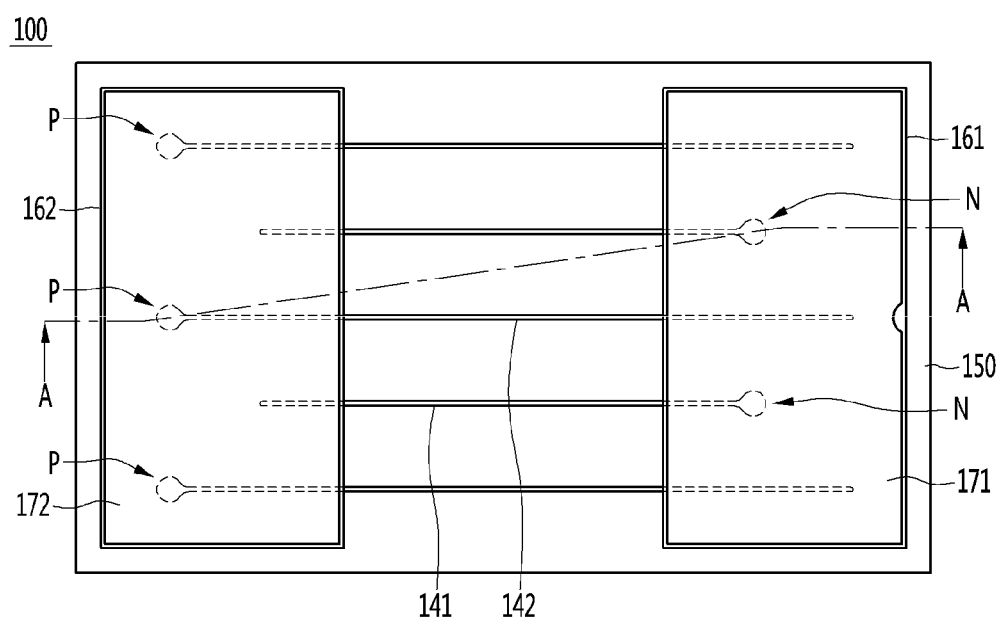

[FIG. 2]
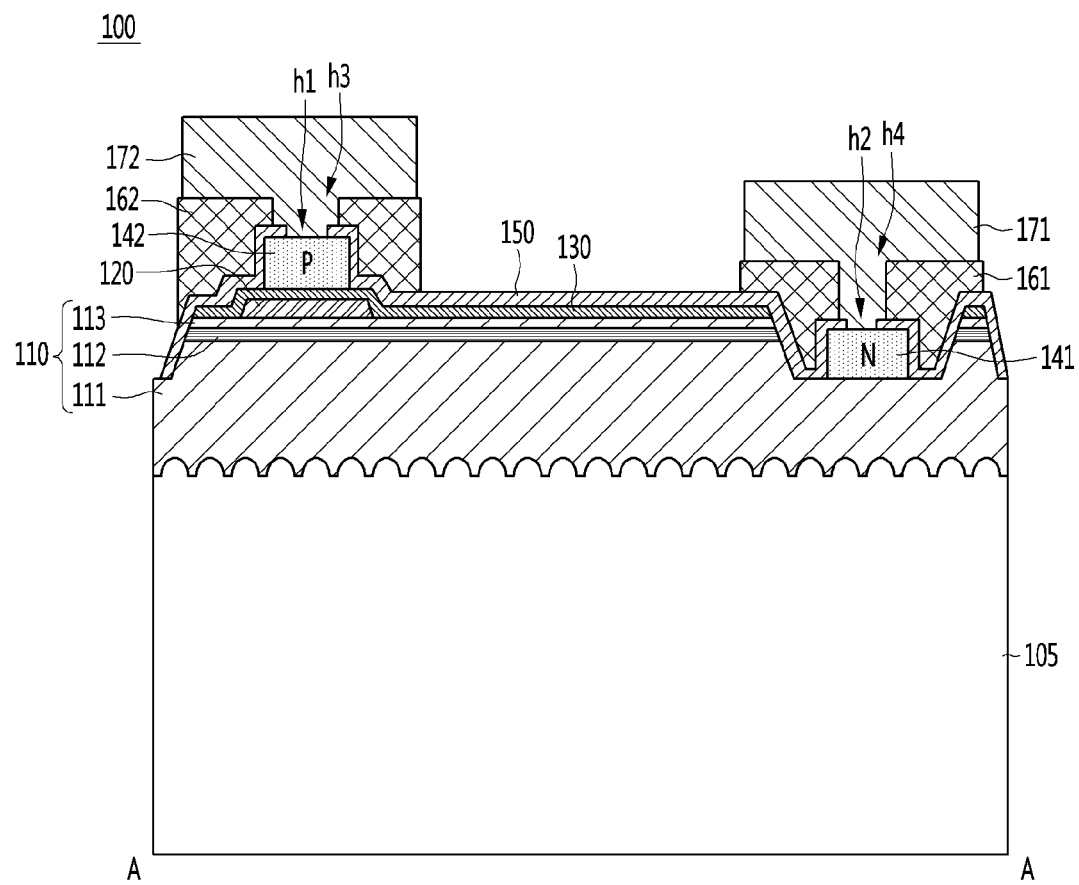

[FIG. 3]
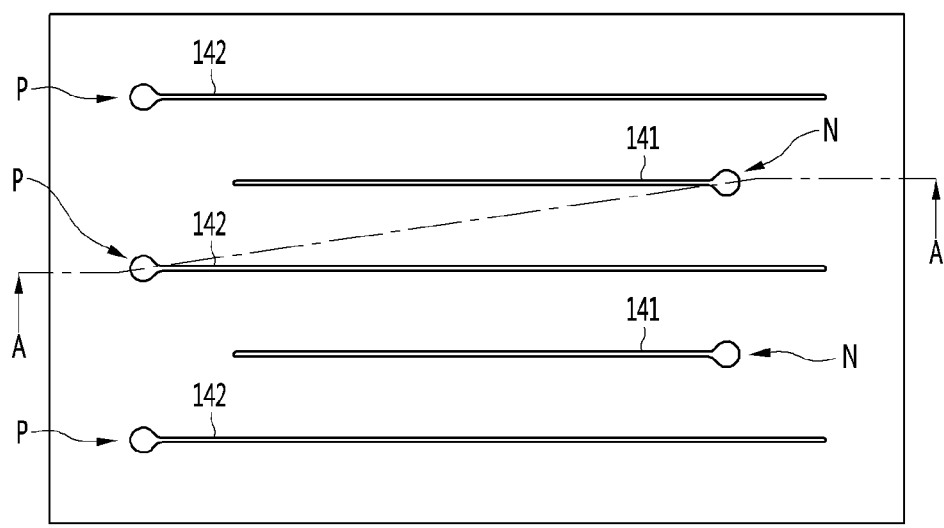

[FIG. 4]
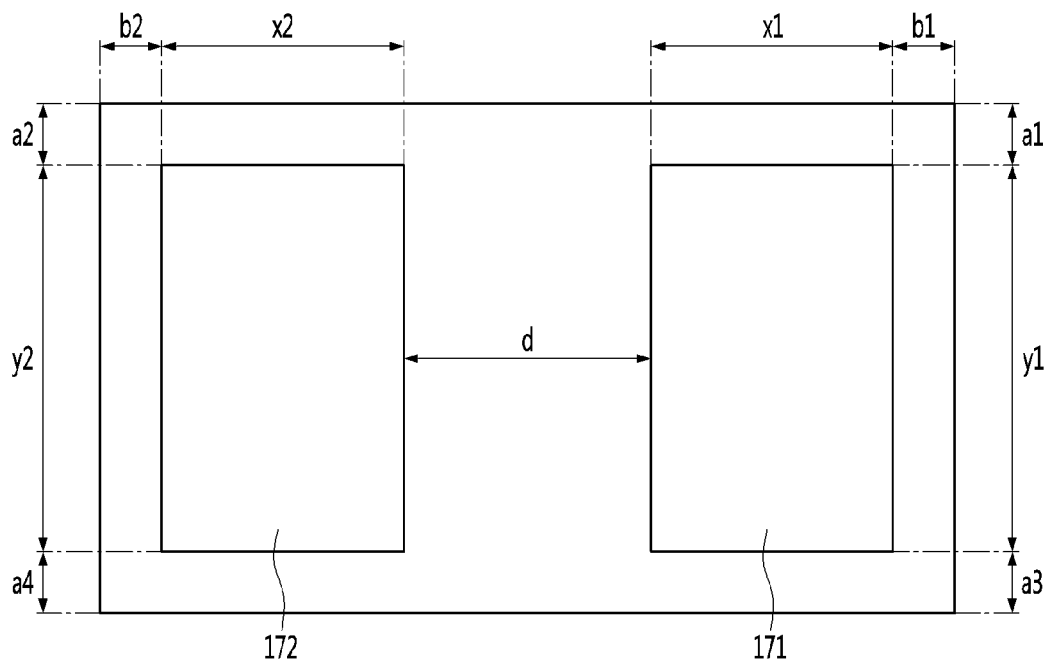

[FIG. 5a]
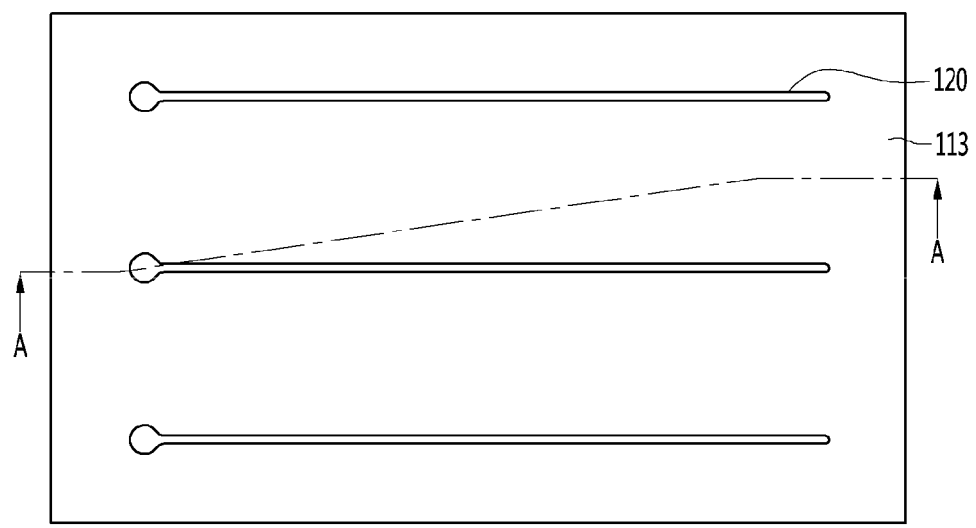

[FIG. 5b]
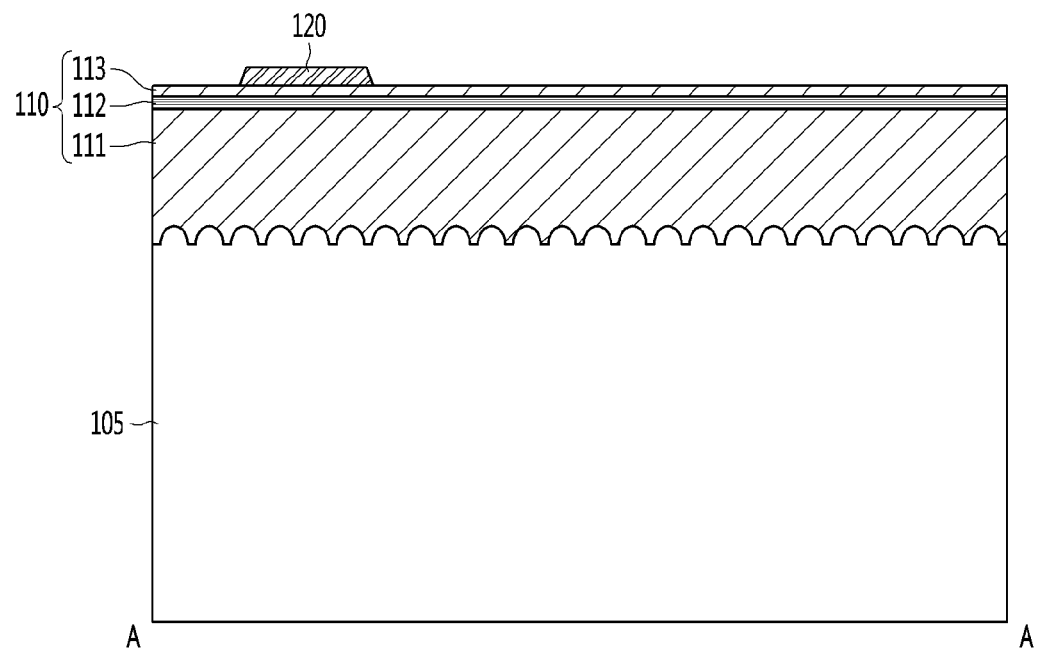

[FIG. 6a]
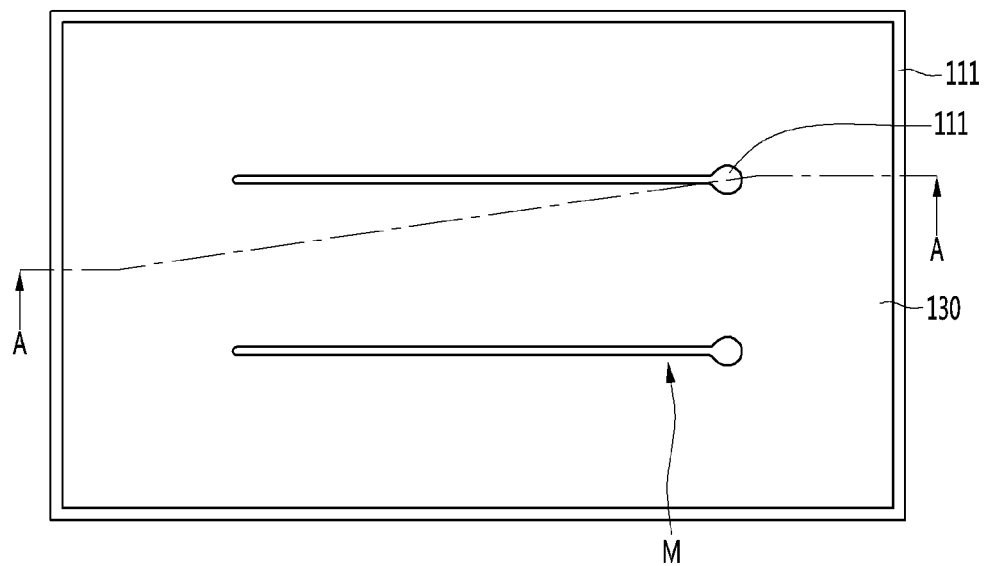

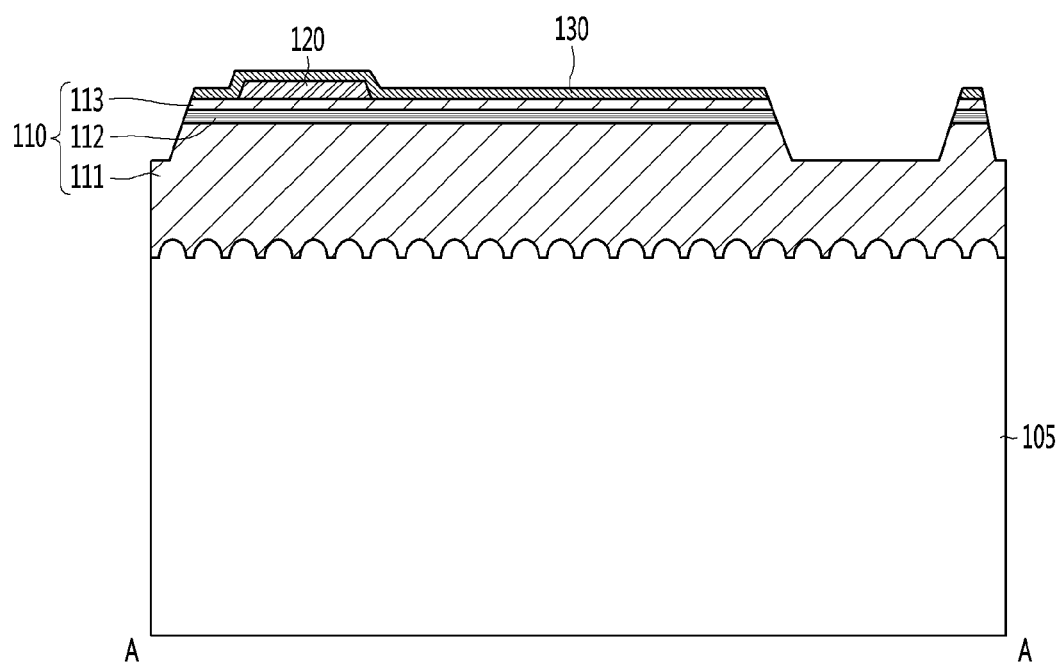
[FIG. 6b]

[FIG. 7a]
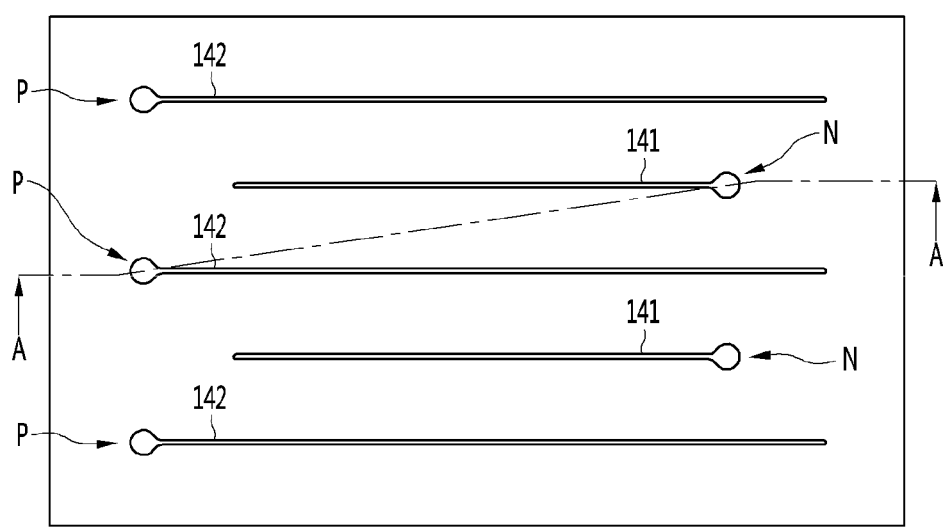

【FIG. 7b】
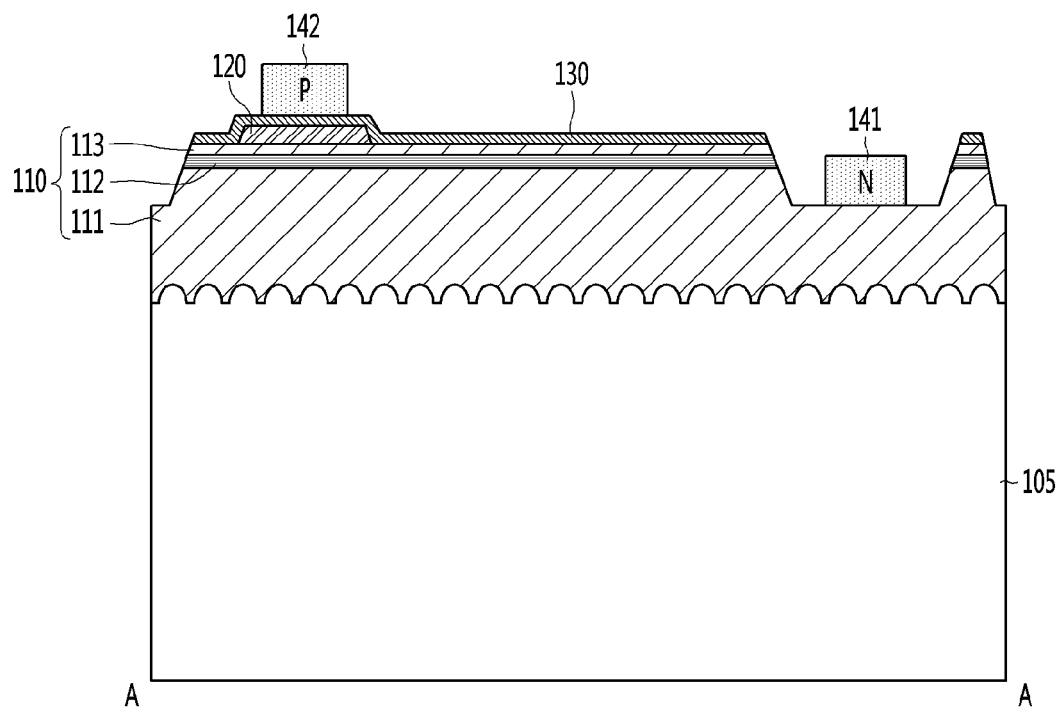

[FIG. 8a]
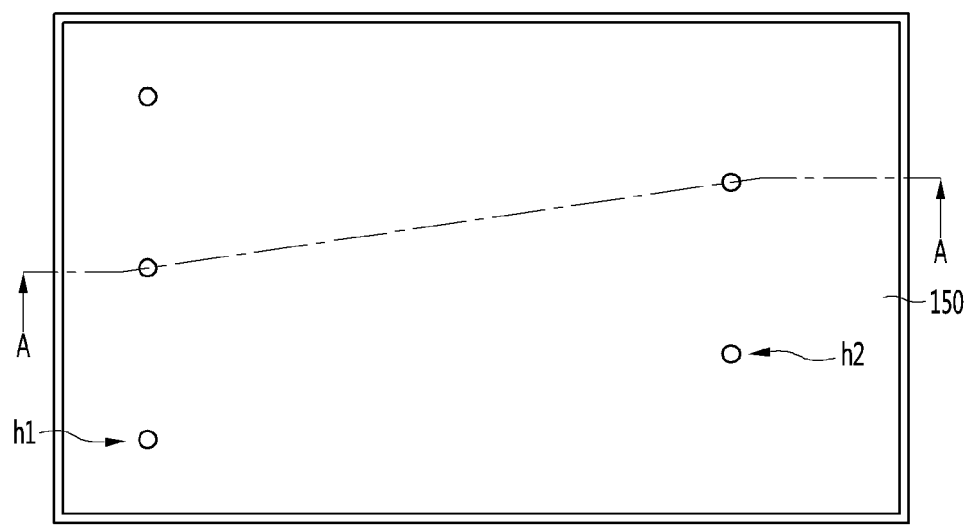

[FIG. 8b]
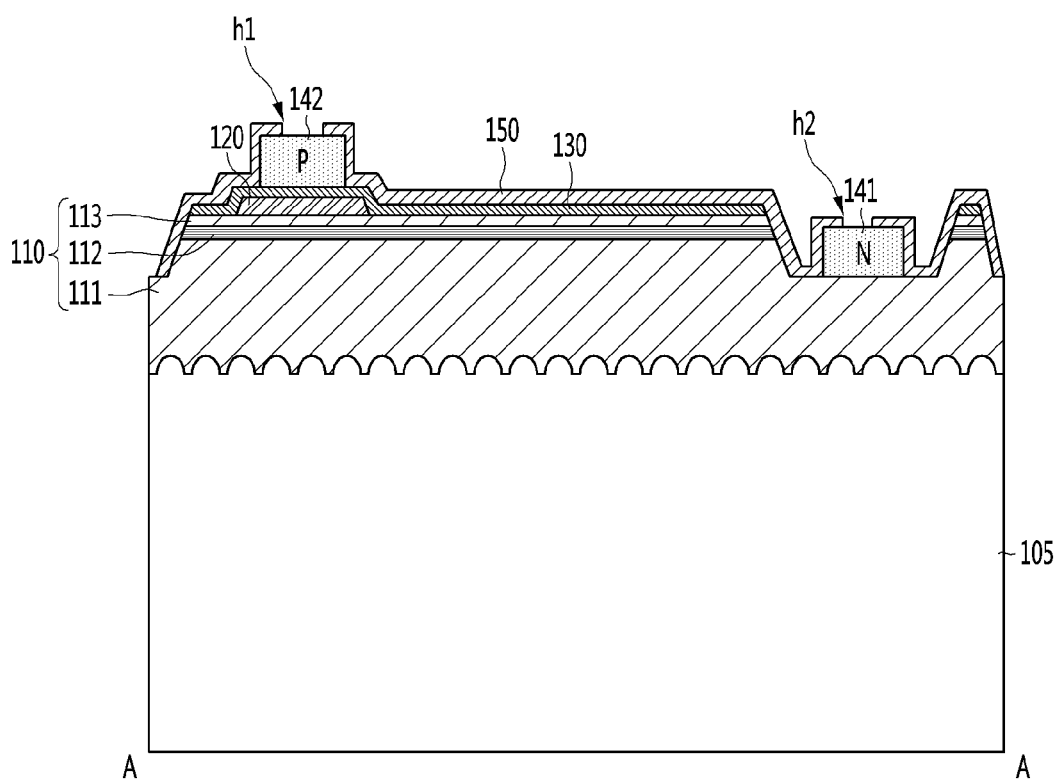

[FIG. 9a]
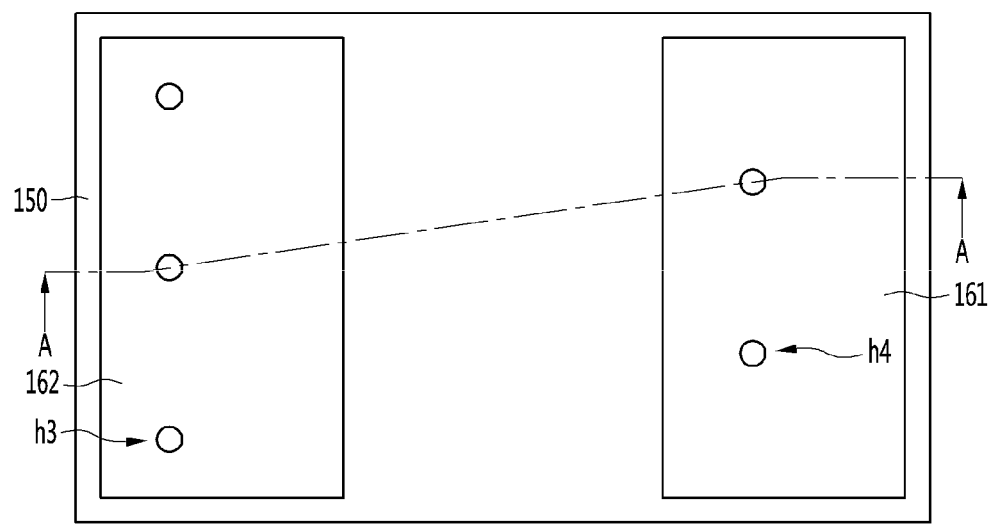

[FIG. 9b]
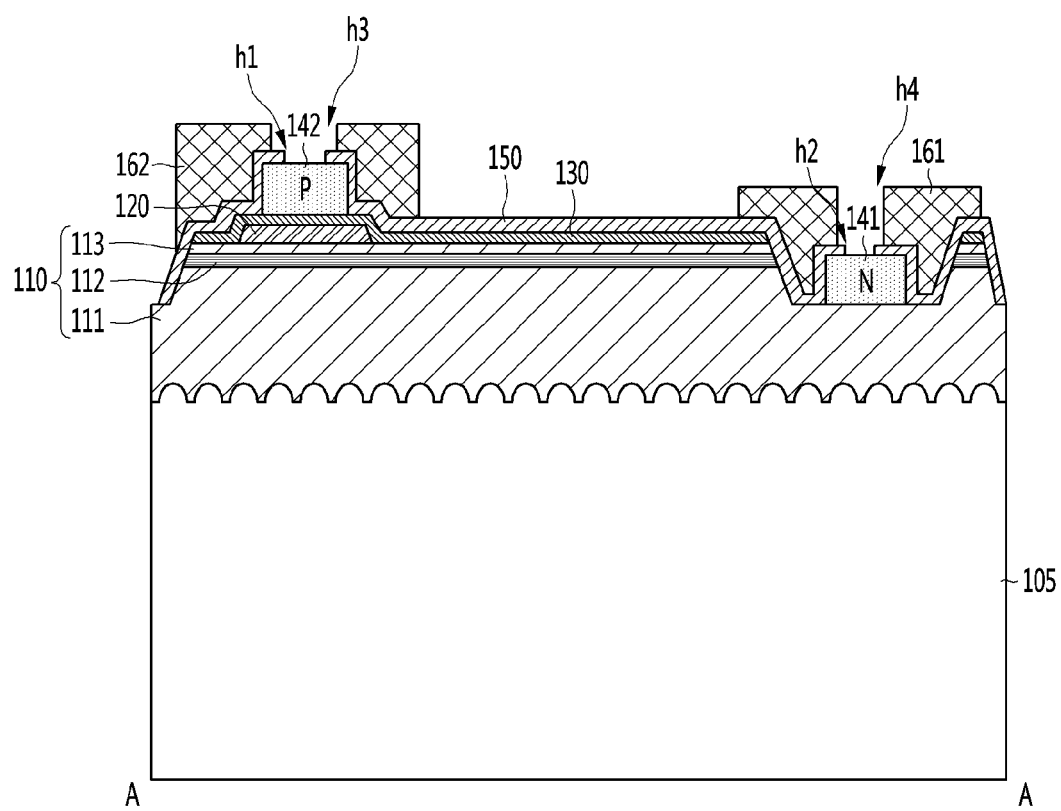

[FIG. 10a]
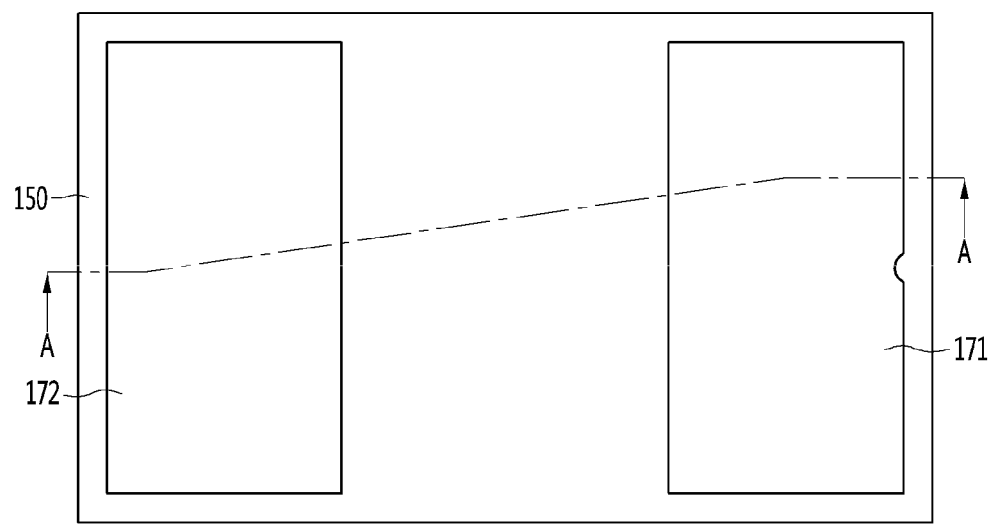

【FIG. 10b】
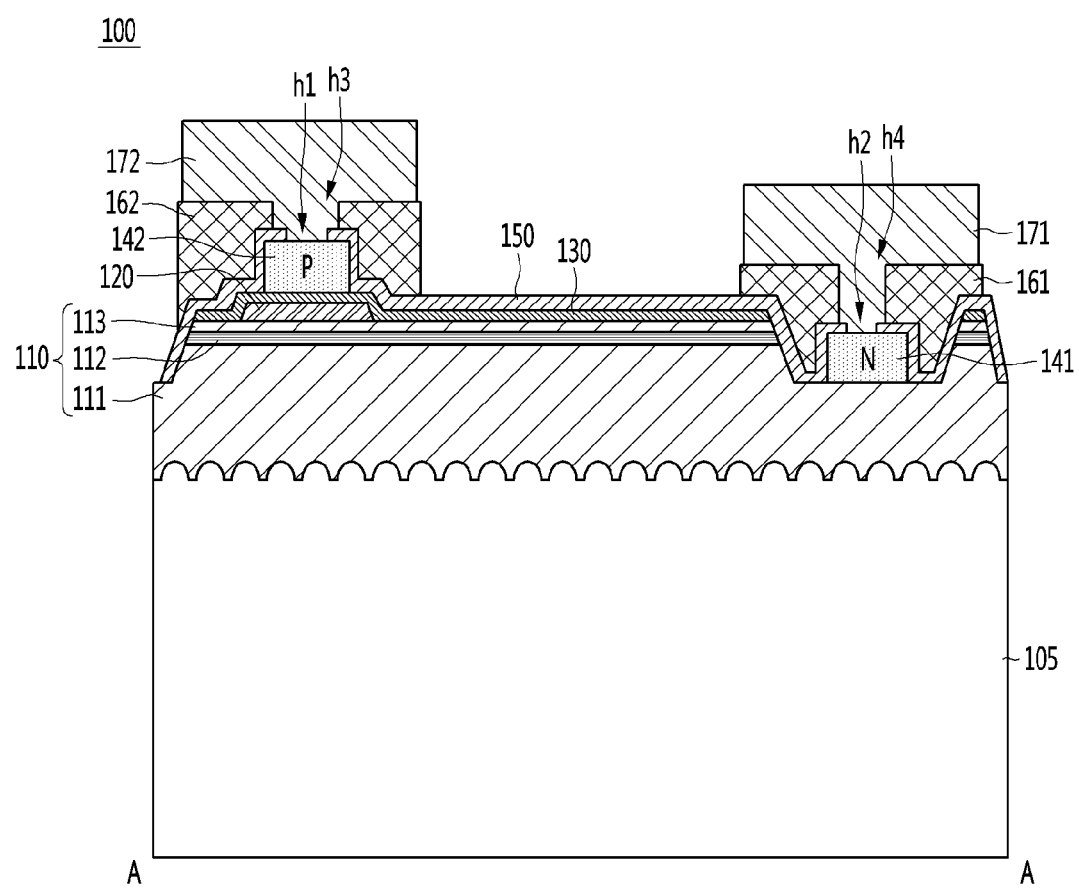

[FIG. 11]
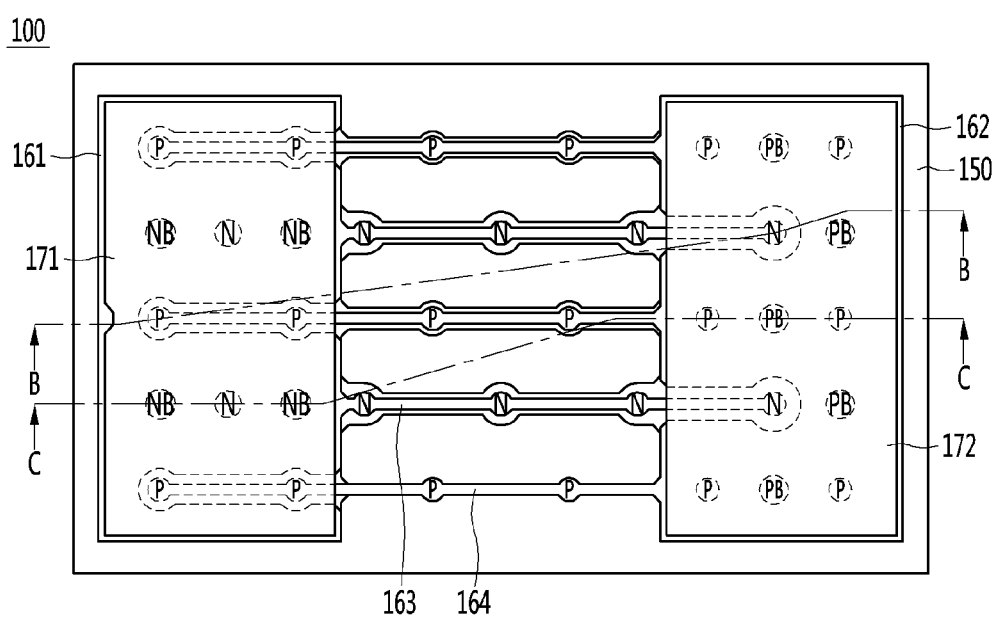

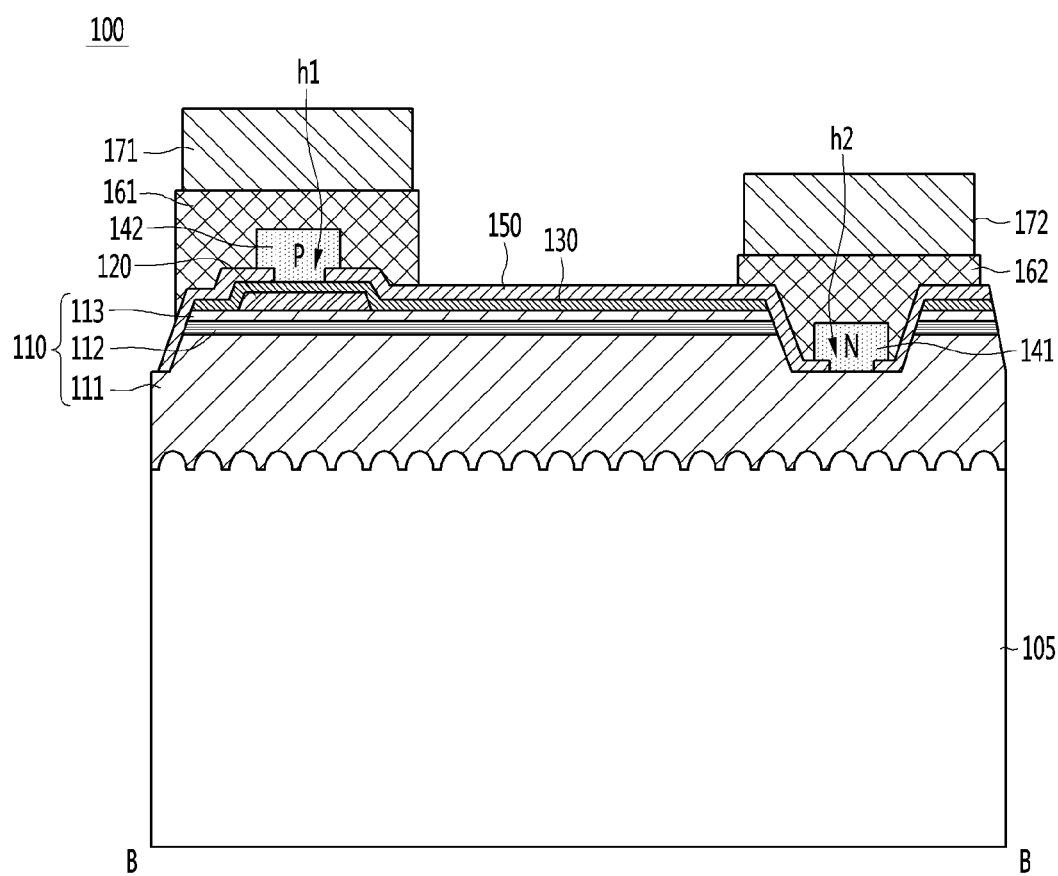
[FIG. 12]

[FIG. 13]
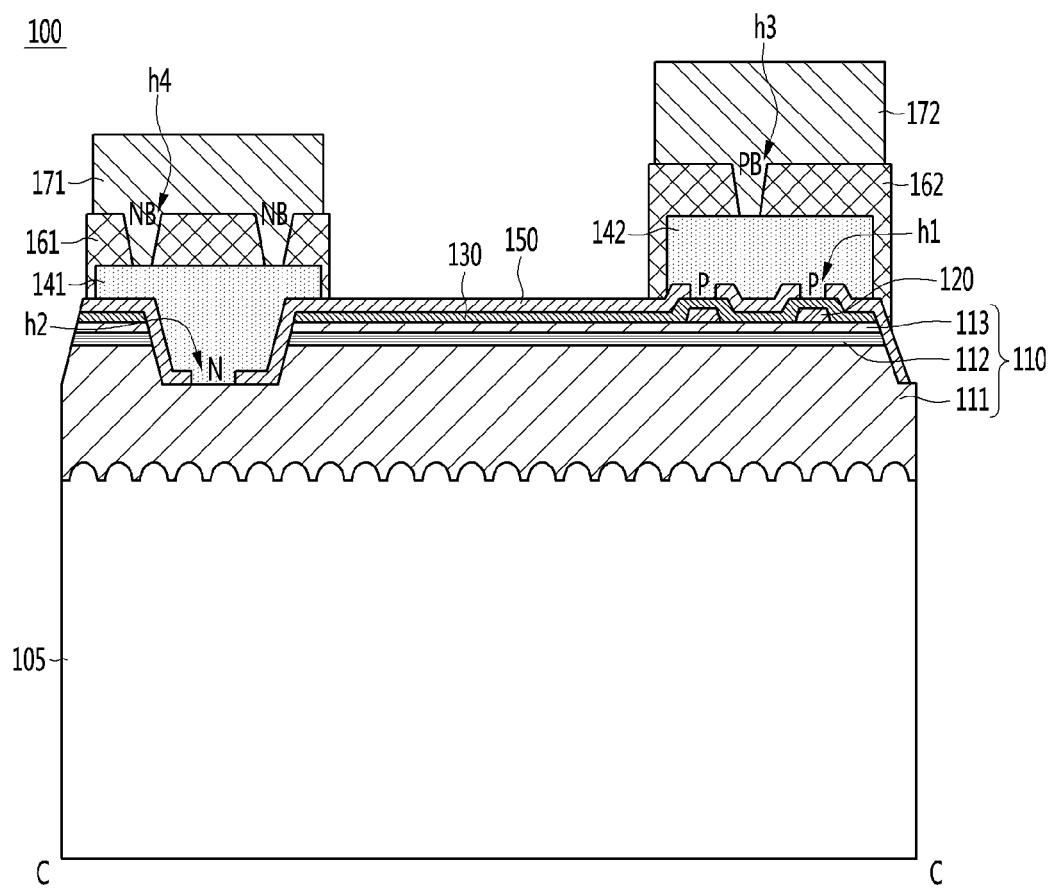

[FIG. 14]
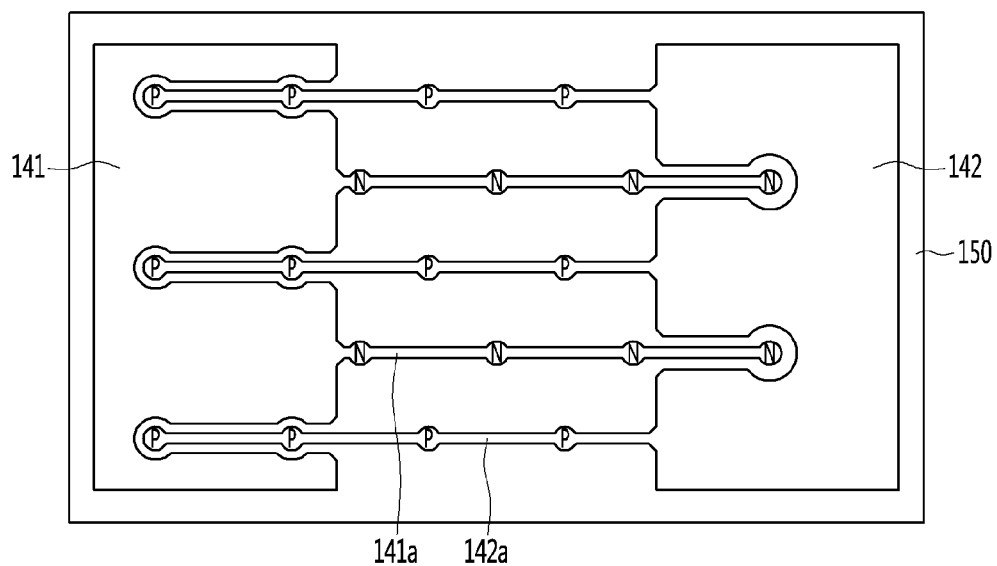

[FIG. 15a]
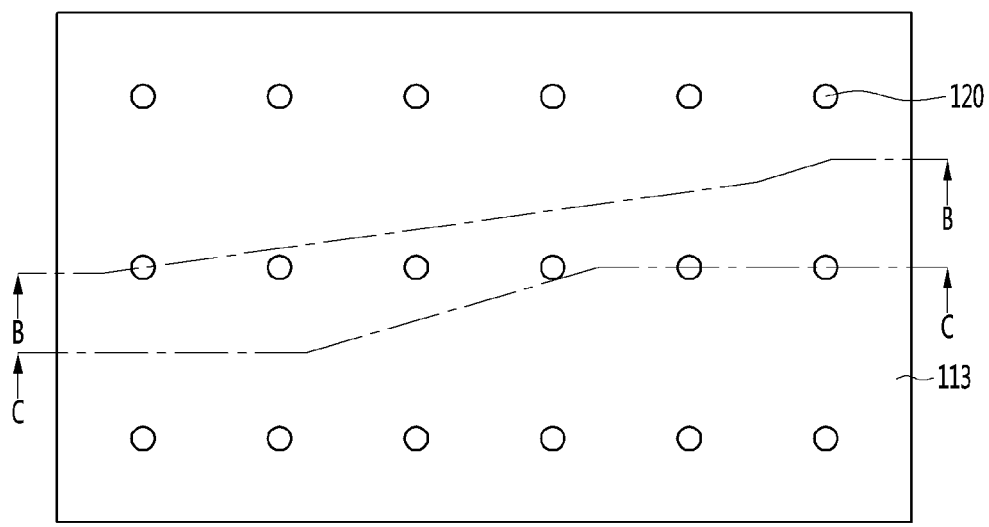

[FIG. 15b]
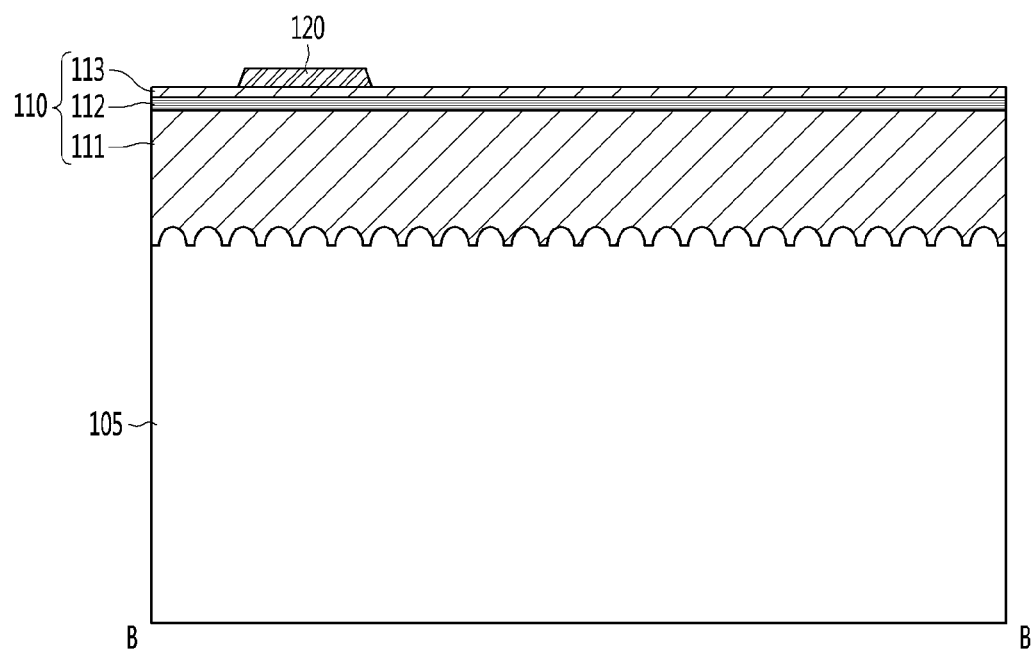

[FIG. 15c]
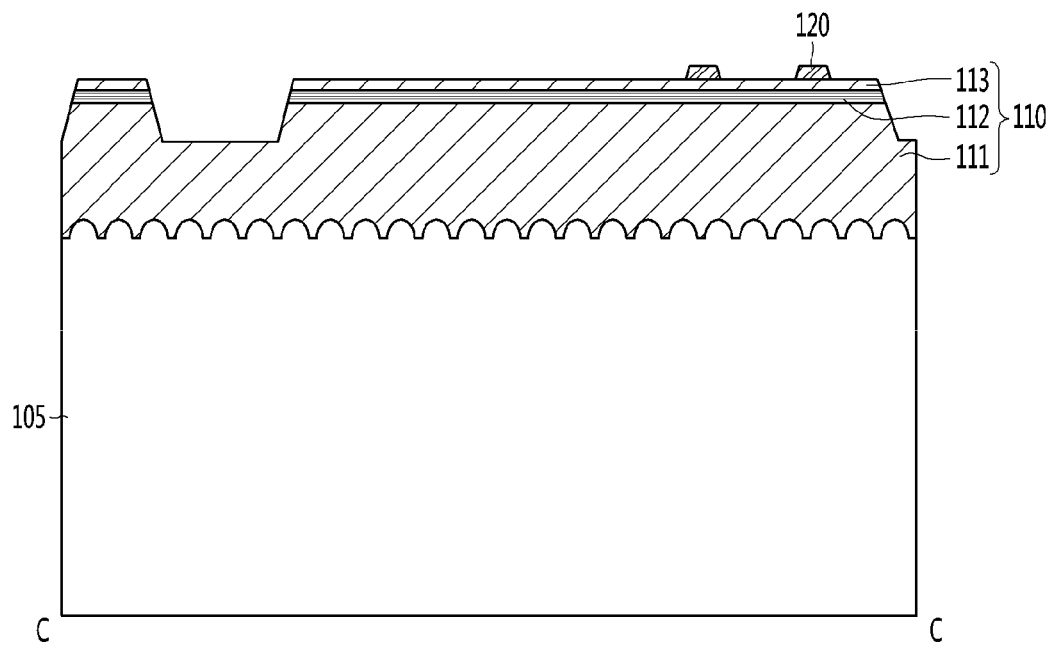

[FIG. 16a]
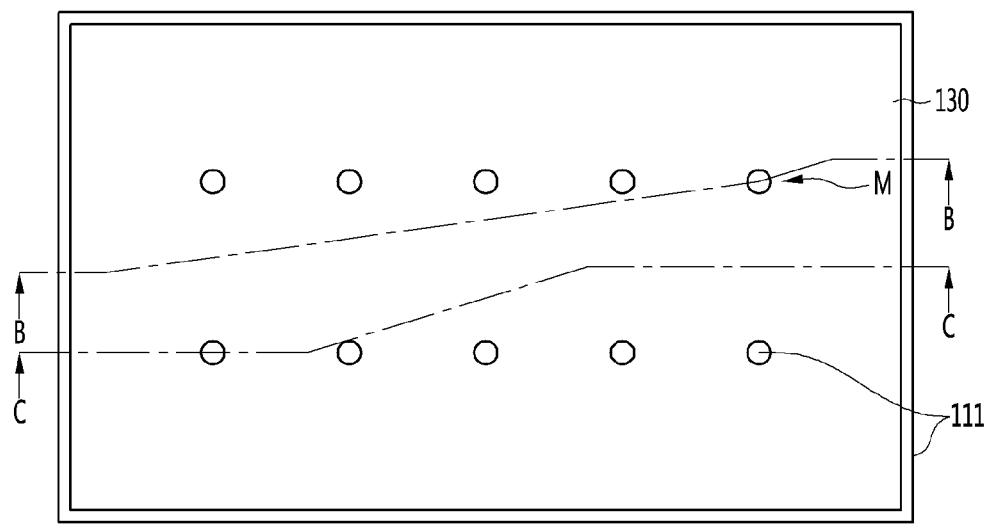

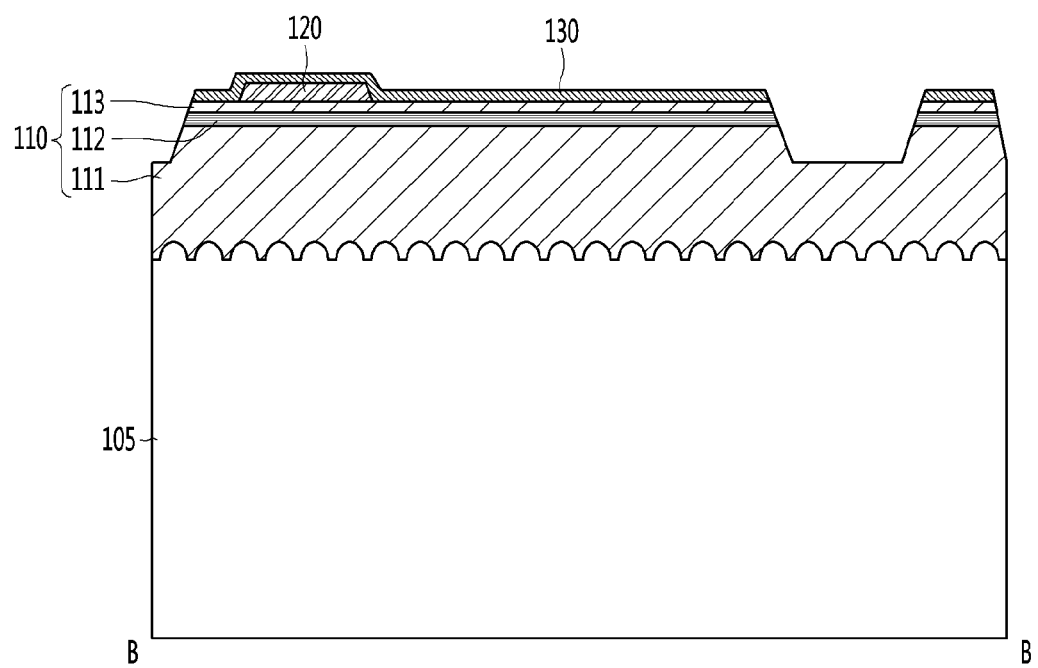
[FIG. 16b]

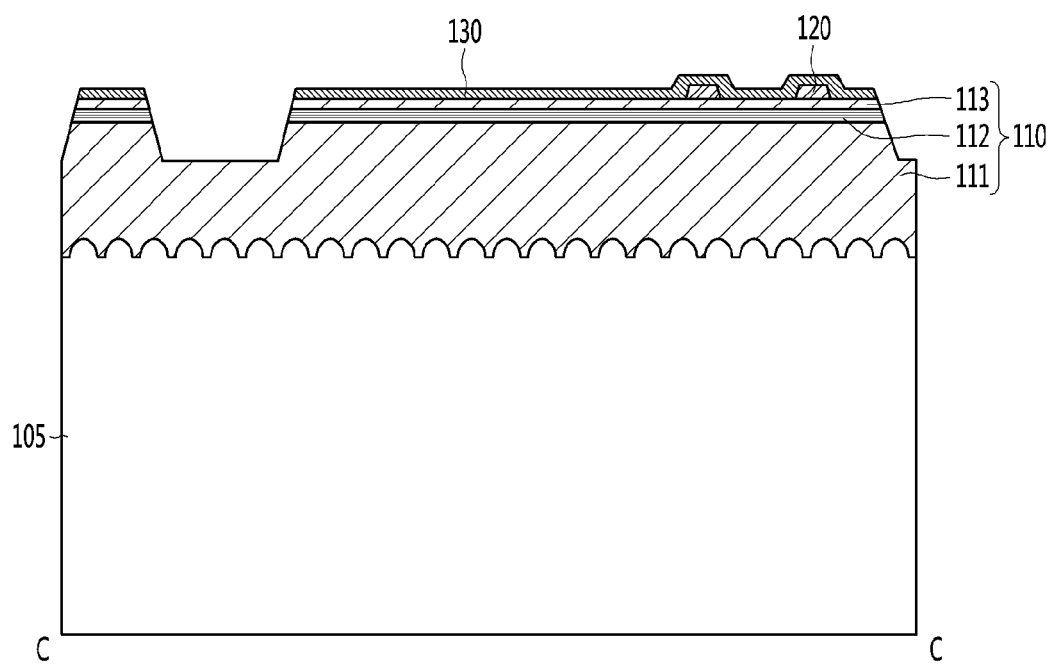
[FIG. 16c]

[FIG. 17a]
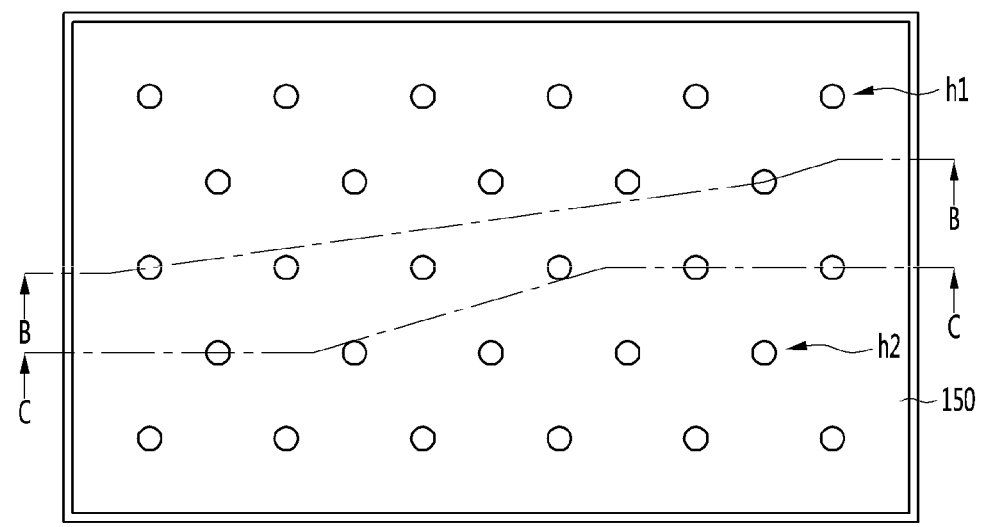

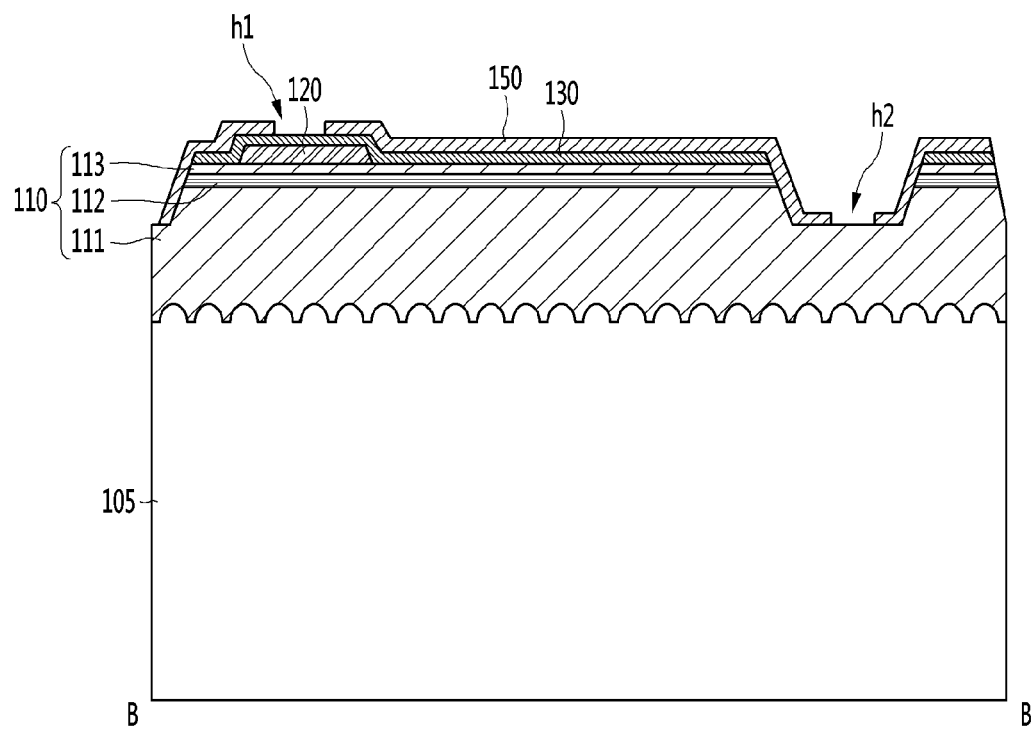
[FIG. 17b]

[FIG. 17c]
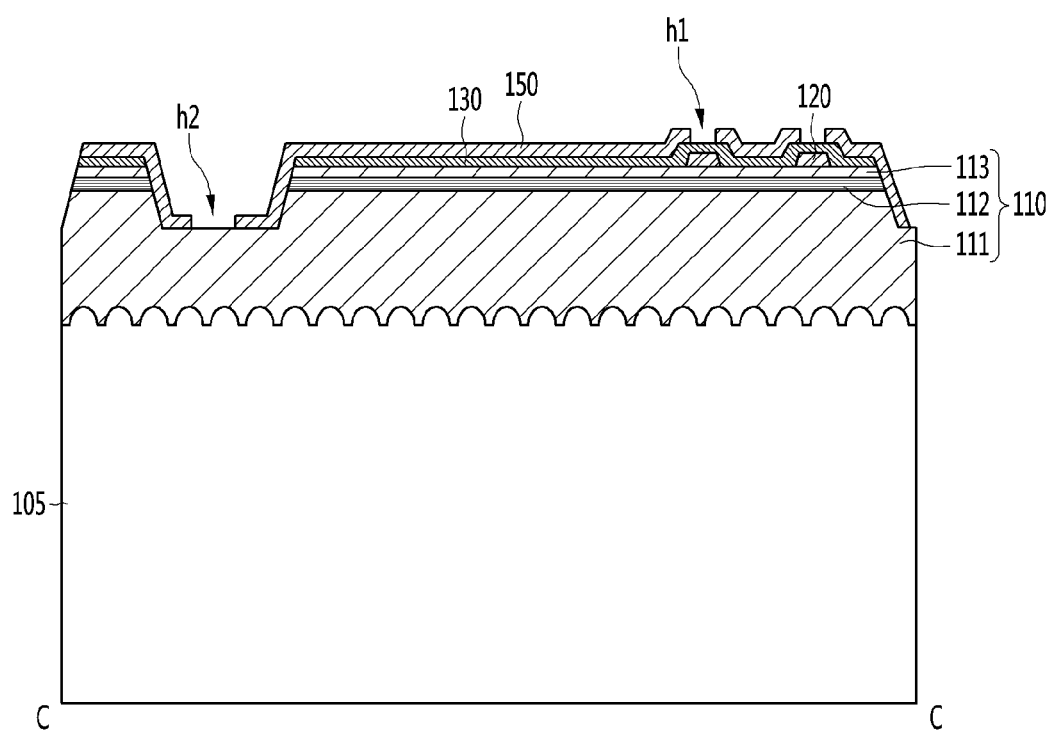

[FIG. 18a]
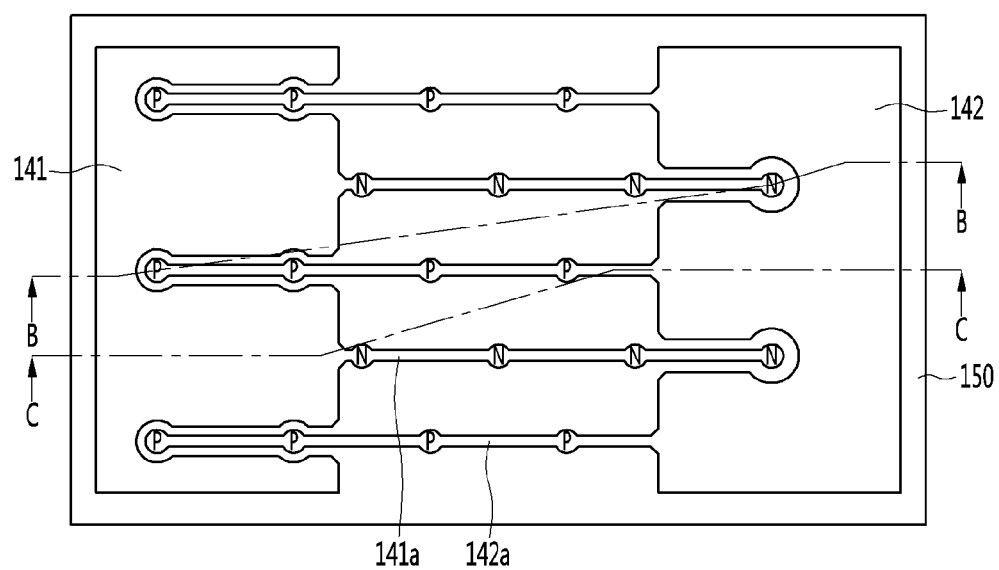

[FIG. 18b]
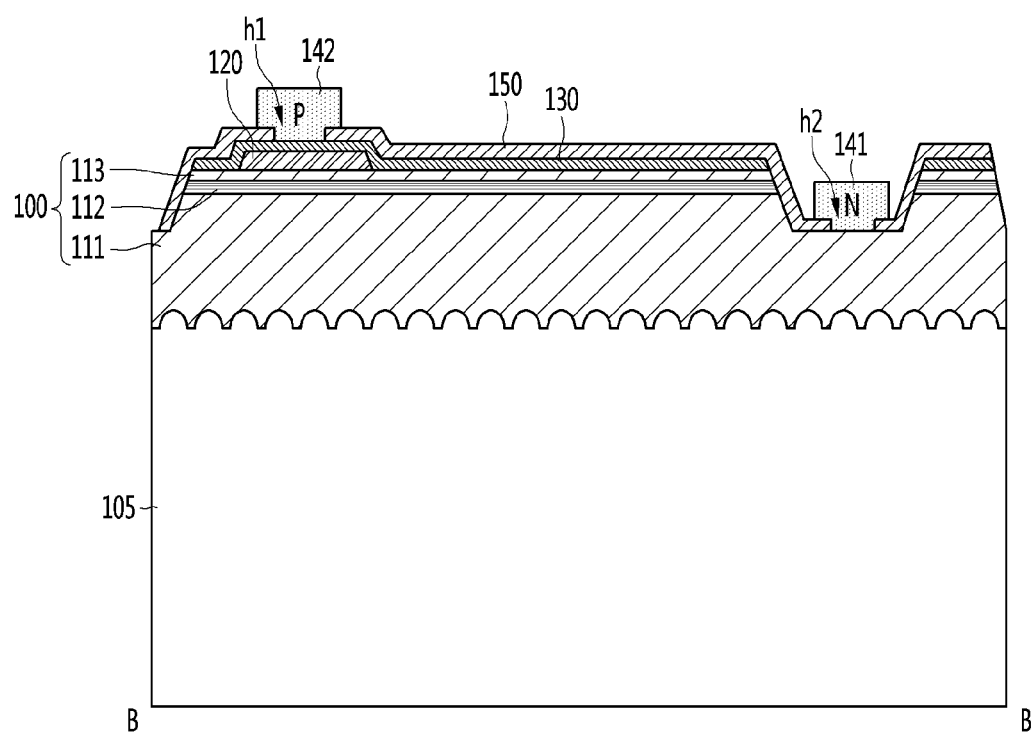

[FIG. 18c]
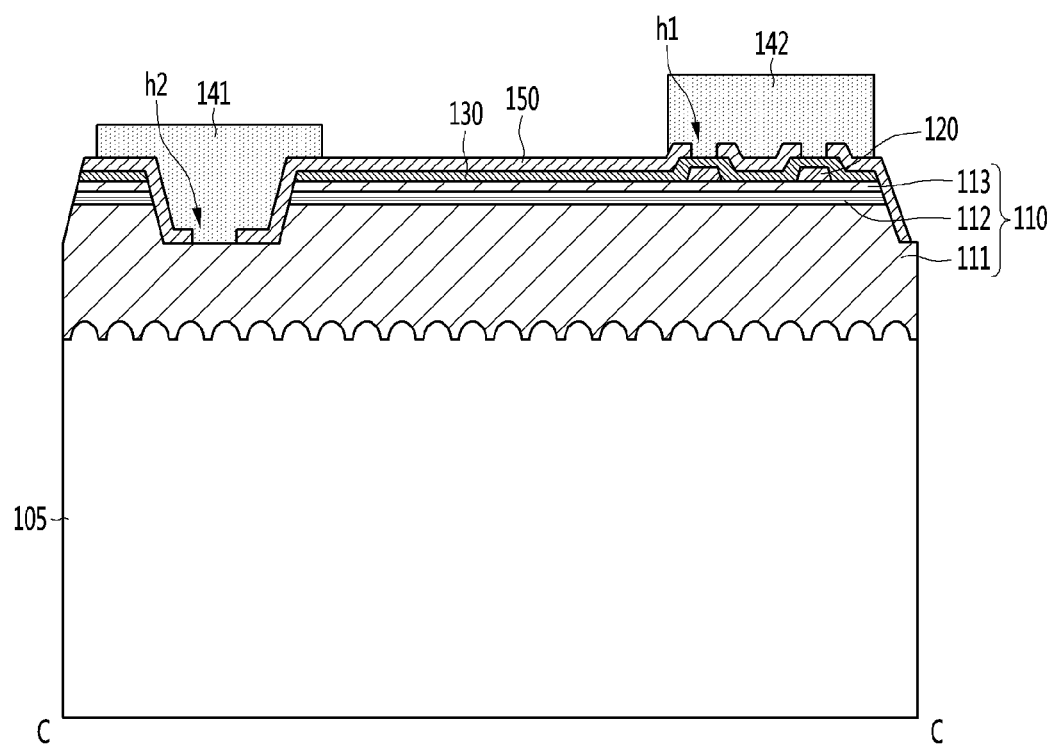

[FIG. 19a]
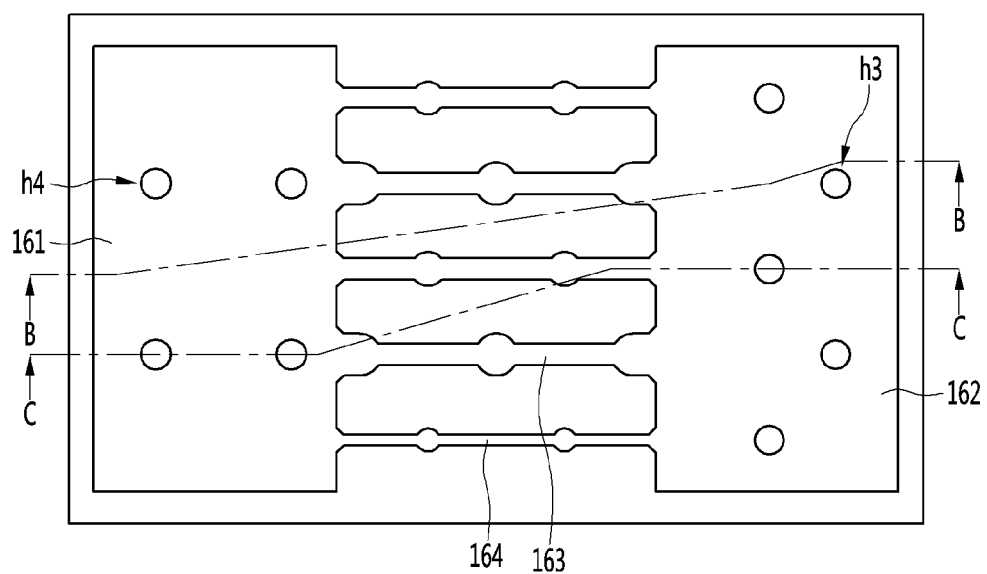

[FIG. 19b]
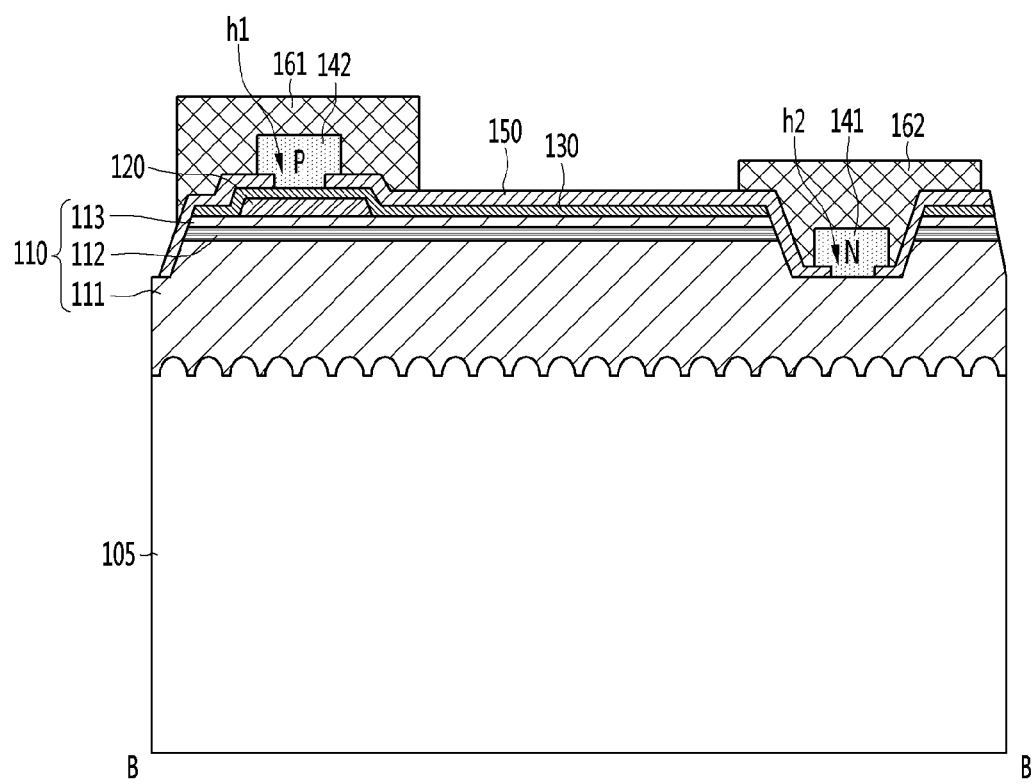

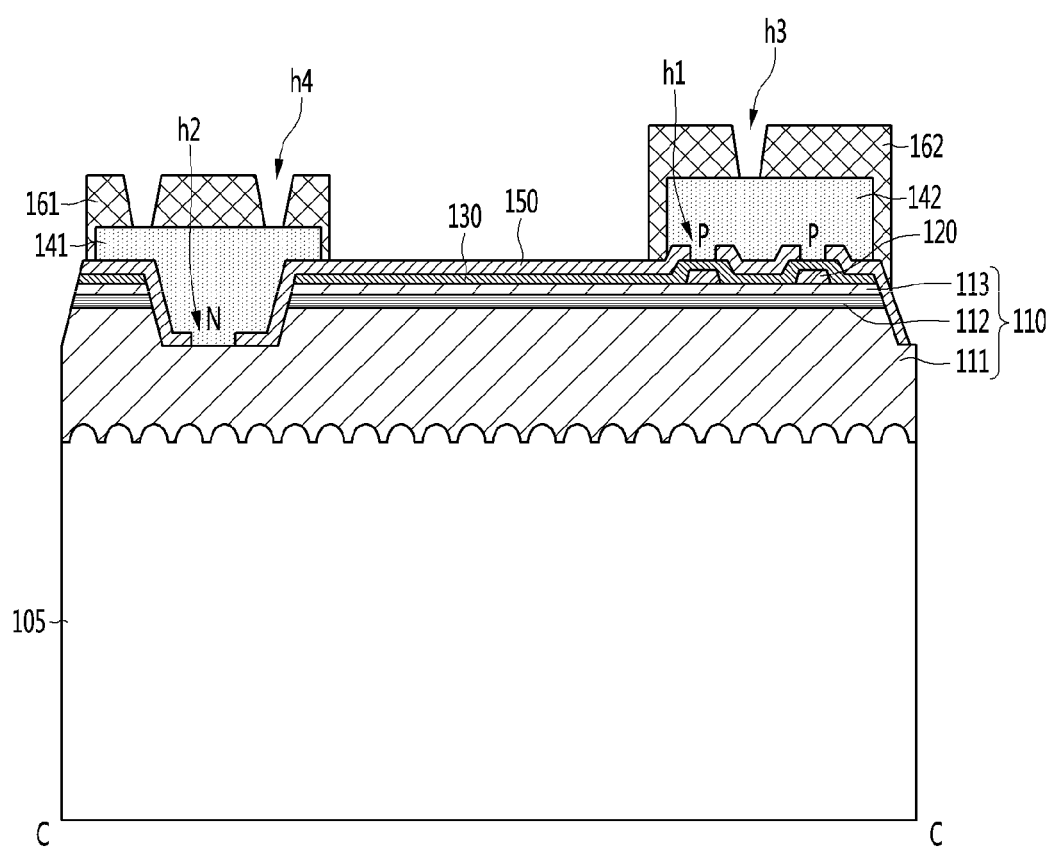
[FIG. 19c]

【FIG. 20a】
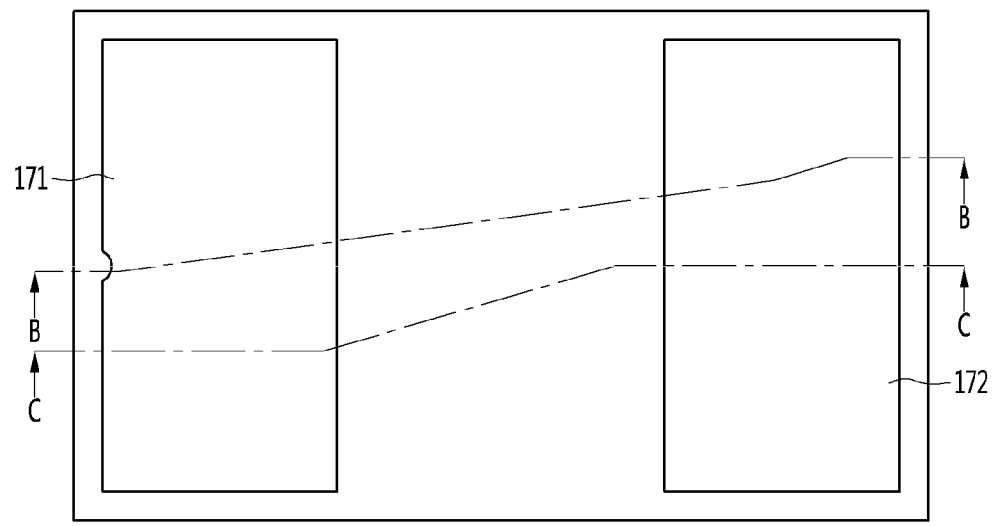

[FIG. 20b]
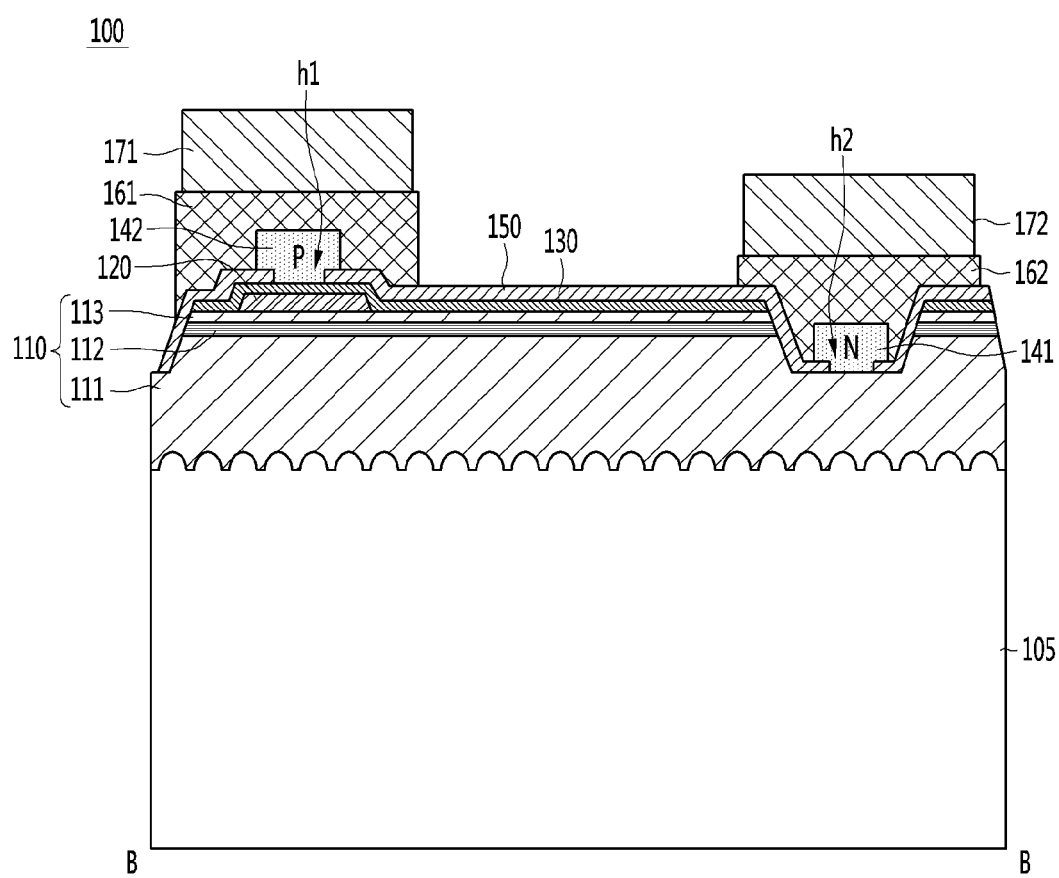

[FIG. 20c]
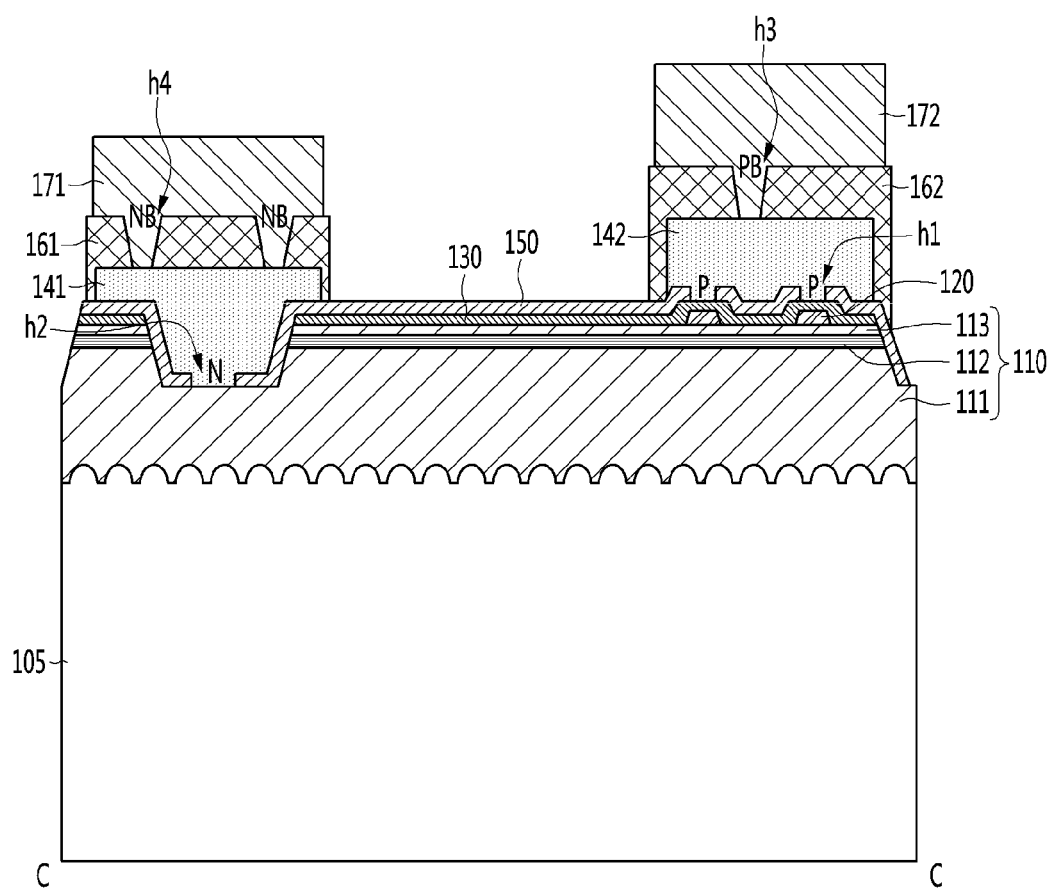

[FIG. 21]
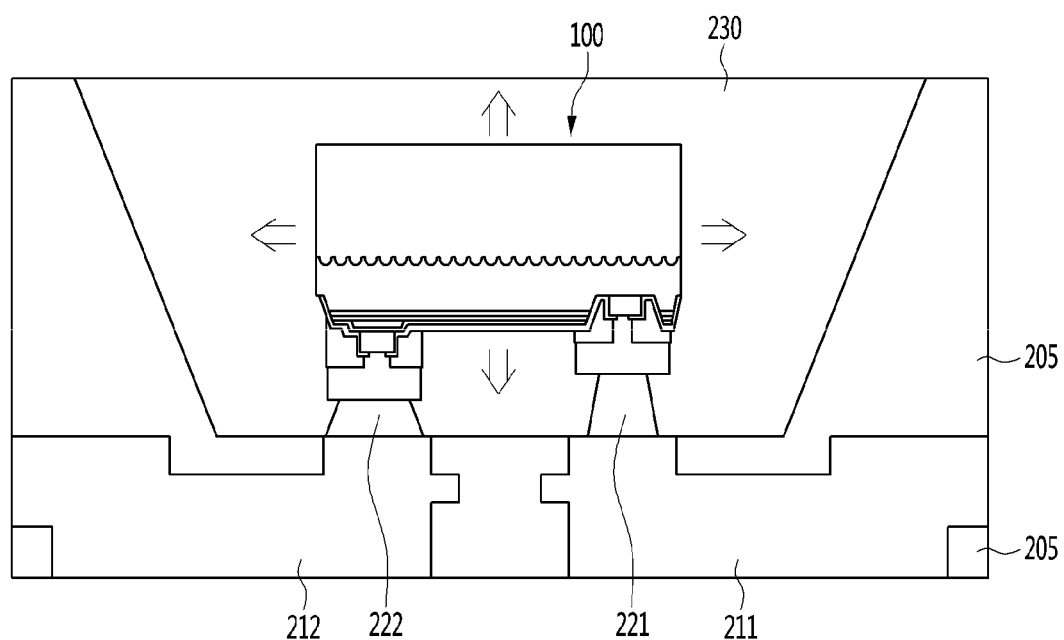

[FIG. 22]
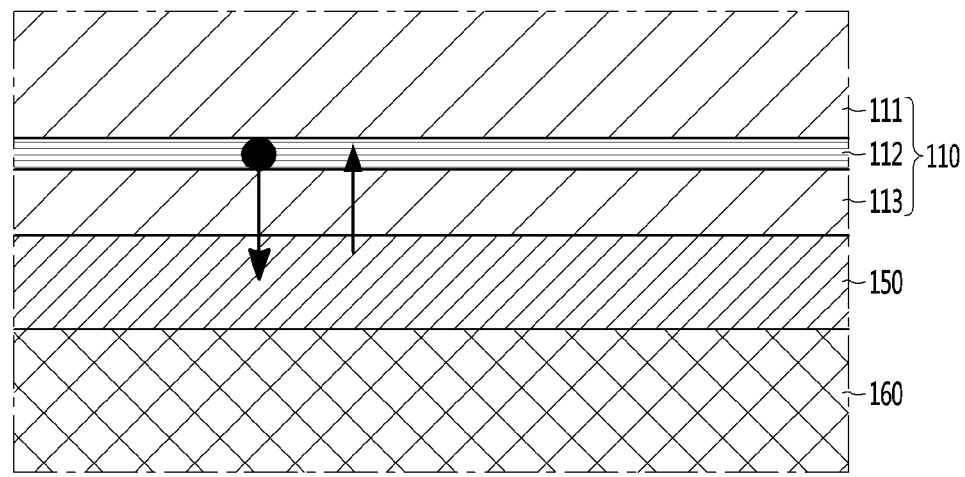

[FIG. 23]
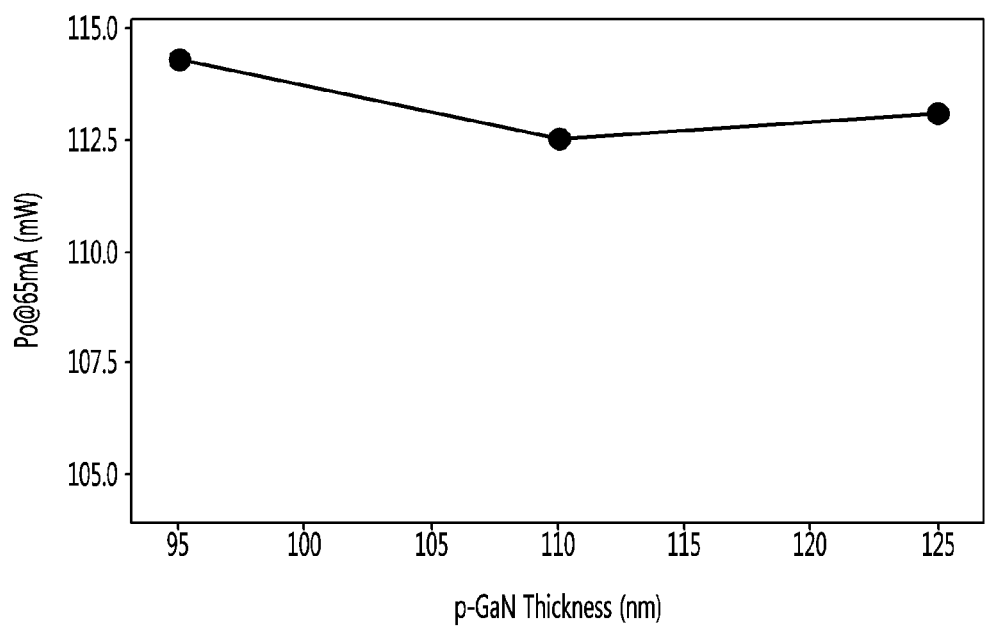

【FIG. 24】
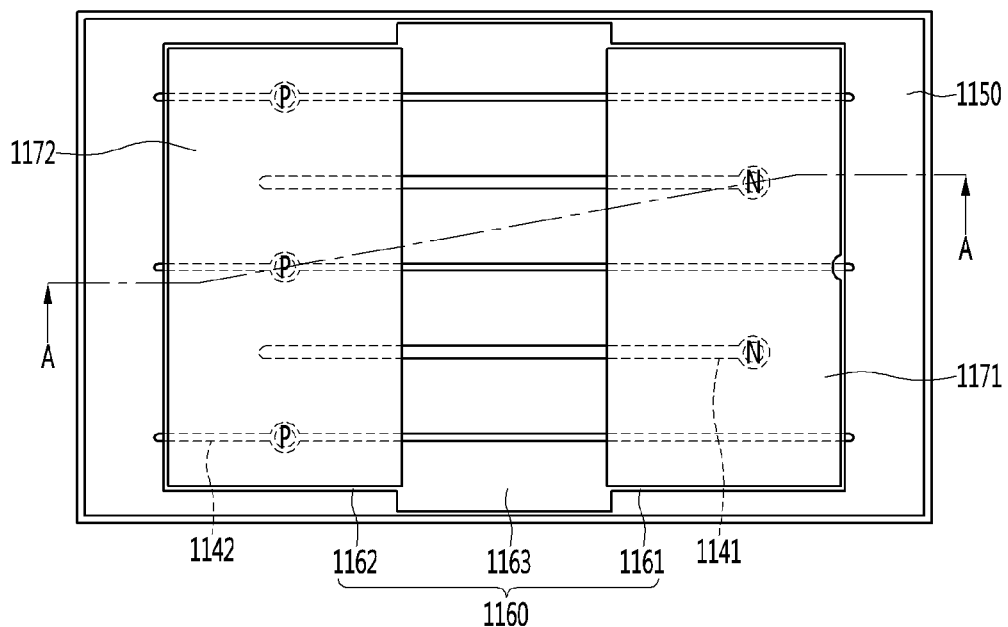

[FIG. 25]
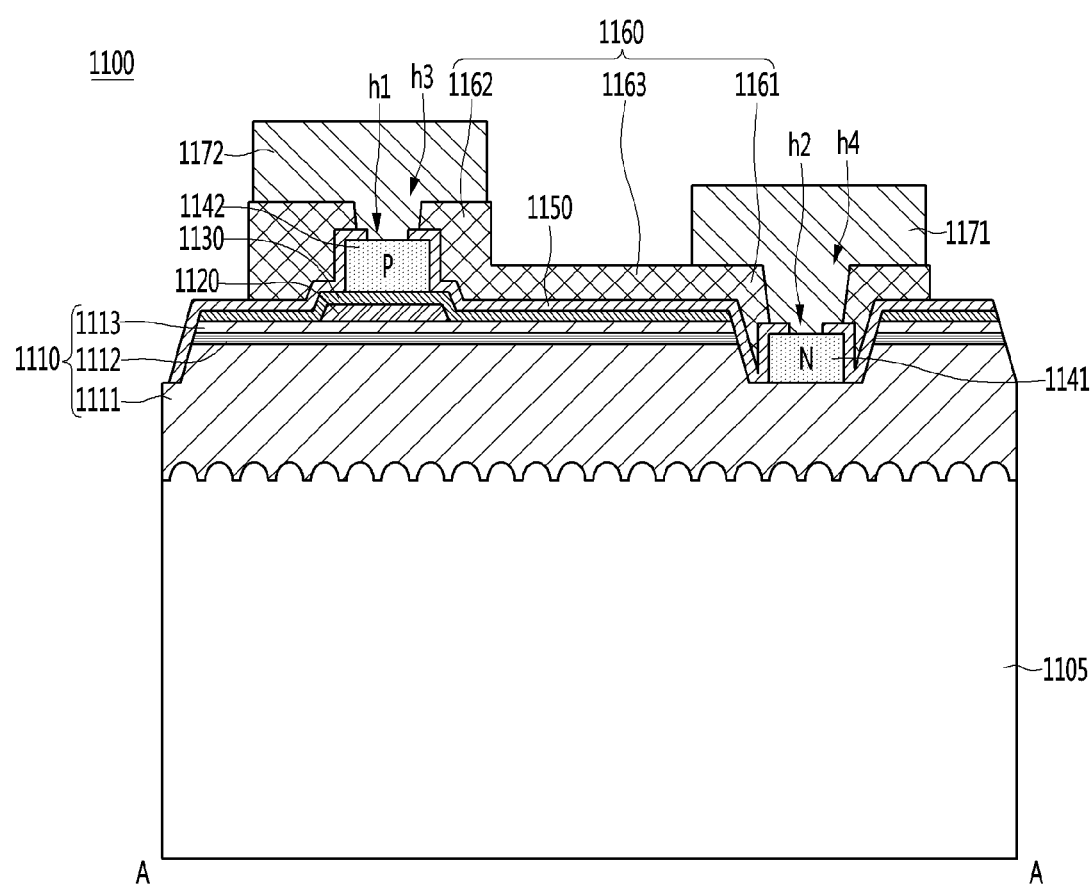

[FIG. 26]
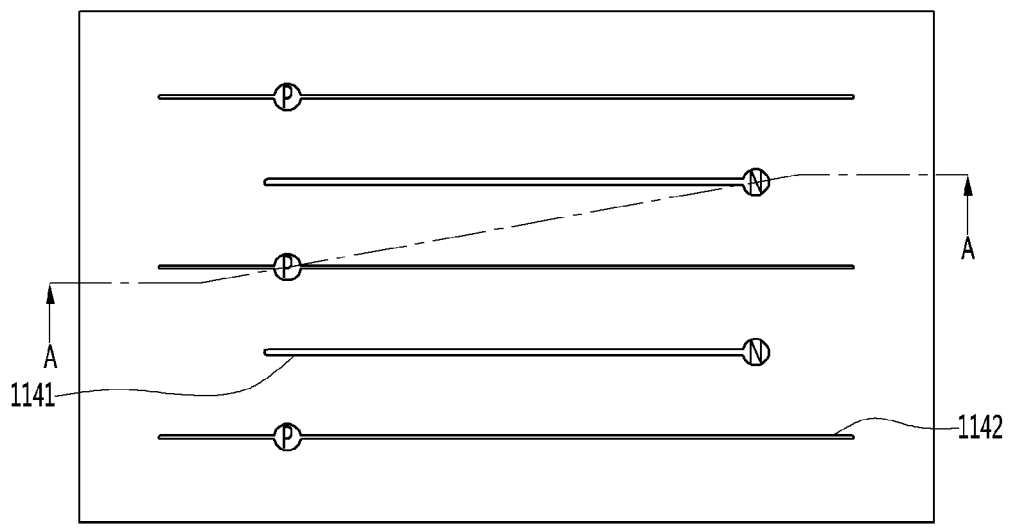

[FIG. 27]
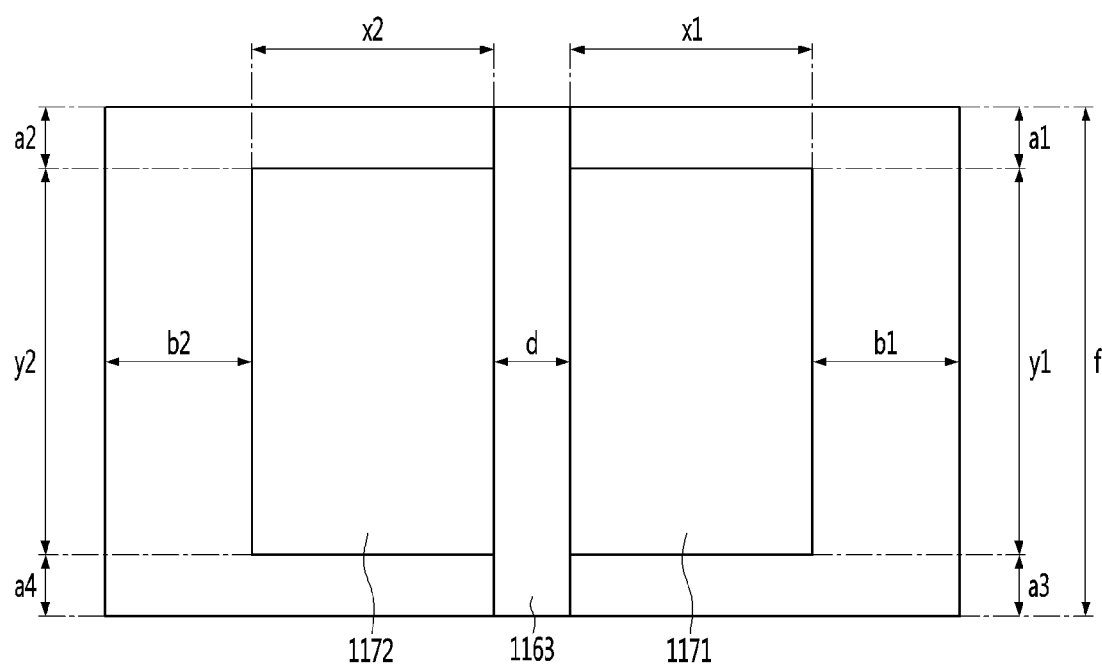

【FIG. 28a】
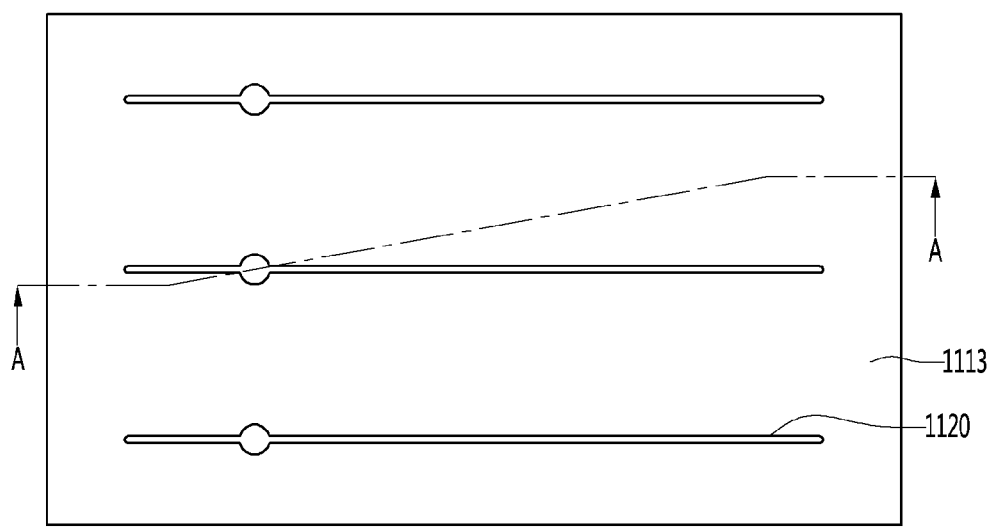

[FIG. 28b]
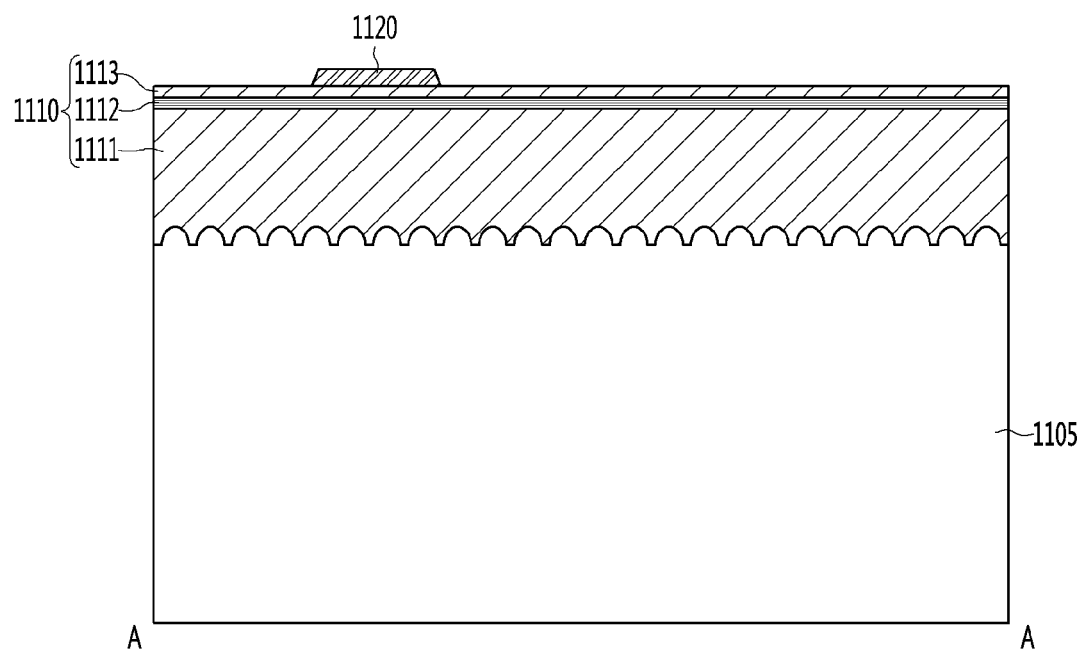

【FIG. 29a】
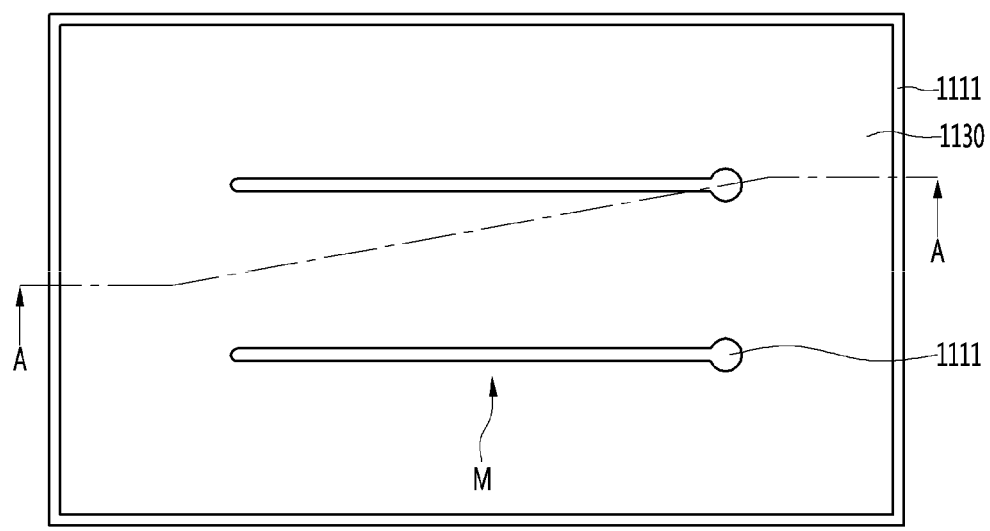

[FIG. 29b]
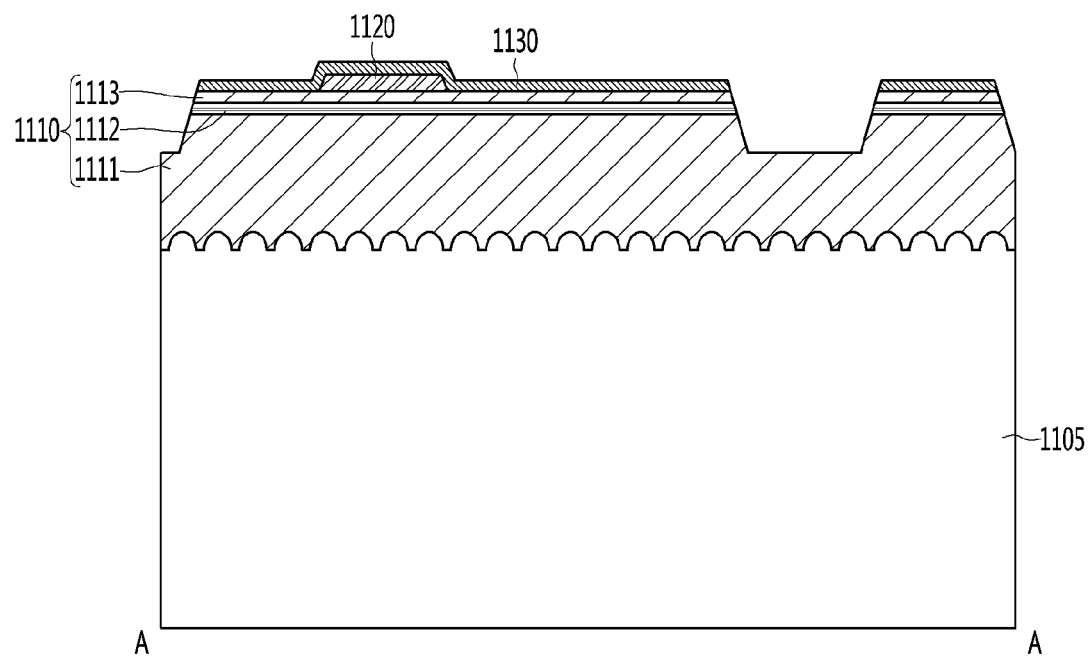

[FIG. 30a]
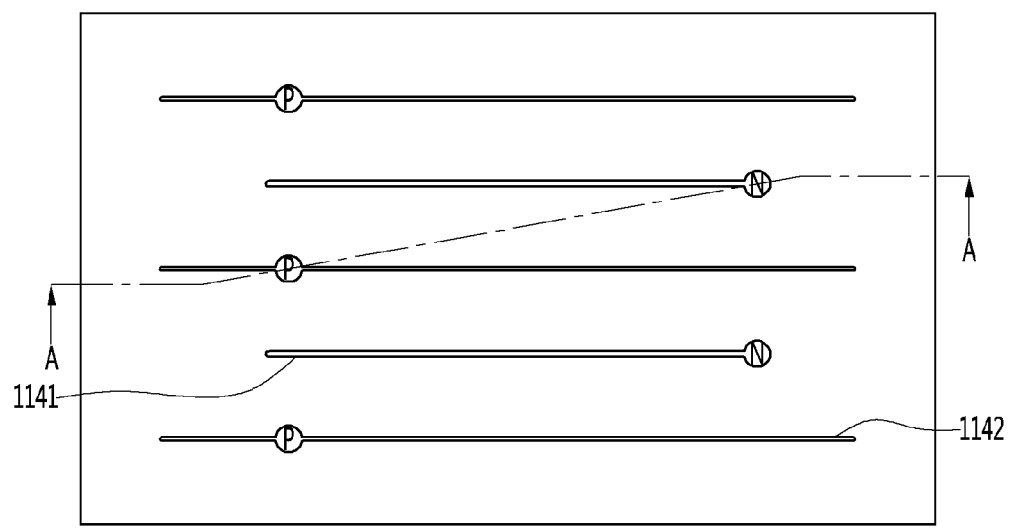

[FIG. 30b]
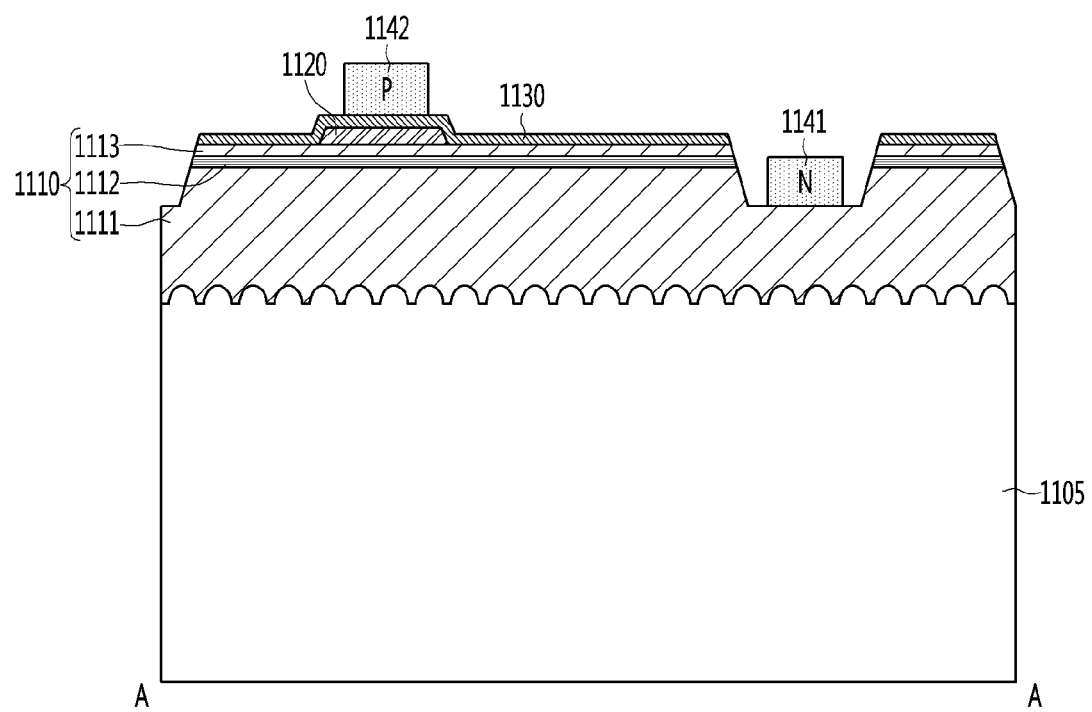

[FIG. 31a]
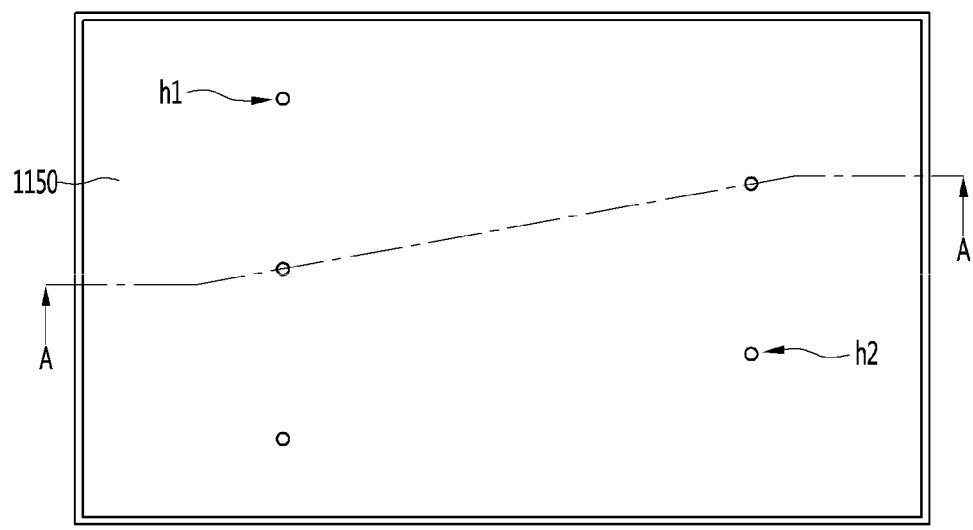

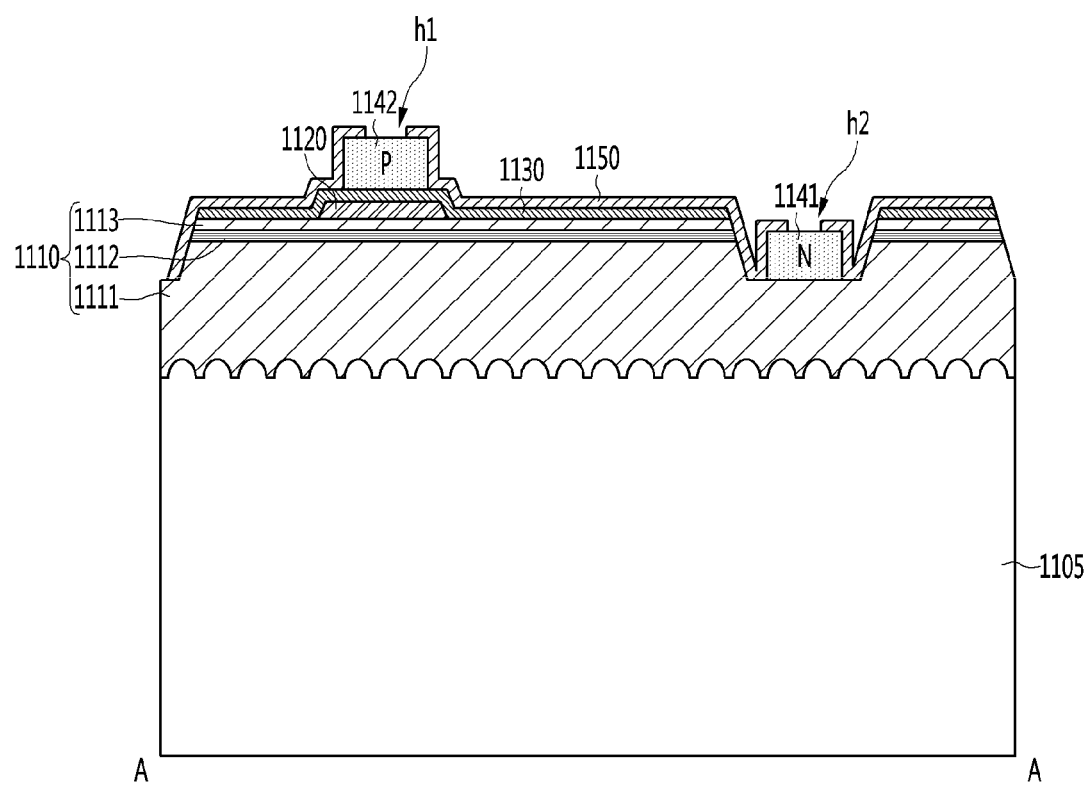
[FIG. 31b]

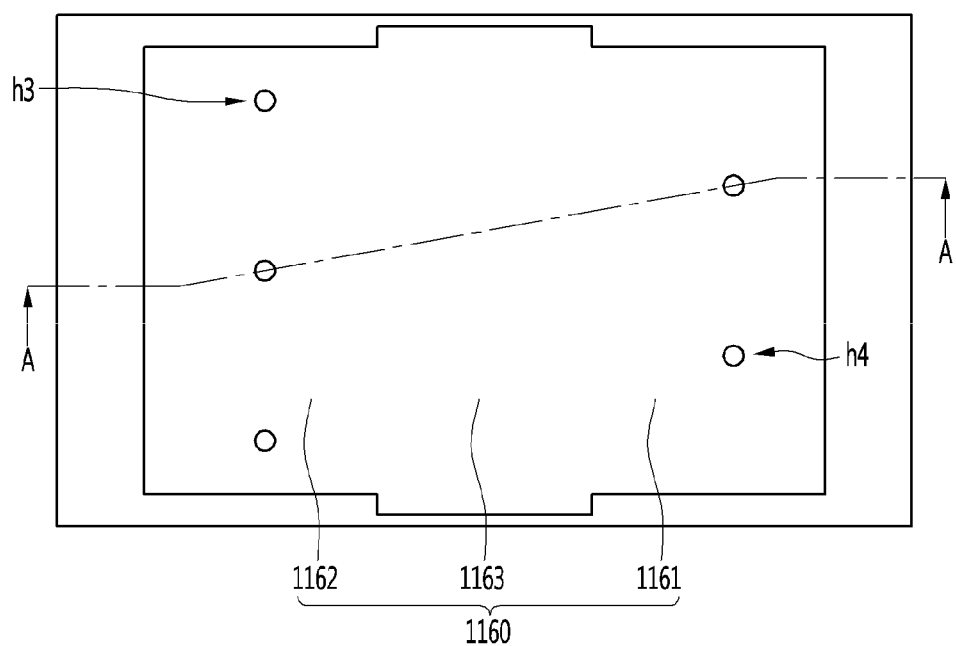
[FIG. 32a]

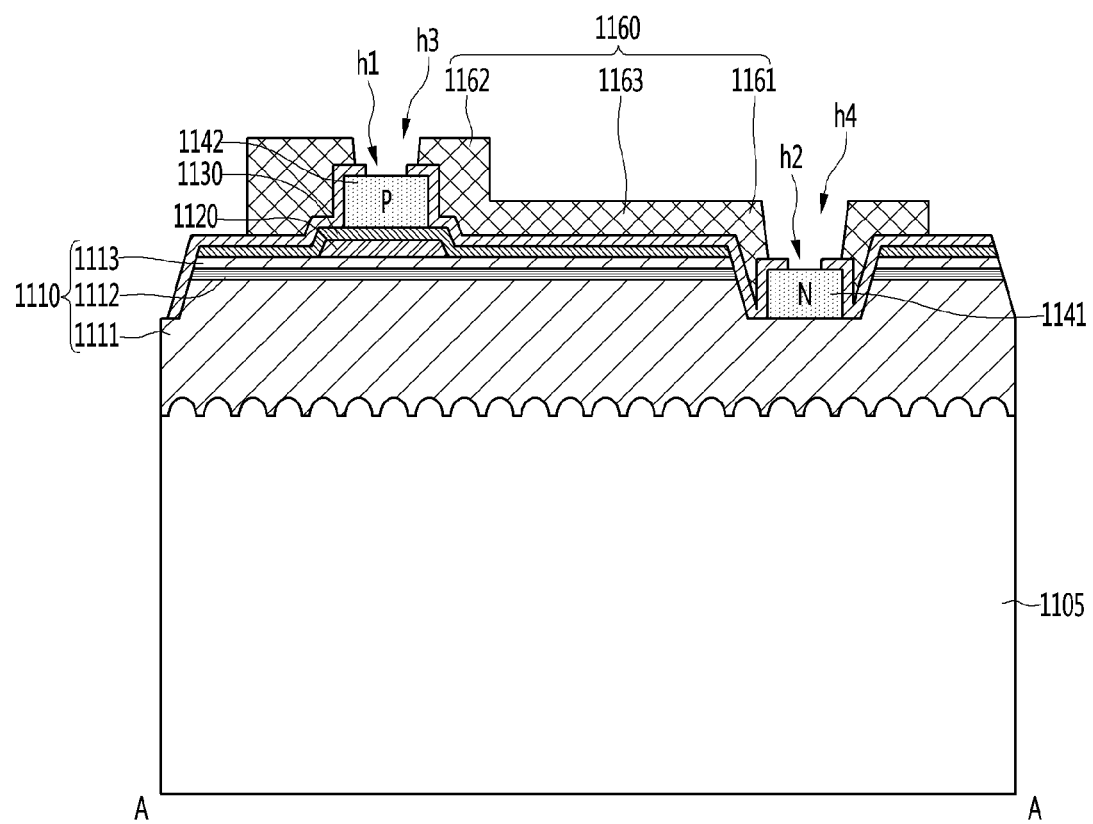
【FIG. 32b】

【FIG. 33a】
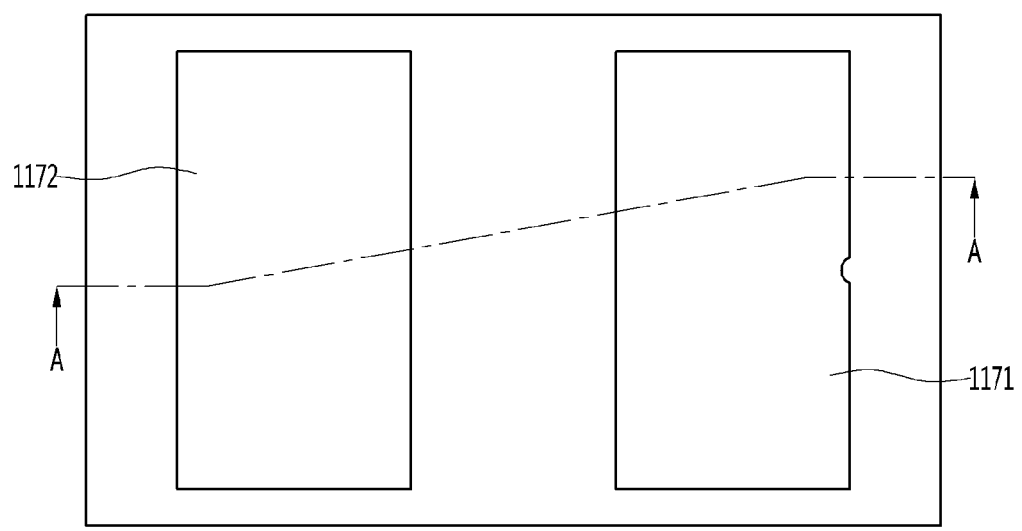

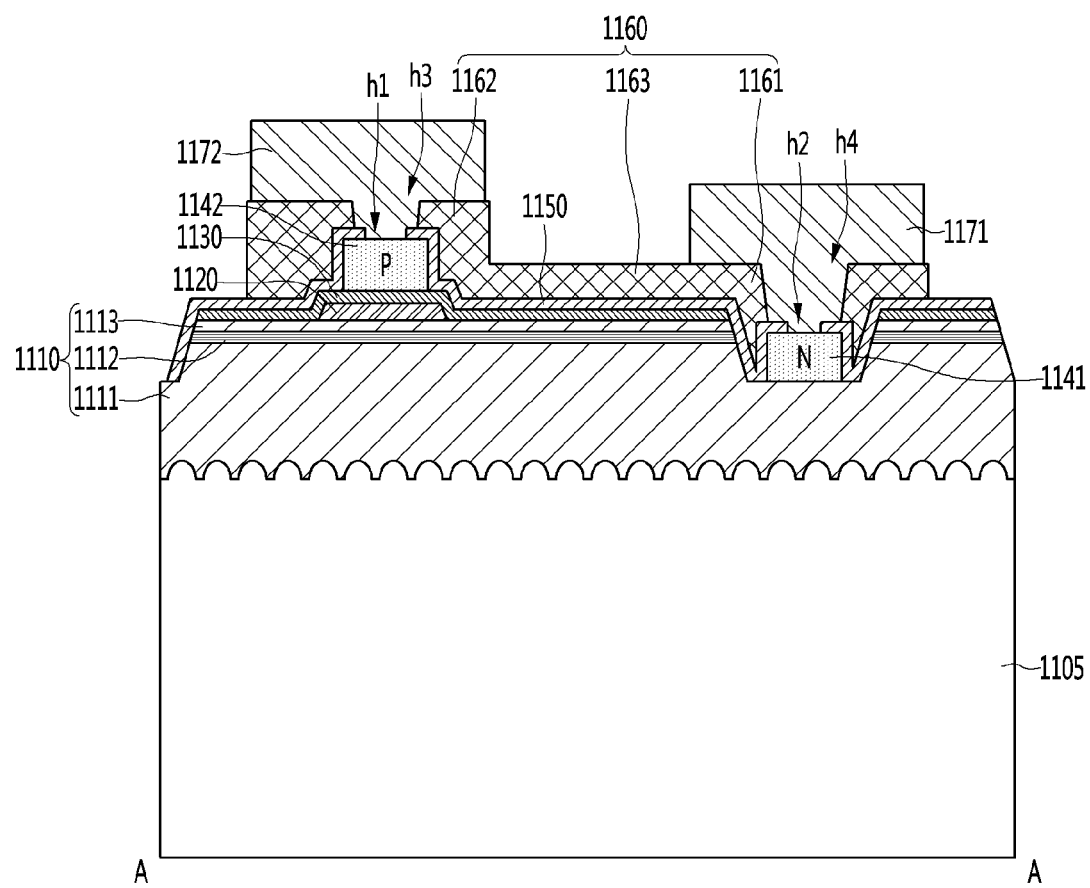
[FIG. 33b]

【FIG. 34】
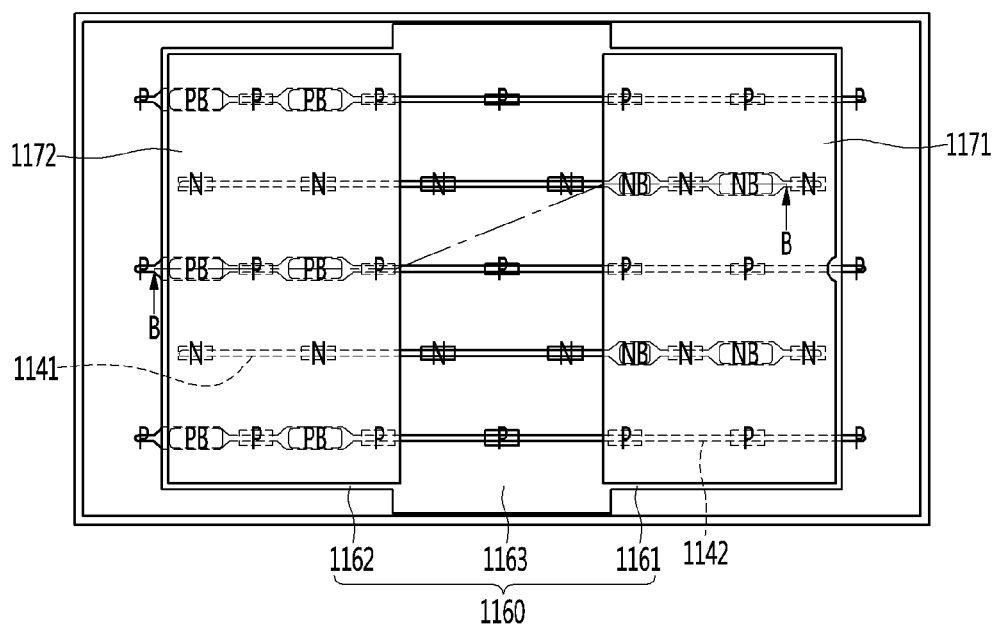

[FIG. 35]
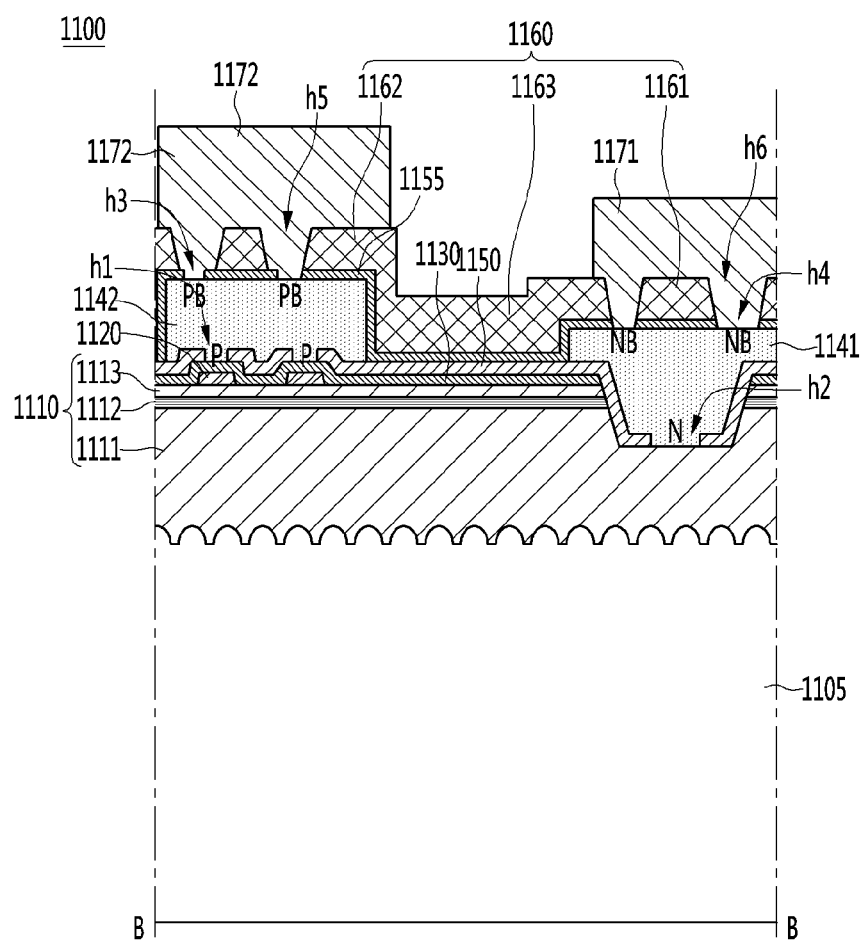

【FIG. 36】
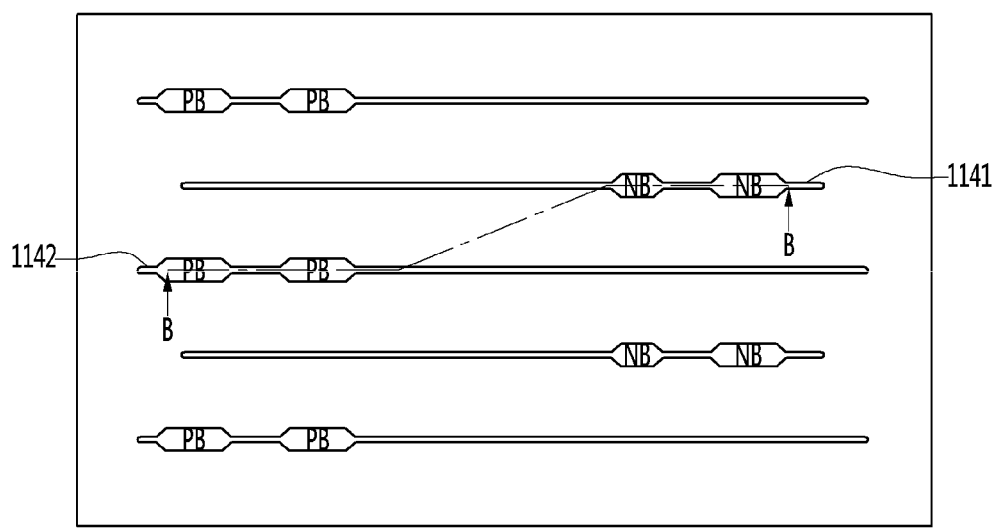

【FIG. 37a】
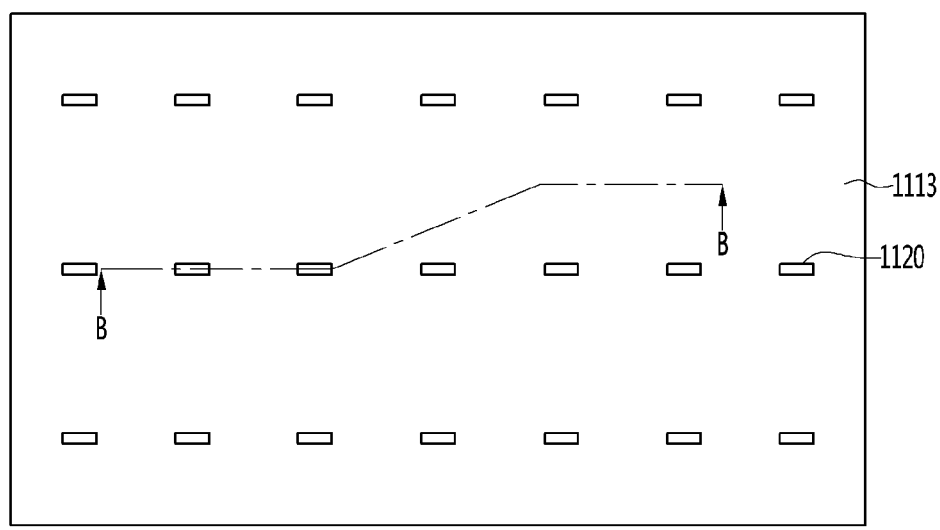

[FIG. 37b]
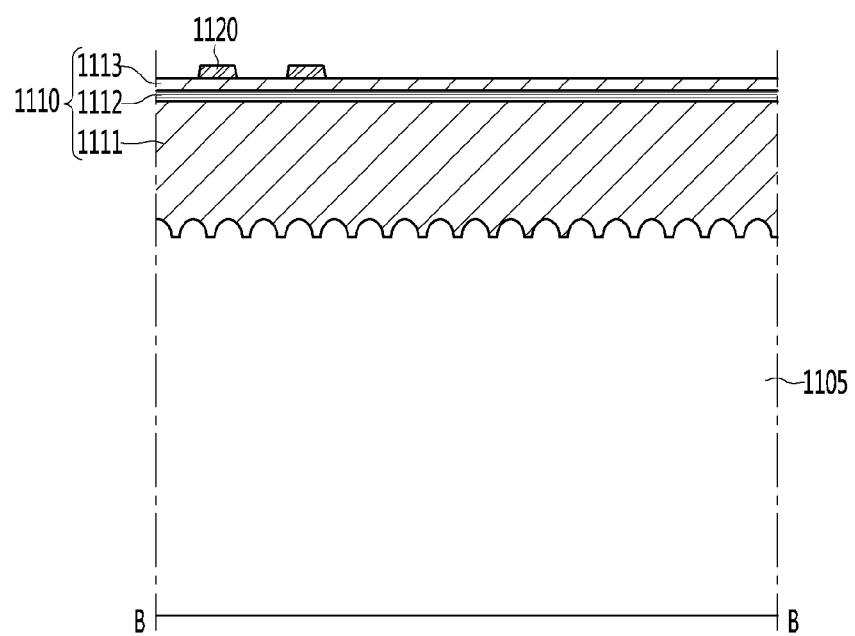

【FIG. 38a】
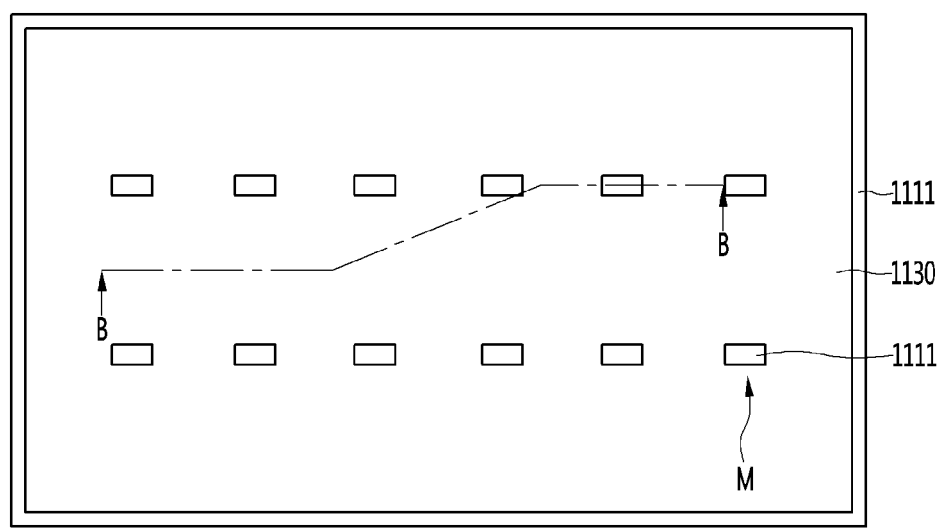

[FIG. 38b]
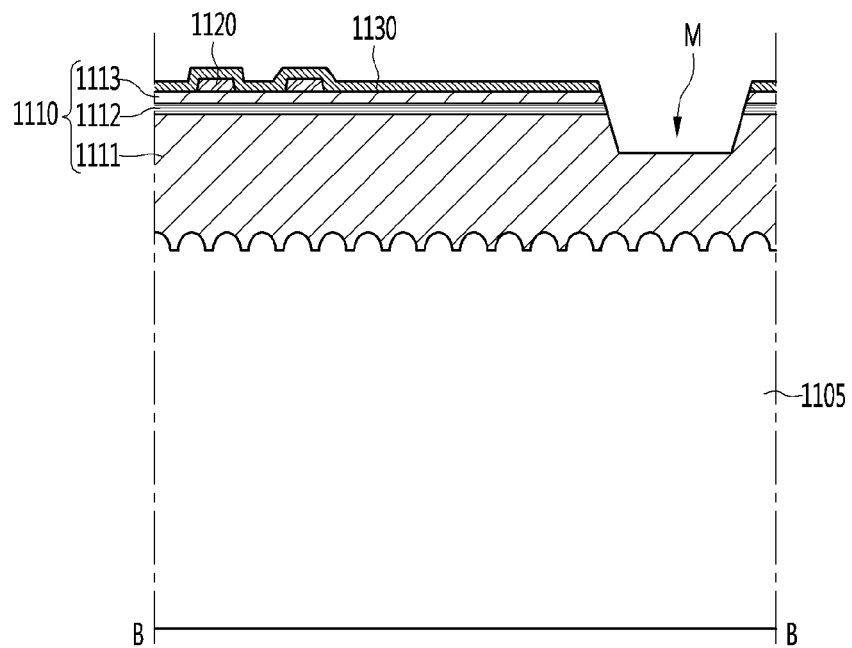

[FIG. 39a]
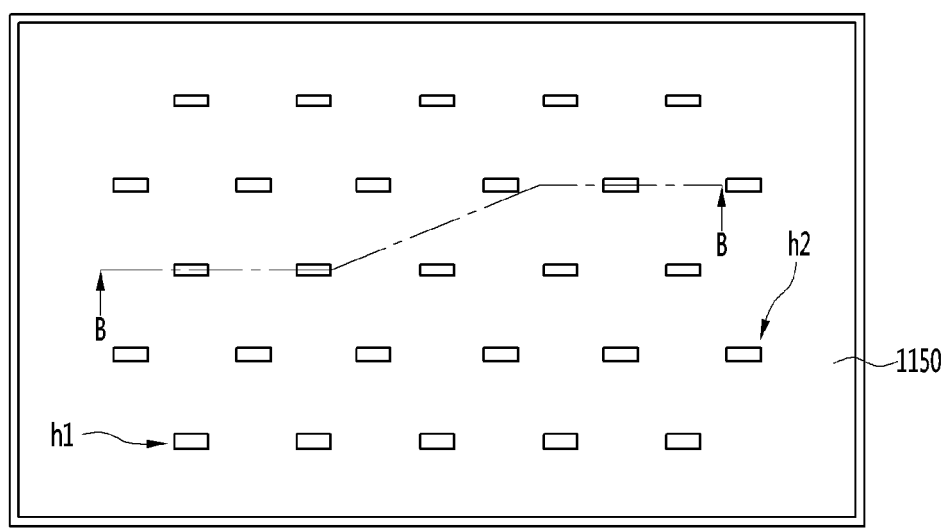

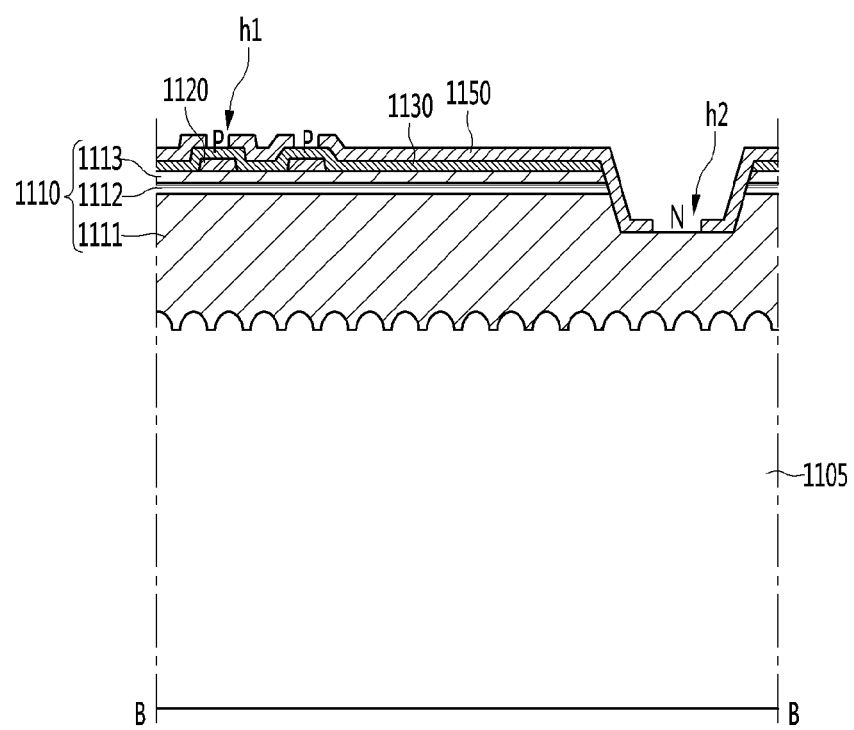
[FIG. 39b]

[FIG. 40a]
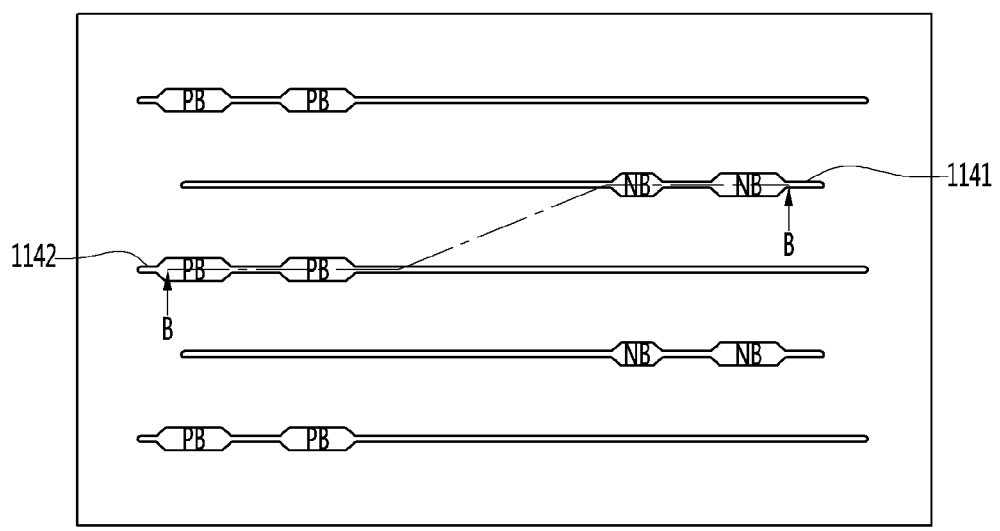

【FIG. 40b】
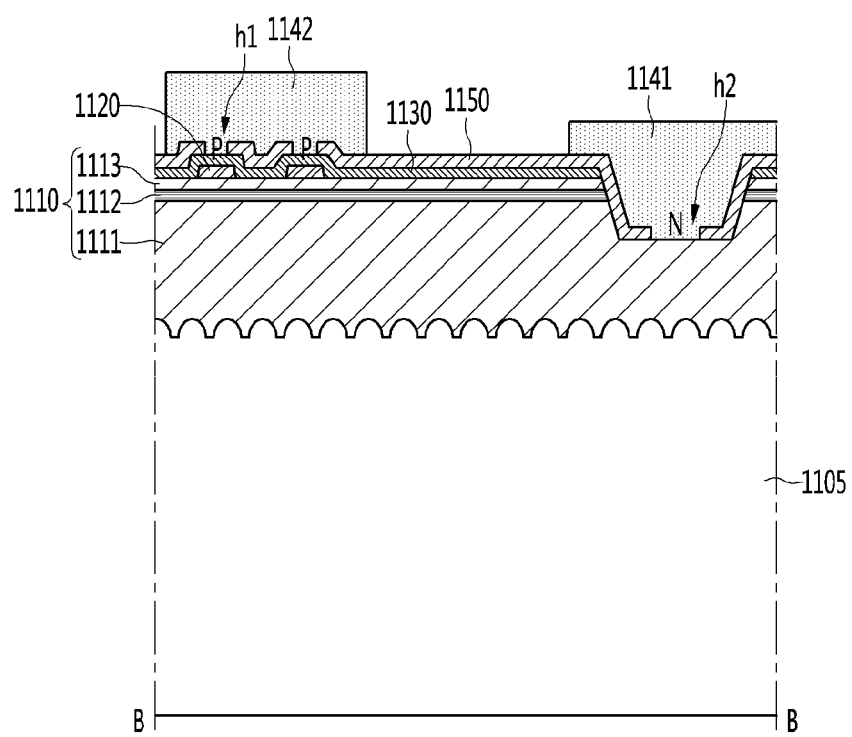

【FIG. 41a】
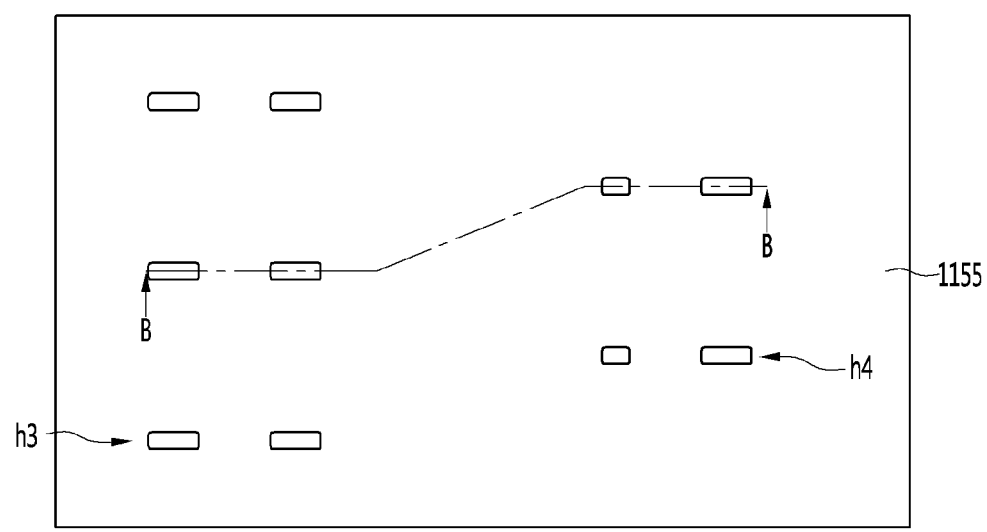

[FIG. 41b]
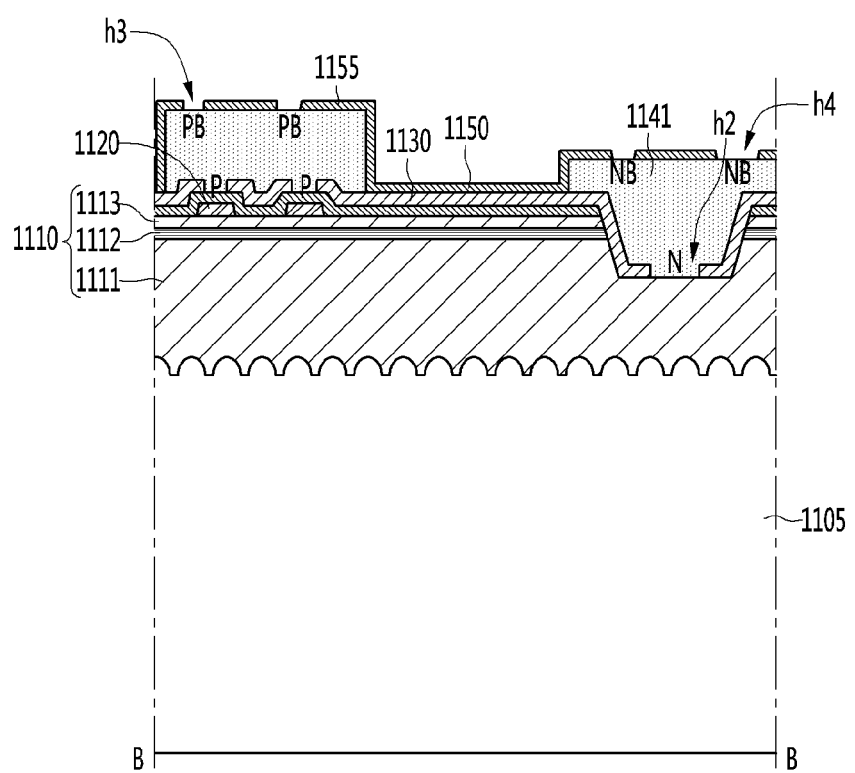

【FIG. 42a】
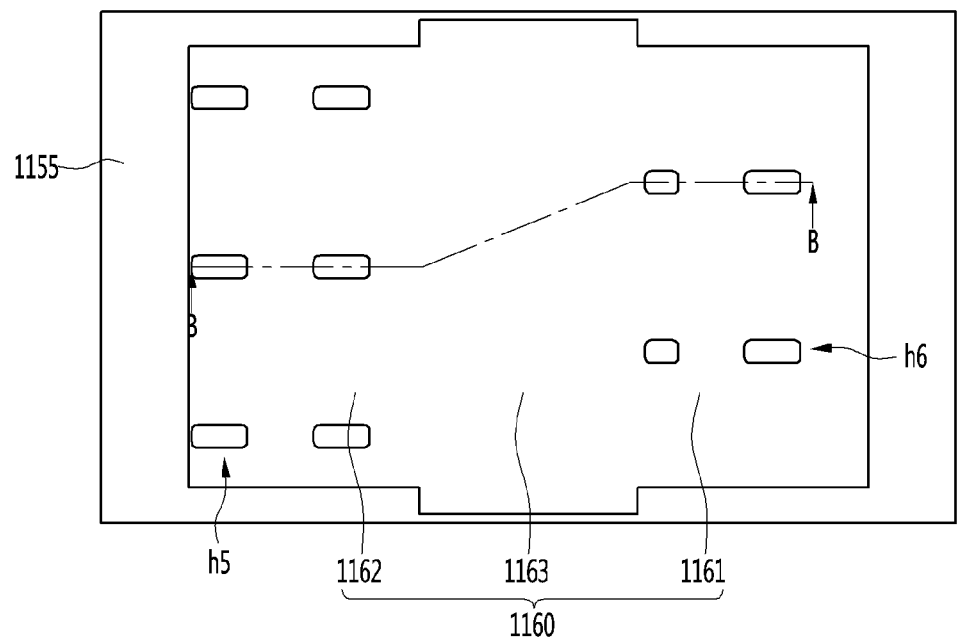

[FIG. 42b]
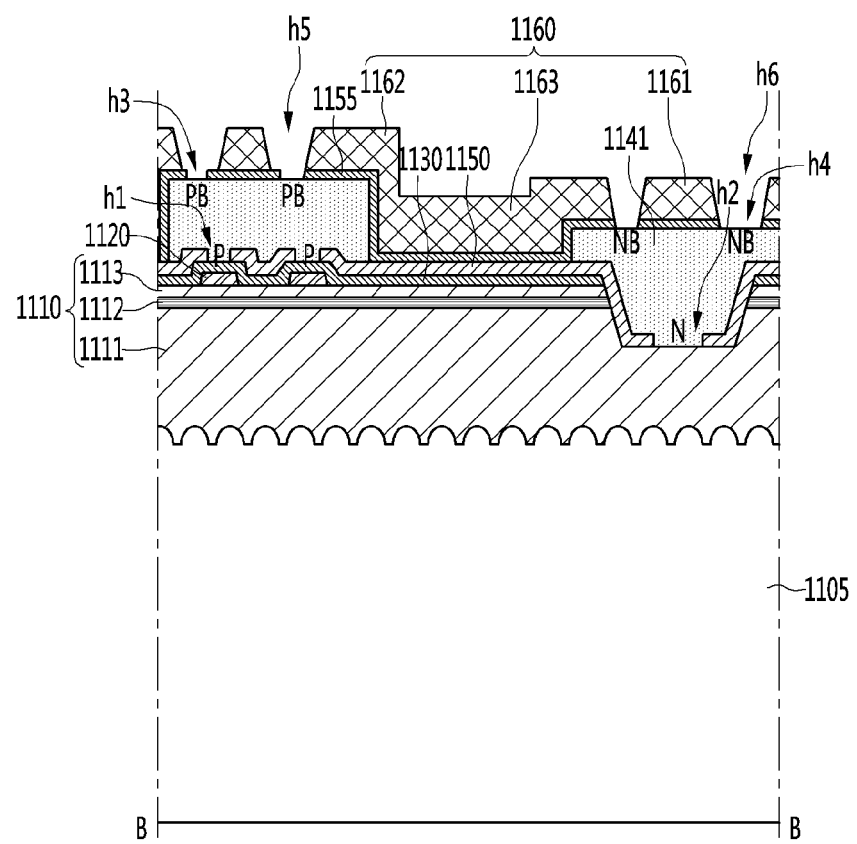

【FIG. 43a】
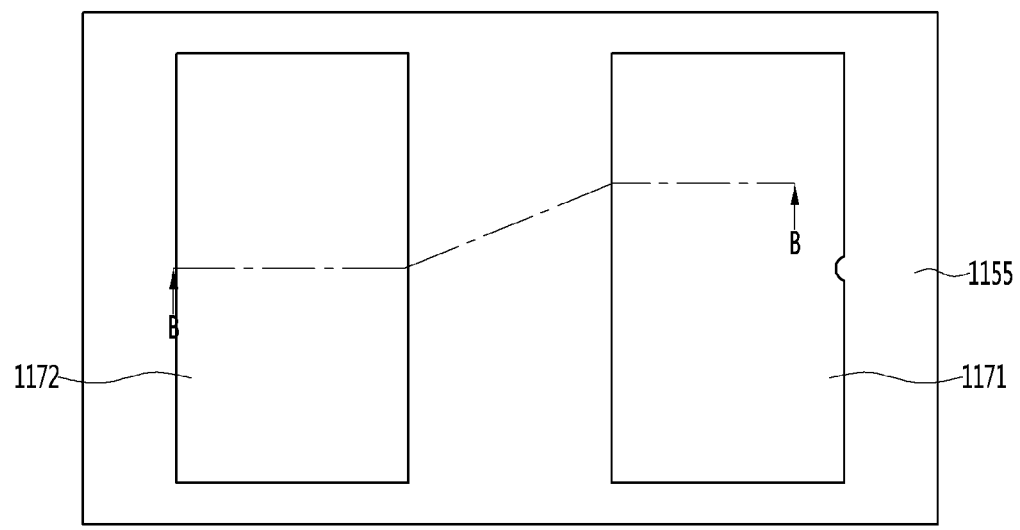

[FIG. 43b]
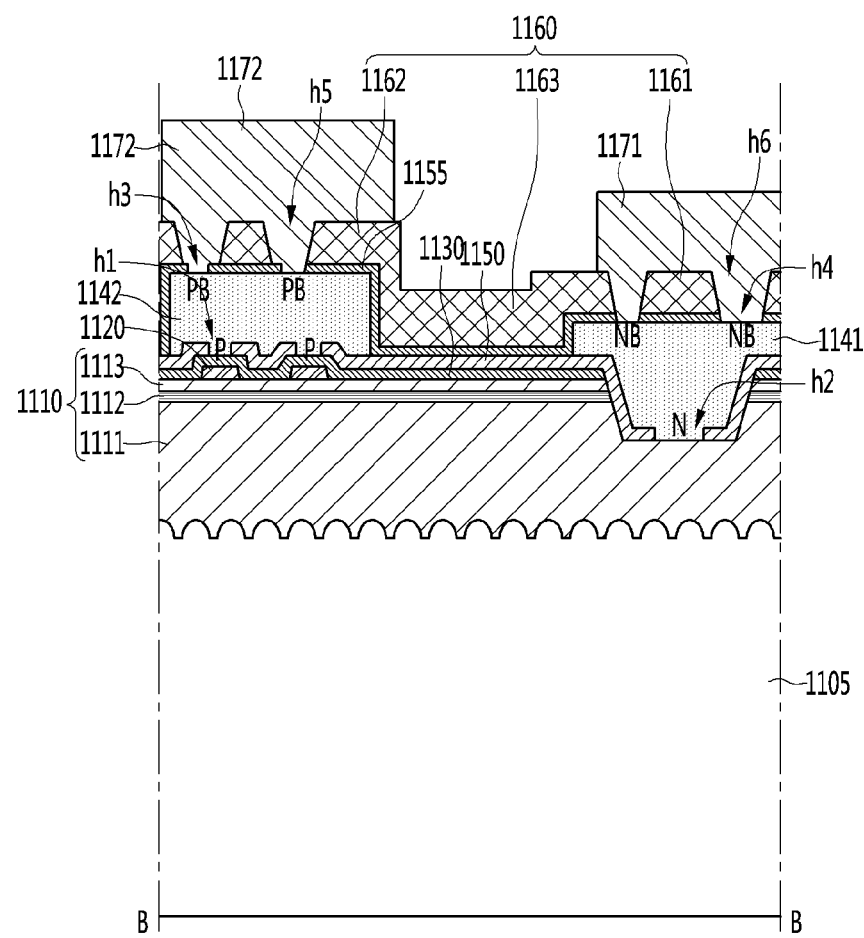

[FIG. 44]
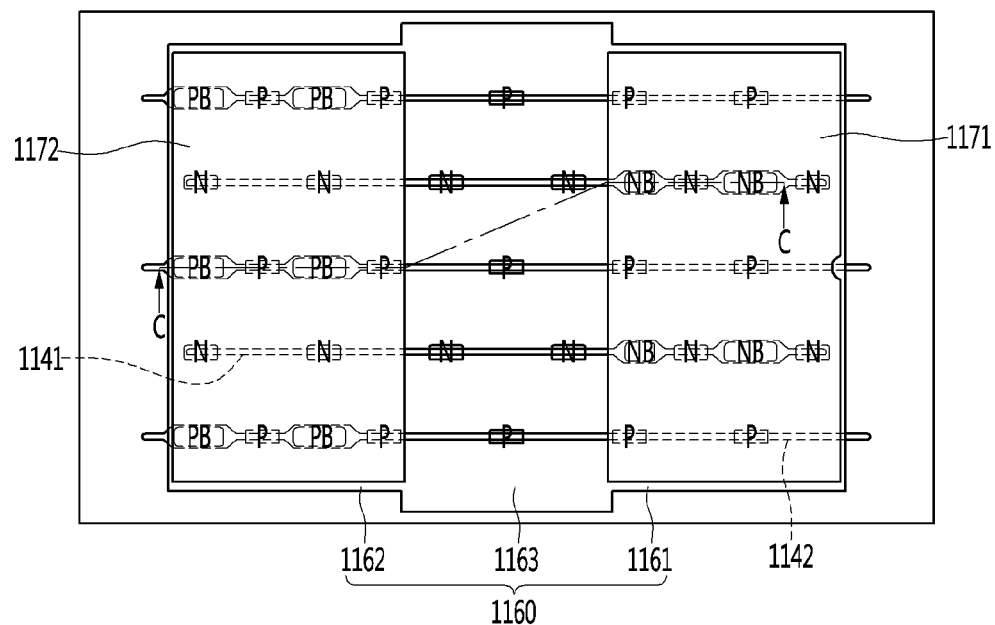

【FIG. 45】
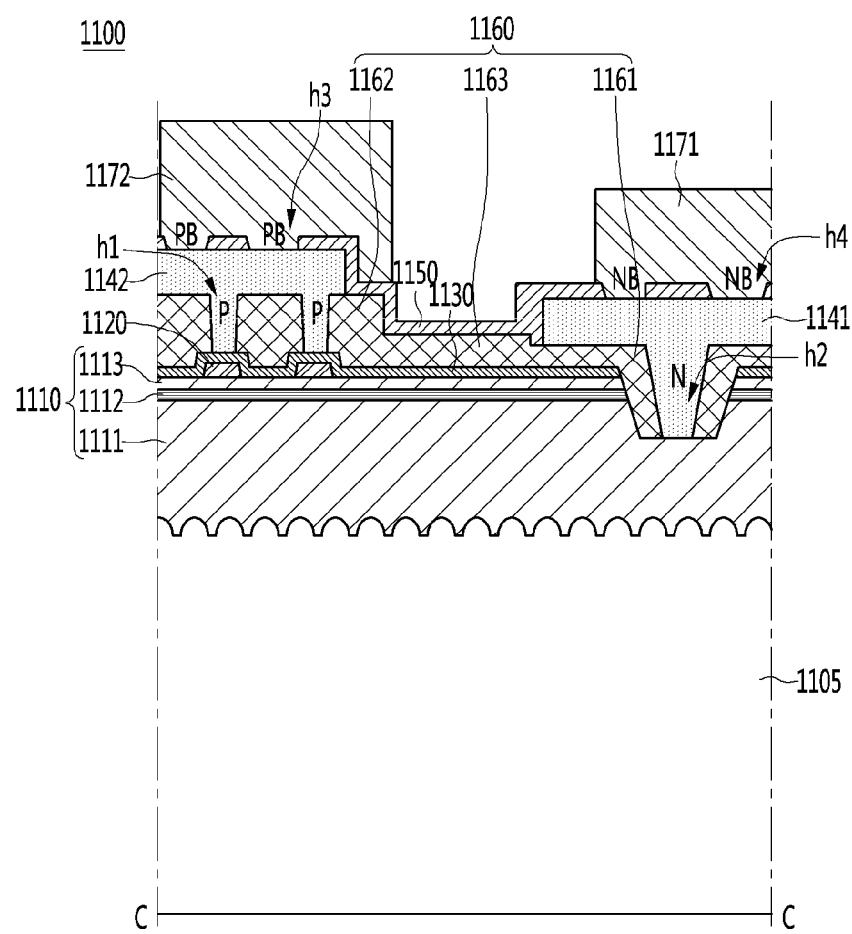

【FIG. 46】
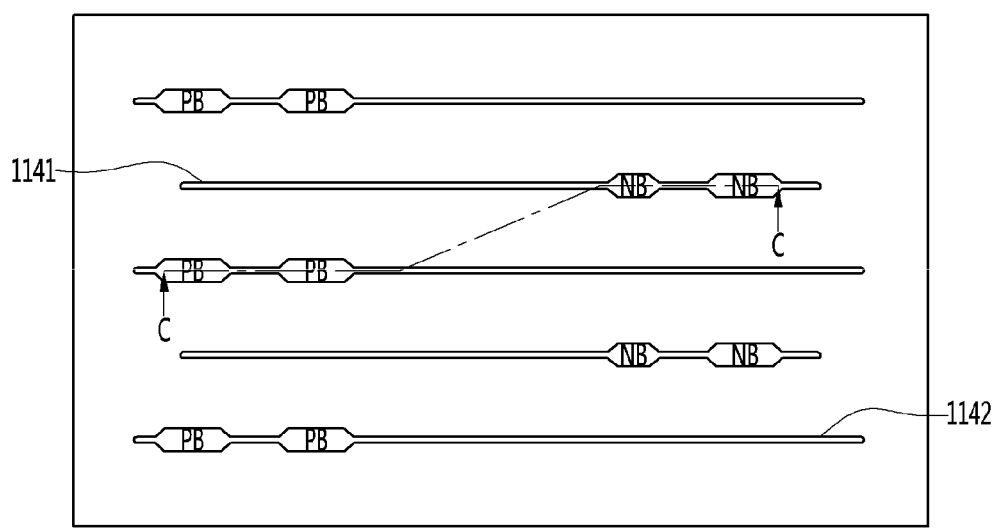

[FIG. 47a]
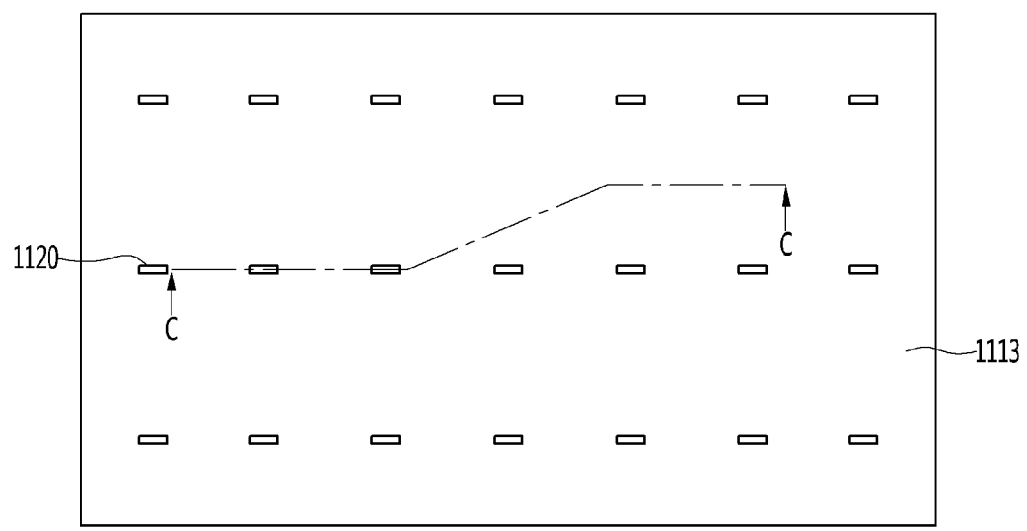

[FIG. 47b]
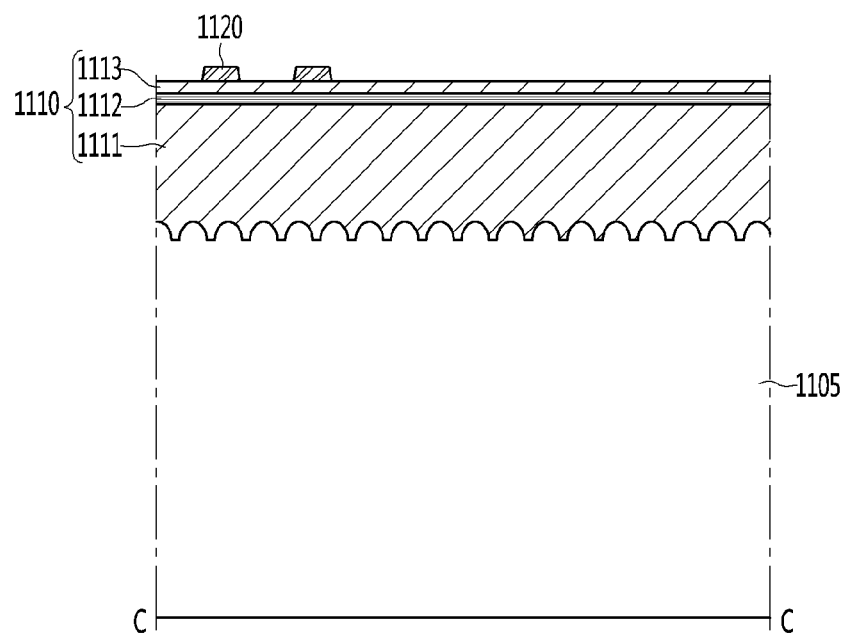

[FIG. 48a]
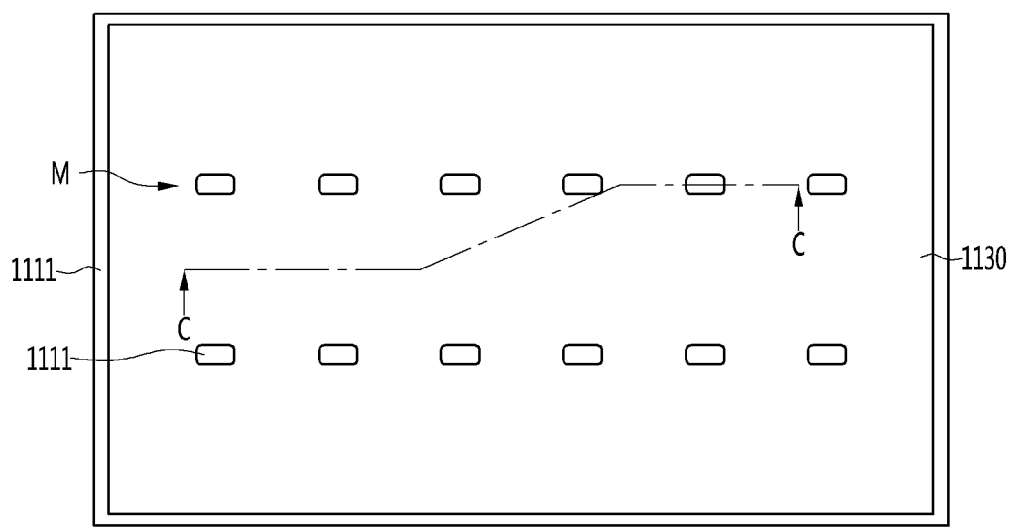

【FIG. 48b】
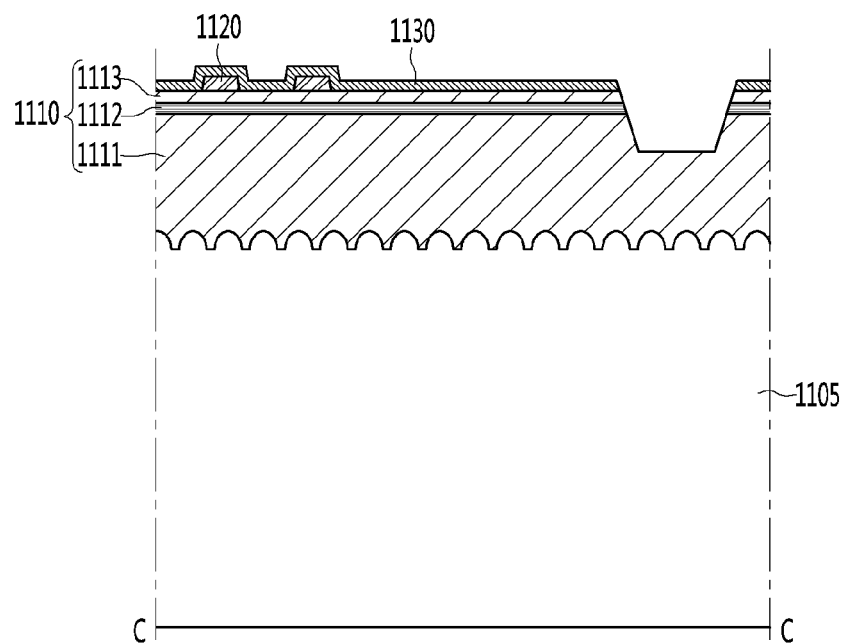

[FIG. 49a]
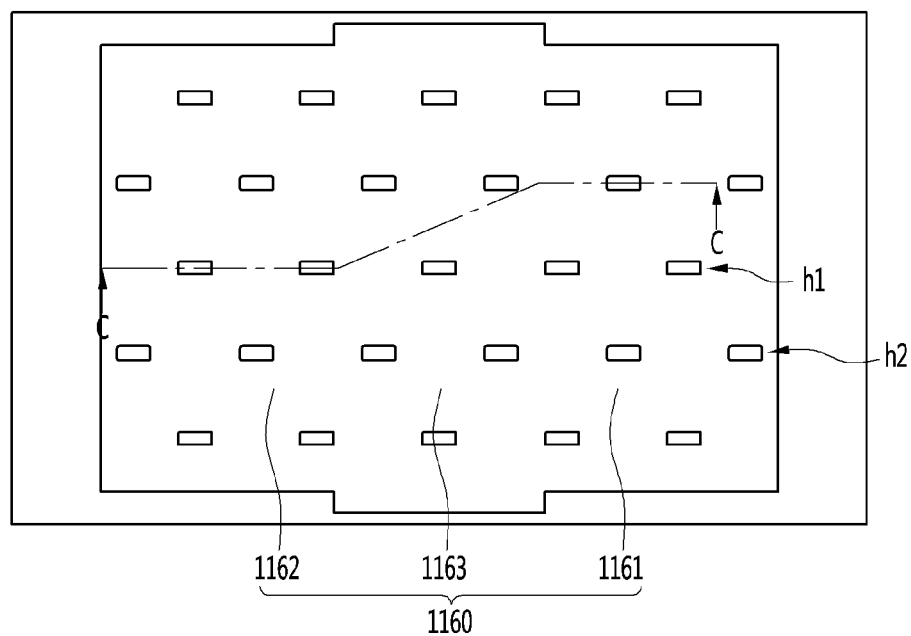

【FIG. 49b】
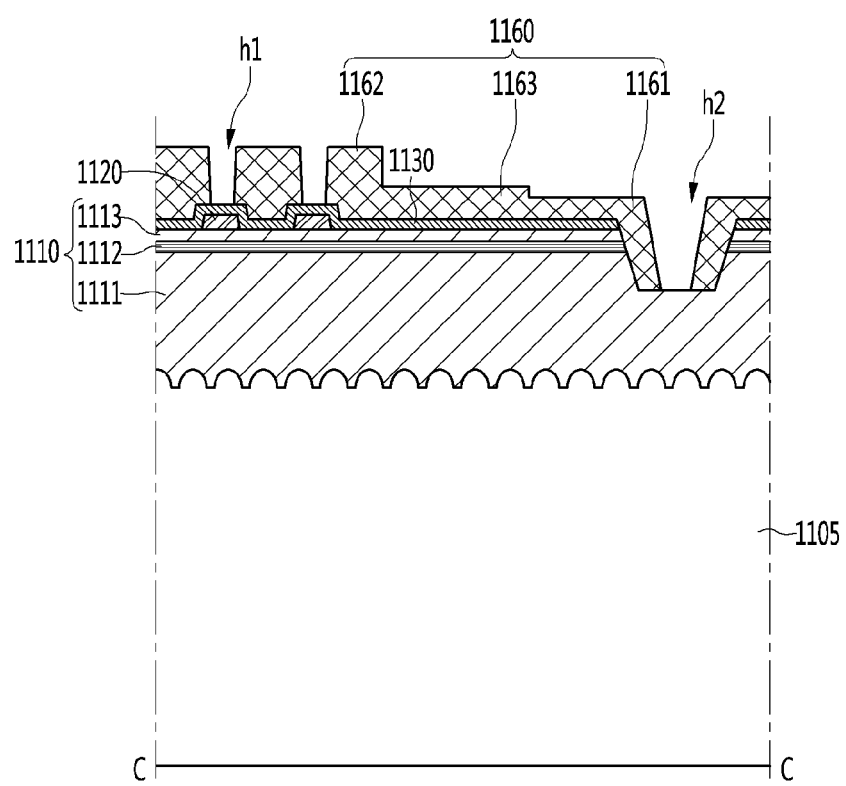

[FIG. 50a]
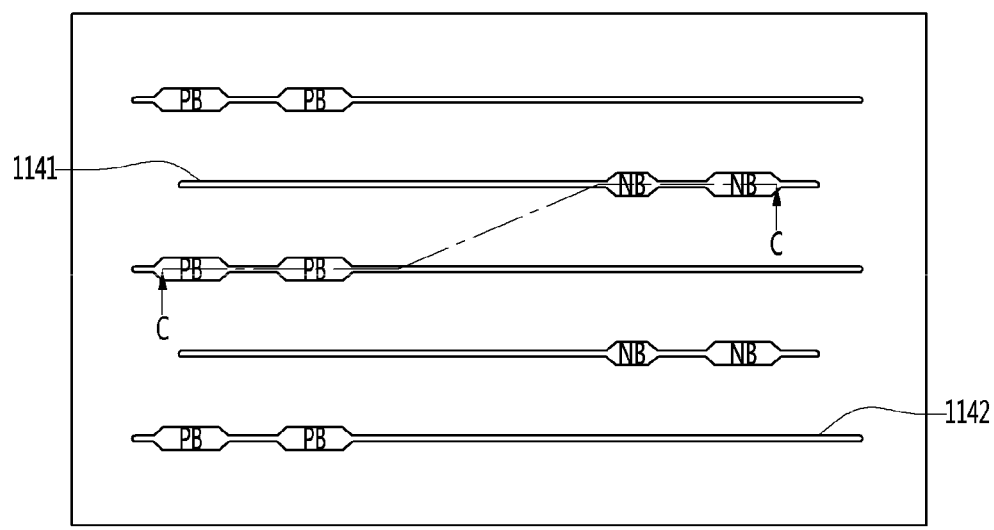

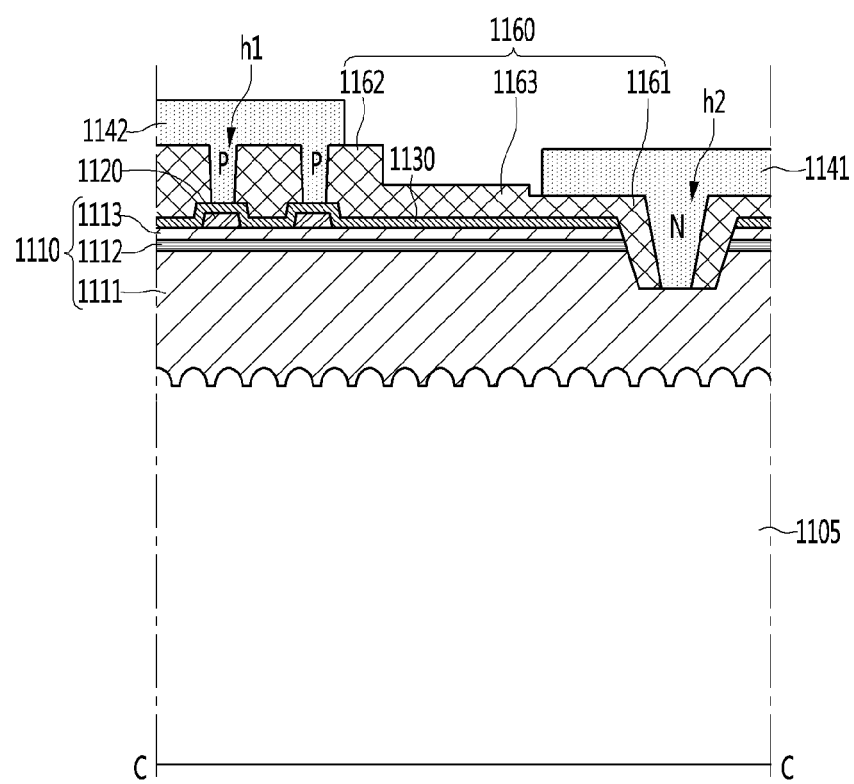
[FIG. 50b]

【FIG. 51a】
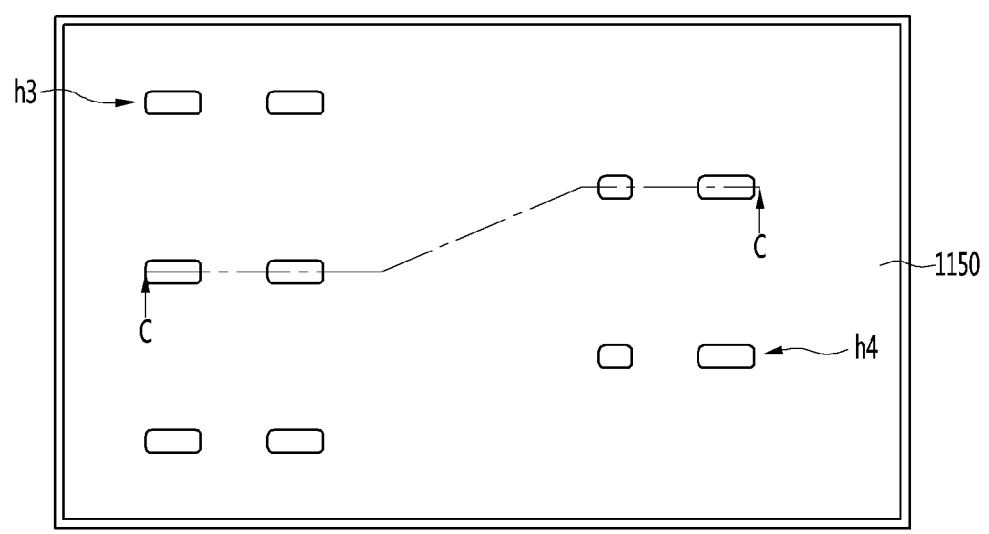

【FIG. 51b】
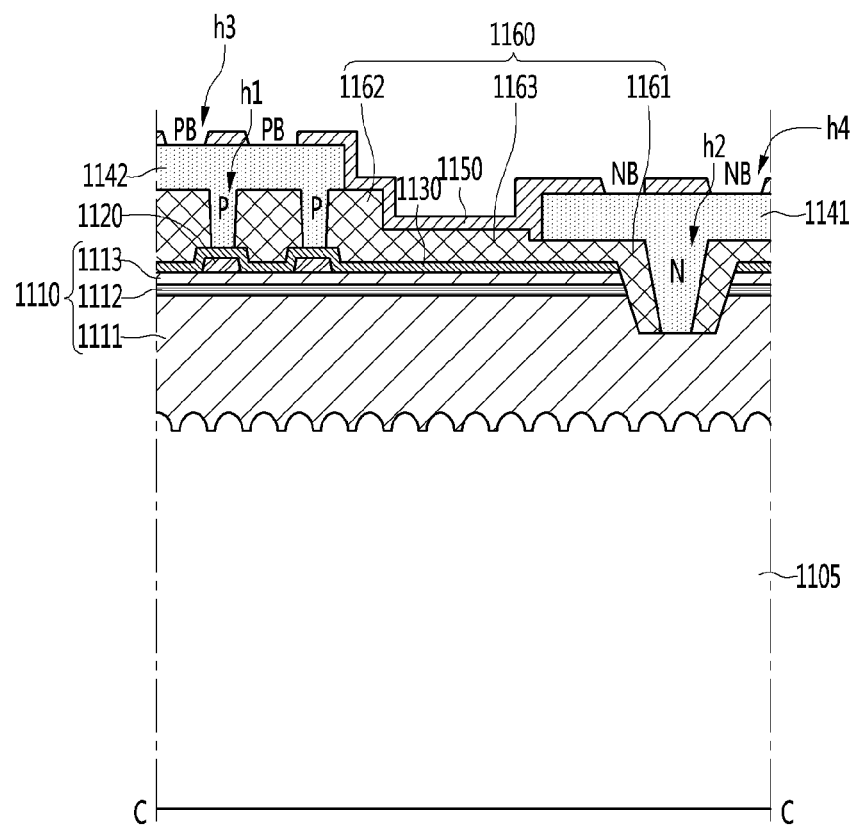

[FIG. 52a]
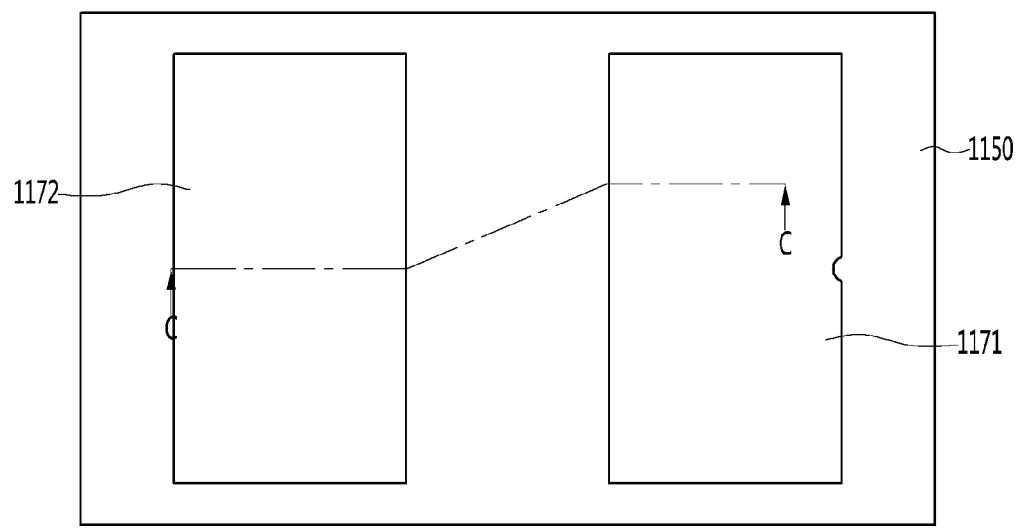

[FIG. 52b]
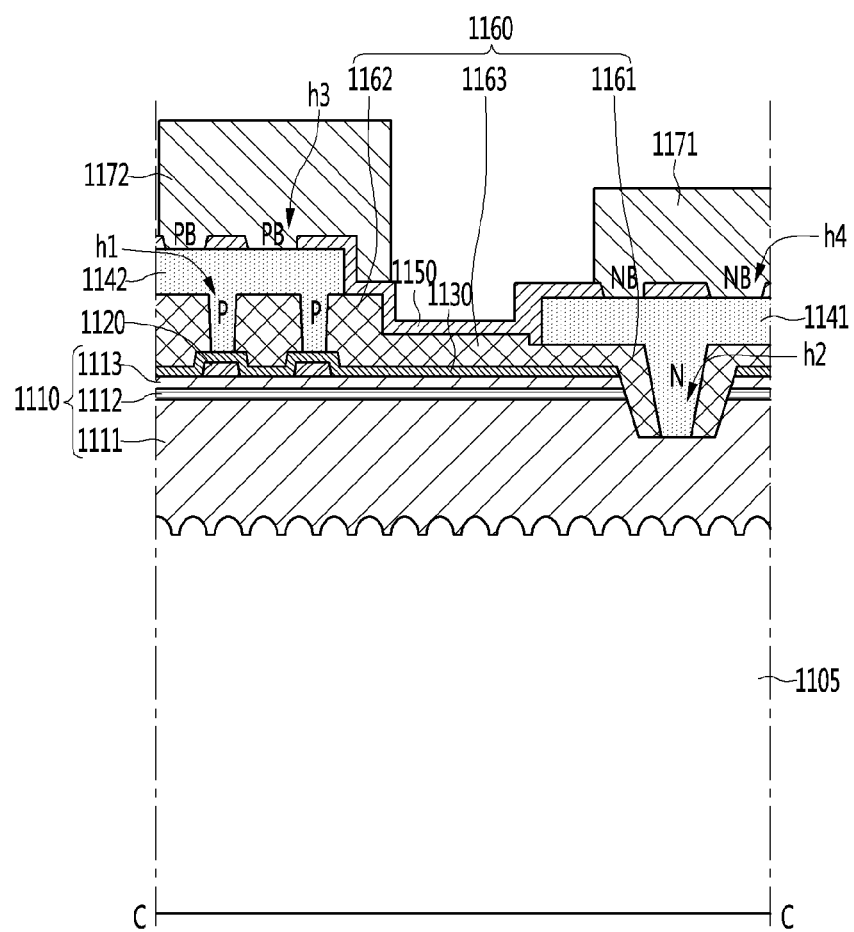

[FIG. 53]
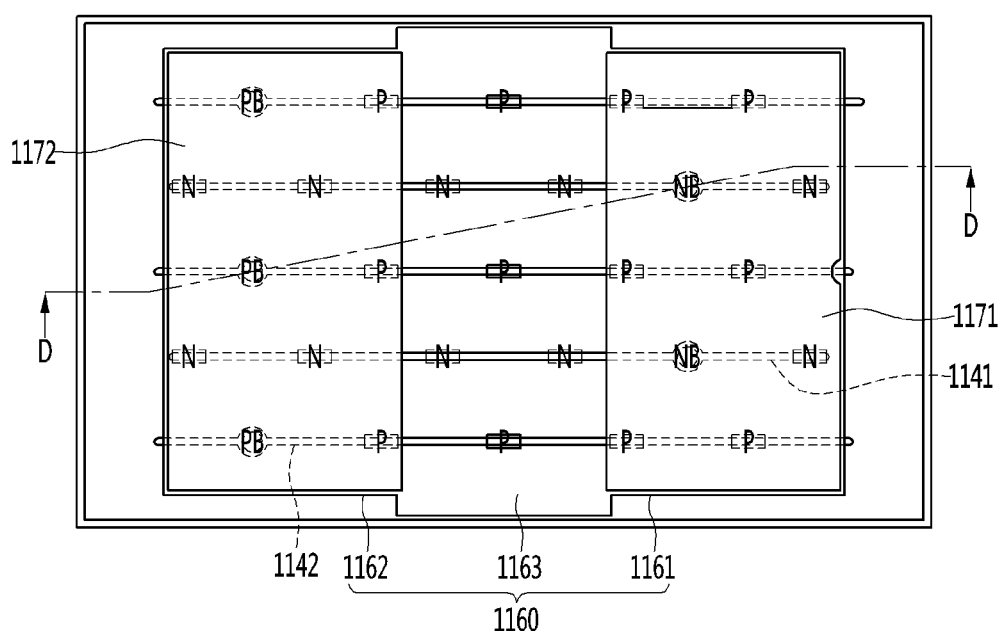

[FIG. 54]
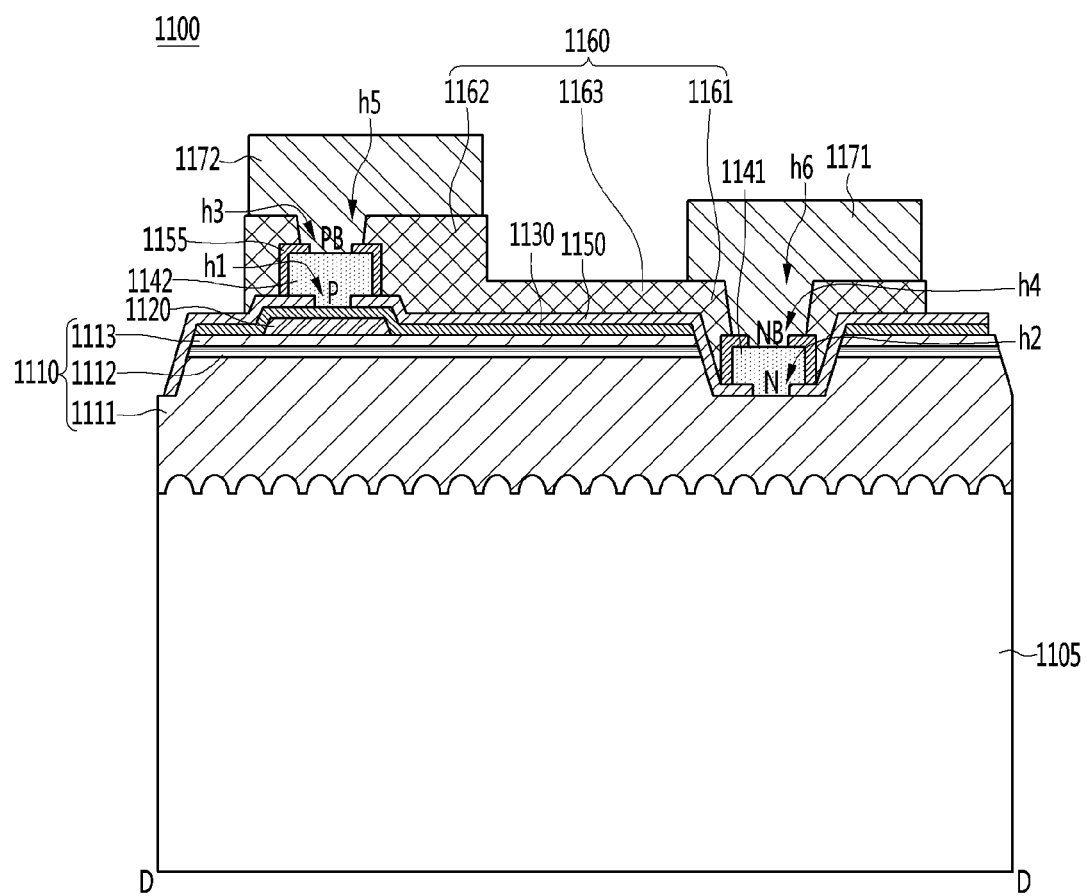

[FIG. 55]
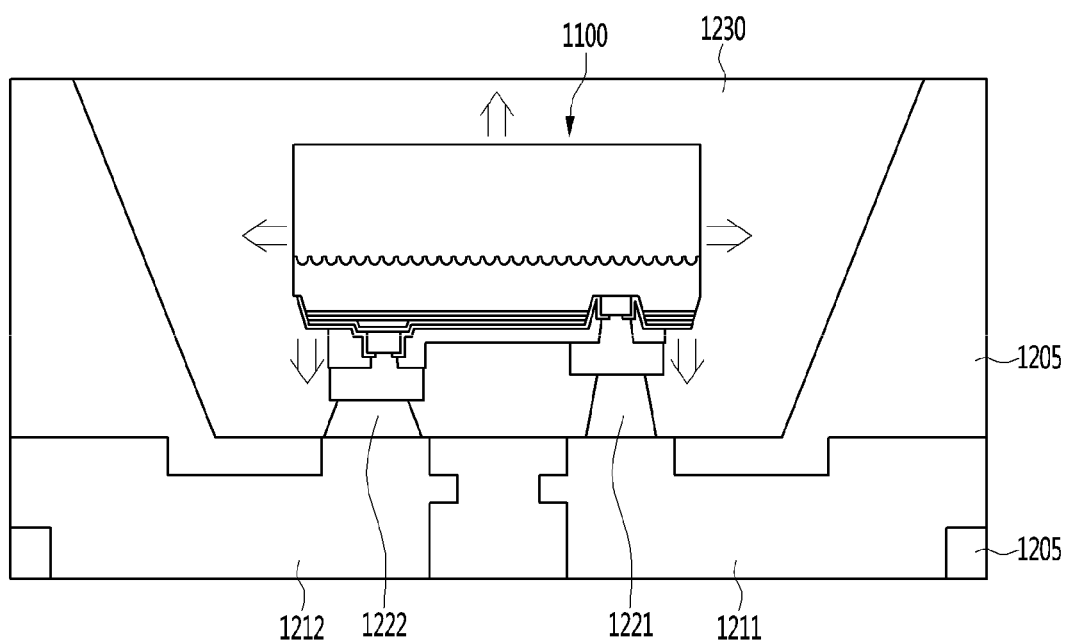

[FIG. 56]
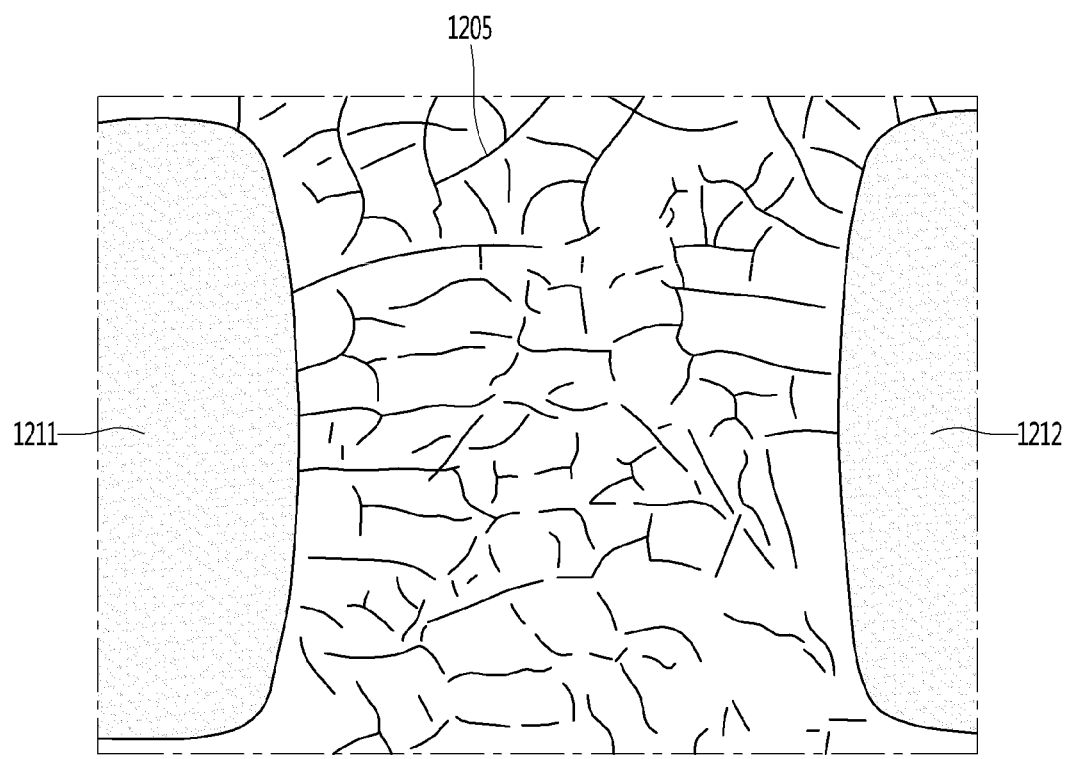

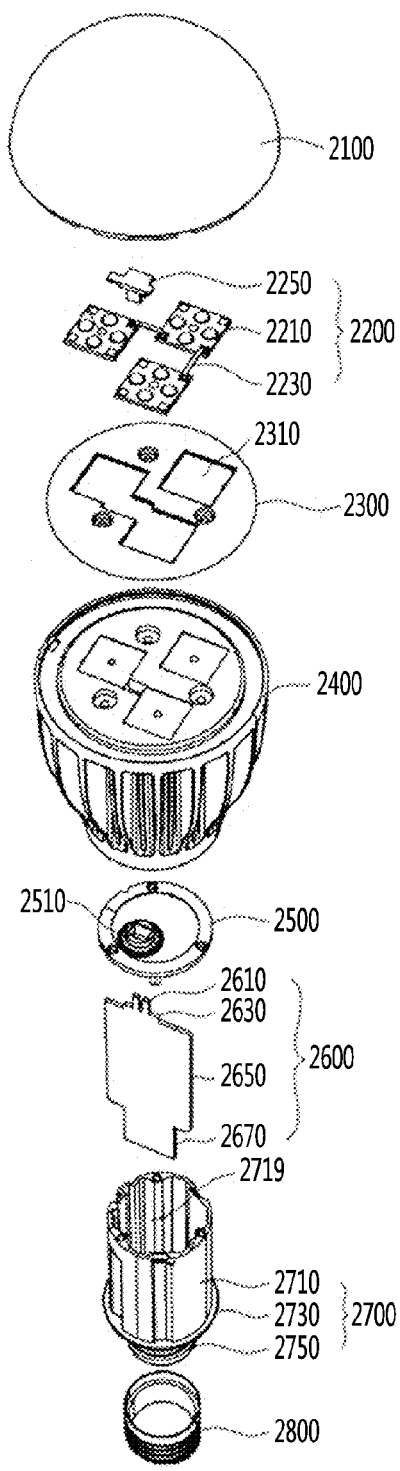
[FIG. 57]

SEMICONDUCTOR DEVICE AND SEMICONDUCTOR DEVICE PACKAGE

CROSS REFERENCE TO RELATED APPLICATIONS

This application is the National Phase of PCT International Application No. PCT/KR2018/000839, filed on Jan. 18, 2018, which claims priority under 35 U.S.C. 119(a) to Patent Application No. 10-2017-0029302, filed in the Republic of Korea on Mar. 8, 2017, and Patent Application No. 10-2017-0029305, filed in the Republic of Korea on Mar. 8, 2017, all of which are hereby expressly incorporated by reference into the present application.

TECHNICAL FIELD

The embodiment relates to a semiconductor device and a method of manufacturing a semiconductor device, and a semiconductor device package.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a light emitting device has advantages such as low power consumption, semi-permanent lifetime, quick response speed, safety, and environmental friendliness compared to conventional light source such as fluorescent lamps and incandescent lamps.

In addition, when a light receiving device such as a photo detector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness, and easy control of device materials, so that the light receiving device can be easily used for a power control, a super-high frequency circuit or a communication module.

Accordingly, the semiconductor device has been applied and expanded to a transmission module of an optical communication tool, a light emitting diode backlight replacing a cold cathode fluorescent lamp (CCFL) constituting a backlight of a liquid crystal display (LCD), a white light emitting diode lighting apparatus replaceable with a fluorescent lamp or an incandescent bulb, a vehicular headlight, a traffic light, and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For example, since a nitride semiconductor has high thermal stability and wide bandgap energy, it has received great attention in the field of development of optical devices and high power electronic devices. Particularly, a blue light emitting device, a green light emitting device, an ultraviolet (UV) light emitting device, and a red light emitting device using the nitride semiconductor are commercialized and widely used.

For example, the ultraviolet light emitting device refers to a light emitting diode that generates light distributed in a wavelength range of 200 nm to 400 nm. In the above wavelength range, a short wavelength may be used for sterilization, purification or the like and a long wavelength may be used for a stepper, a curing apparatus or the like.

Ultraviolet rays may be classified into UV-A (315 nm to 400 nm), UV-B (280 nm to 315 nm) and UV-C (200 nm to 280 nm) in an order of the long wavelength. The UV-A (315 nm to 400 nm) domain is applied to various fields such as industrial UV curing, curing of printing ink, exposure machine, discrimination of counterfeit money, photocatalytic sterilization, special lighting (such as aquarium/agriculture), the UV-B (280 nm to 315 nm) domain is applied to medical use, and the UV-C (200 nm to 280 nm) domain is applied to air purification, water purification, sterilization products and the like.

Meanwhile, as a semiconductor device capable of providing a high output has been requested, studied on a semiconductor device capable of increasing an output power by applying a high power source has been proceeding.

In addition, as for a semiconductor device package, studies on a method of improving the light extraction efficiency of a semiconductor device and improving the light intensity in a package stage has been proceeding. In addition, as for the semiconductor device package, studies on a method of improving bonding strength between a package electrode and a semiconductor device has been proceeding.

DETAIL DESCRIPTION OF THE INVENTION

Technical Problem

The embodiments may provide a semiconductor device, a method of manufacturing a semiconductor device, and a semiconductor device package that can improve light extraction efficiency and electrical characteristics.

The embodiments may provide a semiconductor device, a method of manufacturing a semiconductor device, and a semiconductor device package that can improve bonding strength between a package electrode and a semiconductor device.

The embodiments may provide a semiconductor device, a method of manufacturing a semiconductor device, and a semiconductor device package that can prevent the current concentration phenomenon from occurring and improve the reliability.

The embodiments may provide a semiconductor device, a method of manufacturing a semiconductor device, and a semiconductor device package that can prevent the package body from being degraded by light emitted from the semiconductor device.

Technical Solution

A semiconductor device according to an embodiment may comprise a light emitting structure comprising a first conductivity type semiconductor layer and a second conductivity type semiconductor layer; a first electrode disposed on the first conductivity type semiconductor layer and electrically connected to the first conductivity type semiconductor layer; a second electrode disposed on the second conductivity type semiconductor layer and electrically connected to the second conductivity type semiconductor layer; a first insulating reflective layer disposed on the first electrode and the second electrode, and comprising a first opening exposing an upper surface of the first electrode; a second insulating reflective layer disposed on the first electrode and the second electrode, and disposed spaced apart from the first insulating reflective layer, and comprising a second opening exposing an upper surface of the second electrode; a first bonding pad disposed on the first insulating reflective layer and electrically connected to the first electrode through the first opening; and a second bonding pad disposed on the second insulating reflective layer and disposed spaced apart from the first bonding pad, and electrically connected to the second electrode through the second opening, wherein, when viewed from above the semiconductor device, a sum of an area of the first bonding pad and an area of the second bonding pad may be provided equal to or smaller than 70% of a total area of an upper surface of the semiconductor device on which the first bonding pad and the second bonding pad are disposed.

According to the embodiment, wherein, when viewed from above the semiconductor device, the sum of the area of the first bonding pad and the area of the second bonding pad may be provided equal to or greater than 30% of the total area of the semiconductor device.

According to the embodiment, wherein the first bonding pad or the second bonding pad may be provided along a major axis direction of the semiconductor device at a length of x, and may be provided along a minor axis direction of the semiconductor device at a length of y, and wherein a ratio of x and y may be provided in a range of 1:1.5 to 1:2.

According to the embodiment, wherein a distance between the first bonding pad and the second bonding pad may be provided equal to or greater than 125 micrometers and equal to or smaller than 300 micrometers.

According to the embodiment, wherein the first bonding pad or the second bonding pad may be disposed at a distance of b from an adjacent side surface disposed in a major axis direction of the semiconductor device, and at a distance of a from an adjacent side surface disposed in a minor axis direction of the semiconductor device, and wherein the a may be equal to or greater than 40 micrometers, and the b is equal to or greater than 40 micrometers.

According to the embodiment, wherein light generated in the light emitting structure may be transmitted and emitted at an area of 30% or more of the upper surface of the semiconductor device on which the first bonding pad and the second bonding pad are disposed.

According to the embodiment, wherein the light generated in the light emitting structure may be transmitted and emitted through the upper surface, a lower surface, and four lateral directions of the semiconductor device.

According to the embodiment, wherein light generated in the light emitting structure may be transmitted and emitted in a first region, a second region, and a third region, the first region provided between the first bonding pad and the second bonding pad, the second region provided between side surfaces of the semiconductor device in a major axis direction and the first bonding pad or the second bonding pad which are adjacent to the side surfaces in the major axis direction, and the third region provided between side surfaces of the semiconductor device in a minor axis direction and the first bonding pad or the second bonding pad which are adjacent to the side surfaces in the minor axis.

A semiconductor device package according to an embodiment may comprise a package body comprising a first package electrode and a second package electrode; and a semiconductor device disposed on the package body, wherein the semiconductor device may comprise a light emitting structure comprising a first conductivity type semiconductor layer and a second conductivity type semiconductor layer; a first electrode disposed on the first conductivity type semiconductor layer and electrically connected to the first conductivity type semiconductor layer; a second electrode disposed on the second conductivity type semiconductor layer and electrically connected to the second conductivity type semiconductor layer; a first insulating reflective layer disposed on the first electrode and the second electrode, and comprising a first opening exposing an upper surface of the first electrode; a second insulating reflective layer disposed on the first electrode and the second electrode and spaced apart from the first insulating reflective layer, and comprising a second opening exposing an upper surface of the second electrode; a first bonding pad disposed on the first insulating reflective layer and electrically connected to the first electrode through the first opening; and a second bonding pad disposed on the second insulating reflective layer and spaced apart from the first bonding pad, and electrically connected to the second electrode through the second opening, wherein, when viewed from above the semiconductor device, a sum of an area of the first bonding pad and an area of the second bonding pad may be provided equal to or smaller than 70% of a total area of an upper surface of the semiconductor device on which the first bonding pad and the second bonding pad are disposed, and wherein the first bonding pad of the semiconductor device may be electrically connected to the first package electrode and the second bonding pad of the semiconductor device may be electrically connected to the second package electrode.

A semiconductor device according to an embodiment may comprise a light emitting structure comprising a first conductivity type semiconductor layer, a second conductivity type semiconductor layer, and an active layer disposed between the first conductivity type semiconductor layer and the second conductivity type semiconductor layer; a first electrode disposed on the first conductivity type semiconductor layer and electrically connected with the first conductivity type semiconductor layer; a second electrode disposed on the second conductivity type semiconductor layer and electrically connected with the second conductivity type semiconductor layer; a first bonding pad disposed on the first electrode and the second electrode, and electrically connected with the first electrode; a second bonding pad disposed on the first electrode and the second electrode, and spaced apart from the first bonding pad, and electrically connected with the second electrode; a first reflective layer disposed between the light emitting structure and the first bonding pad; a second reflective layer disposed between the light emitting structure and the second bonding pad; and a third reflective layer disposed between the first bonding pad and the second bonding pad, wherein, when viewed from above the semiconductor device, a sum of an area of the first bonding pad and an area of the second bonding pad may be equal to or smaller than 60% of a total area of an upper surface of the semiconductor device on which the first bonding pad and the second bonding pad are disposed, wherein an area of the third reflective layer may be provided not less than 10% and not more than 25% of the total area of the upper surface of the semiconductor device, wherein light generated in the light emitting structure may not be transmitted and emitted through a first region provided between the first bonding pad and the second bonding pad, and wherein light generated in the light emitting structure may be transmitted and emitted through a second region and a third region, the second region provided between side surfaces of the semiconductor device in a major axis direction and the first bonding pad or the second bonding pad which are adjacent to the side surfaces in the major axis direction, the third region provided between side surfaces of the semiconductor device in a minor axis direction and the first bonding pad or the second bonding pad which are adjacent to the side surfaces in the minor axis.

According to the embodiment, wherein, when viewed from above the semiconductor device, the sum of the area of the first bonding pad and the area of the second bonding pad may be provided equal to or greater than 30% of the total area of the semiconductor device.

According to the embodiment, wherein the first bonding pad or the second bonding pad may be provided along a major axis direction of the semiconductor device at a length of x, and may be provided along a minor axis direction of the semiconductor device at a length of y, and wherein a ratio of x and y may be provided in a range of 1:1.5 to 1:2.

According to the embodiment, wherein a distance between the first bonding pad and the second bonding pad may be provided equal to or greater than 125 micrometers and equal to or smaller than 300 micrometers.

According to the embodiment, wherein the first bonding pad or the second bonding pad may be disposed at a distance of b from an adjacent side surface disposed in a major axis direction of the semiconductor device, and at a distance of a from an adjacent side surface disposed in a minor axis direction of the semiconductor device, and wherein the a may be equal to or greater than 100 micrometers, and the b is equal to or greater than 40 micrometers.

According to the embodiment, wherein light generated in the light emitting structure may be transmitted and emitted at an area of 20% or more of the upper surface of the semiconductor device on which the first bonding pad, the second bonding pad, and the third reflective layer are disposed.

According to the embodiment, wherein the light generated in the light emitting structure may be transmitted and emitted through the upper surface, a lower surface, and four lateral directions of the semiconductor device.

According to the embodiment, wherein the first reflective layer may be an insulating reflective layer provided with a first opening in which the first conductivity type semiconductor layer and the first bonding pad are electrically connected, and the second reflective layer may be an insulating reflective layer provided with a second opening in which the second conductivity type semiconductor layer and the second bonding pad are electrically connected.

According to the embodiment, wherein the third reflective layer may be an insulating reflective layer connected with the first reflective layer and the second reflective layer.

A semiconductor device package according to an embodiment may comprise: a package body comprising a first package electrode and a second package electrode; and a semiconductor device disposed on the package body, wherein the semiconductor device may comprise a light emitting structure comprising a first conductivity type semiconductor layer, a second conductivity type semiconductor layer, and an active layer disposed between the first conductivity type semiconductor layer and the second conductivity type semiconductor layer; a first electrode disposed on the first conductivity type semiconductor layer and electrically connected with the first conductivity type semiconductor layer; a second electrode disposed on the second conductivity type semiconductor layer and electrically connected with the second conductivity type semiconductor layer; a first bonding pad disposed on the first electrode and the second electrode, and electrically connected with the first electrode; a second bonding pad disposed on the first electrode and the second electrode, and spaced apart from the first bonding pad, and electrically connected with the second electrode; a first reflective layer disposed between the light emitting structure and the first bonding pad; a second reflective layer disposed between the light emitting structure and the second bonding pad; and a third reflective layer disposed between the first bonding pad and the second bonding pad, wherein, when viewed from above the semiconductor device, a sum of an area of the first bonding pad and an area of the second bonding pad may be equal to or smaller than 60% of a total area of an upper surface of the semiconductor device on which the first bonding pad and the second bonding pad are disposed, wherein an area of the third reflective layer may be provided not less than 10% and not more than 25% of the total area of the upper surface of the semiconductor device, wherein light generated in the light emitting structure may not be transmitted and emitted through a first region provided between the first bonding pad and the second bonding pad, wherein light generated in the light emitting structure may be transmitted and emitted through a second region and a third region, the second region provided between side surfaces of the semiconductor device in a major axis direction and the first bonding pad or the second bonding pad which are adjacent to the side surfaces in the major axis direction, the third region provided between side surfaces of the semiconductor device in a minor axis direction and the first bonding pad or the second bonding pad which are adjacent to the side surfaces in the minor axis, and wherein the first bonding pad of the semiconductor device may be electrically connected to the first package electrode and the second bonding pad of the semiconductor device may be electrically connected to the second package electrode.

Advantageous Effects

According to the semiconductor device, the method of manufacturing the semiconductor device, and the semiconductor device package of the embodiments, there is an advantage that light extraction efficiency and electrical characteristics can be improved.

According to the semiconductor device, the method of manufacturing the semiconductor device, and the semiconductor device package of the embodiments, there is an advantage that bonding strength between the package electrode and the semiconductor device can be improved.

According to the semiconductor device, the method of manufacturing the semiconductor device, and the semiconductor device package of the embodiments, there is an advantage that it is possible to prevent the current concentration phenomenon from occurring and improve the reliability.

According to the semiconductor device, the method of manufacturing the semiconductor device, and the semiconductor device package of the embodiments, there is an advantage that insulating reflective layer the electrode, the insulating reflective layer and the bonding pad can be disposed to suit the flip chip bonding method, thereby easily performing the bonding process, and improving light extraction efficiency by increasing the transmittance and reflectance of the emitted light.

According to the semiconductor device, the method of manufacturing the semiconductor device, and the semiconductor device package of the embodiments, there is an advantage that the package body can be prevented from being degraded by light emitted from the semiconductor device.

DESCRIPTION OF DRAWINGS

FIG. 1 is a plan view showing a semiconductor device according to an embodiment of the present invention.

FIG. 2 is a sectional view taken along line A-A of the semiconductor device shown in FIG. 1.

FIG. 3 is a view showing an example of an arrangement of a first electrode and a second electrode applied to the semiconductor device according to the embodiment of the present invention.

FIG. 4 is a view showing an example of an arrangement of a first bonding pad and a second bonding pad applied to the semiconductor device according to the embodiment of the present invention.

FIGS. 5a and 5b are views explaining a step in which a semiconductor layer and a current spreading layer are formed by a method of manufacturing a semiconductor device according to an embodiment of the present invention.

FIGS. 6a and 6b are views explaining a step in which an ohmic contact layer is formed by the method of manufacturing the semiconductor device according to the embodiment of the present invention.

FIGS. 7a and 7b are views explaining a step in which a first electrode and a second electrode are formed by the method of manufacturing the semiconductor device according to the embodiment of the present invention.

FIGS. 8a and 8b are views explaining a step in which a passivation layer is formed by the method of manufacturing the semiconductor device according to the embodiment of the present invention.

FIGS. 9a and 9b are views explaining a step in which a first insulating reflective layer and a second insulating reflective layer are formed by the method of manufacturing the semiconductor device according to the embodiment of the present invention.

FIGS. 10a and 10b are views explaining a step of a first bonding pad and a second bonding pad are formed by the method of manufacturing the semiconductor device according to the embodiment of the present invention.

FIG. 11 is a plan view showing another example of a semiconductor device according to an embodiment of the present invention.

FIG. 12 is a sectional view taken along line B-B of the semiconductor device shown in FIG. 11.

FIG. 13 is a sectional view taken along line C-C of the semiconductor device shown in FIG. 11.

FIG. 14 is a view showing an example of an arrangement of a first electrode and a second electrode applied to another example of the semiconductor device according to the embodiment of the present invention.

FIGS. 15a, 15b, and 15c are views explaining a step in which a semiconductor layer and a current spreading layer are formed by a method of manufacturing a semiconductor device according to an embodiment of the present invention.

FIGS. 16a, 16b, and 16c are views explaining a step in which an ohmic contact layer is formed by the method of manufacturing the semiconductor device according to the embodiment of the present invention.

FIGS. 17a, 17b, and 17c are views explaining a step in which a passivation layer is formed by the method of manufacturing the semiconductor device according to the embodiment of the present invention.

FIGS. 18a, 18b, and 18c are views explaining a step in which a first electrode and a second electrode are formed by the method of manufacturing the semiconductor device according to the embodiment of the present invention.

FIGS. 19a, 19b, and 19c are views explaining a step in which a first insulating reflective layer and a second insulating reflective layer are formed by the method of manufacturing the semiconductor device according to the embodiment of the present invention.

FIGS. 20a, 20b and 20c are views explaining a step in which a first bonding pad and a second bonding pad are formed by the method of manufacturing the semiconductor device according to the embodiment of the present invention.

FIG. 21 is a view explaining a semiconductor device package according to an embodiment of the present invention.

FIGS. 22 and 23 are views explaining a change in luminous intensity depending on a thickness of a semiconductor device according to an embodiment of the present invention.

FIG. 24 is a plan view showing still another example of a semiconductor device according to an embodiment of the present invention.

FIG. 25 is sectional view taken along line A-A of the semiconductor device shown in FIG. 24.

FIG. 26 is a view showing an example of an arrangement of a first electrode and a second electrode applied to the semiconductor device according to the embodiment of the present invention.

FIG. 27 is a view showing an example of an arrangement of the first bonding pad and the second bonding pad applied to the semiconductor device according to the embodiment of the present invention.

FIGS. 28a and 28b are views explaining a step in which a semiconductor layer and a current spreading layer are formed by the method of manufacturing a semiconductor device according to an embodiment of the present invention.

FIGS. 29a and 29b are views explaining a step in which an ohmic contact layer is formed by the method of manufacturing the semiconductor device according to the embodiment of the present invention.

FIGS. 30a and 30b are views explaining a step in which a first electrode and a second electrode are formed by the method of manufacturing the semiconductor device according to the embodiment of the present invention.

FIGS. 31a and 31b are views explaining a step in which a passivation layer is formed by the method of manufacturing the semiconductor device according to the embodiment of the present invention.

FIGS. 32a and 32b are views explaining a step in which a reflective layer is formed by the method of manufacturing the semiconductor device according to the embodiment of the present invention.

FIGS. 33a and 33b are views explaining a step in which a first bonding pad and a second bonding pad are formed by the method of manufacturing the semiconductor device according to the embodiment of the present invention.

FIG. 34 is a plan view showing still another example of a semiconductor device according to an embodiment of the present invention.

FIG. 35 is a sectional view taken along line B-B of the semiconductor device shown in FIG. 34.

FIG. 36 is a view showing an example of an arrangement of a first electrode and a second electrode applied to another example of the semiconductor device according to the embodiment of the present invention.

FIGS. 37a and 37b are views explaining a step in which a semiconductor layer and a current spreading layer are formed by a method of manufacturing a semiconductor device according to an embodiment of the present invention.

FIGS. 38a and 38b are views explaining a step in which an ohmic contact layer is formed by the method of manufacturing the semiconductor device according to the embodiment of the present invention.

FIGS. 39a and 39b are views explaining a step in which a first passivation layer is formed by the method of manufacturing the semiconductor device according to the embodiment of the present invention.

FIGS. 40a and 40b are views explaining a step in which a first electrode and a second electrode are formed by the method of manufacturing the semiconductor device according to the embodiment of the present invention.

FIGS. 41a and 41b are views explaining a step in which a second passivation layer is formed by the method of manufacturing the semiconductor device according to the embodiment of the present invention.

FIGS. 42a and 42b are views explaining a step in which a reflective layer is formed by the method of manufacturing the semiconductor device according to the embodiment of the present invention.

FIGS. 43a and 43b are views explaining a step in which a first bonding pad and a second bonding pad are formed by the method of manufacturing the semiconductor device according to the embodiment of the present invention.

FIG. 44 is a plan view showing still another example of a semiconductor device according to an embodiment of the present invention.

FIG. 45 is a sectional view taken along line C-C of the semiconductor device shown in FIG. 44.

FIG. 46 is a view showing an example of an arrangement of a first electrode and a second electrode applied to another example of the semiconductor device according to the embodiment of the present invention.

FIGS. 47a and 47b are views explaining a step in which a semiconductor layer and a current spreading layer are formed by a method of manufacturing a semiconductor device according to an embodiment of the present invention.

FIGS. 48a and 48b are views explaining a step in which an ohmic contact layer is formed by the method of manufacturing the semiconductor device according to the embodiment of the present invention.

FIGS. 49a and 49b are views explaining a step in which a reflective layer is formed by the method of manufacturing the semiconductor device according to the embodiment of the present invention.

FIGS. 50a and 50b are views explaining a step in which a first electrode and a second electrode are formed by the method of manufacturing the semiconductor device according to the embodiment of the present invention.

FIGS. 51a and 51b are views explaining a step in which a passivation layer is formed by the method of manufacturing the semiconductor device according to the embodiment of the present invention.

FIGS. 52a and 52b are views explaining a step in which a first bonding pad and a second bonding pad are formed by the method of manufacturing the semiconductor device according to the embodiment of the present invention.

FIG. 53 is a plan view showing still another example of a semiconductor device according to an embodiment of the present invention.

FIG. 54 is a sectional view taken along line D-D of the semiconductor device shown in FIG. 53.

FIG. 55 is a view explaining a semiconductor device package according to an embodiment of the present invention.

FIG. 56 is a view explaining a problem that may occur in a conventional semiconductor device package.

FIG. 57 is a view showing a lighting apparatus according to an embodiment of the present invention.

MODE FOR INVENTION

Hereinafter, embodiments will be described with reference to the accompanying drawings. In the description of the embodiments, in the case that each layer (film), region, pattern or structure may be referred to as provided "on/over" or "under" a substrate, each layer (film), region, pad, or pattern, the terms "on/over" and "under" include both "directly" and "indirectly interposed with another layer". In addition, "on/over" or "under" of each layer will be described based on the drawings, but the embodiments are not limited thereto.

Hereinafter, a semiconductor device, a method of manufacturing a semiconductor device, and a semiconductor device package according to an embodiment of the present invention will be described in detail with reference to the accompanying drawings.

First, a semiconductor device according to an embodiment of the present invention will be described with reference to FIGS. 1 and 2. FIG. 1 is a plan view showing the semiconductor device according to the embodiment of the present invention, and FIG. 2 is a sectional view taken along line A-A of the semiconductor device shown in FIG. 1.

Meanwhile, in order to facilitate understanding, in FIG. 1, a first electrode 141 electrically connected to a first bonding pad 171 and a second electrode 142 electrically connected to a second bonding pad 172 are illustrated to be seen, even though which are disposed under the first bonding pad 171 and the second bonding pad 172.

The semiconductor device 100 according to the embodiment may comprise a light emitting structure 110 disposed on a substrate 105, as shown in FIGS. 1 and 2.

The substrate 105 may be selected from a group including a sapphire substrate ($Al_2O_3$), SiC, GaAs, GaN, ZnO, Si, GaP, InP, and Ge. For example, the substrate 105 may be provided as a patterned sapphire substrate (PSS) having a concavo-convex pattern formed on its upper surface.

The light emitting structure 110 may comprise a first conductivity type semiconductor layer 111, an active layer 112, and a second conductivity type semiconductor layer 113. The active layer 112 may be disposed between the first conductivity type semiconductor layer 111 and the second conductivity type semiconductor layer 113. For example, the active layer 112 may be disposed on the first conductivity type semiconductor layer 111, and the second conductivity type semiconductor layer 113 may be disposed on the active layer 112.

According to the embodiment, the first conductivity type semiconductor layer 111 may be provided as an n-type semiconductor layer, and the second conductivity type semiconductor layer 113 may be provided as a p-type semiconductor layer. Of course, according to another embodiment, the first conductivity type semiconductor layer 111 may be provided as a p-type semiconductor layer, and the second conductivity type semiconductor layer 113 may be provided as an n-type semiconductor layer.

Hereinafter, for convenience of description, a description will be given based on a case in which the first conductivity type semiconductor layer 111 is provided as an n-type semiconductor layer and the second conductivity type semiconductor layer 113 is provided as a p-type semiconductor layer.

In the above description, the case where the first conductivity type semiconductor layer 111 is disposed on and in contact with the substrate 105 has been described. However, a buffer layer may be further disposed between the first conductivity type semiconductor layer 111 and the substrate 105. For example, the buffer layer can reduce the difference in lattice constant between the substrate 105 and the light emitting structure 110, and improve the crystallinity.

The light emitting structure 110 may be provided of a compound semiconductor. For example, the light emitting structure 110 may be provided of a Group II-VI compound semiconductor or a Group III-V compound semiconductor. For example, the light emitting structure 110 may comprise at least two elements selected from aluminum (Al), gallium (Ga), indium (In), phosphorus (P), arsenic (As), and nitrogen (Ni).

The first conductivity type semiconductor layer 111 may be provided of, for example, a Group II-VI compound semiconductor or a Group III-V compound semiconductor. For example, the first conductivity type semiconductor layer 111 may be provided of a semiconductor material having a composition formula of $In_xAl_yGa_{1-x-y}N(0 \leq x \leq 1, 0 \leq y \leq 1, 0 \leq x+y \leq 1)$ or a semiconductor material having a composition formula of $(Al_xGa_{1-x})_yIn_{1-y}P(0 \leq x \leq 1, 0 \leq y \leq 1)$. For example, the first conductivity type semiconductor layer 111 may be selected from a group including GaN, AlN, AlGaN, InGaN, InN, InAlGaN, AlInN, AlGaAs, GaP, GaAs, GaAsP, AlGaInP, AlInP, GaInP, and the like, and an n-type dopant selected from a group including Si, Ge, Sn, Se, Te, and the like may be doped.

The active layer 112 may be provided of, for example, a Group II-VI compound semiconductor or a Group III-V compound semiconductor. For example, the active layer 112 may be provided of a semiconductor material having a composition formula of $In_xAl_yGa_{1-x-y}N(0 \leq x \leq 1, 0 \leq y \leq 1, 0 \leq x+y \leq 1)$ or a semiconductor material having a composition formula of $(Al_xGa_{1-x})_yIn_{1-y}P(0 \leq x \leq 1, 0 \leq y \leq 1)$. For example, the active layer 112 may be selected from a group including GaN, AlN, AlGaN, InGaN, InN, InAlGaN, AlInN, AlGaAs, GaP, GaAs, GaAsP, AlGaInP, AlInP, GaInP, and the like. For example, the active layer 112 may be provided with a multi-well structure, and may comprise a plurality of barrier layers and a plurality of well layers.

The second conductivity type semiconductor layer 113 may be provided of, for example, a Group II-VI compound semiconductor or a Group III-V compound semiconductor. For example, the second conductivity type semiconductor layer 113 may be provided of a semiconductor material having a composition formula of $In_xAl_yGa_{1-x-y}N(0 \leq x \leq 1, 0 \leq y \leq 1, 0 \leq x+y \leq 1)$ or a semiconductor material having a composition formula of $(Al_xGa_{1-x})_yIn_{1-y}P(0 \leq x \leq 1, 0 \leq y \leq 1)$. For example, the second conductivity type semiconductor layer 113 may be selected from a group including GaN, AlN, AlGaN, InGaN, InN, InAlGaN, AlInN, AlGaAs, GaP, GaAs, GaAsP, AlGaInP, AlInP, GaInP, and the like, and a p-type dopant selected from a group including Mg, Zn, Ca, Sr, Ba, and the like may be doped.

The semiconductor device 100 according to the embodiment may comprise a current spreading layer 120 and an ohmic contact layer 130 as shown in FIG. 2. The current spreading layer 120 and the ohmic contact layer 130 can improve current diffusion to increase light output. An arrangement and shape of the current spreading layer 120 and the ohmic contact layer 130 will be further described later while explaining a method of manufacturing a semiconductor device according to an embodiment.

For example, the current spreading layer 120 may be provided with an oxide, a nitride, or the like. A horizontal width of the current spreading layer 120 may be provided greater than a horizontal width of the second electrode 142 that is disposed on the current spreading layer. Accordingly, the current spreading layer 120 can improve luminous flux by preventing current concentration under the second electrode 142 and improving electrical reliability.

In addition, the ohmic contact layer 130 may comprise at least one selected from a group including a metal, a metal oxide, and a metal nitride. The ohmic contact layer 130 may comprise a light transmitting material. For example, the ohmic contact layer 130 may comprise at least one selected from a group including indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, Ni/IrOx/Au/ITO, Pt, Ni, Au, Rh, and Pd.

The semiconductor device 100 according to the embodiment may comprise a first electrode 141 and a second electrode 142, as shown in FIGS. 1 to 3.

The first electrode 141 may be electrically connected to the first conductivity type semiconductor layer 111. The first electrode 141 may be disposed on the first conductivity type semiconductor layer 111. For example, according to the semiconductor device 100 of the embodiment, the first electrode 141 may be disposed on an upper surface of the first conductivity type semiconductor layer 111 in a recess that penetrates through the second conductivity type semiconductor layer 113 and the active layer 112 to a partial region of the first conductivity type semiconductor layer 111.

The second electrode 142 may be electrically connected to the second conductivity type semiconductor layer 113. The second electrode 142 may be disposed on the second conductivity type semiconductor layer 113. According to the embodiment, the current spreading layer 120 may be disposed between the second electrode 142 and the second conductivity type semiconductor layer 113.

The first electrode 141 and the second electrode 142 may be formed of a single-layer structure or a multi-layer structure. For example, the first electrode 141 and the second electrode 142 may be ohmic electrodes. For example, the first electrode 141 and the second electrode 142 may be at least one of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf or an alloy of two or more of above.

The semiconductor device 100 according to the embodiment may comprise a passivation layer 150, as shown in FIGS. 1 and 2.

The passivation layer 150 may be disposed on the second electrode 142. The passivation layer 150 may comprise a first opening h1 that exposes a portion of an upper surface of the second electrode 142.

In addition, the passivation layer 150 may be disposed on the first electrode 141. The passivation layer 150 may comprise a second opening h2 that exposes a portion of an upper surface the first electrode 141.

For example, the passivation layer 150 may be provided of an insulating material. For example, the passivation layer 150 may be formed of at least one material selected from a group including $SiO_2$, $SiO_x$, $SiO_xN_y$, $Si_3N_4$, and $Al_2O_3$.

In addition, according to the semiconductor device 100 of the embodiment may comprise a first insulating reflective layer 161 and a second insulating reflective layer 162 as shown in FIGS. 1 and 2. The first insulating reflective layer 161 and the second insulating reflective layer 162 may be disposed on the passivation layer 150.

The first insulating reflective layer 161 may be disposed on the first electrode 141 and the second electrode 142. The first insulating reflective layer 161 may comprise a fourth opening h4 that exposes a portion of an upper surface of the first electrode 141. The first insulating reflective layer 161 may comprise a fourth opening h4 provided corresponding to a region where the second opening h2 of the passivation layer 150 is formed.

For example, a maximum width of the fourth opening h4 may be disposed greater than a maximum width of the second opening h2. When the fourth opening h4 included in the first insulating reflective layer 161 is disposed to be narrower than the width of the second opening 112 disposed on the passivation layer 150, the first insulating reflective layer 161 may be disposed along the step of the second opening h2 disposed on the passivation layer 150. If the first insulating reflective layer 161 is disposed along the step of the second opening h2, cracks may be generated in the first insulating reflective layer 161, and reliability of the semiconductor device may be lowered.

A maximum width of the recess may be greater than the width of the second opening h2 and the fourth opening h4. When the maximum width of the recess is larger than the second opening h2 and the fourth opening h4, it is possible to ensure sufficient area for the first electrode to be electrically connected to the first conductive semiconductor layer to improve electrical characteristics, and a process margin for arranging the second opening and the fourth opening to vertically overlap with the recess can be secured.

The second insulating reflective layer 162 may be disposed on the first electrode 141 and the second electrode 142. The second insulating reflective layer 162 may be disposed spaced apart from the first insulating reflective layer 161. The second insulating reflective layer 162 may comprise a third opening h3 exposing an upper surface of the second electrode 142. The second insulating reflective layer 162 may comprise the third opening h3 provided corresponding to a region where the first opening h1 of the passivation layer 150 is formed.

For example, a maximum width of the third opening h3 may be disposed greater than a maximum width of the first opening h1. When the third opening h3 included in the second insulating reflective layer 162 is disposed to be narrower than the width of the first opening h1 disposed on the passivation layer 150, the second insulating reflective layer 162 may be disposed along the step of the first opening h1 disposed on the passivation layer 150. If the second insulating reflective layer 162 is disposed along the step of the first opening h1, cracks may be generated in the second insulating reflective layer 162, a reliability of the semiconductor device may be lowered.

For example, the first insulating reflective layer 161 and the second insulating reflective layer 162 may be provided as a Distributed Bragg Reflector (DBR) layer or an Omni Directional Reflector (ODR) layer.

According to the embodiment, the first insulating reflective layer 161 may be disposed on a side surface and a portion of the upper surface of the first electrode 141. In addition, a portion of the upper surface of the first electrode 141 may be disposed and exposed in the fourth opening h4. The second insulating reflective layer 162 may be disposed on a side surface and a portion of the upper surface of the second electrode 142. In addition, a portion of the upper surface of the second electrode 142 may be disposed and exposed in the third opening h3.

Accordingly, the first insulating reflective layer 161 and the second insulating reflective layer 162 may reflect light emitted from the active layer 112 of the light emitting structure 110, thereby minimizing light absorption from the first bonding pad 161 and the second bonding pad 162, thereby improving luminous intensity Po.

For example, the first insulating reflective layer 161 and the second insulating reflective layer 162 may be made of an insulating material, and may be formed of a material having a high reflectance such as a DBR structure.

The first insulating reflective layer 161 and the second insulating reflective layer 162 may have a DBR structure in which materials having different refractive indexes are repeatedly arranged. For example, the first insulating reflective layer 161 and the second insulating reflective layer 162 may be provided of a material including at least one of $TiO_2$, $SiO_2$, $Ta_2O_5$, and $HfO_2$.

In addition, according to another embodiment, it is not limited thereto, the first insulating reflective layer 161 and the second insulating reflective layer 162 may be freely designed in various configurations in order to increase the reflectivity of the wavelength emitted from the active layer 112.

The semiconductor device 100 according to the embodiment may comprise a first bonding pad 171 disposed on the first insulating reflective layer 161, as shown in FIGS. 1 and 2. In addition, the semiconductor device 100 according to the embodiment may comprise a second bonding pad 172 disposed on the second insulating reflective layer 162. The second bonding pad 172 may be disposed spaced apart from the first bonding pad 171.

The first bonding pad 171 may contact a portion of the upper portion of the first electrode 141 through the fourth opening h4 and the second opening h2. The second bonding pad 172 may contact a portion of the upper portion of the second electrode 142 through the third opening h3 and the first opening h1.

The semiconductor device according to the embodiment may be connected to an external power in a flip chip bonding manner. For example, in manufacturing a semiconductor device package, the upper surface of the first electrode pad 171 and the upper surface of the second electrode pad 172 may be disposed to be attached to a submount, a lead frame, or a circuit board.

For example, the first bonding pad 171 and the second bonding pad 172 may be formed of Au, AuTi, or the like, so that the packaging process can be stably operated. Also, the first bonding pad 171 and the second bonding pad 172 may be formed in a single layer or multiple layers using at least one material or alloys of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/Au/ITO, and the like.

When the semiconductor device according to the embodiment is mounted by a flip-chip bonding method and is implemented as a semiconductor device package, the light provided by the light emitting structure 110 may be emitted through the substrate 105. The light emitted from the light emitting structure 110 may be reflected by the first insulating reflective layer 161 and the second insulating reflective layer 162, and may be emitted toward the substrate 105. Also, the light emitted from the light emitting structure 110 may be emitted in the lateral direction of the light emitting structure 100. Also, the light emitted from the light emitting structure 110 may be transmitted to the outside through a region where the first bonding pad 171 and the second bonding pad 172 are not provided among the surface on which the first bonding pad 171 and the second bonding pad 172 are disposed. Accordingly, the semiconductor device 100 of the embodiment can emit light in six directions surrounding the light emitting structure 100, and the light intensity can be remarkably improved.

In addition, according to the semiconductor device and the semiconductor device package of the embodiment, since the first electrode pad 171 and the second electrode pad 172 having a large area can be directly bonded to the circuit board providing power, the flip chip bonding process can be performed easily and stably.

Meanwhile, in describing the semiconductor device according to the embodiment, the case where the ohmic contact layer 130 is provided on the second conductivity type semiconductor layer 113 has been described. However, according to another embodiment, the ohmic contact layer 130 may be omitted and the second electrode 142 may be disposed in direct contact with the second conductivity type semiconductor layer 113.

Then, referring to FIG. 4, the arrangement relationship of the first bonding pad 171 and the second bonding pad 172 applied to the semiconductor device 100 according to the embodiment will be described in further detail. FIG. 4 is a view showing an example of the arrangement of the first bonding pad 171 and the second bonding pad 172 applied to the semiconductor device according to the embodiment of the present invention.

According to the semiconductor device 100 of the embodiment, when viewed from above the semiconductor device 100, a sum of the areas of the first bonding pad 171 and the second bonding pad 172 may be provided equal to or smaller than 70% of a total area of an upper surface of the semiconductor device on which the first bonding pad 171 and the second bonding pad 172 are disposed.

For example, the total area of the upper surface of the semiconductor device 100 may correspond to an area defined by a lateral length and a longitudinal length of the lower surface of the first conductivity type semiconductor layer 111 of the light emitting structure 100. Also, the total area of the upper surface of the semiconductor device 100 may correspond to the area of the upper surface or the lower surface of the substrate 105.

By providing the sum of the areas of the first bonding pad 171 and the second bonding pad 172 equal to or smaller than 70% of the total area of the semiconductor device 100, the amount of light emitted to the surface on which the first bonding pad 171 and the second bonding pad 172 are disposed can be increased. Thus, according to the embodiment, since the amount of light emitted through the six surface direction of the semiconductor device 100 is increased, the light extraction efficiency can be improved and the light intensity Po can be increased.

In addition, when viewed from above the semiconductor device, the sum of the area of the first bonding pad 171 and the area of the second bonding pad 172 may be provided equal to or greater than 30% of the total area of the semiconductor device 100.

By providing the sum of the areas of the first bonding pad 171 and the second bonding pad 172 equal to or greater than 30% of the total area of the semiconductor device 100, stable mounting can be performed through the first bonding pad 171 and the second bonding pad 172 to ensure that the electrical characteristics of the semiconductor device 100 are not degraded.

In the semiconductor device 100 according to the embodiment, the sum of the areas of the first bonding pad 171 and the second bonding pad 172 can be selected to be equal to or greater than 30% and equal to or smaller than 70% of the total area of the semiconductor device 100 in consideration of light extraction efficiency, securing stability of bonding, and securing electrical characteristics.

That is, when the sum of the areas of the first bonding pad 171 and the second bonding pad 172 is 30% or more to 100% or less of the total area of the semiconductor device 100, the electrical characteristics can be ensured and the bonding force to be mounted on the semiconductor device package can be secured so that stable mounting can be performed.

In addition, when the sum of the areas of the first bonding pad 171 and the second bonding pad 172 is more than 0% to 70% or less of the total area of the semiconductor device 100, the light extraction efficiency of the semiconductor device 100 can be improved and the light intensity Po can be increased by increasing the amount of light emitted to the surface on which the first bonding pad 171 and the second bonding pad 172 are disposed.

In order to secure the electrical characteristics of the semiconductor device 100 and the bonding force to be mounted on the semiconductor device package, and increase the light intensity, the sum of the areas of the first bonding pad 171 and the second bonding pad 172 is selected to be 30% or more to 70% or less of the total area of the semiconductor device 100.

In addition, according to another embodiment, it may not be limited thereto, in order to secure the electrical characteristics and bonding force of the semiconductor device 100, the sum of the areas of the first bonding pad 171 and the second bonding pad 172 may be selected to be more than 70% to 100% or less, and in order to increase the light intensity, the sum of the areas of the first bonding pad 171 and the second bonding pad 172 may be selected to be more than 0% and less than 30%.

According to the embodiment, the first bonding pad 171 may be provided along a major axis direction of the semiconductor device 100 at a length of x1, and may be provided along a minor axis direction of the semiconductor device 100 at a length of y1. At this time, a ratio of x1 and y1 may be provided in a range of 1:1.5 to 1:2, for example.

In addition, the second bonding pad 172 may be provided along the major axis direction of the semiconductor device 100 at a length of x2, and may be provided along the minor axis direction of the semiconductor device 100 at a length of y2. At this time, a ratio of x2 and y2 may be provided in a range of 1:1.5 to 1:2, for example.

For example, a minimum distance d between the first bonding pad 171 and the second bonding pad 172 may be provided equal to or greater than 125 micrometers. The minimum distance d between the first bonding pad 171 and the second bonding pad 172 may be selected by considering a distance between the second electrode pad and the first electrode pad of the package body on which the semiconductor device 100 configured to be mounted.

For example, the minimum distance between the second electrode pad and the first electrode pad of the package body may be provided at a minimum of 125 micrometers and may be provided at a maximum of 200 micrometers. In this case, considering the process error, the distance d between the first bonding pad 171 and the second bonding pad 172 may be provided 125 micrometers or more and 300 micrometers or less.

In addition, the distance d between the first bonding pad 171 and the second bonding pad 172 should be disposed greater than 125 micrometers so that a minimum space may be secured such that a short circuit does not occur between the first bonding pad 171 and the second bonding pad 172 of the semiconductor device, and a light emitting area for improving light extraction efficiency may be secured, thereby increasing the light intensity Po of the semiconductor device 100.

In addition, the distance d between the first bonding pad 171 and the second bonding pad 172 should be provided equal to or less than 300 micrometers so that the first electrode pad and the second electrode pad of the semiconductor device package, and the first bonding pad 171 and the second bonding pad 172 of the semiconductor device may be bonded with sufficient bonding force, and electrical characteristics of the semiconductor device 100 may be secured.

The minimum distance d between the first bonding pad 171 and the second bonding pad 172 may be disposed greater than 125 micrometers in order to secure the optical characteristics, and may be disposed smaller than 300 micrometers in order to secure the reliability by the electrical characteristic and the bonding force.

The embodiment provides the minimum distance d of not less than 125 micrometers and not more than 300 micrometers, but is not limited thereto, and in order to improve electrical characteristics or reliability of the semiconductor device package, it may be arranged to be smaller than 125 micrometers, and in order to improve optical characteristics, it may be arranged greater than 300 micrometers.

According to the embodiment, the first bonding pad 171 may be disposed spaced apart by a length of b1 from the adjacent side surface disposed in the major axis direction of the semiconductor device 100, and the first bonding pad 171 may be disposed spaced apart by a length of a1 or a3 from the adjacent side surface disposed in the minor axis direction of the semiconductor device 100. Herein, the a1 or a3 may be equal to or greater than 40 micrometers, for example, and the b1 may be provided equal to or greater than 40 micrometers.

In addition, the second bonding pad 172 may be disposed spaced apart by a length of b2 from the adjacent side surface disposed in the major axis direction of the semiconductor device 100, and the second bonding pad 172 may be disposed spaced apart by a length of a2 or a4 from the adjacent side surface disposed in the minor axis direction of the semiconductor device 100. Herein, the a2 or a4 may be equal to or greater than 40 micrometers, for example, and the b2 may be provided equal to or greater than 40 micrometers.

According to the embodiment, the a1, a2, a3, and a4 may be provided with the same value. In addition, the b1 and b2 may be provided with the same value. Also, according to another embodiment, at least two of the a1, a2, a3, and a4 may have different values, and the b1 and b2 may have different values.

According to the semiconductor device 100 of the embodiment, light generated in the light emitting structure 110 may be transmitted and emitted through a first region provided between the first bonding pad 171 and the second bonding pad 172. At this time, the first region may be a region corresponding to the minimum distance d between the first bonding pad 171 and the second bonding pad 172.

In addition, light generated in the light emitting structure 110 may be transmitted and emitted through a second region provided between side surfaces of the semiconductor device 100 in the major axis direction and the first bonding pad 171 or the second bonding pad 172 which are adjacent to the side surfaces in the major axis direction. At this time, the second region may be a region corresponding to the b1 and b2.

In addition, light generated in the light emitting structure may be transmitted and emitted through a third region provided between side surfaces of the semiconductor device 100 in the minor axis direction and the first bonding pad 171 or the second bonding pad 172 which are adjacent to the side surfaces in the minor axis. At this time, the third region may be a region corresponding to the a1, a2, a3, and a4.

For example, in the case where a length of the semiconductor device 100 according to the embodiment in the major axis direction is 1250 micrometers, and a length of the semiconductor device 100 according to the embodiment in the minor axis direction is 750 micrometers, the above mentioned variables may have the following values.

When the area of the first bonding pad 171 is equal to the area of the second bonding pad 172, and if the sum thereof is 30%, x1:y1=1:2 and the value of d is provided of 125 micrometers, the value of x1 may be provided of 265 micrometers, and the value of y1 may be provided of 530 micrometers. Thus, the value of a1 may be less than or equal to 110 micrometers, for example, and the value of b1 may be provided as less than or equal to 300 micrometers as an example.

That is, the sum of the area of the first bonding pad 171 and the area of the second bonding pad 172 is determined according to the size of the semiconductor device 100, and if the width/length ratio of the first bonding pad 171 and the value of d are determined, the remaining variables can be calculated. Accordingly, the upper limit values of a1, a2, a3, a4, b1, b2, and the like are not indicated.

According to the embodiment, the size of the first insulating reflective layer 161 may be provided several micrometers larger than the size of the first bonding pad 171. For example, the area of the first insulating reflective layer 161 may be provided sufficiently large to cover the area of the first bonding pad 171. The length of one side of the first insulating reflective layer 161 may be provided greater than the length of one side of the first bonding pad 171 by about 4 micrometers to about 10 micrometers, for example, in considering of the process error.

In addition, the size of the second insulating reflective layer 162 may be provided several micrometers larger than the size of the second bonding pad 172. For example, the area of the second insulating reflective layer 162 may be provided sufficiently large to cover the area of the second bonding pad 172. The length of one side of the second insulating reflective layer 162 may be provided greater than the length of one side of the second bonding pad 172 by about 4 micrometers to about 10 micrometers, for example, in considering of the process error.

According to the embodiment, light emitted from the light emitting structure 110 may be reflected without being incident on the first bonding pad 171 and the second bonding pad 162 by the first insulating reflective layer 161 and the second insulating reflective layer 162. Accordingly, the area of the first insulating reflective layer 161 and the second insulating reflective layer 162 are disposed equal to or larger than the areas of the first bonding pad 171 and the second bonding pad 172, so that light loss of the light that is generated and emitted from the light emitting structure 110, by being incident on the first bonding pad 171 and the second bonding pad 172, can be minimized.

Hereinafter, a method of manufacturing a semiconductor device according to an embodiment will be described with reference to the accompanying drawings. In describing the method of manufacturing the semiconductor device according to the embodiment, description overlapping with those described with reference to FIGS. 1 to 4 may be omitted.

First, according to the method of manufacturing the semiconductor device of the embodiment, as shown in FIGS. 5a and 5b, a light emitting structure 110 and a current spreading layer 120 may be formed on a substrate 105. FIG. 5a is a plan view showing a shape of the light emitting structure 110 and the current spreading layer 120 formed according to the method of manufacturing the semiconductor device of the embodiment, and FIG. 5b is a process sectional view taken along line A-A of the semiconductor device shown in FIG. 5a.

According to the embodiment, the light emitting structure 110 may be formed on the substrate 105. For example, the first conductivity type semiconductor layer 111, the active layer 112, and the second conductivity type semiconductor layer 113 may be formed on the substrate 105.

Then, the current spreading layer 120 may be formed on a portion of the second conductivity type semiconductor layer 113. For example, the current spreading layer 120 may be formed in a shape of a plurality of lines.

Next, as shown in FIGS. 6a and 6b, an ohmic contact layer 130 may be formed. FIG. 6a is a plan view showing a shape of the ohmic contact layer 130 formed according to the method of manufacturing the semiconductor device of the embodiment, and FIG. 6b is a process sectional view taken along line A-A of the semiconductor device shown in FIG. 6a.

According to the embodiment, the ohmic contact layer 130 may be formed on the second conductivity type semiconductor layer 113. The ohmic contact layer 130 may be formed on the current spreading layer 120 as well. Meanwhile, according to the embodiment, a portion of the first conductivity type semiconductor layer 111 may be formed to be exposed through a mesa etching process. The ohmic contact layer 130 may comprise a mesa opening M exposing the first conductivity type semiconductor layer 111 by a mesa etching. For example, the mesa opening M may be provided in a shape of a plurality of lines. The mesa opening M may also be referred to as a recess.

Then, as shown in FIGS. 7a and 7b, a first electrode 141 and a second electrode 142 may be formed. FIG. 7a is a plan view showing a shape of the first electrode 141 and the second electrode 142 formed according to the method of manufacturing the semiconductor device of the embodiment, FIG. 7b is a process sectional view taken along line A-A of the semiconductor device shown in FIG. 7a.

According to the embodiment, the first electrode 141 may be formed on the first conductivity type semiconductor layer 111 exposed by the recess M. The first electrode 141 may be formed in a shape of line, for example. In addition, the first electrode 141 may comprise an N region having a relatively larger area than other regions having a shape of line. The N region of the first electrode 141 may be electrically connected with a first bonding pad 171 to be formed later.

Also, the second electrode 142 may be formed on the current spreading layer 120. The second electrode 142 may be formed, for example, in a shape of line. In addition, the second electrode 142 may comprise a P region having a relatively larger area than other regions having a shape of line. The P region of the second electrode 142 may be electrically connected with a second bonding pad 172 to be formed later.

Next, as shown in FIGS. 8a and 8b, a passivation layer 150 may be formed. FIG. 8a is a plan view showing a shape of the passivation layer 150 formed according to the method of manufacturing the semiconductor device of the embodiment, and FIG. 8b is a process sectional view taken along line A-A of the semiconductor device shown in FIG. 8a.

According to the embodiment, the passivation layer 150 may be formed on the first electrode 141 and the second electrode 142. The passivation layer 150 may comprise a plurality of openings. For example, the passivation layer 150 may comprise a plurality of first openings h1. A portion of the P region of the second electrode 142 may be exposed through the plurality of first openings h1. In addition, the passivation layer 150 may comprise a plurality of second openings h2. A portion of the N region of the first electrode 141 may be exposed through the plurality of second openings h2.

As shown in FIGS. 9a and 9b, a first insulating reflective layer 161 and a second insulating reflective layer 162 may be formed. 9A is a plan view showing a shape of the first insulating reflective layer 161 and the second insulating reflective layer 162 formed according to the method of manufacturing the semiconductor device of the embodiment. FIG. 9b is a process sectional view taken along line A-A of the semiconductor device shown in FIG. 9a.

According to the embodiment, the first insulating reflective layer 161 and the second insulating reflective layer 162 may be formed on the passivation layer 150.

The first insulating reflective layer 161 may comprise a plurality of fourth openings h4. For example, the plurality of fourth openings h4 may be provided corresponding to positions where the plurality of second openings h2 are formed. A portion of the N region of the first electrode 141 may be exposed through the plurality of fourth openings h4 and the plurality of second openings h2.

In addition, the second insulating reflective layer 162 may comprise a plurality of third openings h3. For example, the plurality of third openings h3 may be provided corresponding to positions where the plurality of first openings h1 are formed. A portion of the P region of the second electrode 142 may be exposed through the plurality of third openings h3 and the plurality of first openings h1.

Then, as shown in FIGS. 10a and 10b, a first bonding pad 171 and a second bonding pad 172 may be formed. FIG. 10a is a plan view showing a shape of the first bonding pad 171 and the second bonding pad 172 formed according to the method of manufacturing the semiconductor device of the embodiment, and FIG. 10b is a process sectional view taken along line A-A of the semiconductor device shown in FIG. 10a.

According to the embodiment, the first electrode pad 171 and the second electrode pad 172 may be formed in the shape shown in FIG. 10a. The first electrode pad 171 may be disposed on the first insulating reflective layer 161. The second electrode pad 172 may be disposed on the second insulating reflective layer 162.

A lower surface of the first electrode pad 171 may be in contact with an upper surface of the first electrode 141. A portion of the first electrode pad 171 may be disposed in the fourth opening h4 and the second opening h2 to contact a portion of the N region of the first electrode 141.

A lower surface of the second electrode pad 172 may be in contact with an upper surface of the second electrode 142. A portion of the second electrode pad 172 may be disposed in the third opening h3 and the first opening h1 to contact a portion of the P region of the second electrode 142.

According to the embodiment, when the power is applied to the first electrode pad 171 and the second electrode pad 172, the light emitting structure 110 can emit light.

The semiconductor device according to the embodiment may be connected to an external power in a flip chip bonding manner. For example, an upper surface of the first electrode pad 171 and an upper surface of the second electrode pad 172 may be arranged to be attached to a submount, a lead frame, a circuit board, or the like.

When the semiconductor device according to the embodiment is mounted by a flip-chip bonding method and is implemented as a semiconductor device package, the light provided by the light emitting structure 110 may be emitted through the substrate 105. The light emitted from the light emitting structure 110 may be reflected by the first insulating reflective layer 161 and the second insulating reflective layer 162, and may be emitted toward the substrate 105. Also, the light emitted from the light emitting structure 110 may be emitted in the lateral direction of the light emitting structure 100. Also, the light emitted from the light emitting structure 110 may be transmitted to the outside through a region where the first bonding pad 171 and the second bonding pad 172 are not provided among the surface on which the first bonding pad 171 and the second bonding pad 172 are disposed. Accordingly, the semiconductor device 100 of the embodiment can emit light in six directions surrounding the light emitting structure 100, and the light intensity can be remarkably improved.

According to the semiconductor device 100 of the embodiment, when viewed from above the semiconductor device 100, a sum of the areas of the first bonding pad 171 and the second bonding pad 172 may be provided equal to or smaller than 70% of a total area of an upper surface of the semiconductor device on which the first bonding pad 171 and the second bonding pad 172 are disposed.

For example, the total area of the upper surface of the semiconductor device 100 may correspond to an area defined by a lateral length and a longitudinal length of the lower surface of the first conductivity type semiconductor layer 111 of the light emitting structure 100. Also, the total area of the upper surface of the semiconductor device 100 may correspond to the area of the upper surface or the lower surface of the substrate 105.

By providing the sum of the areas of the first bonding pad 171 and the second bonding pad 172 equal to or smaller than 70% of the total area of the semiconductor device 100 the amount of light emitted to the surface on which the firsts bonding pad 171 and the second bonding pad 172 are disposed can be increased. Thus, according to the embodiment, since the amount of light emitted through the six surface direction of the semiconductor device 100 is increased, the light extraction efficiency can be improved and the light intensity Po can be increased.

In addition, when viewed from above the semiconductor device, the sum of the area of the first bonding pad 171 and the area of the second bonding pad 172 may be provided equal to or greater than 30% of the total area of the semiconductor device 100.

By thus providing the sum of the areas of the first bonding pad 171 and the second bonding pad 172 equal to or greater than 30% of the total area of the semiconductor device 100, stable mounting can be performed through the first bonding pad 171 and the second bonding pad 172.

In the semiconductor device 100 according to the embodiment, the sum of the areas of the first bonding pad 171 and the second bonding pad 172 can be selected to be equal to or greater than 30% and equal to or smaller than 70% of the total area of the semiconductor device 100 in consideration of light extraction efficiency and securing stability of bonding That is, when the sum of the areas of the first bonding pad 171 and the second bonding pad 172 is 30% or more to 100% or less of the total area of the semiconductor device 100, the electrical characteristics can be ensured and the bonding force to be mounted on the semiconductor device package can be secured so that stable mounting can be performed.

In addition, when the sum of the areas of the first bonding pad 171 and the second bonding pad 172 is more than 0% to 70% or less of the total area of the semiconductor device 100, the light extraction efficiency of the semiconductor device 100 can be improved and the light intensity Po can be increased by increasing the amount of light emitted to the surface on which the first bonding pad 171 and the second bonding pad 172 are disposed.

In order to secure the electrical characteristics of the semiconductor device 100 and the bonding force to be mounted on the semiconductor device package, and increase the light intensity, the sum of the areas of the first bonding pad 171 and the second bonding pad 172 is selected to be 30% or more to 70% or less of the total area of the semiconductor device 100.

In addition, according to another embodiment, it is not limited above, in order to secure the electrical characteristics and bonding force of the semiconductor device 100, the sum of the areas of the first bonding pad 171 and the second bonding pad 172 may be selected to be more than 70% to 100% or less, and in order to increase the light intensity, the sum of the areas of the first bonding pad 171 and the second bonding pad 172 may be selected to be more than 0% and less than 30%.

According to the semiconductor device 100 of the embodiment, light generated in the light emitting structure 110 may be transmitted and emitted through a first region provided between the first bonding pad 171 and the second bonding pad 172.

In addition, light generated in the light emitting structure 110 may be transmitted and emitted through a second region provided between side surfaces of the semiconductor device 100 in the major axis direction and the first bonding pad 171 or the second bonding pad 172 which are adjacent to the side surfaces in the major axis direction.

In addition, light generated in the light emitting structure may be transmitted and emitted through a third region provided between side surfaces of the semiconductor device 100 in the minor axis direction and the first bonding pad 171 or the second bonding pad 172 which are adjacent to the side surfaces in the minor axis.

The semiconductor device and the method of manufacturing the semiconductor device of the embodiment can provide a flip chip bonding type semiconductor device and the method of manufacturing the semiconductor device that can be applied to products requiring high voltage and high output.

Then, another example of a semiconductor device according to an embodiment of the present invention will be described with reference to FIGS. 11 to 14. In describing the semiconductor device according to the embodiment with reference to FIGS. 11 to 14, description overlapping with those described above may be omitted.

FIG. 11 is a plan view showing another example of the semiconductor device according to the embodiment of the present invention, FIG. 12 is a sectional view taken along line B-B of the semiconductor device shown in FIG. 11. FIG. 13 is a sectional view taken along line C-C of the semiconductor device shown in FIG. 11, and FIG. 14 is a view showing an example of the arrangement of a first electrode and a second electrode applied to another example of the semiconductor device according to the embodiment of the present invention.

Meanwhile, in order to facilitate understanding, in FIG. 11, a first electrode 141 electrically connected to the first bonding pad 171 and a second electrode 142 electrically connected to the second bonding pad 172 are illustrated to be seen, even though which are disposed under the first bonding pad 171 and the second bonding pad 172.

The semiconductor device 100 according to the embodiment may comprise a light emitting structure 110 disposed on a substrate 105, as shown in FIGS. 11 to 13.

The light emitting structure 110 may comprise a first conductivity type semiconductor layer 111, an active layer 112, and a second conductivity type semiconductor layer 113. The active layer 112 may be disposed between the first conductivity type semiconductor layer 111 and the second conductivity type semiconductor layer 113. For example, the active layer 112 may be disposed on the first conductivity type semiconductor layer 111, and the second conductivity type semiconductor layer 113 may be disposed on the active layer 112.

According to the embodiment, the first conductivity type semiconductor layer 111 may be provided as an n-type semiconductor layer, and the second conductivity type semiconductor layer 113 may be provided as a p-type semiconductor layer. Of course, according to another embodiment, the first conductivity type semiconductor layer 111 may be provided as a p-type semiconductor layer, and the second conductivity type semiconductor layer 113 may be provided as an n-type semiconductor layer.

Hereinafter, for convenience of description, a description will be given based on a case in which the first conductivity type semiconductor layer 111 is provided as an n-type semiconductor layer and the second conductivity type semiconductor layer 113 is provided as a p-type semiconductor layer.

The semiconductor device 100 according to the embodiment may comprise a current spreading layer 120 and an ohmic contact layer 130, as shown in FIGS. 12 and 13. The current spreading layer 120 and the ohmic contact layer 130 can improve current diffusion to increase light output. An arrangement and shape of the current spreading layer 120 and the ohmic contact layer 130 will be further described with reference to a method of manufacturing a semiconductor device according to an embodiment.

For example, the current spreading layer 120 may be provided as an oxide or a nitride. The current spreading layer 120 can improve luminous flux by preventing current concentration under the second electrode 142 and improving electrical reliability.

In addition, the ohmic contact layer 130 may comprise at least one selected from a group including a metal, a metal oxide, and a metal nitride. The ohmic contact layer 130 may comprise a light transmitting material.

The semiconductor device 100 according to the embodiment may comprise a passivation layer 150, as shown in FIGS. 11 to 13.

The passivation layer 150 may comprise a plurality of first openings h1 exposing the ohmic contact layer 130. The current spreading layer 120 may be disposed under a region provided with the plurality of first openings h1.

In addition, the passivation layer 150 may comprise a plurality of second openings h2 exposing the first conductivity type semiconductor layer 111.

The semiconductor device 100 according to the embodiment may comprise a first electrode 141 and a second electrode 142, as shown in FIGS. 11 to 14.

The first electrode 141 may be electrically connected to the first conductivity type semiconductor layer 111. The first electrode 141 may be disposed on the first conductivity type semiconductor layer 111. For example, according to the semiconductor device 100 of the embodiment, the first electrode 141 may be disposed on an upper surface of the first conductivity type semiconductor layer 111 that is exposed by removing a portion of the second conductivity type semiconductor layer 113 and a portion of the active layer 112.

The first electrode 141 may be electrically connected to the upper surface of the first conductivity type semiconductor layer 111 through a second opening h2 provided in the passivation layer 150. For example, the first electrode 141 may be in contact with the upper surface of the first conductivity type semiconductor layer 111 in a plurality of N regions, as shown in FIGS. 11 to 14.

The second electrode 142 may be electrically connected to the second conductivity type semiconductor layer 113. The second electrode 142 may be disposed on the second conductivity type semiconductor layer 113. According to the embodiment, the current spreading layer 120 may be disposed between the second electrode 142 and the second conductivity type semiconductor layer 113.

The second electrode 142 may be electrically connected to the upper surface of the second conductivity type semiconductor layer 113 through a first opening h1 provided in the passivation layer 150. For example, the second electrode 142 may be electrically connected to the second conductivity type semiconductor layer 113 in a portion of a plurality of P regions, as shown in FIGS. 11 to 14.

According to the embodiment, as shown in FIGS. 11 to 14, the first electrode 141 and the second electrode 142 may be disposed spaced apart from each other.

The first electrode 141 may comprise a plurality of first branch electrodes 141a extending in a direction in which the second electrode 142 is disposed. A plurality of N regions may be formed in a portion of the plurality of first branch electrodes 141a. The first electrode 141 may be electrically connected to the first conductivity type semiconductor layer 111 through a portion of the plurality of N regions.

The second electrode 142 may comprise a plurality of second branch electrodes 142a extending in a direction in which the first electrode 141 is disposed. A plurality of P regions may be formed in a portion of the plurality of second branch electrodes 142a. The second electrode 142 may be electrically connected to the second conductivity type semiconductor layer 113 through a portion of the plurality of P regions.

In addition, the semiconductor device 100 according to the embodiment may comprise a first insulating reflective layer 161 and a second insulating reflective layer 162, as shown in FIGS. 11 to 13. The first insulating reflective layer 161 and the second insulating reflective layer 162 may be disposed on the passivation layer 150. Also, the first insulating reflective layer 161 and the second insulating reflective layer 162 may be disposed on the first electrode 141 and the second electrode 142.

The first insulating reflective layer 161 may be disposed on the first electrode 141 and the second electrode 142. The first insulating reflective layer 161 may comprise a fourth opening h4 exposing an upper surface of the first electrode 141.

The second insulating reflective layer 162 may be disposed on the first electrode 141 and the second electrode 142. The second insulating reflective layer 162 may be disposed spaced apart from the first insulating reflective layer 161. The second insulating reflective layer 162 may comprise a third opening h3 exposing an upper surface of the second electrode 142.

For example, the first insulating reflective layer 161 and the second insulating reflective layer 162 may be provided as a Distributed Bragg Reflector (DBR) layer or an Omni Directional Reflector (ODR) layer.

According to the embodiment, the first insulating reflective layer 161 may be disposed on a side surface and a portion of the upper surface of the first electrode 141 to expose the upper surface of the first electrode 141. The second insulating reflective layer 162 may be disposed on a side surface and a portion of the upper surface of the second electrode 142 to expose the upper surface of the second electrode 142.

Accordingly, the first insulating reflective layer 161 and the second insulating reflective layer 162 may reflect light emitted from the active layer 112 of the light emitting structure 110, thereby minimizing light absorption from the first bonding pad 161 and the second bonding pad 162, thereby improving luminous intensity Po.

For example, the first insulating reflective layer 161 and the second insulating reflective layer 162 may be made of an insulating material, and may be formed of a material having a high reflectance such as a DBR structure.

The first insulating reflective layer 161 and the second insulating reflective layer 162 may have a DBR structure in which materials having different refractive indexes are repeatedly arranged. For example, the first insulating reflective layer 161 and the second insulating reflective layer 162 may be provided of a material including at least one of $TiO_2$, $SiO_2$, $Ta_2O_5$, and $HfO_2$.

In addition, according to another embodiment, it is not limited thereto, the first insulating reflective layer 161 and the second insulating reflective layer 162 may be freely designed in various configurations in order to increase the reflectivity of the wavelength emitted from the active layer 112.

The semiconductor device 100 according to the embodiment may comprise a first bonding pad 171 disposed on the first insulating reflective layer 161, as shown in FIGS. 11 to 13. In addition, the semiconductor device 100 according to the embodiment may comprise a second bonding pad 172 disposed on the second insulating reflective layer 162. The second bonding pad 172 may be disposed spaced apart from the first bonding pad 171.

The first bonding pad 171 may be in contact with the upper surface of the first electrode 141 through the fourth opening h4 provided in the first insulating reflective layer 161 in a plurality of NB regions. The second bonding pad 172 may be in contact with the upper surface of the second electrode 142 through the third opening h3 provided in the second insulating reflective layer 162 in a plurality of PB regions.

According to the semiconductor device 100 of the embodiment, the first bonding pad 171 and the first electrode 141 can be contacted in a plurality of regions. Also, the second bonding pad 172 and the second electrode 142 can be contacted in a plurality of regions. Thus, according to the embodiment, power can be supplied through a plurality of regions, so there is an advantage that current spreading effect can be generated according to increase of the contact area and dispersion of the contact region, and operation voltage can be reduced.

The semiconductor device according to the embodiment may be connected to an external power in a flip chip bonding manner. For example, in manufacturing a semiconductor device package, the upper surface of the first electrode pad 171 and the upper surface of the second electrode pad 172 may be disposed to be attached to a submount, a lead frame, or a circuit board.

When the semiconductor device according to the embodiment is mounted by a flip-chip bonding method and is implemented as a semiconductor device package, the light provided by the light emitting structure 110 may be emitted through the substrate 105. The light emitted from the light emitting structure 110 may be reflected by the first insulating reflective layer 161 and the second insulating reflective layer 162, and may be emitted toward the substrate 105. Also, the light emitted from the light emitting structure 110 may be emitted in the lateral direction of the light emitting structure 100. Also, the light emitted from the light emitting structure 110 may be transmitted to the outside through a region where the first bonding pad 171 and the second bonding pad 172 are not provided among the surface on which the first bonding pad 171 and the second bonding pad 172 are disposed. Accordingly, the semiconductor device 100 of the embodiment can emit light in six directions surrounding the light emitting structure 100, and the light intensity can be remarkably improved.

In addition, according to the semiconductor device and the semiconductor device package of the embodiment, since the first electrode pad 171 and the second electrode pad 172 having a large area can be directly bonded to the circuit board providing power, the flip chip bonding process can be performed easily and stably.

Meanwhile, according to the semiconductor device 100 of the embodiment, as described above with reference to FIG. 4, when viewed from above the semiconductor device 100, a sum of the areas of the first bonding pad 171 and the second bonding pad 172 may be provided equal to or smaller than 70% of a total area of an upper surface of the semiconductor device 100 on which the first bonding pad 171 and the second bonding pad 172 are disposed.

For example, the total area of the upper surface of the semiconductor device 100 may correspond to an area defined by a lateral length and a longitudinal length of the lower surface of the first conductivity type semiconductor layer 111 of the light emitting structure 100. Also, the total area of the upper surface of the semiconductor device 100 may correspond to the area of the upper surface or the lower surface of the substrate 105.

By providing the sum of the areas of the first bonding pad 171 and the second bonding pad 172 equal to or smaller than 70% of the total area of the semiconductor device 100, the amount of light emitted to the surface on which the first bonding pad 171 and the second bonding pad 172 are disposed can be increased. Thus, according to the embodiment, since the amount of light emitted through the six surface direction of the semiconductor device 100 is increased, the light extraction efficiency can be improved and the light intensity Po can be increased.

In addition, when viewed from above the semiconductor device, the sum of the area of the first bonding pad 171 and the area of the second bonding pad 172 may be provided equal to or greater than 30% of the total area of the semiconductor device 100.

By thus providing the sum of the areas of the first bonding pad 171 and the second bonding pad 172 equal to or greater than 30% of the total area of the semiconductor device 100, stable mounting can be performed through the first bonding pad 171 and the second bonding pad 172.

In the semiconductor device 100 according to the embodiment, the sum of the areas of the first bonding pad 171 and the second bonding pad 172 can be selected to be equal to or greater than 30% and equal to or smaller than 70% of the total area of the semiconductor device 100 in consideration of light extraction efficiency and securing stability of bonding That is, when the sum of the areas of the first bonding pad 171 and the second bonding pad 172 is 30% or more to 100% or less of the total area of the semiconductor device 100, the electrical characteristics can be ensured and the bonding force to be mounted on the semiconductor device package can be secured so that stable mounting can be performed.

In addition, when the sum of the areas of the first bonding pad 171 and the second bonding pad 172 is more than 0% to 70% or less of the total area of the semiconductor device 100, the light extraction efficiency of the semiconductor device 100 can be improved and the light intensity Po can be increased by increasing the amount of light emitted to the surface on which the first bonding pad 171 and the second bonding pad 172 are disposed.

In order to secure the electrical characteristics of the semiconductor device 100 and the bonding force to be mounted on the semiconductor device package, and increase the light intensity, the sum of the areas of the first bonding pad 171 and the second bonding pad 172 is selected to be 30% or more to 70% or less of the total area of the semiconductor device 100.

In addition, according to another embodiment, it is not limited above, in order to secure the electrical characteristics and bonding force of the semiconductor device 100, the sum of the areas of the first bonding pad 171 and the second bonding pad 172 may be selected to be more than 70% to 100% or less, and in order to increase the light intensity, the sum of the areas of the first bonding pad 171 and the second bonding pad 172 may be selected to be more than 0% and less than 30%.

According to the semiconductor device 100 of the embodiment, light generated in the light emitting structure 110 may be transmitted and emitted through a first region provided between the first bonding pad 171 and the second bonding pad 172. At this time, the first region may correspond to a minimum gap between the first bonding pad 171 and the second bonding pad 172.

In addition, light generated in the light emitting structure 110 may be transmitted and emitted through a second region provided between side surfaces of the semiconductor device 100 in the major axis direction and the first bonding pad 171 or the second bonding pad 172 which are adjacent to the side surfaces in the major axis direction.

In addition, light generated in the light emitting structure 110 may be transmitted and emitted through a third region provided between side surfaces of the semiconductor device 100 in the minor axis direction and the first bonding pad 171 or the second bonding pad 172 which are adjacent to the side surfaces in the minor axis.

Hereinafter, a method of manufacturing a semiconductor device according to an embodiment will be described with reference to the accompanying drawings. In describing the method of manufacturing the semiconductor device according to the embodiment, description overlapping with those described with reference to FIGS. 1 to 14 may be omitted.

First, according to the method of manufacturing the semiconductor device of the embodiment, as shown in FIGS. 15a to 15c, a light emitting structure 110 and a current spreading layer 120 may be formed on a substrate 105. FIG. 15a is a plan view showing a shape of the light emitting structure 110 and the current spreading layer 120 formed according to the method of manufacturing the semiconductor device of the embodiment. FIG. 15b is a process sectional view taken along line B-B of the semiconductor device shown in FIG. 15a, and FIG. 15c is a process sectional view taken along line C-CB of the semiconductor device shown in FIG. 15a.

According to the embodiment, the light emitting structure 110 may be formed on the substrate 105. For example, the first conductivity type semiconductor layer 111, the active layer 112, and the second conductivity type semiconductor layer 113 may be formed on the substrate 105.

Then, the current spreading layer 120 may be formed on a portion of the second conductivity type semiconductor layer 113. For example, the current spreading layer 120 may be formed in a shape of a plurality of dots. For example, the current spreading layer 120 may be formed in a shape of a plurality of circles having a predetermined size.

Next, as shown in FIGS. 16a to 16c, an ohmic contact layer 130 may be formed. FIG. 16a is a plan view showing a shape of the ohmic contact layer 130 formed according to the method of manufacturing the semiconductor device of the embodiment, FIG. 16b is a process sectional view taken along line B-B of the semiconductor device shown in FIG. 16a, and FIG. 16c is a process sectional view taken along line C-C of the semiconductor device shown in FIG. 16a.

According to the embodiment, the ohmic contact layer 130 may be formed on the second conductivity type semiconductor layer 113. The ohmic contact layer 130 may be formed on the current spreading layer 120.

Meanwhile, according to the embodiment, a portion of the first conductivity type semiconductor layer 111 may be formed to be exposed through a mesa etching process. The light emitting structure 110 may comprise a recess exposing the first conductivity type semiconductor layer 111. For example, the light emitting structure 110 may comprise a plurality of circular recesses.

Next, as shown in FIGS. 17a to 17c, a passivation layer 150 may be formed. FIG. 17a is a plan view showing a shape of the passivation layer 150 formed according to the method of manufacturing the semiconductor device of the embodiment, FIG. 17b is a process sectional view taken along line B-B of the semiconductor device shown in FIG. 17*a*, and FIG. 17*c* is a process sectional view taken along line C-C of the semiconductor device shown in FIG. 17*a*.

The passivation layer 150 may comprise a plurality of openings. For example, the passivation layer 150 may comprise a plurality of first openings h1. The current spreading layer 120 may be exposed through the plurality of first openings h1. In addition, the passivation layer 150 may comprise a plurality of second openings h2. The upper surface of the first conductivity type semiconductor layer 111 may be exposed through the plurality of second openings h2. The plurality of second openings h2 may be provided on and corresponding to the plurality of recesses M.

Next, as shown in FIGS. 18*a* to 18*c*, a first electrode 141 and a second electrode 142 may be formed. FIG. 18*a* is a plan view showing a shape of the first electrode 141 and the second electrode 142 formed according to the method of manufacturing the semiconductor device of the embodiment, FIG. 18*b* is a process sectional view taken along line B-B of the semiconductor device shown in FIG. 18*a*, and FIG. 18*c* is a process sectional view taken along line C-C of the semiconductor device shown in FIG. 18*a*.

According to the embodiment, the first electrode 141 and the second electrode 142 may be disposed spaced apart from each other.

The first electrode 141 may comprise a plurality of first branch electrodes 141*a* extending in a direction in which the second electrode 142 is disposed. A plurality of N regions may be formed in a portion of the plurality of first branch electrodes 141*a*. The first electrode 141 may be electrically connected to the first conductivity type semiconductor layer 111 through the plurality of N regions.

The second electrode 142 may comprise a plurality of second branch electrodes 142*a* extending in a direction in which the first electrode 141 is disposed. A plurality of P regions may be formed in a portion of the plurality of second branch electrodes 142*a*. The second electrode 142 may be electrically connected to the second conductivity type semiconductor layer 113 through the plurality of P regions.

According to the embodiment, the N region of the first electrode 141 may be formed on the first conductivity type semiconductor layer 111 exposed by the second opening 112 and the recess M.

In addition, the P region of the second electrode 142 may be formed on the current spreading layer 120 exposed by the first opening h1.

Then, as shown in FIGS. 19*a* to 19*c*, a first insulating reflective layer 161 and a second insulating reflective layer 162 may be formed. FIG. 19*a* is a plan view showing a shape of the first insulating reflective layer 161 and the second insulating reflective layer 162 formed according to the method of manufacturing the semiconductor device of the embodiment, FIG. 19*b* is a process sectional view taken along line B-B of the semiconductor device shown in FIG. 19*a*, and FIG. 19*c* is a process sectional view taken along line C-C of the semiconductor device shown in FIG. 19*a*.

According to the embodiment, the first insulating reflective layer 161 and the second insulating reflective layer 162 may be formed on the first electrode 141 and the second electrode 142.

The first insulating reflective layer 161 may be disposed on the first electrode 141 and the second electrode 142. The first insulating reflective layer 161 may comprise a plurality of fourth openings h4. For example, a portion of the upper surface of the first electrode 141 may be exposed through the plurality of fourth openings h4.

In addition, the second insulating reflective layer 162 may be disposed on the first electrode 141 and the second electrode 142. The second insulating reflective layer 162 may comprise a plurality of third openings h3. For example, a portion of the upper surface of the second electrode 142 may be exposed through the plurality of third openings h3.

In addition, the semiconductor device 100 according to the embodiment may comprise a third insulating reflective layer 163 disposed on the first branch electrode 141*a* and a fourth insulating reflective layer 164 disposed on the second branch electrode 142*a*.

According to the embodiment, the first insulating reflective layer 161 may be disposed on a side surface and a portion of the upper surface of the first electrode 141 to expose the upper surface of the first electrode 141. The second insulating reflective layer 162 may be disposed on a side surface and a portion of the upper surface of the second electrode 142 to expose the upper surface of the second electrode 142.

Then, as shown in FIGS. 20*a* to 20*c*, a first bonding pad 171 and a second bonding pad 172 may be formed. FIG. 20*a* is a plan view showing a shape of the first bonding pad 171 and the second bonding pad 172 formed according to the method of manufacturing the semiconductor device of the embodiment, FIG. 20*b* is a process sectional view taken along line B-B of the semiconductor device shown in FIG. 20*a*, and FIG. 20*c* is a process sectional view taken along line C-C of the semiconductor device shown in FIG. 20*a*.

According to the embodiment, the first electrode pad 171 and the second electrode pad 172 may be formed in the shape shown in FIG. 20*a*. The first electrode pad 171 may be disposed on the first insulating reflective layer 161. The second electrode pad 172 may be disposed on the second insulating reflective layer 162. The second bonding pad 172 may be spaced apart from the first bonding pad 171.

The first bonding pad 171 may be in contact with the upper surface of the first electrode 141 through the fourth opening h4 provided in the first insulating reflective layer 161 in a plurality of NB regions. The second bonding pad 172 may be in contact with the upper surface of the second electrode 142 through the third opening h3 provided in the second insulating reflective layer 162 in a plurality of PB regions.

The semiconductor device according to the embodiment may be connected to an external power in a flip chip bonding manner. For example, in manufacturing a semiconductor device package, the top surface of the first electrode pad 171 and the top surface of the second electrode pad 172 may be disposed to be attached to a submount, a lead frame, or a circuit board.

When the semiconductor device according to the embodiment is mounted by a flip-chip bonding method and is implemented as a semiconductor device package, the light provided by the light emitting structure 110 may be emitted through the substrate 105. The light emitted from the light emitting structure 110 may be reflected by the first insulating reflective layer 161 and the second insulating reflective layer 162 and may be emitted toward the substrate 105. Also, the light emitted from the light emitting structure 110 may be emitted in the lateral direction of the light emitting structure 100. Also, the light emitted from the light emitting structure 110 may be emitted to the outside through a region where the first bonding pad 171 and the second bonding pad 172 are not provided among the surface on which the first bonding pad 171 and the second bonding pad 172 are disposed. Accordingly, the semiconductor device 100 of the embodiment can emit light in six directions surrounding the light emitting structure 100, and the light intensity can be remarkably improved.

In addition, according to the semiconductor device and the semiconductor device package of the embodiment, since the first electrode pad 171 and the second electrode pad 172 having a large area can be directly bonded to the circuit board providing power, the flip chip bonding process can be performed easily and stably.

Meanwhile, according to semiconductor device of the embodiment, as described above with reference to FIG. 4, when viewed from above the semiconductor device 100, a sum of the areas of the first bonding pad 171 and the second bonding pad 172 may be provided equal to or smaller than 70% of a total area of an upper surface of the semiconductor device on which the first bonding pad 171 and the second bonding pad 172 are disposed.

For example, the total area of the upper surface of the semiconductor device 100 may correspond to an area defined by a lateral length and a longitudinal length of the lower surface of the first conductivity type semiconductor layer 111 of the light emitting structure 100. Also, the total area of the upper surface of the semiconductor device 100 may correspond to the area of the upper surface or the lower surface of the substrate 105.

By providing the sum of the areas of the first bonding pad 171 and the second bonding pad 172 equal to or smaller than 70% of the total area of the semiconductor device 100, the amount of light emitted to the surface on which the first bonding pad 171 and the second bonding pad 172 are disposed can be increased. Thus, according to the embodiment, since the amount of light emitted through the six surface direction of the semiconductor device 100 is increased, the light extraction efficiency can be improved and the light intensity Po can be increased.

In addition, when viewed from above the semiconductor device, the sum of the area of the first bonding pad 171 and the area of the second bonding pad 172 may be provided equal to or greater than 30% of the total area of the semiconductor device 100.

By providing the sum of the areas of the first bonding pad 171 and the second bonding pad 172 equal to or greater than 30% of the total area of the semiconductor device 100, stable mounting can be performed through the first bonding pad 171 and the second bonding pad 172.

In the semiconductor device 100 according to the embodiment, the sum of the areas of the first bonding pad 171 and the second bonding pad 172 can be selected to be equal to or greater than 30% and equal to or smaller than 70% of the total area of the semiconductor device 100 in consideration of light extraction efficiency and securing stability of bonding.

That is, when the sum of the areas of the first bonding pad 171 and the second bonding pad 172 is 30% or more to 100% or less of the total area of the semiconductor device 100, the electrical characteristics can be ensured and the bonding force to be mounted on the semiconductor device package can be secured so that stable mounting can be performed.

In addition, when the sum of the areas of the first bonding pad 171 and the second bonding pad 172 is more than 0% to 70% or less of the total area of the semiconductor device 100, the light extraction efficiency of the semiconductor device 100 can be improved and the light intensity Po can be increased by increasing the amount of light emitted to the surface on which the first bonding pad 171 and the second bonding pad 172 are disposed.

In order to secure the electrical characteristics of the semiconductor device 100 and the bonding force to be mounted on the semiconductor device package, and increase the light intensity, the sum of the areas of the first bonding pad 171 and the second bonding pad 172 is selected to be 30% or more to 70% or less of the total area of the semiconductor device 100.

In addition, according to another embodiment, it is not limited above, in order to secure the electrical characteristics and bonding force of the semiconductor device 100, the sum of the areas of the first bonding pad 171 and the second bonding pad 172 may be selected to be more than 70% to 100% or less, and in order to increase the light intensity, the sum of the areas of the first bonding pad 171 and the second bonding pad 172 may be selected to be more than 0% and less than 30%.

According to the semiconductor device 100 of the embodiment, light generated in the light emitting structure 110 may be transmitted and emitted through a first region provided between the first bonding pad 171 and the second bonding pad 172. At this time, the first region may be a region corresponding to the interval between the first bonding pad 171 and the second bonding pad 172.

In addition, light generated in the light emitting structure 110 may be transmitted and emitted through a second region provided between side surfaces of the semiconductor device 100 in the major axis direction and the first bonding pad 171 or the second bonding pad 172 which are adjacent to the side surfaces in the major axis direction.

In addition, light generated in the light emitting structure may be transmitted and emitted through a third region provided between side surfaces of the semiconductor device 100 in the minor axis direction and the first bonding pad 171 or the second bonding pad 172 which are adjacent to the side surfaces in the minor axis.

The semiconductor device according to the embodiment described above can be applied to a semiconductor device package. The semiconductor device according to the embodiment may be electrically connected to a substrate or a lead electrode through a flip chip bonding method, a die bonding method, a wire bonding method, or the like, and may be provided as a semiconductor device package.

Meanwhile, FIG. 21 is a view explaining a semiconductor device package according to an embodiment of the present invention. In describing the semiconductor device package according to the embodiment with reference to FIG. 21, description overlapping with those described with reference to FIGS. 1 to 20 may be omitted.

A semiconductor device package according to the embodiment may comprise a package body 205, a first package electrode 211 and a second package electrode 212 disposed on the package body 205, a semiconductor device 100 disposed on the package body 205, and a molding part 230 provided with a phosphor disposed on the semiconductor device 100. For example, the semiconductor device 100 may be a semiconductor device according to the embodiment described with reference to FIGS. 1 to 20.

For example, the package body 205 may be formed of at least one selected from a group including polyphthalamide (PPA), polychloro tri phenyl (PCT), liquid crystal polymer (LCP), polyamide9T (PAST), silicone, epoxy molding compound (EMC), a material comprising a metal, ceramic, photo sensitive glass (PSG), sapphire ($Al_2O_3$), and a printed circuit board (PCB). In addition, the package body 205 may comprise a high refractive index filler such as $TiO_2$ and $SiO_2$.

The first package electrode 211 and the second package electrode 212 may comprise a conductive material. For example, the first package electrode 211 and the second package electrode 212 may comprise at least one of Ti, Cu, Ni, Au, Cr, Ta, Pt, Sn, Ag, P, Fe, Sn, Zn, and Al, and may be a single layer or multiple layers.

The semiconductor device 100 may be electrically connected with the first package electrode 211 and the second package electrode 212. For example, the semiconductor device 100 may be electrically connected with the first package electrode 211 and the second package electrode 212 through a first bump 221 and a second bump 222. The first bonding pad and the second bonding pad of the semiconductor device 100 may be electrically connected to the first package electrode 211 and the second package electrode 212, respectively.

The first bump 221 and the second bump 222 may be formed of a metal having a high reflectivity of 80% or more, for example, at least one of Ag, Au, or Al, or an alloy thereof, thereby preventing light absorption by an electrode to improve light extraction efficiency. For example, the first bump 221 and the second bump 222 may be formed of at least one of Ti, Cu, Ni, Au, Cr, Ta, Pt, Sn, Ag, and P, or a selective alloy thereof.

Also, the semiconductor device 100 may be mounted on the first package electrode 211 and the second package electrode 212 by eutectic bonding without a bump.

As described above, the semiconductor device 100 according to the embodiment can emit light in six plane directions. The light emitted to the downward direction in which the first bonding pad and the second bonding pad of the semiconductor device 100 are disposed can be reflected on the bottom surface of the package body 205 to be provided in the upper direction of the package body 205.

According to the semiconductor device 100 of the embodiment, as described above with reference to FIGS. 1 to 20, the area of the first bonding pad and the area of the second bonding pad are selected in order to provide sufficient bonding force with the first package electrode 211 and the second package electrode 212. In addition, according to the semiconductor device 100 of the embodiment, the area of the first bonding pad and the area of the second bonding pad are selected in order to improve not only the bonding force but also the efficiency of emitting light in the downward direction, in consideration of the size of the region through which light can be transmitted to the region where the first bonding pad and the second bonding pad are disposed.

Meanwhile, according to the semiconductor device of the embodiment, as described above with reference to FIG. 4, when viewed from above the semiconductor device 100, a sum of the areas of the first bonding pad and the second bonding pad may be provided equal to or smaller than 70% of a total area of an upper surface of the semiconductor device on which the first bonding pad and the second bonding pad are disposed.

By providing the sum of the areas of the first bonding pad and the second bonding pad equal to or smaller than 70% of the total area of the semiconductor device 100, the amount of light emitted to the surface on which the first bonding pad and the second bonding pad are disposed can be increased. Thus, according to the embodiment, since the amount of light emitted through the six surface direction of the semiconductor device 100 is increased, the light extraction efficiency can be improved and the light intensity Po can be increased.

In addition, when viewed from above the semiconductor device, the sum of the area of the first bonding pad and the area of the second bonding pad may be provided equal to or greater than 30% of the total area of the semiconductor device 100.

By providing the sum of the areas of the first bonding pad and the second bonding pad equal to or greater than 30% of the total area of the semiconductor device 100, stable mounting can be performed through the first bonding pad and the second bonding pad.

In the semiconductor device 100 according to the embodiment, the sum of the areas of the first bonding pad and the second bonding pad can be selected to be equal to or greater than 30% and equal to or smaller than 70% of the total area of the semiconductor device 100 in consideration of light extraction efficiency and securing stability of bonding.

That is, when the sum of the areas of the first bonding pad 171 and the second bonding pad 172 is 30% or more to 100% or less of the total area of the semiconductor device 100, the electrical characteristics can be ensured and the bonding force to be mounted on the semiconductor device package can be secured so that stable mounting can be performed.

In addition, when the sum of the areas of the first bonding pad 171 and the second bonding pad 172 is more than 0% to 70% or less of the total area of the semiconductor device 100, the light extraction efficiency of the semiconductor device 100 can be improved and the light intensity Po can be increased by increasing the amount of light emitted to the surface on which the first bonding pad 171 and the second bonding pad 172 are disposed.

In order to secure the electrical characteristics of the semiconductor device 100 and the bonding force to be mounted on the semiconductor device package, and increase the light intensity, the sum of the areas of the first bonding pad 171 and the second bonding pad 172 is selected to be 30% or more to 70% or less of the total area of the semiconductor device 100.

In addition, according to another embodiment, it is not limited above, in order to secure the electrical characteristics and bonding force of the semiconductor device 100, the sum of the areas of the first bonding pad and the second bonding pad may be selected to be more than 70% to 100% or less, and in order to increase the light intensity, the sum of the areas of the first bonding pad and the second bonding pad may be selected to be more than 0% and less than 30%.

According to the semiconductor device 100 of the embodiment, light generated in the light emitting structure 110 may be transmitted and emitted through a first region provided between the first bonding pad and the second bonding pad. At this time, the first region may be a region corresponding to an interval between the first bonding pad and the second bonding pad.

In addition, light generated in the light emitting structure 110 may be transmitted and emitted through a second region provided between side surfaces of the semiconductor device 100 in the major axis direction and the first bonding pad 171 or the second bonding pad 172 which are adjacent to the side surfaces in the major axis direction.

In addition, light generated in the light emitting structure may be transmitted and emitted through a third region provided between side surfaces of the semiconductor device 100 in the minor axis direction and the first bonding pad 171 or the second bonding pad 172 which are adjacent to the side surfaces in the minor axis.

According to the semiconductor device package of the embodiment, the light emitted in the direction of the six side surfaces of the semiconductor device 100 is reflected by the bottom surface and the side surface of the package body 205 and may be provided in the upper direction of the package body 205.

Meanwhile, FIGS. 22 and 23 are views explaining a change in luminous intensity depending on the thickness of a semiconductor device according to an embodiment of the present invention.

The semiconductor device according to the embodiment may comprise a light emitting structure 110 and an insulating reflective layer 160 disposed under the light emitting structure 110, as shown in FIG. 22. For example, the insulating reflective layer 160 may be the second insulating reflective layer described with reference to FIGS. 1 to 20.

The light emitting structure 110 may comprise a first conductivity type semiconductor layer 111, an active layer 112, and a second conductivity type semiconductor layer 113. For example, the first conductivity type semiconductor layer 111 may be provided as an n-GaN layer, and the second conductivity type semiconductor layer 113 may be provided as a p-GaN layer.

Light generated in the active layer 112 may propagate downward and reflect upward in the insulating reflective layer 160. Accordingly, the light reflected from the insulating reflective layer 160 may interfere with the light generated in the active layer 112. For example, the light reflected from the insulating reflective layer 160 may cause constructive interference with the light generated in the active layer 112 depending on the thickness of the second conductivity type semiconductor layer 113.

In the semiconductor device according to the embodiment, as shown in [Table 1], the electrical and optical characteristics may be changed depending on the thickness of the second conductivity type semiconductor layer 113. FIG. 23 is a graph showing a change in the luminous intensity Po according to the thickness variation of the second conductivity type semiconductor layer.

TABLE 1

| p-GaN thickness (nm) | | 95 | | 110 (Ref.) | | 125 | |
|---|---|---|---|---|---|---|---|
| Integrating sphere (Median) | If (mA) | 65 | 150 | 65 | 150 | 65 | 150 |
| | Wd (nm) | 454.4 | 453.9 | 454.9 | 454.4 | 454.8 | 454.3 |
| | Vf (V) | 2.82 | 3.04 | 2.82 | 3.08 | 2.81 | 3.03 |
| | Po (mW) | 114.3 (101.6%) | 245.8 | 112.5 (Ref.) | 240.5 | 113.1 | 244.2 |

In the case of a conventional semiconductor device, it is recommended that the thickness of the second conductivity type semiconductor layer 113 is generally 110 nm or more in order to ensure good electrical characteristics. However, in the semiconductor device according to the embodiment, as shown in [Table 1] and FIG. 23, when the thickness of the second conductivity type semiconductor layer 113 is from 90 nanometers to 100 nanometers, it can be seen that the light intensity characteristic is improved and detected. This is interpreted to be due to constructive interference between the light reflected from the insulating reflective layer 160 and the light generated and emitted from the active layer 112 when the thickness of the second conductivity type semiconductor layer 113 is provided in a range of 90 nanometers to 100 nanometers.

For reference, although not shown in [Table 1] and FIG. 23, when the thickness of the second conductivity type semiconductor layer 113 is provided of 90 nm or less, it was detected that the light intensity characteristic is lowered again.

Next, a semiconductor device according to an embodiment of the present invention will be described with reference to FIGS. 24 and 25. FIG. 24 is a plan view showing a semiconductor device according to an embodiment of the present invention, and FIG. 25 is a sectional view taken along line A-A of the semiconductor device shown in FIG. 24.

In describing the semiconductor device of the embodiment with reference to FIGS. 24 and 25, description overlapping with those described above may be omitted.

Meanwhile, in order to facilitate understanding, in FIG. 24, a first electrode 1141 electrically connected to a first bonding pad 1171 and a second electrode 1142 electrically connected to a second bonding pad 1172 are illustrated to be seen, even though which are disposed under the first bonding pad 1171 and the second bonding pad 1172.

The semiconductor device 1100 according to the embodiment may comprise a light emitting structure 1100 disposed on a substrate 1105, as shown in FIGS. 24 and 25.

The light emitting structure 1100 may comprise a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

According to the embodiment, the first conductivity type semiconductor layer 1111 may be provided as an n-type semiconductor layer, and the second conductivity type semiconductor layer 1113 may be provided as a p-type semiconductor layer. Of course, according to another embodiment, the first conductivity type semiconductor layer 1111 may be provided as a p-type semiconductor layer, and the second conductivity type semiconductor layer 1113 may be provided as an n-type semiconductor layer.

Hereinafter, for convenience of description, a description will be given based on a case in which the first conductivity type semiconductor layer 1111 is provided as an n-type semiconductor layer and the second conductivity type semiconductor layer 1113 is provided as a p-type semiconductor layer.

In the above description, the case where the first conductivity type semiconductor layer 1111 is disposed on and in contact with the substrate 1105 has been described. However, a buffer layer may be further disposed between the first conductivity type semiconductor layer 1111 and the substrate 1105. For example, the buffer layer can reduce the difference in lattice constant between the substrate 1105 and the light emitting structure 1100, and improve crystallinity.

The semiconductor device 1100 according to the embodiment may comprise a current spreading layer 1120 and an ohmic contact layer 1130 as shown in FIG. 25. The current spreading layer 1120 and the ohmic contact layer 1130 can improve current diffusion to increase light output. An arrangement and shape of the current spreading layer 1120 and the ohmic contact layer 1130 will be further described later while explaining a method of manufacturing a semiconductor device according to an embodiment.

For example, the current spreading layer 1120 may be provided with an oxide, a nitride, or the like. A horizontal width of the current spreading layer 1120 may be provided greater than a horizontal width of the second electrode 1142 that is disposed on the current spreading layer 1120. Accordingly, the current spreading layer 1120 can improve luminous flux by preventing current concentration under the second electrode 1142 and improving electrical reliability.

In addition, the ohmic contact layer 1130 may comprise at least one selected from a group including a metal, a metal oxide, and a metal nitride. The ohmic contact layer 1130 may comprise a light transmitting material. The semiconductor device 1100 according to the embodiment may comprise a first electrode 1141 and a second electrode 1142, as shown in FIGS. 24 to 26.

The first electrode 1141 may be electrically connected to the first conductivity type semiconductor layer 1111. The first electrode 1141 may be disposed on the first conductivity type semiconductor layer 1111. For example, according to the semiconductor device 1100 of the embodiment, the first electrode 1141 may be disposed on an upper surface of the first conductivity type semiconductor layer 1111 that is exposed by removing a portion of the second conductivity type semiconductor layer 1113 and a portion of the active layer 1112.

The second electrode 1142 may be electrically connected to the second conductivity type semiconductor layer 1113. The second electrode 1142 may be disposed on the second conductivity type semiconductor layer 1113. According to the embodiment, the current spreading layer 1120 may be disposed between the second electrode 1142 and the second conductivity type semiconductor layer 1113.

The semiconductor device 1100 according to the embodiment may comprise a passivation layer 1150, as shown in FIGS. 24 and 25.

The passivation layer 1150 may be disposed on the second electrode 1142. The passivation layer 1150 may comprise a first opening h1 that exposes a portion of the P region of the second electrode 1142.

In addition, the passivation layer 1150 may be disposed on the first electrode 1141. The passivation layer 1150 may comprise a second opening h2 that exposes a portion of the N region of the first electrode 1141.

In addition, the semiconductor device 1100 according to the embodiment may comprise a reflective layer 1160, as shown in FIGS. 24 and 25. The reflective layer 1160 may comprise a first reflective layer 1161, a second reflective layer 1162, and a third reflective layer 1163. The reflective layer 1160 may be disposed on the passivation layer 1150.

The first reflective layer 1161 may be disposed on the first electrode 1141 and the second electrode 1142. The first reflective layer 1161 may be disposed on a portion of the first electrode 1141. The first reflective layer 1161 may be disposed on a portion of the second electrode 1142.

The first reflective layer 1161 may comprise a fourth opening h4 exposing an upper surface of the first electrode 1141. The first reflective layer 1161 may comprise a fourth opening h4 provided corresponding to a region where the second opening h2 of the passivation layer 1150 is formed.

The second reflective layer 1162 may be disposed on the first electrode 1141 and the second electrode 1142. The second reflective layer 1162 may be disposed on a portion of the first electrode 1141. The second reflective layer 1162 may be disposed on a portion of the second electrode 1142.

The second reflective layer 1162 may be disposed spaced apart from the first reflective layer 1161. The second reflective layer 1162 may comprise a third opening h3 exposing an upper surface of the second electrode 1142. The second reflective layer 1162 may comprise a third opening h3 provided corresponding to a region where the first opening h1 of the passivation layer 1150 is formed.

In addition, the third reflective layer 1163 may be disposed on the first electrode 1141 and the second electrode 1142. The third reflective layer 1163 may be disposed on a portion of the first electrode 1141. The third reflective layer 1163 may be disposed on a portion of the second electrode 1142.

The third reflective layer 1163 may be disposed between the first reflective layer 1161 and the second reflective layer 1162. For example, the third reflective layer 1163 may be connected to the first reflective layer 1161. Also, the third reflective layer 1163 may be connected to the second reflective layer 1162. The third reflective layer 1163 may be physically in direct contact with the first reflective layer 1161 and the second reflective layer 1162.

The reflective layer 1160 may be provided as an insulating reflective layer. For example, the reflective layer 1160 may be provided as a Distributed Bragg Reflector (DBR) layer or an Omni Directional Reflector (ODR) layer. Also, the reflective layer 1160 may comprise a metal material.

According to the embodiment, the first reflective layer 1161 may be disposed on a side surface and a portion of an upper surface of the first electrode 1141 so as to expose the upper surface of the first electrode 1141. The second reflective layer 1162 may be disposed on a side surface and a portion of an upper surface of the second electrode 1142 to expose the upper surface of the second electrode 1142.

Accordingly, the first reflective layer 1161 and the second reflective layer 1162 may reflect light emitted from the active layer 1112 of the light emitting structure 1110, thereby minimizing light absorption from a first bonding pad 1161 and a second bonding pad 1162, thereby improving luminous intensity Po.

For example, the first reflective layer 1161 and the second reflective layer 1162 may be made of an insulating material, and may be formed of a material having a high reflectivity, for example, such as a DBR structure in order to reflect light emitted from the active layer 1112. Also, the third reflective layer 1163 may have a DBR structure as an example.

The first reflective layer 1161 and the second reflective layer 1162 may have a DBR structure in which materials having different refractive indexes are repeatedly arranged. For example, the first reflective layer 1161 and the second reflective layer 1162 may be disposed in a single layer or a stacked structure comprising at least one of $TiO_2$, $SiO_2$, $Ta_2O_5$, and $HfO_2$.

In addition, according to another embodiment, it is not limited thereto, the first reflective layer 1161 and the second reflective layer 1162 may be freely provided in various configurations in order to adjust the reflectivity of the light emitted from the active layer 1112 according to the wavelength emitted from the active layer 1112.

The semiconductor device 1100 according to the embodiment may comprise a first bonding pad 1171 disposed on the first reflective layer 1161, as shown in FIGS. 24 and 25. In addition, the semiconductor device 1100 according to the embodiment may comprise a second bonding pad 1172 disposed on the second reflective layer 1162. The second bonding pad 1172 may be disposed spaced apart from the first bonding pad 1171.

The first bonding pad 1171 may contact a portion of the upper portion of the N region of the first electrode 1141 through the fourth opening h4 and the second opening h2. The second bonding pad 1172 may contact a portion of the upper portion of the P region of the second electrode 1142 through the third opening h3 and the first opening h1.

The semiconductor device according to the embodiment may be connected to an external power in a flip chip bonding manner. For example, in manufacturing a semiconductor device package, the upper surface of the first bonding pad 1171 and the upper surface of the second electrode pad 1172 may be disposed to be attached to a submount, a lead frame, or a circuit board.

For example, the first bonding pad 1171 and the second bonding pad 1172 may be formed of Au, AuTi, or the like, so that the packaging process can be stably operated. Also, the first bonding pad 1171 and the second bonding pad 1172 may be formed in a single layer or multiple layers using at least one material or alloys of Ti, Al, In, Ir, Ta, Pd, Co, Cr. Mg, Zn, Ni, Si, Ge, Ag, Ag alloy, Au, HE Pt, Ru, Rh, ZnO, IrOx, RuOx, NiO, RuOx/ITO, Ni/IrOx/Au, Ni/IrOx/Au/ITO, and the like.

When the semiconductor device according to the embodiment is mounted by a flip-chip bonding method and is implemented as a semiconductor device package, the light provided by the light emitting structure 1100 may be emitted through the substrate 1105. The light emitted from the light emitting structure 1100 may be reflected by the first reflective layer 1161 and the second reflective layer 1162, and may be emitted toward the substrate 1105.

Also, the light emitted from the light emitting structure 1100 may be emitted in the lateral direction of the light emitting structure 1100. Also, the light emitted from the light emitting structure 1100 may be transmitted to the outside through a region where the first bonding pad 1171 and the second bonding pad 1172 are not provided among the surface on which the first bonding pad 1171 and the second bonding pad 1172 are disposed.

Specifically, the light emitted from the light emitting structure 1100 may be transmitted to the outside through a region where the first reflective layer 1161, the second reflective layer 1162, and the third reflective layer 1163 are not provided among the surface on which the first bonding pad 1171 and the second bonding pad 1172 are disposed.

Accordingly, the semiconductor device 1100 of the embodiment can emit light in six directions surrounding the light emitting structure 1100, and the light intensity can be remarkably improved.

In addition, according to the semiconductor device and the semiconductor device package of the embodiment, since the first bonding pad 1171 and the second electrode pad 1172 having a large area can be directly bonded to the circuit board providing power, the chip bonding process can be performed easily and stably.

Meanwhile, in describing the semiconductor device according to the embodiment, the case where the ohmic contact layer 1130 is provided on the second conductivity type semiconductor layer 1113 has been described. However, according to another embodiment, the ohmic contact layer 1130 may be omitted and the second electrode 1142 may be disposed in direct contact with the second conductivity type semiconductor layer 1113.

Then, referring to FIG. 27, the arrangement relationship of the first bonding pad 1171 and the second bonding pad 1172 applied to the semiconductor device 1100 according to the embodiment will be further described. FIG. 27 is a view showing an example of the arrangement of the first bonding pad 1171 and the second bonding pad 1172 applied to the semiconductor device according to the embodiment of the present invention.

According to the semiconductor device 1100 of the embodiment, when viewed from above the semiconductor device 1100, a sum of the areas of the first bonding pad 1171 and the second bonding pad 1172 may be provided equal to or smaller than 60% of a total area of an upper surface of the semiconductor device 1100 on which the first bonding pad 1171 and the second bonding pad 1172 are disposed.

For example, the total area of the upper surface of the semiconductor device 1100 may correspond to an area defined by a lateral length and a longitudinal length of the lower surface of the first conductivity type semiconductor layer 1111 of the light emitting structure 1100. Also, the total area of the upper surface of the semiconductor device 1100 may correspond to the area of the upper surface or the lower surface of the substrate 1105.

By providing the sum of the areas of the first bonding pad 1171 and the second bonding pad 1172 equal to or smaller than 60% of the total area of the semiconductor device 1100, the amount of light emitted to the surface on which the first bonding pad 1171 and the second bonding pad 1172 are disposed can be increased. Thus, according to the embodiment, since the amount of light emitted through the six surface direction of the semiconductor device 1100 is increased, the light extraction efficiency can be improved and the light intensity Po can be increased.

In addition, when viewed from above the semiconductor device, the sum of the area of the first bonding pad 1171 and the area of the second bonding pad 1172 may be provided equal to or greater than 30% of the total area of the semiconductor device 1100.

By providing the sum of the areas of the first bonding pad 1171 and the second bonding pad 1172 equal to or greater than 30% of the total area of the semiconductor device 1100, stable mounting can be performed through the first bonding pad 1171 and the second bonding pad 1172, and the electrical characteristics of the semiconductor device 1100 can be ensured not to degrade.

In the semiconductor device 1100 according to the embodiment, the sum of the areas of the first bonding pad 1171 and the second bonding pad 1172 can be selected to be equal to or greater than 30% and equal to or smaller than 60% of the total area of the semiconductor device 1100 in consideration of light extraction efficiency, securing stability of bonding, and securing electrical characteristics.

That is, when the sum of the areas of the first bonding pad 1171 and the second bonding pad 1172 is 30% or more to 100% or less of the total area of the semiconductor device 1100, the electrical characteristics can be ensured and the bonding force to be mounted on the semiconductor device package can be secured so that stable mounting can be performed.

In addition, when the sum of the areas of the first bonding pad 1171 and the second bonding pad 1172 is more than 0% to 60% or less of the total area of the semiconductor device 1100, the light extraction efficiency of the semiconductor device 1100 can be improved and the light intensity Po can be increased by increasing the amount of light emitted to the surface on which the first bonding pad 1171 and the second bonding pad 1172 are disposed.

In order to secure the electrical characteristics of the semiconductor device 1100 and the bonding force to be mounted on the semiconductor device package, and increase the light intensity, the sum of the areas of the first bonding pad 1171 and the second bonding pad 1172 is selected to be 30% or more to 60% or less of the total area of the semiconductor device 1100.

In addition, according to another embodiment, it is not limited thereto, in order to secure the electrical characteristics and bonding force of the semiconductor device 1100, the sum of the areas of the first bonding pad 1171 and the second bonding pad 1172 may be selected to be more than 60% to 100% or less, and in order to increase the light intensity, the sum of the areas of the first bonding pad 1171 and the second bonding pad 1172 may be selected to be more than 0% and less than 30%.

According to the embodiment, the first bonding pad 1171 may be provided along a major axis direction of the semiconductor device 1100 at a length of x1, and may be provided along a minor axis direction of the semiconductor device 1100 at a length of y1. At this time, a ratio of x1 and y1 may be provided in a range of 1:1.5 to 1:2, for example.

In addition, the second bonding pad 1172 may be provided along the major axis direction of the semiconductor device 1100 at a length of x2 and may be provided along the minor axis direction of the semiconductor device 1100 at a length of y2. At this time, a ratio of x2 and y2 may be provided in a range of 1:1.5 to 1:2, for example.

In addition, a minimum distance d between the first bonding pad 1171 and the second bonding pad 1172 may be provided equal to or greater than 125 micrometers. The minimum distance d between the first bonding pad 1171 and the second bonding pad 1172 may be selected by considering a distance between the second electrode pad and the first electrode pad of the package body on which the semiconductor device 1100 is mounted.

As an example, the minimum distance between the second electrode pad and the first electrode pad of the package body may be provided at a minimum of 125 micrometers, and may be provided at a maximum of 200 micrometers. In this case, considering the process error, the distance d between the first bonding pad 1171 and the second bonding pad 1172 may be provided 125 micrometers or more and 300 micrometers or less, for example.

In addition, the distance d between the first bonding pad 1171 and the second bonding pad 1172 should be disposed greater than 125 micrometers so that a minimum space may be secured such that a short circuit does not occur between the first bonding pad 1171 and the second bonding pad 1172 of the semiconductor device, and a light emitting area for improving light extraction efficiency may be secured, thereby increasing the light intensity Po of the semiconductor device 1100.

In addition, the distanced between the first bonding pad 1171 and the second bonding pad 1172 should be provided equal to or less than 300 micrometers so that the first electrode pad and the second electrode pad of the semiconductor device package, and the first bonding pad 1171 and the second bonding pad 1172 of the semiconductor device may be bonded with sufficient bonding force, and electrical characteristics of the semiconductor device 1100 may be secured.

The minimum distance d between the first bonding pad 1171 and the second bonding pad 1172 may be disposed greater than 125 micrometers in order to secure the optical characteristics, and may be disposed smaller than 300 micrometers in order to ensure the reliability by the electrical characteristic and the bonding force.

The embodiment provides the minimum distance d of not less than 125 micrometers and not more than 300 micrometers, but is not limited thereto, and in order to improve electrical characteristics or reliability of the semiconductor device package, it may be arranged to be smaller than 125 micrometers, and in order to improve optical characteristics, it may be arranged greater than 300 micrometers.

According to the embodiment, the first bonding pad 1171 may be disposed spaced apart by a length of b1 from the adjacent side surface disposed in the major axis direction of the semiconductor device 1100, and the first bonding pad 1171 may be disposed spaced apart by a length of a1 or a3 from the adjacent side surface disposed in the minor axis direction of the semiconductor device 1100. Herein, the a1 or a3 may be equal to or greater than 40 micrometers, for example, and the b1 may be provided equal to or greater than 100 micrometers.

In addition, the second bonding pad 1172 may be disposed spaced apart by a length of b2 from the adjacent side surface disposed in the major axis direction of the semiconductor device 1100, and the second bonding pad 1172 may be disposed spaced apart by a length of a2 or a4 from the adjacent side surface disposed in the minor axis direction of the semiconductor device 1100. Herein, the a2 or a4 may be equal to or greater than 40 micrometers, for example, and the b2 may be provided equal to or greater than 100 micrometers.

According to the embodiment, the a1, a2, a3, and a4 may be provided with the same value. In addition, the b1 and b2 may be provided with the same value. Also, according to another embodiment, at least two of the a1, a2, a3, and a4 may have different values, and the b1 and b2 may have different values.

In addition, according to the semiconductor device 1100 of the embodiment, as shown in FIG. 27, the third reflective layer 1163 may be disposed between the first bonding pad 1171 and the second bonding pad 1172. For example, the length d of the third reflective layer 1163 along the major axis direction of the semiconductor device 1100 may be disposed to correspond to the distance between the first bonding pad 1171 and the second bonding pad 1172. Also, the third reflective layer 1163 may be provided at a length of f along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be provided equal to or greater than 10% and equal to or smaller than 25% of the entire upper surface of the semiconductor device 1100, for example.

When the area of the third reflective layer 1163 is 10% or more of the entire upper surface of the semiconductor device 1100, the package body disposed under the semiconductor device can be prevented from discolored or cracked, and when the area of the third reflective layer 1163 is 25% or less, it is advantageous to secure the light extraction efficiency to emit light to the six surfaces of the semiconductor device.

In addition, according to another embodiment, it may not be limited thereto, in order to secure to increase the light extraction efficiency, the area of the third reflective layer 1163 may be disposed more than 0% to less than 10% of the entire upper surface of the semiconductor device 1100, and the area of the third reflective layer 1163 may be disposed more than 25% to less than 100% of the entire upper surface of the semiconductor device 1100 in order to prevent from discoloration or cracking in the package body.

According to the semiconductor device 1100 of the embodiment, light generated in the light emitting structure 1100 may not be transmitted and emitted through a first region provided between the first bonding pad 1171 and the second bonding pad 1172. Here, the first region may be a region corresponding to the minimum distance d between the first bonding pad 1171 and the second bonding pad 1172. Also, the first region may correspond to the length d of the third reflective layer 1163 disposed in the major axis direction of the semiconductor device.

In addition, light generated in the light emitting structure 1110 may be transmitted and emitted through a second region provided between side surfaces of the semiconductor device 1100 in the major axis direction and the first bonding pad 1171 or the second bonding pad 1172 which are adjacent to the side surfaces in the major axis direction. At this time, the second region may be a region corresponding to the b1 and b2.

In addition, light generated in the light emitting structure may be transmitted and emitted through a third region provided between side surfaces of the semiconductor device 1100 in the minor axis direction and the first bonding pad 1171 or the second bonding pad 1172 which are adjacent to the side surfaces in the minor axis. At this time, the third region may be a region corresponding to the a1, a2, a3, and a4.

For example, in the case where a length of the semiconductor device 1100 according to the embodiment in the major axis direction is 1250 micrometers, and a length of the semiconductor device 1100 according to the embodiment in the minor axis direction is 750 micrometers, the above mentioned variables may have the following values.

When the area of the first bonding pad 1171 and the area of the second bonding pad 1172 are equal, and if the sum thereof is 30%, x1:y1=1:2 and the value of d is provided of 125 micrometers, the value of x1 may be provided of 265 micrometers, and the value of y1 may be provided of 530 micrometers. Thus, the value of a1 may be less than or equal to 110 micrometers for example, and the value of b1 may be provided as less than or equal to 300 micrometers as an example.

That is, the sum of the area of the first bonding pad 1171 and the area of the second bonding pad 1172 is determined according to the size of the semiconductor device 1100, and if the width/length ratio of the first bonding pad 1171 and the value of d are determined, the remaining variables can be calculated. Accordingly, the upper limit values of a1, a2, a3, a4, b1, b2, and the like are not indicated.

According to the embodiment, the size of the first reflective layer 1161 may be provided several micrometers larger than the size of the first bonding pad 1171. For example, the area of the first reflective layer 1161 may be provided sufficiently large to cover the area of the first bonding pad 1171. The length of one side of the first reflective layer 1161 may be provided greater than the length of one side of the first bonding pad 1171 by about 4 micrometers to about 10 micrometers, for example, in consideration of the process error.

In addition, the size of the second reflective layer 1162 may be provided several micrometers larger than the size of the second bonding pad 1172. For example, the area of the second reflective layer 1162 may be provided sufficiently large to cover the area of the second bonding pad 1172. The length of one side of the second reflective layer 1162 may be provided greater than the length of one side of the second bonding pad 1172 by about 4 micrometers to about 10 micrometers, for example, in consideration of the process error.

According to the embodiment, the light emitted from the light emitting structure 1100 may be reflected by the first reflective layer 1161 and the second reflective layer 1162 without being incident on the first bonding pad 1171 and the second bonding pad 1172. Accordingly, light loss of the light that is generated and emitted from the light emitting structure 1110, by being incident on the first bonding pad 1171 and the second bonding pad 1172, can be minimized.

In addition, according to the semiconductor device 1100 of the embodiment, since the third reflective layer 1163 is disposed between the first bonding pad 1171 and the second boding pad 1172, the light may be prevented from being emitted between the first bonding pad 1171 and the second bonding pad 1172.

As described above, the semiconductor device 1100 according to the embodiment can be mounted, for example, in a flip chip bonding manner and provided in the form of a semiconductor device package. At this time, when the package body on which the semiconductor device 1100 is mounted is provided with resin or the like, the package body may be discolored or cracked due to strong short wavelength light emitted from the semiconductor device 1100, in a region under the semiconductor device 1100.

However, according to the semiconductor device 1100 of the embodiment, since light can be prevented from being emitted between the regions where the first bonding pad 1171 and the second bonding pad 1172 are disposed, the package body that is disposed under the semiconductor device 1100 can be prevented from being discolored or cracked.

In addition, according to the semiconductor device 1100 of the embodiment, the minimum distance between the first electrode pad and the second electrode pad provided in the package body is taken into consideration, so that the width d of the third reflective layer 1163 may be selected to be minimized. By maximally ensuring the spacing b1 and b2 provided between the first bonding pad 1171 or the second bonding pad 1172 adjacent to the side surface of the semiconductor device 1100 in the major axis direction, the amount of light emitted to the sides of the first bonding pad 1171 and the second bonding pad 1172 can be improved.

According to the embodiment, the light generated in the light emitting structure 1100 can be transmitted and emitted in an area of more than 20% of the upper surface of the semiconductor device 1100 on which the first bonding pad 1171, the second bonding pad 1172, and the third reflective layer 1163 are disposed.

Thus, according to the embodiment, since the amount of light emitted in the six surface direction of the semiconductor device 1100 is increased, the light extraction efficiency can be improved and the light intensity Po can be increased. In addition, it is possible to prevent the package body disposed close to the lower surface of the semiconductor device 1100 from being discolored or cracked.

Hereinafter, a method of manufacturing a semiconductor device according to an embodiment will be described with reference to the accompanying drawings. In describing the method of manufacturing the semiconductor device according to the embodiment, description overlapping with those described above may be omitted.

First, according to the method of manufacturing the semiconductor device of the embodiment, as shown in FIGS. 28a and 28b, a light emitting structure 1100 and a current spreading layer 1120 may be formed on a substrate 1105. FIG. 28a is a plan view showing a shape of the light emitting structure 1100 and the current spreading layer 1120 formed according to the method of manufacturing the semiconductor device of the embodiment, and FIG. 28b is a process sectional view taken along line A-A of the semiconductor device shown in FIG. 28a.

According to the embodiment, the light emitting structure 1100 may be formed on the substrate 1105. For example, the first conductivity type semiconductor layer 1111, the active layer 1112, and the second conductivity type semiconductor layer 1113 may be formed on the substrate 1105.

Then, the current spreading layer 1120 may be formed on a portion of the second conductivity type semiconductor layer 1113. For example, the current spreading layer 1120 may be formed in a shape of a plurality of lines.

Next, as shown in FIGS. 29a and 29b, an ohmic contact layer 1130 may be formed. FIG. 29a is a plan view showing a shape of the ohmic contact layer 1130 formed according to the method of manufacturing the semiconductor device of the embodiment, and FIG. 29b is a process sectional view taken along line A-A of the semiconductor device shown in FIG. 29a.

According to the embodiment, the ohmic contact layer 1130 may be formed on the second conductivity type semiconductor layer 1113. The ohmic contact layer 1130 may be formed on the current spreading layer 1120 as well. Meanwhile, according to the embodiment, a portion of the first conductivity type semiconductor layer 1111 may be formed to be exposed through a mesa etching process. The ohmic contact layer 1130 may comprise a mesa opening M exposing the first conductivity type semiconductor layer 1111 by a mesa etching. For example, the mesa opening M may be provided in a shape of a plurality of lines. The mesa opening M may also be referred to as a recess.

Then, as shown in FIGS. 30a and 30b, a first electrode 1141 and a second electrode 1142 may be formed. FIG. 30a is a plan view showing a shape of the first electrode 1141 and the second electrode 1142 formed according to the method of manufacturing the semiconductor device of the embodiment, FIG. 30b is a process sectional view taken along line A-A of the semiconductor device shown in FIG. 30a.

According to the embodiment, the first electrode 1141 may be formed on the first conductivity type semiconductor layer 1111 exposed by the mesa opening M. The first electrode 1141 may be formed in a shape of line, for example. In addition, the first electrode 1141 may comprise an N region having a relatively larger area than other regions having a shape of line. The N region of the first electrode 1141 may be electrically connected with a first bonding pad 1171 to be formed later.

In addition, the second electrode 1142 may be formed on the current spreading layer 1120. The second electrode 1142 may be formed in a shape of line, for example. In addition, the second electrode 1142 may comprise a P region having a relatively larger area than other regions having a shape of line. The P region of the second electrode 1142 may be electrically connected with a second bonding pad 1172 to be formed later.

Next, as shown in FIGS. 31a and 31b, a passivation layer 1150 may be formed. FIG. 31a is a plan view showing a shape of the passivation layer 1150 formed according to the method of manufacturing the semiconductor device of the embodiment, and FIG. 31b is a process sectional view taken along line A-A of the semiconductor device shown in FIG. 31a.

According to the embodiment, the passivation layer 1150 may be formed on the first electrode 1141 and the second electrode 1142. The passivation layer 1150 may comprise a plurality of openings. For example, the passivation layer 1150 may comprise a plurality of first openings h1. A portion of the P region of the second electrode 1142 may be exposed through the plurality of first openings h1. In addition, the passivation layer 1150 may comprise a plurality of second openings 112. A portion of the N region of the first electrode 1141 may be exposed through the plurality of second openings h2.

Then, as shown in FIGS. 32a and 32b, a reflective layer 1160 may be formed. FIG. 32a is a plan view showing a shape of the reflective layer 1160 formed according to the method of manufacturing the semiconductor device of the embodiment, and FIG. 32b is a process sectional view taken along line A-A of the semiconductor device shown in FIG. 32a.

According to the embodiment, the reflective layer 1160 may be formed on the passivation layer 1150. The reflective layer 1160 may comprise a first reflective layer 1161, a second reflective layer 1162, and a third reflective layer 1163. The third reflective layer 1163 may be formed between the first reflective layer 1161 and the second reflective layer 1162.

The first reflective layer 1161 may comprise a plurality of fourth openings h4. For example, the plurality of fourth openings h4 may be provided corresponding to positions where the plurality of second openings h2 are formed. A portion of the N region of the first electrode 1141 may be exposed through the plurality of fourth openings h4 and the plurality of second openings h2.

In addition, the second reflective layer 1162 may comprise a plurality of third openings h3. For example, the plurality of third openings h3 may be provided corresponding to positions where the plurality of first openings h1 are formed. The P region of the second electrode 1142 may be exposed through the plurality of third openings h3 and the plurality of first openings h1.

In addition, the third reflective layer 1163 may be disposed on the first electrode 1141 and the second electrode 1142. The third reflective layer 1163 may be disposed between the first reflective layer 1161 and the second reflective layer 1162. For example, the third reflective layer 1163 may be connected with the first reflective layer 1161. Also, the third reflective layer 1163 may be connected with the second reflective layer 1162. The third reflective layer 1163 may be physically in direct contact with the first reflective layer 1161 and the second reflective layer 1162.

Then, as shown in FIGS. 33a and 33b, a first bonding pad 1171 and a second bonding pad 1172 may be formed. FIG. 33a is a plan view showing shape of the first bonding pad 1171 and the second bonding pad 1172 formed according to the method of manufacturing the semiconductor device of the embodiment, and FIG. 33b is a process sectional view taken along line A-A of the semiconductor device shown in FIG. 33a.

According to the embodiment, the first bonding pad 1171 and the second electrode pad 1172 may be formed in the shape shown in FIG. 33a. The first bonding pad 1171 may be disposed on the first reflective layer 1161. The second electrode pad 1172 may be disposed on the second reflective layer 1162.

A lower surface of the first bonding pad 1171 may be in contact with an upper surface of the first electrode 1141. A portion of the first bonding pad 1171 may be disposed in the fourth opening h4 and the second opening h2 to contact a portion of the N region of the first electrode 1141.

A lower surface of the second electrode pad 1172 may be in contact with an upper surface of the second electrode 1142. A portion of the second electrode pad 1172 may be disposed in the third opening h3 and the first opening h1 to contact a portion of the P region of the second electrode 1142.

According to the embodiment, when the power is applied to the first bonding pad 1171 and the second electrode pad 1172, the light emitting structure 1100 can emit light.

The semiconductor device according to the embodiment may be connected to an external power in a flip chip bonding manner. For example, an upper surface of the first bonding pad 1171 and an upper surface of the second electrode pad 1172 may be arranged to be attached to a submount, a lead frame, a circuit board, or the like.

When the semiconductor device according to the embodiment is mounted by a flip-chip bonding method and is implemented as a semiconductor device package, the light provided by the light emitting structure 1100 may be emitted through the substrate 1105. Light emitted from the light emitting structure 1100 may be reflected by the first reflective layer 1161 and the second reflective layer 1162, and may be emitted toward the substrate 1105.

Also, the light emitted from the light emitting structure 1100 may be emitted in the lateral direction of the light emitting structure 1100. Also, the light emitted from the light emitting structure 1100 may be transmitted to the outside through a region where the first bonding pad 1171 and the second bonding pad 1172 are not provided among the surfaces on which the first bonding pad 1171 and the second bonding pad 1172 are disposed. The pad 1172 may be discharged to the outside through an area not provided.

Specifically, the light emitted from the light emitting structure 1100 may be transmitted to the outside through a region where the first reflective layer 1161, the second reflective layer 1172, and the second reflective layer 1173 are not provided among the surface on which the first bonding pad 1171 and the second bonding pad 1172 are disposed. Accordingly, the semiconductor device 1100 according to the embodiment can emit light in six directions surrounding the light emitting structure 1100, and the light intensity can be remarkably improved.

According to the semiconductor device 1100 of the embodiment, when viewed from above the semiconductor device 1100, a sum of the areas of the first bonding pad 1171 and the second bonding pad 1172 may be provided equal to or smaller than 60% of a total area of an upper surface of the semiconductor device 1100 on which the first bonding pad 1171 and the second bonding pad 1172 are disposed.

For example, the total area of the upper surface of the semiconductor device 1100 may correspond to an area defined by a lateral length and a longitudinal length of the lower surface of the first conductivity type semiconductor layer 1111 of the light emitting structure 1100. Also, the total area of the upper surface of the semiconductor device 1100 may correspond to the area of the upper surface or the lower surface of the substrate 1105.

By providing the sum of the areas of the first bonding pad 1171 and the second bonding pad 1172 equal to or smaller than 60% of the total area of the semiconductor device 1100, the amount of light emitted to the surface on which the first bonding pad 1171 and the second bonding pad 1172 are disposed can be increased. Thus, according to the embodiment, since the amount of light emitted through the six surface direction of the semiconductor device 1100 is increased, the light extraction efficiency can be improved and the light intensity Po can be increased.

In addition, when viewed from above the semiconductor device, the sum of the area of the first bonding pad 1171 and the area of the second bonding pad 1172 may be provided equal to or greater than 30% of the total area of the semiconductor device 1100.

By providing the sum of the areas of the first bonding pad 1171 and the second bonding pad 1172 equal to or greater than 30% of the total area of the semiconductor device 1100, stable mounting can be performed through the first bonding pad 1171 and the second bonding pad 1172.

In the semiconductor device 1100 according to the embodiment, the sum of the areas of the first bonding pad 1171 and the second bonding pad 1172 can be selected to be equal to or greater than 30% and equal to or smaller than 60% of the total area of the semiconductor device 1100 in consideration of light extraction efficiency and securing stability of bonding.

That is, when the sum of the areas of the first bonding pad 1171 and the second bonding pad 1172 is 30% or more to 100% or less of the total area of the semiconductor device 1100, the electrical characteristics can be ensured and the bonding force to be mounted on the semiconductor device package can be secured so that stable mounting can be performed.

In addition, when the sum of the areas of the first bonding pad 1171 and the second bonding pad 1172 is more than 0% to 60% or less of the total area of the semiconductor device 1100, the light extraction efficiency of the semiconductor device 1100 can be improved and the light intensity Po can be increased by increasing the amount of light emitted to the surface on which the first bonding pad 1171 and the second bonding pad 1172 are disposed.

In order to secure the electrical characteristics of the semiconductor device 1100 and the bonding force to be mounted on the semiconductor device package, and increase the light intensity, the sum of the areas of the first bonding pad 1171 and the second bonding pad 1172 is selected to be 30% or more to 60% or less of the total area of the semiconductor device 1100.

In addition, according to another embodiment, it is not limited thereto, in order to secure the electrical characteristics and bonding force of the semiconductor device 1100, the sum of the areas of the first bonding pad 1171 and the second bonding pad 1172 may be selected to be more than 60% to 100% or less, and in order to increase the light intensity, the sum of the areas of the first bonding pad 1171 and the second bonding pad 1172 may be selected to be more than 0% and less than 30%.

In addition, according to the semiconductor device 1100 of the embodiment, as shown in FIG. 27, the third reflective layer 1163 may be disposed between the first bonding pad 1171 and the second bonding pad 1172. For example, the length d of the third reflective layer 1163 along the major axis direction of the semiconductor device 1100 may be disposed to correspond to the distance between the first bonding pad 1171 and the second bonding pad 1172. Also, the third reflective layer 1163 may be provided at a length off along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be provided equal to or greater than 10% and equal to or smaller than 25% of the entire upper surface of the semiconductor device 1100, for example.

When the area of the third reflective layer 1163 is 10% or more of the entire upper surface of the semiconductor device 1100, the package body disposed under the semiconductor device can be prevented from discolored or cracked, and when the area of the third reflective layer 1163 is 25% or less, it is advantageous to secure the light extraction efficiency to emit light to the six surfaces of the semiconductor device.

In addition, according to another embodiments, it may not be limited thereto. In order to secure to increase the light extraction efficiency, the area of the third reflective layer 1163 may be disposed more than 0% to less than 10% of the entire upper surface of the semiconductor device 1100, and the area of the third reflective layer 1163 may be disposed more than 25% and less than 100% of the entire upper surface of the semiconductor device 1100 in order to prevent from discoloration or cracking in the package body.

According to the semiconductor device 1100 of the embodiment, light generated in the light emitting structure 1100 may not be transmitted and emitted through a first region provided between the first bonding pad 1171 and the second bonding pad 1172. In this case, the first region may be a region corresponding to an interval between the first bonding pad 1171 and the second bonding pad 1172. Also, the first region may correspond to the length d of the third reflective layer 1163 disposed in the major axis direction of the semiconductor device.

In addition, light generated in the light emitting structure 1110 may be transmitted and emitted through a second region provided between side surfaces of the semiconductor device 1100 in the major axis direction and the first bonding pad 1171 or the second bonding pad 1172 which are adjacent to the side surfaces in the major axis direction. At this time, the second region may be a region corresponding to the b1 and b2.

In addition, light generated in the light emitting structure may be transmitted and emitted through a third region provided between side surfaces of the semiconductor device 1100 in the minor axis direction and the first bonding pad 1171 or the second bonding pad 1172 which are adjacent to the side surfaces in the minor axis.

In addition, according to the semiconductor device 1100 of the embodiment, since the third reflective layer 1163 is disposed between the first bonding pad 1171 and the second bonding pad 1172, the light may be prevented from being emitted between the first bonding pad 1171 and the second bonding pad 1172.

As described above, the semiconductor device 1100 according to the embodiment can be mounted, for example, in a flip chip bonding manner and provided in the form of a semiconductor device package. At this time, when the package body on which the semiconductor device 1100 is mounted is provided with resin or the like, the package body may be discolored or cracked due to strong short wavelength light emitted from the semiconductor device 1100, in a region under the semiconductor device 1100.

However, according to the semiconductor device 1100 of the embodiment, since light can be prevented from being emitted between the regions where the first bonding pad 1171 and the second bonding pad 1172 are disposed, the package body that is disposed under the semiconductor device 1100 can be prevented from being discolored or cracked.

In addition, according to the semiconductor device 1100 of the embodiment, the interval between the first electrode pad and the second electrode pad provided in the package body is taken into consideration, so that the width d of the third reflective layer 1163 may be selected to be minimized. By maximally ensuring the spacing b1 and b2 provided between the first bonding pad 1171 or the second bonding pad 1172 adjacent to the side surface of the semiconductor device 1100 in the major axis direction, the amount of light emitted to the sides of the first bonding pad 1171 and the second bonding pad 1172 can be improved.

According to the embodiment, the light generated in the light emitting structure 1100 can be transmitted and emitted in an area of more than 20% of the upper surface of the semiconductor device 1100 on which the first bonding pad 1171, the second bonding pad 1172, and the third reflective layer 1163 are disposed.

Thus, according to the embodiment, since the amount of light emitted in the six surface direction of the semiconductor device 1100 is increased, the light extraction efficiency can be improved and the light intensity Po can be increased. In addition, it is possible to prevent the package body disposed close to the lower surface of the semiconductor device 1100 from being discolored or cracked.

The semiconductor device and the method of manufacturing the semiconductor device of the embodiments can provide a flip chip bonding type semiconductor device and the method of manufacturing the semiconductor device that can be applied to products requiring high voltage and high output.

Next, another example of a semiconductor device according to an embodiment of the present invention will be described with reference to FIGS. 34 to 36. In describing the semiconductor device of the embodiment with reference to FIGS. 34 to 36, description overlapping with those described above may be omitted.

FIG. 34 is a plan view showing still another example of the semiconductor device according to the embodiment of the present invention, FIG. 35 is a sectional view taken along line B-B of the semiconductor device shown in FIG. 34, and FIG. 36 is a view showing an example of an arrangement of a first electrode and a second electrode applied to another example of the semiconductor device according to the embodiment of the present invention.

Meanwhile, in order to facilitate understanding, in FIG. 34, a first electrode 1141 electrically connected to a first bonding pad 1171 and a second electrode 1142 electrically connected to a second bonding pad 1172 are illustrated to be seen, even though which are disposed under the first bonding pad 1171 and the second bonding pad 1172.

The semiconductor device 1100 according to the embodiment may comprise a light emitting structure 1100 disposed on a substrate 1105, as shown in FIGS. 34 to 36.

The light emitting structure 1100 may comprise a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

According to the embodiment, the first conductivity type semiconductor layer 1111 may be provided as an n-type semiconductor layer, and the second conductivity type semiconductor layer 1113 may be provided as a p-type semiconductor layer. Of course, according to another embodiment, the first conductivity type semiconductor layer 1111 may be provided as a p-type semiconductor layer, and the second conductivity type semiconductor layer 1113 may be provided as an n-type semiconductor layer.

Hereinafter, for convenience of description, a description will be given based on a case in which the first conductivity type semiconductor layer 1111 is provided as an n-type semiconductor layer and the second conductivity type semiconductor layer 1113 is provided as a p-type semiconductor layer.

The semiconductor device 1100 according to the embodiment may comprise a current spreading layer 1120 and an ohmic contact layer 1130 as shown in FIG. 35. The current spreading layer 1120 and the ohmic contact layer 1130 can improve current diffusion to increase light output. An arrangement and shape of the current spreading layer 1120 and the ohmic contact layer 1130 will be further described later while explaining a method of manufacturing a semiconductor device according to an embodiment.

For example, the current spreading layer 1120 may be provided with an oxide, a nitride, or the like. The current spreading layer 1120 can improve luminous flux by preventing current concentration under the second electrode 1142 and improving the electrical reliability.

In addition, the ohmic contact layer 1130 may comprise at least one selected from a group including a metal, a metal oxide, and a metal nitride. The ohmic contact layer 1130 may comprise a light transmitting material.

The semiconductor device 1100 according to the embodiment may comprise a first passivation layer 1150, as shown in FIGS. 34 to 36.

The first passivation layer 1150 may comprise a plurality of first openings h1 that exposes the ohmic contact layer 1130. The current spreading layer 1120 may be disposed under the region provided with the plurality of first openings h1.

In addition, the first passivation layer 1150 may comprise a plurality of second openings h2 that expose the first conductivity type semiconductor layer 1111.

The semiconductor device 1100 according to the embodiment may comprise a first electrode 1141 and a second electrode 1142, as shown in FIGS. 34 to 36.

The first electrode 1141 may be electrically connected to the first conductivity type semiconductor layer 1111. The first electrode 1141 may be disposed on the first conductivity type semiconductor layer 1111. For example, according to the semiconductor device 1100 of the embodiment, the first electrode 1141 may be disposed on an upper surface of the first conductivity type semiconductor layer 1111 that is exposed by removing a portion of the second conductivity type semiconductor layer 1113 and a portion of the active layer 1112.

The first electrode 1141 may be electrically connected to the upper surface of the first conductivity type semiconductor layer 1111 through a second opening h2 provided in the first passivation layer 1150. For example, the first electrode 1141 may be in contact with the upper surface of the first conductivity type semiconductor layer 1111 in a plurality of N regions, as shown in FIGS. 34 to 36.

The second electrode 1142 may be electrically connected to the second conductivity type semiconductor layer 1113. The second electrode 1142 may be disposed on the second conductivity type semiconductor layer 1113. According to the embodiment, the current spreading layer 1120 may be disposed between the second electrode 1142 and the second conductivity type semiconductor layer 1113.

The second electrode 1142 may be electrically connected to the upper surface of the second conductivity type semiconductor layer 1113 through a first opening h1 provided in the first passivation layer 1150. For example, the second electrode 1142 may be electrically connected to the second conductivity type semiconductor layer 1113 in a plurality of P regions, as shown in FIGS. 34 to 36.

According to the embodiment, as shown in FIGS. 34 to 36, the first electrode 1141 and the second electrode 1142 may be disposed spaced apart from each other.

In addition, the semiconductor device 1100 according to the embodiment may comprise a second passivation layer 1155, as shown in FIGS. 34 to 36. The second passivation layer 1155 may be disposed on the first electrode 1141 and the second electrode 1142. The second passivation layer 1155 may be disposed on the first passivation layer 1150.

The second passivation layer 1155 may comprise a fourth opening h4 exposing an upper surface of the first electrode 1141. The second passivation layer 1155 may comprise a plurality of fourth openings h4 exposing a plurality of NB regions of the first electrode 1141.

The second passivation layer 1155 may comprise a third opening h3 exposing an upper surface of the second electrode 1142. The second passivation layer 1155 may comprise a plurality of third openings h3 exposing a plurality of PB regions of the second electrode 1142.

In addition, the semiconductor device 1100 according to the embodiment may comprise a reflective layer 1160, as shown in FIGS. 34 to 36. The reflective layer 1160 may comprise a first reflective layer 1161, a second reflective layer 1162, and a third reflective layer 1163. The reflective layer 1160 may be disposed on the second passivation layer 1155. The reflective layer 1160 may be disposed on the first electrode 1141 and the second electrode 1142.

The first reflective layer 1161 may be disposed on the first electrode 1141 and the second electrode 1142. The first reflective layer 1161 may comprise a sixth opening h6 exposing an upper surface of the first electrode 1141. The first reflective layer 1161 may comprise a plurality of sixth openings h6 exposing a plurality of NB regions of the first electrode 1141. The first reflective layer 1161 may comprise a sixth opening h6 provided corresponding to a region where the fourth opening h4 of the second passivation layer 1155 is formed.

The second reflective layer 1162 may be disposed on the first electrode 1141 and the second electrode 1142. The second reflective layer 1162 may be disposed spaced apart from the first reflective layer 1161. The second reflective layer 1162 may comprise a fifth opening 115 exposing an upper surface of the second electrode 1142. The second reflective layer 1162 may comprise a plurality of fifth openings h5 exposing a plurality of PB regions of the second electrode 1142. The second reflective layer 1162 may comprise a fifth opening h5 provided corresponding to a region where the third opening h3 of the second passivation layer 1155 is formed.

In addition, the third reflective layer 1163 may be disposed on the first electrode 1141 and the second electrode 1142. The third reflective layer 1163 may be disposed between the first reflective layer 1161 and the second reflective layer 1162. For example, the third reflective layer 1163 may be connected to the first reflective layer 1161. Also, the third reflective layer 1163 may be connected to the second reflective layer 1162. The third reflective layer 1163 may be physically in direct contact with the first reflective layer 1161 and the second reflective layer 1162.

The reflective layer 1160 may be provided as an insulating reflective layer. For example, the reflective layer 1160 may be provided as a Distributed Bragg Reflector (DBR) layer or an Omni Directional Reflector (ODR) layer.

According to the embodiment, the first reflective layer 1161 may be disposed on a side surface and a portion of an upper surface of the first electrode 1141 so as to expose the upper surface of the first electrode 1141. The second reflective layer 1162 may be disposed on a side surface and a portion of an upper surface of the second electrode 1142 to expose the upper surface of the second electrode 1142.

Accordingly, the first reflective layer 1161 and the second reflective layer 1162 may reflect light emitted from the active layer 1112 of the light emitting structure 1110, thereby minimizing light absorption from a first bonding pad 1161 and a second bonding pad 1162, thereby improving luminous intensity Po.

For example, the first reflective layer 1161 and the second reflective layer 1162 may be made of an insulating material, and may be formed of a material having a high reflectivity, for example, such as a DBR structure in order to reflect light emitted from the active layer 1112. Also, the third reflective layer 1163 may be provided with a DBR structure.

The first reflective layer 1161 and the second reflective layer 1162 may have a DBR structure in which materials having different refractive indexes are repeatedly arranged. For example, the first reflective layer 1161 and the second reflective layer 1162 may be disposed in a single layer or a stacked structure comprising at least one of $TiO_2$, $SiO_2$, $Ta_2O_5$, and $HfO_2$.

In addition, according to another embodiment, it is not limited thereto, the first reflective layer 1161 and the second reflective layer 1162 may be freely provided in various configurations in order to adjust the reflectivity of the light emitted from the active layer 1112 according to the wavelength emitted from the active layer 1112.

The semiconductor device 1100 according to the embodiment may comprise a first bonding pad 1171 disposed on the first reflective layer 1161, as shown in FIGS. 34 to 36. In addition, the semiconductor device 1100 according to the embodiment may comprise a second bonding pad 1172 disposed on the second reflective layer 1162. The second bonding pad 1172 may be disposed spaced apart from the first bonding pad 1171.

The first bonding pad 1171 may contact the upper surface of the first electrode 1141 through the sixth opening h6 provided in the first reflective layer 1161 in a plurality of NB regions. The second bonding pad 1172 may contact the upper surface of the second electrode 1142 through the fifth opening h5 provided in the second reflective layer 1162 in a plurality of PB regions.

According to the semiconductor device 1100 of the embodiment, the first bonding pad 1171 and the first electrode 1141 can be contacted in a plurality of regions. Also, the second bonding pad 1172 and the second electrode 1142 can be contacted in a plurality of regions. Thus, according to the embodiment, power can be supplied through a plurality of regions, so that current spreading effect is occurred according to increase of the contact area and dispersion of the contact region, and there is an advantage that operation voltage can be reduced.

The semiconductor device according to the embodiment may be connected to an external power in a flip chip bonding manner. For example, in manufacturing a semiconductor device package, the upper surface of the first bonding pad 1171 and the upper surface of the second electrode pad 1172 may be disposed to be attached to a submount, a lead frame, or a circuit board.

When the semiconductor device according to the embodiment is mounted by a flip-chip bonding method and is implemented as a semiconductor device package, the light provided by the light emitting structure 1100 may be emitted through the substrate 1105. The light emitted from the light emitting structure 1100 may be reflected by the first reflective layer 1161 and the second reflective layer 1162, and may be emitted toward the substrate 1105.

Also, the light emitted from the light emitting structure 1100 may be emitted in the lateral direction of the light emitting structure 1100. Also, the light emitted from the light emitting structure 1100 may be transmitted to the outside through a region where the first bonding pad 1171 and the second bonding pad 1172 are not provided among the surface on which the first bonding pad 1171 and the second bonding pad 1172 are disposed.

Specifically, the light emitted from the light emitting structure 1100 may be transmitted to the outside through a region where the first reflective layer 1161, the second reflective layer 1162, and the third reflective layer 1163 are not provided among the surface on which the first bonding pad 1171 and the second bonding pad 1172 are disposed.

Accordingly, the semiconductor device 1100 of the embodiment can emit light in six directions surrounding the light emitting structure 1100, and the light intensity can be remarkably improved.

In addition, according to the semiconductor device and the semiconductor device package of the embodiment, since the first bonding pad 1171 and the second electrode pad 1172 having a large area can be directly bonded to the circuit board providing power, the chip bonding process can be performed easily and stably.

Meanwhile, according to the semiconductor device 1100 of the embodiment, as described with reference to FIG. 27, when viewed from above the semiconductor device 1100, a sum of the areas of the first bonding pad 1171 and the second bonding pad 1172 may be provided equal to or smaller than 60% of a total area of an upper surface of the semiconductor device 1100 on which the first bonding pad 1171 and the second bonding pad 1172 are disposed.

For example, the total area of the upper surface of the semiconductor device 1100 may correspond to an area defined by a lateral length and a longitudinal length of the lower surface of the first conductivity type semiconductor layer 1111 of the light emitting structure 1100. Also, the total area of the upper surface of the semiconductor device 1100 may correspond to the area of the upper surface or the lower surface of the substrate 1105.

By providing the sum of the areas of the first bonding pad 1171 and the second bonding pad 1172 equal to or smaller than 60% of the total area of the semiconductor device 1100, the amount of light emitted to the surface on which the first bonding pad 1171 and the second bonding pad 1172 are disposed can be increased. Thus, according to the embodiment, since the amount of light emitted through the six surface direction of the semiconductor device 1100 is increased, the light extraction efficiency can be improved and the light intensity Po can be increased.

In addition, when viewed from above the semiconductor device, the sum of the area of the first bonding pad 1171 and the area of the second bonding pad 1172 may be provided equal to or greater than 30% of the total area of the semiconductor device 1100.

By providing the sum of the areas of the first bonding pad 1171 and the second bonding pad 1172 equal to or greater than 30% of the total area of the semiconductor device 1100, stable mounting can be performed through the first bonding pad 1171 and the second bonding pad 1172.

In the semiconductor device 1100 according to the embodiment, the sum of the areas of the first bonding pad 1171 and the second bonding pad 1172 can be selected to be equal to or greater than 30% and equal to or smaller than 60% of the total area of the semiconductor device 1100 in consideration of light extraction efficiency and securing stability of bonding.

That is, when the sum of the areas of the first bonding pad 1171 and the second bonding pad 1172 is 30% or more to 100% or less of the total area of the semiconductor device 1100, the electrical characteristics can be ensured and the bonding force to be mounted on the semiconductor device package can be secured so that stable mounting can be performed.

In addition, when the sum of the areas of the first bonding pad 1171 and the second bonding pad 1172 is more than 0% to 60% or less of the total area of the semiconductor device 1100, the light extraction efficiency of the semiconductor device 1100 can be improved and the light intensity Po can be increased by increasing the amount of light emitted to the surface on which the first bonding pad 1171 and the second bonding pad 1172 are disposed.

In order to secure the electrical characteristics of the semiconductor device 1100 and the bonding force to be mounted on the semiconductor device package, and increase the light intensity, the sum of the areas of the first bonding pad 1171 and the second bonding pad 1172 is selected to be 30% or more to 60% or less of the total area of the semiconductor device 1100.

In addition, according to another embodiment, it is not limited thereto, in order to secure the electrical characteristics and bonding force of the semiconductor device 1100, the sum of the areas of the first bonding pad 1171 and the second bonding pad 1172 may be selected to be more than 60% to 100% or less, and in order to increase the light intensity, the sum of the areas of the first bonding pad 1171 and the second bonding pad 1172 may be selected to be more than 0% and less than 30%.

In addition, according to the semiconductor device 1100 of the embodiment, as shown in FIG. 27, the third reflective layer 1163 may be disposed between the first bonding pad 1171 and the second bonding pad 1172. For example, the length d of the third reflective layer 1163 along the major axis direction of the semiconductor device 1100 may be disposed to correspond to the distance between the first bonding pad 1171 and the second bonding pad 1172. Also, the third reflective layer 1163 may be provided at a length of f along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be provided equal to or greater than 10% and equal to or smaller than 25% of the entire upper surface of the semiconductor device 1100, for example.

When the area of the third reflective layer 1163 is 10% or more of the entire upper surface of the semiconductor device 1100, the package body disposed under the semiconductor device can be prevented from discolored or cracked, and when the area of the third reflective layer 1163 is 25% or less, it is advantageous to secure the light extraction efficiency to emit light to the six surfaces of the semiconductor device.

In addition, according to another embodiment, it may not be limited thereto, in order to secure to increase the light extraction efficiency, the area of the third reflective layer 1163 may be disposed more than 0% to less than 10% of the entire upper surface of the semiconductor device 1100, and the area of the third reflective layer 1163 may be disposed more than 25% to less than 100% of the entire upper surface of the semiconductor device 1100 in order to prevent from discoloration or cracking in the package body.

According to the semiconductor device 1100 of the embodiment, light generated in the light emitting structure 1100 may not be transmitted and emitted through a first region provided between the first bonding pad 1171 and the second bonding pad 1172. Here, the first region may be a region corresponding to an interval between the first bonding pad 1171 and the second bonding pad 1172. Also, the first region may correspond to the length d of the third reflective layer 1163 disposed in the major axis direction of the semiconductor device.

In addition, light generated in the light emitting structure 1110 may be transmitted and emitted through a second region provided between side surfaces of the semiconductor device 1100 in the major axis direction and the first bonding pad 1171 or the second bonding pad 1172 which are adjacent to the side surfaces in the major axis direction.

In addition, light generated in the light emitting structure may be transmitted and emitted through a third region provided between side surfaces of the semiconductor device 1100 in the minor axis direction and the first bonding pad 1171 or the second bonding pad 1172 which are adjacent to the side surfaces in the minor axis.

According to the embodiment, the size of the first reflective layer 1161 may be provided several micrometers larger than the size of the first bonding pad 1171. For example, the area of the first reflective layer 1161 may be provided sufficiently large to cover the area of the first bonding pad 1171. The length of one side of the first reflective layer 1161 may be provided greater than the length of one side of the first bonding pad 1171 by about 4 micrometers to about 10 micrometers, for example, in consideration of the process error.

In addition, the size of the second reflective layer 1162 may be provided several micrometers larger than the size of the second bonding pad 1172. For example, the area of the second reflective layer 1162 may be provided sufficiently large to cover the area of the second bonding pad 1172. The length of one side of the second reflective layer 1162 may be provided greater than the length of one side of the second bonding pad 1172 by about 4 micrometers to about 10 micrometers, for example, in consideration of the process error.

According to the embodiment, the light emitted from the light emitting structure 1100 may be reflected by the first reflective layer 1161 and the second reflective layer 1162 without being incident on the first bonding pad 1171 and the second bonding pad 1172. Accordingly, light loss of the light that is generated and emitted from the light emitting structure 1110, by being incident on the first bonding pad 1171 and the second bonding pad 1172, can be minimized.

In addition, according to the semiconductor device 1100 of the embodiment, since the third reflective layer 1163 is disposed between the first bonding pad 1171 and the second boding pad 1172, the light may be prevented from being emitted between the first bonding pad 1171 and the second bonding pad 1172.

As described above, the semiconductor device 1100 according to the embodiment can be mounted, for example, in a flip chip bonding manner and provided in the form of a semiconductor device package. At this time, when the package body on which the semiconductor device 1100 is mounted is provided with resin or the like, the package body may be discolored or cracked due to strong short wavelength light emitted from the semiconductor device 1100, in a region under the semiconductor device 1100.

However, according to the semiconductor device 1100 of the embodiment, since light can be prevented from being emitted between the regions where the first bonding pad 1171 and the second bonding pad 1172 are disposed, the package body that is disposed under the semiconductor device 1100 can be prevented from being discolored or cracked.

In addition, according to the semiconductor device 1100 of the embodiment, the interval d between the N electrode pad and the P electrode pad provided in the package body is taken into consideration, so that the width d of the third reflective layer 1163 may be selected to be minimized. By maximally ensuring the spacing b1 and b2 provided between the first bonding pad 1171 or the second bonding pad 1172 adjacent to the side surface of the semiconductor device 1100 in the major axis direction, the amount of light emitted to the sides of the first bonding pad 1171 and the second bonding pad 1172 can be improved.

According to the embodiment, the light generated in the light emitting structure 1100 can be transmitted and emitted in an area of more than 20% of the upper surface of the semiconductor device 1100 on which the first bonding pad 1171, the second bonding pad 1172, and the third reflective layer 1163 are disposed.

Thus, according to the embodiment, since the amount of light emitted in the six surface direction of the semiconductor device 1100 is increased, the light extraction efficiency can be improved and the light intensity Po can be increased. In addition, it is possible to prevent the package body disposed close to the lower surface of the semiconductor device 1100 from being discolored or cracked.

Hereinafter, a method of manufacturing a semiconductor device according to an embodiment will be described with reference to the accompanying drawings. In describing the method of manufacturing the semiconductor device according to the embodiment, description overlapping with those described above may be omitted.

First, according to the method of manufacturing the semiconductor device of the embodiment, as shown in FIGS. 37a and 37b, a light emitting structure 1100 and a current spreading layer 1120 may be formed on a substrate 1105. FIG. 37a is a plan view showing a shape of the light emitting structure 1100 and the current spreading layer 1120 formed according to the method of manufacturing the semiconductor device of the embodiment and FIG. 37b is a process sectional view taken along line B-B of the semiconductor device shown in FIG. 37a.

According to the embodiment, the light emitting structure 1100 may be formed on the substrate 1105. For example, the first conductivity type semiconductor layer 1111, the active layer 1112, and the second conductivity type semiconductor layer 1113 may be formed on the substrate 1105.

Then, the current spreading layer 1120 may be formed on a portion of the second conductivity type semiconductor layer 1113. For example, the current spreading layer 1120 may be formed in a shape of a plurality of dots. For example, the current spreading layer 1120 may be formed in a plurality of rectangular shapes having a predetermined size.

Next, as shown in FIGS. 38a and 38b, an ohmic contact layer 1130 may be formed. FIG. 38a is a plan view showing a shape of the ohmic contact layer 1130 formed according to the method of manufacturing the semiconductor device of the embodiment, and FIG. 38b is a process sectional view taken along line B-B of the semiconductor device shown in FIG. 38a.

According to the embodiment, the ohmic contact layer 1130 may be formed on the second conductivity type semiconductor layer 1113. The ohmic contact layer 1130 may be formed on the current spreading layer 1120 as well. Meanwhile, according to the embodiment, a portion of the first conductivity type semiconductor layer 1111 may be formed to be exposed through a mesa etching process. The ohmic contact layer 1130 may comprise a mesa opening M exposing the first conductivity type semiconductor layer 1111 by a mesa etching. For example, the mesa opening M may be provided in a plurality of rectangular shapes.

Next, as shown in FIGS. 39a and 39b, a first passivation layer 1150 may be formed. FIG. 39a is a plan view showing a shape of the first passivation layer 1150 formed according to the method of manufacturing the semiconductor device according to the embodiment, and FIG. 39b is a process sectional view taken along line B-B of the semiconductor device shown in FIG. 39a.

The first passivation layer 1150 may comprise a plurality of openings. For example, the first passivation layer 1150 may comprise a plurality of first openings h1. The current spreading layer 1120 may be exposed through the plurality of first openings h1. In addition, the first passivation layer 1150 may comprise a plurality of second openings h2. An upper surface of the first conductivity type semiconductor layer 1111 may be exposed through the plurality of second openings h2. The plurality of second openings h2 may be provided correspondingly on the plurality of mesa openings M.

Then, as shown in FIGS. 40a and 40b, a first electrode 1141 and a second electrode 1142 may be formed. FIG. 40a is a plan view showing a shape of the first electrode 1141 and the second electrode 1142 formed according to the method of manufacturing the semiconductor device according to the embodiment, and FIG. 40b is a process sectional view taken along line B-B of the semiconductor device shown in FIG. 40a.

According to the embodiment, the first electrode 1141 and the second electrode 1142 may be disposed spaced apart from each other.

The first electrode 1141 may be electrically connected to the first conductivity type semiconductor layer 1111. The first electrode 1141 may be disposed on the first conductivity type semiconductor layer 1111. For example, according to the semiconductor device 1100 of the embodiment, the first electrode 1141 may be disposed on an upper surface of the first conductivity type semiconductor layer 1111 that is exposed by removing a portion of the second conductivity type semiconductor layer 1113 and a portion of the active layer 1112.

The first electrode 1141 may be electrically connected to the upper surface of the first conductivity type semiconductor layer 1111 through a second opening h2 provided in the first passivation layer 1150. For example, the first electrode 1141 may be in contact with the upper surface of the first conductivity type semiconductor layer 1111 in a plurality of N regions, as shown in FIGS. 34 to 36.

The second electrode 1142 may be electrically connected to the second conductivity type semiconductor layer 1113. The second electrode 1142 may be disposed on the second conductivity type semiconductor layer 1113. According to the embodiment, the current spreading layer 1120 may be disposed between the second electrode 1142 and the second conductivity type semiconductor layer 1113.

The second electrode 1142 may be electrically connected to the upper surface of the second conductivity type semiconductor layer 1113 through a first opening h1 provided in the first passivation layer 1150. For example, the second electrode 1142 may be electrically connected to the second conductivity type semiconductor layer 1113 in a plurality of P regions, as shown in FIGS. 34 to 36.

Next, as shown in FIGS. 41a and 41b, a second passivation layer 1155 may be formed. FIG. 41a is a plan view showing a shape of the second passivation layer 1155 formed according to the method of manufacturing the semiconductor device of the embodiment, and FIG. 41b is a process sectional view taken along line B-B of the semiconductor device shown in FIG. 41a.

The second passivation layer 1155 may be disposed on the first electrode 1141 and the second electrode 1142. The second passivation layer 1155 may be disposed on the first passivation layer 1150.

The second passivation layer 1155 may comprise a fourth opening h4 exposing an upper surface of the first electrode 1141. The second passivation layer 1155 may comprise a plurality of fourth openings h4 exposing a plurality of NB regions of the first electrode 1141.

The second passivation layer 1155 may comprise a third opening h3 exposing an upper surface of the second electrode 1142. The second passivation layer 1155 may comprise a plurality of third openings h3 exposing a plurality of PB regions of the second electrode 1142.

Then, as shown in FIGS. 42a and 42b, a reflective layer 1160 may be formed. FIG. 42a is a plan view showing a shape of the reflective layer 1160 formed according to the method of manufacturing the semiconductor device of the embodiment, and FIG. 42b is a process sectional view taken along line B-B of the semiconductor device shown in FIG. 42a.

The reflective layer 1160 may comprise a first reflective layer 1161, a second reflective layer 1162, and a third reflective layer 1163. The reflective layer 1160 may be disposed on the second passivation layer 1155. The reflective layer 1160 may be disposed on the first electrode 1141 and the second electrode 1142.

The first reflective layer 1161 may be disposed on the first electrode 1141 and the second electrode 1142. The first reflective layer 1161 may comprise a sixth opening h6 exposing an upper surface of the first electrode 1141. The first reflective layer 1161 may comprise a plurality of sixth openings h6 exposing a plurality of NB regions of the first electrode 1141. The first reflective layer 1161 may comprise a sixth opening h6 provided corresponding to a region where the second opening h2 of the second passivation layer 1155 is formed.

The second reflective layer 1162 may be disposed on the first electrode 1141 and the second electrode 1142. The second reflective layer 1162 may be disposed spaced apart from the first reflective layer 1161. The second reflective layer 1162 may comprise a fifth opening h5 exposing an upper surface of the second electrode 1142. The second reflective layer 1162 may comprise a plurality of fifth openings h5 exposing a plurality of PB regions of the second electrode 1142. The second reflective layer 1162 may comprise a fifth opening h5 provided corresponding to a region where the third opening h3 of the second passivation layer 1155 is formed.

In addition, the third reflective layer 1163 may be disposed on the first electrode 1141 and the second electrode 1142. The third reflective layer 1163 may be disposed between the first reflective layer 1161 and the second reflective layer 1162. For example, the third reflective layer 1163 may be connected to the first reflective layer 1161. The third reflective layer 1163 may be connected to the second reflective layer 1162. The third reflective layer 1163 may be physically in direct contact with the first reflective layer 1161 and the second reflective layer 1162.

According to the embodiment, the first reflective layer 1161 may be disposed on a side surface and a portion of an upper surface of the first electrode 1141 so as to expose the upper surface of the first electrode 1141. The second reflective layer 1162 may be disposed on a side surface and a portion of an upper surface of the second electrode 1142 to expose the upper surface of the second electrode 1142.

Accordingly, the first reflective layer 1161 and the second reflective layer 1162 may reflect light emitted from the active layer 1112 of the light emitting structure 1110, thereby minimizing light absorption from a first bonding pad 1161 and a second bonding pad 1162, thereby improving luminous intensity Po.

For example, the first reflective layer 1161 and the second reflective layer 1162 may be made of an insulating material, and may be formed of a material having a high reflectivity, for example, such as a DBR structure in order to reflect light emitted from the active layer 1112. Also, the third reflective layer 1163 may be provided with a DBR structure.

The first reflective layer 1161 and the second reflective layer 1162 may have a DBR structure in which materials having different refractive indexes are repeatedly arranged. For example, the first reflective layer 1161 and the second reflective layer 1162 may be disposed in a single layer or a stacked structure comprising at least one of $TiO_2$, $SiO_2$, $Ta_2O_5$, and $HfO_2$.

In addition, according to another embodiment, it is not limited thereto, the first reflective layer 1161 and the second reflective layer 1162 may be freely provided in various configurations in order to adjust the reflectivity of the light emitted from the active layer 1112 according to the wavelength emitted from the active layer 1112.

Next, as shown in FIGS. 43a and 43b, a first bonding pad 1171 and a second bonding pad 1172 may be formed. FIG. 43a is a plan view showing a shape of the first bonding pad 1171 and the second bonding pad 1172 formed according to the method of manufacturing the semiconductor device of the embodiment, and FIG. 43b is a process sectional view taken along line B-B of the semiconductor device shown in FIG. 43a.

According to the embodiment, the first bonding pad 1171 and the second bonding pad 1172 may be formed in the shape shown in FIG. 43a. The first bonding pad 1171 may be disposed on the first reflective layer 1161. The second bonding pad 1172 may be disposed on the second reflective layer 1162. The second bonding pad 1172 may be disposed spaced apart from the first bonding pad 1171.

The first bonding pad 1171 may contact the upper surface of the first electrode 1141 through the sixth opening h6 provided in the first reflective layer 1161 in a plurality of NB regions. The second bonding pad 1172 may contact the upper surface of the second electrode 1142 through the fifth opening h5 provided in the second reflective layer 1162 in a plurality of PB regions.

According to the semiconductor device 1100 of the embodiment, the first bonding pad 1171 and the first electrode 1141 can be contacted in a plurality of regions. Also, the second bonding pad 1172 and the second electrode 1142 can be contacted in a plurality of regions. Thus, according to the embodiment, power can be supplied through a plurality of regions, so that current spreading effect is occurred according to increase of the contact area and dispersion of the contact region, and there is an advantage that operation voltage can be reduced.

The semiconductor device according to the embodiment may be connected to an external power in a flip chip bonding manner. For example, in manufacturing a semiconductor device package, the upper surface of the first bonding pad 1171 and the upper surface of the second bonding pad 1172 may be disposed to be attached to a submount, a lead frame, or a circuit board.

When the semiconductor device according to the embodiment is mounted by a flip-chip bonding method and is implemented as a semiconductor device package, the light provided by the light emitting structure 1100 may be emitted through the substrate 1105. The light emitted from the light emitting structure 1100 may be reflected by the first reflective layer 1161 and the second reflective layer 1162, and may be emitted toward the substrate 1105.

Also, the light emitted from the light emitting structure 1100 may be emitted in the lateral direction of the light emitting structure 1100. Also, the light emitted from the light emitting structure 1100 may be transmitted to the outside through a region where the first bonding pad 1171 and the second bonding pad 1172 are not provided among the surface on which the first bonding pad 1171 and the second bonding pad 1172 are disposed.

Specifically, the light emitted from the light emitting structure 1100 may be transmitted to the outside through a region where the first reflective layer 1161, the second reflective layer 1162, and the third reflective layer 1163 are not provided among the surface on which the first bonding pad 1171 and the second bonding pad 1172 are disposed.

Accordingly, the semiconductor device 1100 of the embodiment can emit light in six directions surrounding the light emitting structure 1100, and the light intensity can be remarkably improved.

In addition, according to the semiconductor device and the semiconductor device package of the embodiment, since the first bonding pad 1171 and the second bonding pad 1172 having a large area can be directly bonded to the circuit board providing power, the chip bonding process can be performed easily and stably.

Meanwhile, according to the semiconductor device of the embodiment, as described with reference to FIG. 27, when viewed from above the semiconductor device 1100, a sum of the areas of the first bonding pad 1171 and the second bonding pad 1172 may be provided equal to or smaller than 60% of a total area of an upper surface of the semiconductor device 1100 on which the first bonding pad 1171 and the second bonding pad 1172 are disposed.

For example, the total area of the upper surface of the semiconductor device 1100 may correspond to an area defined by a lateral length and a longitudinal length of the lower surface of the first conductivity type semiconductor layer 1111 of the light emitting structure 1100. Also, the total area of the upper surface of the semiconductor device 1100 may correspond to the area of the upper surface or the lower surface of the substrate 1105.

By providing the sum of the areas of the first bonding pad 1171 and the second bonding pad 1172 equal to or smaller than 60% of the total area of the semiconductor device 1100, the amount of light emitted to the surface on which the first bonding pad 1171 and the second bonding pad 1172 are disposed can be increased. Thus, according to the embodiment, since the amount of light emitted through the six surface direction of the semiconductor device 1100 is increased, the light extraction efficiency can be improved and the light intensity Po can be increased.

In addition, when viewed from above the semiconductor device, the sum of the area of the first bonding pad 1171 and the area of the second bonding pad 1172 may be provided equal to or greater than 30% of the total area of the semiconductor device 1100.

By providing the sum of the areas of the first bonding pad 1171 and the second bonding pad 1172 equal to or greater than 30% of the total area of the semiconductor device 1100, stable mounting can be performed through the first bonding pad 1171 and the second bonding pad 1172.

In the semiconductor device 1100 according to the embodiment, the sum of the areas of the first bonding pad 1171 and the second bonding pad 1172 can be selected to be equal to or greater than 30% and equal to or smaller than 60% of the total area of the semiconductor device 1100 in consideration of light extraction efficiency and securing stability of bonding.

That is, when the sum of the areas of the first bonding pad 1171 and the second bonding pad 1172 is 30% or more to 100% or less of the total area of the semiconductor device 1100, the electrical characteristics can be ensured and the bonding force to be mounted on the semiconductor device package can be secured so that stable mounting can be performed.

In addition, when the sum of the areas of the first bonding pad 1171 and the second bonding pad 1172 is more than 0% to 60% or less of the total area of the semiconductor device 1100, the light extraction efficiency of the semiconductor device 1100 can be improved and the light intensity Po can be increased by increasing the amount of light emitted to the surface on which the first bonding pad 1171 and the second bonding pad 1172 are disposed.

In order to secure the electrical characteristics of the semiconductor device 1100 and the bonding force to be mounted on the semiconductor device package, and increase the light intensity, the sum of the areas of the first bonding pad 1171 and the second bonding pad 1172 is selected to be 30% or more to 60% or less of the total area of the semiconductor device 1100. In addition, according to another embodiment, it is not limited thereto, in order to secure the electrical characteristics and bonding force of the semiconductor device 1100, the sum of the areas of the first bonding pad 1171 and the second bonding pad 1172 may be selected to be more than 60% to 100% or less, and in order to increase the light intensity, the sum of the areas of the first bonding pad 1171 and the second bonding pad 1172 may be selected to be more than 0% and less than 30%.

In addition, according to the semiconductor device 1100 of the embodiment, as shown in FIG. 27, the third reflective layer 1163 may be disposed between the first bonding pad 1171 and the second bonding pad 1172. For example, the length d of the third reflective layer 1163 along the major axis direction of the semiconductor device 1100 may be disposed to correspond to the distance between the first bonding pad 1171 and the second bonding pad 1172. Also, the third reflective layer 1163 may be provided at a length of f along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be provided equal to or greater than 10% and equal to or smaller than 25% of the entire upper surface of the semiconductor device 1100, for example.

According to the semiconductor device 1100 of the embodiment, light generated in the light emitting structure 1100 may not be transmitted and emitted through a first region provided between the first bonding pad 1171 and the second bonding pad 1172. Here, the first region may be a region corresponding to an interval between the first bonding pad 1171 and the second bonding pad 1172. Also, the first region may correspond to the length d of the third reflective layer 1163 disposed in the major axis direction of the semiconductor device.

In addition, light generated in the light emitting structure 1110 may be transmitted and emitted through a second region provided between side surfaces of the semiconductor device 1100 in the major axis direction and the first bonding pad 1171 or the second bonding pad 1172 which are adjacent to the side surfaces in the major axis direction.

In addition, light generated in the light emitting structure may be transmitted and emitted through a third region provided between side surfaces of the semiconductor device 1100 in the minor axis direction and the first bonding pad 1171 or the second bonding pad 1172 which are adjacent to the side surfaces in the minor axis.

According to the embodiment, the size of the first reflective layer 1161 may be provided several micrometers larger than the size of the first bonding pad 1171. For example, the area of the first reflective layer 1161 may be provided sufficiently large to cover the area of the first bonding pad 1171. The length of one side of the first reflective layer 1161 may be provided greater than the length of one side of the first bonding pad 1171 by about 4 micrometers to about 10 micrometers, for example, in consideration of the process error.

In addition, the size of the second reflective layer 1162 may be provided several micrometers larger than the size of the second bonding pad 1172. For example, the area of the second reflective layer 1162 may be provided sufficiently large to cover the area of the second bonding pad 1172. The length of one side of the second reflective layer 1162 may be provided greater than the length of one side of the second bonding pad 1172 by about 4 micrometers to about 10 micrometers, for example, in consideration of the process error.

According to the embodiment, the light emitted from the light emitting structure 1100 may be reflected by the first reflective layer 1161 and the second reflective layer 1162 without being incident on the first bonding pad 1171 and the second bonding pad 1172. Accordingly, light loss of the light that is generated and emitted from the light emitting structure 1110, by being incident on the first bonding pad 1171 and the second bonding pad 1172, can be minimized.

In addition, according to the semiconductor device 1100 of the embodiment, since the third reflective layer 1163 is disposed between the first bonding pad 1171 and the second boding pad 1172, the light may be prevented from being emitted between the first bonding pad 1171 and the second bonding pad 1172.

As described above, the semiconductor device 1100 according to the embodiment can be mounted, for example, in a flip chip bonding manner and provided in the form of a semiconductor device package. At this time, when the package body on which the semiconductor device 1100 is mounted is provided with resin or the like, the package body may be discolored or cracked due to strong short wavelength light emitted from the semiconductor device 1100, in a region under the semiconductor device 1100.

However, according to the semiconductor device 1100 of the embodiment, since light can be prevented from being emitted between the regions where the first bonding pad 1171 and the second bonding pad 1172 are disposed, the package body that is disposed under the semiconductor device 1100 can be prevented from being discolored or cracked.

In addition, according to the semiconductor device 1100 of the embodiment, the interval d between the N electrode pad and the P electrode pad provided in the package body is taken into consideration, so that the width d of the third reflective layer 1163 may be selected to be minimized. By maximally ensuring the spacing b1 and b2 provided between the first bonding pad 1171 or the second bonding pad 1172 adjacent to the side surface of the semiconductor device 1100 in the major axis direction, the amount of light emitted to the sides of the first bonding pad 1171 and the second bonding pad 1172 can be improved.

According to the embodiment, the light generated in the light emitting structure 1100 can be transmitted and emitted in an area of more than 20% of the upper surface of the semiconductor device 1100 on which the first bonding pad 1171, the second bonding pad 1172, and the third reflective layer 1163 are disposed.

Thus, according to the embodiment, since the amount of light emitted in the six surface direction of the semiconductor device 1100 is increased, the light extraction efficiency can be improved and the light intensity Po can be increased. In addition, it is possible to prevent the package body disposed close to the lower surface of the semiconductor device 1100 from being discolored or cracked.

Next, another example of the semiconductor device according to the embodiment of the present invention will be described with reference to FIGS. 44 to 46. In describing the semiconductor device according to the embodiment with reference to FIGS. 44 to 46, description overlapping with those described above may be omitted.

FIG. 44 is a plan view showing still another example of the semiconductor device according to the embodiment of the present invention, FIG. 45 is a sectional view taken along line C-C of the semiconductor device shown in FIG. 44, and FIG. 46 is a view showing an example of the arrangement of a first electrode and a second electrode applied to another example of the semiconductor device according to the embodiment of the present invention.

Meanwhile, in order to facilitate understanding, in FIG. 44, a first electrode 1141 electrically connected to a first bonding pad 1171 and a second electrode 1142 electrically connected to a second bonding pad 1172 are illustrated to be seen, even though which are disposed under the first bonding pad 1171 and the second bonding pad 1172.

The semiconductor device 1100 according to the embodiment may comprise a light emitting structure 1100 disposed on a substrate 1105, as shown in FIGS. 44 to 46.

The light emitting structure 1100 may comprise a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

According to the embodiment, the first conductivity type semiconductor layer 1111 may be provided as an n-type semiconductor layer, and the second conductivity type semiconductor layer 1113 may be provided as a p-type semiconductor layer. Of course, according to another embodiment, the first conductivity type semiconductor layer 1111 may be provided as a p-type semiconductor layer, and the second conductivity type semiconductor layer 1113 may be provided as an n-type semiconductor layer.

Hereinafter, for convenience of description, a description will be given based on a case in which the first conductivity type semiconductor layer 1111 is provided as an n-type semiconductor layer and the second conductivity type semiconductor layer 1113 is provided as a p-type semiconductor layer.

The semiconductor device 1100 according to the embodiment may comprise a current spreading layer 1120 and an ohmic contact layer 1130 as shown in FIG. 45. The current spreading layer 1120 and the ohmic contact layer 1130 can improve current diffusion to increase light output. An arrangement and shape of the current spreading layer 1120 and the ohmic contact layer 1130 will be further described later while explaining a method of manufacturing a semiconductor device according to an embodiment.

For example, the current spreading layer 1120 may be provided with an oxide, a nitride, or the like. The current spreading layer 1120 can improve luminous flux by preventing the current concentration under the second electrode 1142 and improving the electrical reliability.

In addition, the ohmic contact layer 1130 may comprise at least one selected from a group including a metal, a metal oxide, and a metal nitride. The ohmic contact layer 1130 may comprise a light transmitting material.

The semiconductor device 1100 according to the embodiment may comprise a reflective layer 1160, as shown in FIGS. 44 and 45. The reflective layer 1160 may comprise a first reflective layer 1161, a second reflective layer 1162, and a third reflective layer 1163.

The first reflective layer 1161 may comprise a first opening h1 exposing the ohmic contact layer 1130. The first reflective layer 1161 may comprise a plurality of first openings h1 disposed on the current spreading layer 1120. The plurality of first openings h1 may be provided corresponding to a region where the current spreading layer 1120 is disposed.

The second reflective layer 1162 may comprise a plurality of second openings h2 exposing an upper surface of the first conductivity type semiconductor layer 1111.

The third reflective layer 1163 may be disposed between the first reflective layer 1161 and the second reflective layer 1162. For example, the third reflective layer 1163 may be connected to the first reflective layer 1161. Also, the third reflective layer 1163 may be connected to the second reflective layer 1162. The third reflective layer 1163 may be physically in direct contact with the first reflective layer 1161 and the second reflective layer 1162.

The reflective layer 1160 may be provided as an insulating reflective layer. For example, the reflective layer 1160 may be provided as a Distributed Bragg Reflector (DBR) layer or an Omni Directional Reflector (ODR) layer.

The semiconductor device 1100 according to the embodiment may comprise a first electrode 1141 and a second electrode 1142, as shown in FIGS. 44 to 46.

The first electrode 1141 may be electrically connected to the first conductivity type semiconductor layer 1111. The first electrode 1141 may be disposed on the first conductivity type semiconductor layer 1111. For example, according to the semiconductor device 1100 of the embodiment, the first electrode 1141 may be disposed on an upper surface of the first conductivity type semiconductor layer 1111 that is exposed by removing a portion of the second conductivity type semiconductor layer 1113 and a portion of the active layer 1112.

The first electrode 1141 may be electrically connected to the upper surface of the first conductivity type semiconductor layer 1111 through a second opening h2 provided in the first reflective layer 1161. For example, the first electrode 1141 may be in contact with the upper surface of the first conductivity type semiconductor layer 1111 in a plurality of N regions, as shown in FIGS. 44 and 45.

The second electrode 1142 may be electrically connected to the second conductivity type semiconductor layer 1113. The second electrode 1142 may be disposed on the second conductivity type semiconductor layer 1113. According to the embodiment, the current spreading layer 1120 and the ohmic contact layer 1130 may be disposed between the second electrode 1142 and the second conductivity type semiconductor layer 1113.

The second electrode 1142 may be electrically connected to the upper surface of the second conductivity type semiconductor layer 1113 through a first opening h1 provided in the second reflective layer 1162. For example, as shown in FIGS. 44 and 45, the second electrode 1142 may be electrically connected to the second conductivity type semiconductor layer 1113 through the ohmic contact layer 1130 in a plurality of P regions.

According to the embodiment, as shown in FIGS. 44 to 46, the first electrode 1141 and the second electrode 1142 may be disposed spaced apart from each other.

The semiconductor device 1100 according to the embodiment may comprise a passivation layer 1150, as shown in FIGS. 44 and 45.

The passivation layer 1150 may comprise a plurality of third openings h3 exposing the second electrode 1142. The plurality of third openings h3 may correspond to a plurality of PB regions provided in the second electrode 1142.

In addition, the passivation layer 1150 may comprise a plurality of fourth openings h4 exposing the first electrode 1141. The plurality of fourth openings h4 may correspond to a plurality of NB regions provided in the first electrode 1142.

The semiconductor device 1100 according to the embodiment may comprise a first bonding pad 1171 and a second bonding pad 1172 disposed on the passivation layer 1150 as shown in FIGS. 44 and 45.

The first bonding pad 1171 may be disposed on the first reflective layer 1161. Also, the second bonding pad 1172 may be disposed on the second reflective layer 1162. The second bonding pad 1172 may be disposed spaced apart from the first bonding pad 1171.

The first bonding pad 1171 may contact the upper surface of the first electrode 1141 through a plurality of the fourth openings h4 provided in the passivation layer 1150 in a plurality of NB regions. The second bonding pad 1172 may contact the upper surface of the second electrode 1142 through a plurality of the third openings h3 provided in the passivation layer 1150 in a plurality of PB regions.

According to the semiconductor device 1100 of the embodiment, the first bonding pad 1171 and the first electrode 1141 can be contacted in a plurality of regions. Also, the second bonding pad 1172 and the second electrode 1142 can be contacted in a plurality of regions. Thus, according to the embodiment, power can be supplied through a plurality of regions, so that current spreading effect is occurred according to increase of the contact area and dispersion of the contact region, and there is an advantage that operation voltage can be reduced.

In addition, according to the semiconductor device 1100 of the embodiment, as shown in FIG. 45, the first reflective layer 1161 is disposed under the first electrode 1141, and the second reflective layer 1162 is disposed under the first electrode 1141. Accordingly, the first reflective layer 1161 and the second reflective layer 1162 may reflect light emitted from the active layer 1112 of the light emitting structure 1110, thereby minimizing light absorption from a first electrode 1141 and a second electrode 1142, thereby improving luminous intensity Po.

For example, the first reflective layer 1161 and the second reflective layer 1162 may be made of an insulating material, and may be formed of a material having a high reflectivity, for example, such as a DBR structure in order to reflect light emitted from the active layer 1112.

The first reflective layer 1161 and the second reflective layer 1162 may have a DBR structure in which materials having different refractive indexes are repeatedly arranged. For example, the first reflective layer 1161 and the second reflective layer 1162 may be disposed in a single layer or a stacked structure comprising at least one of $TiO_2$, $SiO_2$, $Ta_2O_5$, and $HfO_2$.

In addition, according to another embodiment, it is not limited thereto, the first reflective layer 1161 and the second reflective layer 1162 may be freely provided in various configurations in order to adjust the reflectivity of the light emitted from the active layer 1112 according to the wavelength emitted from the active layer 1112.

The semiconductor device according to the embodiment may be connected to an external power in a flip chip bonding manner. For example, in manufacturing a semiconductor device package, the upper surface of the first bonding pad 1171 and the upper surface of the second bonding pad 1172 may be disposed to be attached to a submount, a lead frame, a circuit board, and the like.

When the semiconductor device according to the embodiment is mounted by a flip-chip bonding method and is implemented as a semiconductor device package, the light provided by the light emitting structure 1100 may be emitted through the substrate 1105. The light emitted from the light emitting structure 1100 may be reflected by the first reflective layer 1161 and the second reflective layer 1162, and may be emitted toward the substrate 1105.

Also, the light emitted from the light emitting structure 1100 may be emitted in the lateral direction of the light emitting structure 1100. Also, the light emitted from the light emitting structure 1100 may be transmitted to the outside through a region where the first bonding pad 1171 and the second bonding pad 1172 are not provided among the surface on which the first bonding pad 1171 and the second bonding pad 1172 are disposed.

Specifically, the light emitted from the light emitting structure 1100 may be transmitted to the outside through a region where the first reflective layer 1161, the second reflective layer 1162, and the third reflective layer 1163 are not provided among the surface on which the first bonding pad 1171 and the second bonding pad 1172 are disposed.

Accordingly, the semiconductor device 1100 of the embodiment can emit light in six directions surrounding the light emitting structure 1100, and the light intensity can be remarkably improved.

In addition, according to the semiconductor device and the semiconductor device package of the embodiment, since the first bonding pad 1171 and the second bonding pad 1172 having a large area can be directly bonded to the circuit board providing power, the chip bonding process can be performed easily and stably.

Meanwhile, according to the semiconductor device of the embodiment, as described with reference to FIG. 27, when viewed from above the semiconductor device 1100, a sum of the areas of the first bonding pad 1171 and the second bonding pad 1172 may be provided equal to or smaller than 60% of a total area of an upper surface of the semiconductor device 1100 on which the first bonding pad 1171 and the second bonding pad 1172 are disposed.

For example, the total area of the upper surface of the semiconductor device 1100 may correspond to an area defined by a lateral length and a longitudinal length of the lower surface of the first conductivity type semiconductor layer 1111 of the light emitting structure 1100. Also, the total area of the upper surface of the semiconductor device 1100 may correspond to the area of the upper surface or the lower surface of the substrate 1105.

By providing the sum of the areas of the first bonding pad 1171 and the second bonding pad 1172 equal to or smaller than 60% of the total area of the semiconductor device 1100, the amount of light emitted to the surface on which the first bonding pad 1171 and the second bonding pad 1172 are disposed can be increased. Thus, according to the embodiment, since the amount of light emitted through the six surface direction of the semiconductor device 1100 is increased, the light extraction efficiency can be improved and the light intensity Po can be increased.

In addition, when viewed from above the semiconductor device, the sum of the area of the first bonding pad 1171 and the area of the second bonding pad 1172 may be provided equal to or greater than 30% of the total area of the semiconductor device 1100.

By providing the sum of the areas of the first bonding pad 1171 and the second bonding pad 1172 equal to or greater than 30% of the total area of the semiconductor device 1100, dtable mounting can be performed through the first bonding pad 1171 and the second bonding pad 1172.

In the semiconductor device 1100 according to the embodiment, the sum of the areas of the first bonding pad 1171 and the second bonding pad 1172 can be selected to be equal to or greater than 30% and equal to or smaller than 60% of the total area of the semiconductor device 1100 in consideration of light extraction efficiency and securing stability of bonding.

That is, when the sum of the area of the first bonding pad 1171 and the area of the second bonding pad 1172 is smaller than 30%, the bonding force mounted on the light emitting device package may be weakened, for example. Also, when the sum of the areas of the first bonding pad 1171 and the second bonding pad 1172 is greater than 60%, the amount of light emitted to the surface on which the first bonding pad 1171 and the second bonding pad 1172 are disposed may become insufficient.

In addition, according to the semiconductor device 1100 of the embodiment, as shown ill FIG. 27, the third reflective layer 1163 may be disposed between the first bonding pad 1171 and the second bonding pad 1172. For example, the length d of the third reflective layer 1163 along the major axis direction of the semiconductor device 1100 may be disposed to correspond to the distance between the first bonding pad 1171 and the second bonding pad 1172. Also, the third reflective layer 1163 may be provided at a length off along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be provided equal to or greater than 10% and equal to or smaller than 25% of the entire upper surface of the semiconductor device 1100, for example.

According to the semiconductor device 1100 of the embodiment, light generated in the light emitting structure 1100 may not be transmitted and emitted through a first region provided between the first bonding pad 1171 and the second bonding pad 1172. Here, the first region may be a region corresponding to an interval between the first bonding pad 1171 and the second bonding pad 1172. Also, the first region may correspond to the length d of the third reflective layer 1163 disposed in the major axis direction of the semiconductor device.

In addition, light generated in the light emitting structure 1110 may be transmitted and emitted through a second region provided between side surfaces of the semiconductor device 1100 in the major axis direction and the first bonding pad 1171 or the second bonding pad 1172 which are adjacent to the side surfaces in the major axis direction.

In addition, light generated in the light emitting structure may be transmitted and emitted through a third region provided between side surfaces of the semiconductor device 1100 in the minor axis direction and the first bonding pad 1171 or the second bonding pad 1172 which are adjacent to the side surfaces in the minor axis.

According to the embodiment, the size of the first reflective layer 1161 may be provided several micrometers larger than the size of the first bonding pad 1171. For example, the area of the first reflective layer 1161 may be provided sufficiently large to cover the area of the first bonding pad 1171. The length of one side of the first reflective layer 1161 may be provided greater than the length of one side of the first bonding pad 1171 by about 4 micrometers to about 10 micrometers, for example, in consideration of the process error.

In addition, the size of the second reflective layer 1162 may be provided several micrometers larger than the size of the second bonding pad 1172. For example, the area of the second reflective layer 1162 may be provided sufficiently large to cover the area of the second bonding pad 1172. The length of one side of the second reflective layer 1162 may be provided greater than the length of one side of the second bonding pad 1172 by about 4 micrometers to about 10 micrometers, for example, in consideration of the process error.

According to the embodiment, the light emitted from the light emitting structure 1100 may be reflected by the first reflective layer 1161 and the second reflective layer 1162 without being incident on the first bonding pad 1171 and the second bonding pad 1172. Accordingly, light loss of the light that is generated and emitted from the light emitting structure 1110, by being incident on the first bonding pad 1171 and the second bonding pad 1172, can be minimized.

In addition, according to the semiconductor device 1100 of the embodiment, since the third reflective layer 1163 is disposed between the first bonding pad 1171 and the second boding pad 1172, the light may be prevented from being emitted between the first bonding pad 1171 and the second bonding pad 1172.

As described above, the semiconductor device 1100 according to the embodiment can be mounted, for example, in a flip chip bonding manner and provided in the form of a semiconductor device package. At this time, when the package body on which the semiconductor device 1100 is mounted is provided with resin or the like, the package body may be discolored or cracked due to strong short wavelength light emitted from the semiconductor device 1100, in a region under the semiconductor device 1100.

However, according to the semiconductor device 1100 of the embodiment, since light can be prevented from being emitted between the regions where the first bonding pad 1171 and the second bonding pad 1172 are disposed, the package body that is disposed under the semiconductor device 1100 can be prevented from being discolored or cracked.

In addition, according to the semiconductor device 1100 of the embodiment, the interval d between the N electrode pad and the P electrode pad provided in the package body is taken into consideration, so that the width d of the third reflective layer 1163 may be selected to be minimized. By maximally ensuring the spacing b1 and b2 provided between the first bonding pad 1171 or the second bonding pad 1172 adjacent to the side surface of the semiconductor device 1100 in the major axis direction, the amount of light emitted to the sides of the first bonding pad 1171 and the second bonding pad 1172 can be improved.

According to the embodiment, the light generated in the light emitting structure 1100 can be transmitted and emitted in an area of more than 20% of the upper surface of the semiconductor device 1100 on which the first bonding pad 1171, the second bonding pad 1172, and the third reflective layer 1163 are disposed.

Thus, according to the embodiment, since the amount of light emitted in the six surface direction of the semiconductor device 1100 is increased, the light extraction efficiency can be improved and the light intensity Po can be increased. In addition, it is possible to prevent the package body disposed close to the lower surface of the semiconductor device 1100 from being discolored or cracked.

Hereinafter, a method of manufacturing a semiconductor device according to an embodiment will be described with reference to the accompanying drawings. In describing the method of manufacturing the semiconductor device according to the embodiment, description overlapping with those described with reference to FIGS. 1 to 46 may be omitted.

First, according to the method of manufacturing the semiconductor device according to the embodiment, the light emitting structure 1100 and the current spreading layer 1120 may be formed on the substrate 1105, as shown in FIGS. 47a and 47b. FIG. 47a is a plan view showing a shape of the light emitting structure 1100 and the current spreading layer 1120 formed according to the method of manufacturing the semiconductor device of the embodiment and FIG. 47b is a process sectional view taken along line C-C of the semiconductor device shown in FIG. 47a.

According to the embodiment, the light emitting structure 1100 may be formed on the substrate 1105. For example, the first conductivity type semiconductor layer 1111, the active layer 1112, and the second conductivity type semiconductor layer 1113 may be formed on the substrate 1105.

Then, the current spreading layer 1120 may be formed on a portion of the second conductivity type semiconductor layer 1113. For example, the current spreading layer 1120 may be formed in a shape of a plurality of dots. For example, the current spreading layer 1120 may be formed in a plurality of rectangular shapes having a predetermined size.

Next, as shown in FIGS. 48a and 48b, an ohmic contact layer 1130 may be formed. FIG. 48a is a plan view showing a shape of the ohmic contact layer 1130 formed according to the method of manufacturing the semiconductor device of the embodiment, and FIG. 48b is a process sectional view taken along line C-C of the semiconductor device shown in FIG. 48a.

According to the embodiment, the ohmic contact layer 1130 may be formed on the second conductivity type semiconductor layer 1113. The ohmic contact layer 1130 may be formed on the current spreading layer 1120 as well.

Meanwhile, according to the embodiment, a portion of the first conductivity type semiconductor layer 1111 may be exposed through a mesa etching process. The ohmic contact layer 1130 may comprise a mesa opening M exposing the first conductivity type semiconductor layer 1111 by a mesa etching. For example, the mesa opening M may be provided in a plurality of rectangular shapes.

Next, as shown in FIGS. 49*a* and 49*b*, a reflective layer 1160 may be formed. FIG. 49*a* is a plan view showing a shape of the reflective layer 1160 formed according to the method of manufacturing the semiconductor device of the embodiment, and FIG. 49*b* is a process sectional view taken along line C-C of the semiconductor device shown in FIG. 49*a*.

The reflective layer 1160 may comprise a first reflective layer 1161, a second reflective layer 1162, and a third reflective layer 1163. The reflective layer 1160 may be disposed on the ohmic contact layer 1130. The reflective layer 1160 may be disposed on the first conductivity type semiconductor layer 1111 and the second conductivity type semiconductor layer 1113.

The second reflective layer 1162 may comprise a plurality of openings. For example, the second reflective layer 1162 may comprise a plurality of first openings h1. The current spreading layer 1120 may be exposed through the plurality of first openings h1. In addition, the first reflective layer 1161 may comprise a plurality of second openings h2. An upper surface of the first conductivity type semiconductor layer 1111 may be exposed through the plurality of second openings h2. The plurality of second openings h2 may be provided correspondingly on the plurality of mesa openings M.

Next, as shown in FIGS. 50*a* and 50*b*, a first electrode 1141 and a second electrode 1142 may be formed. FIG. 50*a* is a plan view showing a shape of the first electrode 1141 and the second electrode 1142 formed according to the method of manufacturing the semiconductor device according to the embodiment, and FIG. 50*b* is a process sectional view taken along line C-C of the semiconductor device shown in FIG. 50*a*.

According to the embodiment, the first electrode 1141 and the second electrode 1142 may be disposed spaced apart from each other.

The first electrode 1141 may be electrically connected to the first conductivity type semiconductor layer 1111. The first electrode 1141 may be disposed on the first conductivity type semiconductor layer 1111. For example, according to the semiconductor device 1100 of the embodiment, the first electrode 1141 may be disposed on an upper surface of the first conductivity type semiconductor layer 1111 that is exposed by removing a portion of the second conductivity type semiconductor layer 1113 and a portion of the active layer 1112.

The first electrode 1141 may be electrically connected to the upper surface of the first conductivity type semiconductor layer 1111 through a second opening h2 provided in the first reflective layer 1161. For example, the first electrode 1141 may be in contact with the upper surface of the first conductivity type semiconductor layer 1111 in a plurality of N regions, as shown in FIGS. 44 and 45.

The second electrode 1142 may be electrically connected to the second conductivity type semiconductor layer 1113. The second electrode 1142 may be disposed on the second conductivity type semiconductor layer 1113. According to the embodiment, the current spreading layer 1120 may be disposed between the second electrode 1142 and the second conductivity type semiconductor layer 1113.

The second electrode 1142 may be electrically connected to the upper surface of the second conductivity type semiconductor layer 1113 through a first opening h1 provided in the second reflective layer 1162. For example, as shown in FIGS. 44 and 45, the second electrode 1142 may be electrically connected to the second conductivity type semiconductor layer 1113 through the ohmic contact layer 1130 in a plurality of P regions.

Next, as shown in FIGS. 51*a* and 51*b*, a passivation layer 1150 may be formed. FIG. 51*a* is a plan view showing a shape of the passivation layer 1150 formed according to the method of manufacturing the semiconductor device of the embodiment, and FIG. 51*b* is a process sectional view taken along line C-C of the semiconductor device shown in FIG. 51*a*.

The passivation layer 1150 may be disposed on the first electrode 1141 and the second electrode 1142. The passivation layer 1150 may be disposed on the reflective layer 1160.

The passivation layer 1150 may comprise a fourth opening h4 exposing an upper surface of the first electrode 1141. The passivation layer 1150 may comprise a plurality of fourth openings 114 exposing a plurality of NB regions of the first electrode 1141.

The passivation layer 1150 may comprise a third opening h3 exposing an upper surface of the second electrode 1142. The passivation layer 1150 may comprise a plurality of third openings h3 exposing a plurality of PB regions of the second electrode 1142.

Then, as shown in FIGS. 52*a* and 52*b*, a first bonding pad 1171 and a second bonding pad 1172 may be formed. FIG. 52*a* is a plan view showing a shape of the first bonding pad 1171 and the second bonding pad 1172 formed according to the method of manufacturing the semiconductor device of the embodiment, and FIG. 52*b* is a process sectional view taken along line C-C of the semiconductor device shown in FIG. 52*a*.

According to the embodiment, the first bonding pad 1171 and the second bonding pad 1172 may be formed in the shape shown in FIG. 52*a*. The first bonding pad 1171 and the second bonding pad 1172 may be disposed on the passivation layer 1150.

The first bonding pad 1171 may be disposed on the first reflective layer 1161. The second bonding pad 1172 may be disposed on the second reflective layer 1162. The second bonding pad 1172 may be disposed spaced apart from the first bonding pad 1171.

The first bonding pad 1171 may contact the upper surface of the first electrode 1141 through the fourth opening h4 provided in the passivation layer 1150 in a plurality of NB regions. The second bonding pad 1172 may contact the upper surface of the second electrode 1142 through the third opening h3 provided in the passivation layer 1150 in a plurality of PB regions.

According to the semiconductor device 1100 of the embodiment, the first bonding pad 1171 and the first electrode 1141 can be contacted in a plurality of regions. Also, the second bonding pad 1172 and the second electrode 1142 can be contacted in a plurality of regions. Thus, according to the embodiment, power can be supplied through a plurality of regions, so that current spreading effect is occurred according to increase of the contact area and dispersion of the contact region, and there is an advantage that operation voltage can be reduced.

The semiconductor device according to the embodiment may be connected to an external power source in a flip chip bonding manner. For example, in manufacturing a semiconductor device package, the upper surface of the first bonding pad 1171 and the upper surface of the second bonding pad 1172 may be disposed to be attached to a submount, a lead frame, or a circuit board.

When the semiconductor device according to the embodiment is mounted by a flip-chip bonding method and is implemented as a semiconductor device package, the light provided by the light emitting structure 1100 may be emitted through the substrate 1105. The Light emitted from the light emitting structure 1100 may be reflected by the first reflective layer 1161 and the second reflective layer 1162 and may be emitted toward the substrate 1105.

Also, the light emitted from the light emitting structure 1100 may be emitted in the lateral direction of the light emitting structure 1100. Also, the light emitted from the light emitting structure 1100 may be transmitted to the outside through a region where the first bonding pad 1171 and the second bonding pad 1172 are not provided among the surface on which the first bonding pad 1171 and the second bonding pad 1172 are disposed.

Specifically, the light emitted from the light emitting structure 1100 may be transmitted to the outside through a region where the first reflective layer 1161, the second reflective layer 1162, and the third reflective layer 1163 are not provided among the surface on which the first bonding pad 1171 and the second bonding pad 1172 are disposed.

Accordingly, the semiconductor device 1100 of the embodiment can emit light in six directions surrounding the light emitting structure 1100, and the light intensity can be remarkably improved.

In addition, according to the semiconductor device and the semiconductor device package of the embodiment, since the first bonding pad 1171 and the second bonding pad 1172 having a large area can be directly bonded to the circuit board providing power, the chip bonding process can be performed easily and stably.

Meanwhile, according to the semiconductor device of the embodiment, as described with reference to FIG. 27, when viewed from above the semiconductor device 1100, a sum of the areas of the first bonding pad 1171 and the second bonding pad 1172 may be provided equal to or smaller than 60% of a total area of an upper surface of the semiconductor device 1100 on which the first bonding pad 1171 and the second bonding pad 1172 are disposed.

For example, the total area of the upper surface of the semiconductor device 1100 may correspond to an area defined by a lateral length and a longitudinal length of the lower surface of the first conductivity type semiconductor layer 1111 of the light emitting structure 1100. Also, the total area of the upper surface of the semiconductor device 1100 may correspond to the area of the upper surface or the lower surface of the substrate 1105.

By providing the sum of the areas of the first bonding pad 1171 and the second bonding pad 1172 equal to or smaller than 60% of the total area of the semiconductor device 1100, the amount of light emitted to the surface on which the first bonding pad 1171 and the second bonding pad 1172 are disposed can be increased. Thus, according to the embodiment, since the amount of light emitted through the six surface direction of the semiconductor device 1100 is increased, the light extraction efficiency can be improved and the light intensity Po can be increased.

In addition, when viewed from above the semiconductor device, the sum of the area of the first bonding pad 1171 and the area of the second bonding pad 1172 may be provided equal to or greater than 30% of the total area of the semiconductor device 1100.

By providing the sum of the areas of the first bonding pad 1171 and the second bonding pad 1172 equal to or greater than 30% of the total area of the semiconductor device 1100, stable mounting can be performed through the first bonding pad 1171 and the second bonding pad 1172.

In the semiconductor device 1100 according to the embodiment, the sum of the areas of the first bonding pad 1171 and the second bonding pad 1172 can be selected to be equal to or greater than 30% and equal to or smaller than 60% of the total area of the semiconductor device 1100 in consideration of light extraction efficiency and securing stability of bonding.

That is, when the sum of the area of the first bonding pad 1171 and the area of the second bonding pad 1172 is smaller than 30%, the bonding force mounted on the light emitting device package may be weakened, for example. Also, when the sum of the areas of the first bonding pad 1171 and the second bonding pad 1172 is greater than 60%, the amount of light emitted to the surface on which the first bonding pad 1171 and the second bonding pad 1172 are disposed may become insufficient.

In addition, according to the semiconductor device 1100 of the embodiment, as shown in FIG. 27, the third reflective layer 1163 may be disposed between the first bonding pad 1171 and the second bonding pad 1172. For example, the length d of the third reflective layer 1163 along the major axis direction of the semiconductor device 1100 may be disposed to correspond to the distance between the first bonding pad 1171 and the second bonding pad 1172. Also, the third reflective layer 1163 may be provided at a length of f along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be provided equal to or greater than 10% and equal to or smaller than 25% of the entire upper surface of the semiconductor device 1100, for example.

When the area of the third reflective layer 1163 is 10% or more of the entire upper surface of the semiconductor device 1100, the package body disposed under the semiconductor device can be prevented from discolored or cracked, and when the area of the third reflective layer 1163 is 25% or less, it is advantageous to secure the light extraction efficiency to emit light to the six surfaces of the semiconductor device.

In addition, according to another embodiment, it may not be limited thereto, in order to secure to increase the light extraction efficiency, the area of the third reflective layer 1163 may be disposed more than 0% to less than 10% of the entire upper surface of the semiconductor device 1100, and the area of the third reflective layer 1163 may be disposed more than 25% to less than 100% of the entire upper surface of the semiconductor device 1100 in order to prevent from discoloration or cracking in the package body.

According to the semiconductor device 1100 of the embodiment, light generated in the light emitting structure 1100 may not be transmitted and emitted through a first region provided between the first bonding pad 1171 and the second bonding pad 1172. Here, the first region may correspond to an interval between the first bonding pad 1171 and the second bonding pad 1172. Also, the first region may correspond to the length d of the third reflective layer 1163 disposed in the major axis direction of the semiconductor device.

In addition, light generated in the light emitting structure 1110 may be transmitted and emitted through a second region provided between side surfaces of the semiconductor device 1100 in the major axis direction and the first bonding pad 1171 or the second bonding pad 1172 which are adjacent to the side surfaces in the major axis direction.

In addition, light generated in the light emitting structure may be transmitted and emitted through a third region provided between side surfaces of the semiconductor device 1100 in the minor axis direction and the first bonding pad 1171 or the second bonding pad 1172 which are adjacent to the side surfaces in the minor axis.

According to the embodiment, the size of the first reflective layer 1161 may be provided several micrometers larger than the size of the first bonding pad 1171. For example, the area of the first reflective layer 1161 may be provided sufficiently large to cover the area of the first bonding pad 1171. The length of one side of the first reflective layer 1161 may be provided greater than the length of one side of the first bonding pad 1171 by about 4 micrometers to about 10 micrometers, for example, in consideration of the process error.

In addition, the size of the second reflective layer 1162 may be provided several micrometers larger than the size of the second bonding pad 1172. For example, the area of the second reflective layer 1162 may be provided sufficiently large to cover the area of the second bonding pad 1172. The length of one side of the second reflective layer 1162 may be provided greater than the length of one side of the second bonding pad 1172 by about 4 micrometers to about 10 micrometers, for example, in consideration of the process error.

According to the embodiment, the light emitted from the light emitting structure 1100 may be reflected by the first reflective layer 1161 and the second reflective layer 1162 without being incident on the first bonding pad 1171 and the second bonding pad 1172. Accordingly, light loss of the light that is generated and emitted from the light emitting structure 1110, by being incident on the first bonding pad 1171 and the second bonding pad 1172, can be minimized.

In addition, according to the semiconductor device 1100 of the embodiment, since the third reflective layer 1163 is disposed between the first bonding pad 1171 and the second boding pad 1172, the light may be prevented from being emitted between the first bonding pad 1171 and the second bonding pad 1172.

As described above, the semiconductor device 1100 according to the embodiment can be mounted, for example, in a flip chip bonding manner and provided in the form of a semiconductor device package. At this time, when the package body on which the semiconductor device 1100 is mounted is provided with resin or the like, the package body may be discolored or cracked due to strong short wavelength light emitted from the semiconductor device 1100, in a region under the semiconductor device 1100.

However, according to the semiconductor device 1100 of the embodiment, since light can be prevented from being emitted between the regions where the first bonding pad 1171 and the second bonding pad 1172 are disposed, the package body that is disposed under the semiconductor device 1100 can be prevented from being discolored or cracked.

In addition, according to the semiconductor device 1100 of the embodiment, the minimum distance between the first electrode pad and the second electrode pad provided in the package body is taken into consideration, so that the width d of the third reflective layer 1163 may be selected to be minimized. By maximally ensuring the spacing b1 and b2 provided between the first bonding pad 1171 or the second bonding pad 1172 adjacent to the side surface of the semiconductor device 1100 in the major axis direction, the amount of light emitted to the sides of the first bonding pad 1171 and the second bonding pad 1172 can be improved.

According to the embodiment, the light generated in the light emitting structure 1100 can be transmitted and emitted in an area of more than 20% of the upper surface of the semiconductor device 1100 on which the first bonding pad 1171, the second bonding pad 1172, and the third reflective layer 1163 are disposed.

Thus, according to the embodiment, since the amount of light emitted in the six surface direction of the semiconductor device 1100 is increased, the light extraction efficiency can be improved and the light intensity Po can be increased. In addition, it is possible to prevent the package body disposed close to the lower surface of the semiconductor device 1100 from being discolored or cracked.

Meanwhile, FIG. 53 is a plan view showing another example of a semiconductor device according to an embodiment of the present invention, and FIG. 54 is a sectional view taken along line D-D of the semiconductor device shown in FIG. 53.

Meanwhile, in order to facilitate understanding, in FIG. 54, a first electrode 1141 electrically connected to a first bonding pad 1171 and a second electrode 1142 electrically connected to a second bonding pad 1172 are illustrated to be seen, even though which are disposed under the first bonding pad 1171 and the second bonding pad 1172.

Then, another example of the semiconductor device according to the embodiment will be described with reference to FIGS. 53 and 54. In describing the semiconductor device of the embodiment with reference to FIGS. 53 and 54, description overlapping with those described above may be omitted.

The semiconductor device according to the embodiment may comprise a light emitting structure 1100 disposed on a substrate 1105, as shown in FIGS. 53 and 54.

The light emitting structure 1100 may comprise a first conductivity type semiconductor layer 1111, an active layer 1112, and a second conductivity type semiconductor layer 1113. The active layer 1112 may be disposed between the first conductivity type semiconductor layer 1111 and the second conductivity type semiconductor layer 1113. For example, the active layer 1112 may be disposed on the first conductivity type semiconductor layer 1111, and the second conductivity type semiconductor layer 1113 may be disposed on the active layer 1112.

The semiconductor device 1100 according to the embodiment may comprise a current spreading layer 1120 and an ohmic contact layer 1130 as shown in FIG. 55. The current spreading layer 1120 and the ohmic contact layer 1130 can improve current diffusion to increase light output.

The semiconductor device 1100 according to the embodiment may comprise a first electrode 1141 and a second electrode 1142, as shown in FIGS. 54 and 55.

The first electrode 1141 may be electrically connected to the first conductivity type semiconductor layer 1111. The first electrode 1141 may be disposed on the first conductivity type semiconductor layer 1111. For example, according to the semiconductor device 1100 of the embodiment, the first electrode 1141 may be disposed on an upper surface of the first conductivity type semiconductor layer 1111 that is exposed by removing a portion of the second conductivity type semiconductor layer 1113 and a portion of the active layer 1112.

The second electrode 1142 may be electrically connected to the second conductivity type semiconductor layer 1113. The second electrode 1142 may be disposed on the second conductivity type semiconductor layer 1113. According to the embodiment, the current spreading layer 1120 may be disposed between the second electrode 1142 and the second conductivity type semiconductor layer 1113.

The semiconductor device 1100 according to the embodiment may comprise a first passivation layer 1150, as shown in FIG. 55.

The first passivation layer 1150 may comprise a plurality of first openings h1 exposing the ohmic contact layer 1130. The current spreading layer 1120 may be disposed under the region provided with the plurality of first openings h1.

In addition, the first passivation layer 1150 may comprise a plurality of second openings h2 that expose the first conductivity type semiconductor layer 1111.

The semiconductor device 1100 according to the embodiment may comprise a first electrode 1141 and a second electrode 1142, as shown in FIGS. 54 and 55.

The first electrode 1141 may be electrically connected to the first conductivity type semiconductor layer 1111. The first electrode 1141 may be disposed on the first conductivity type semiconductor layer 1111. For example, according to the semiconductor device 1100 of the embodiment, the first electrode 1141 may be disposed on an upper surface of the first conductivity type semiconductor layer 1111 that is exposed by removing a portion of the second conductivity type semiconductor layer 1113 and a portion of the active layer 1112.

The first electrode 1141 may be electrically connected to the upper surface of the first conductivity type semiconductor layer 1111 through a second opening h2 provided in the first passivation layer 1150. For example, the first electrode 1141 may be in contact with the upper surface of the first conductivity type semiconductor layer 1111 in a plurality of N regions, as shown in FIGS. 54 and 55.

The second electrode 1142 may be electrically connected to the second conductivity type semiconductor layer 1113. The second electrode 1142 may be disposed on the second conductivity type semiconductor layer 1113. According to the embodiment, the current spreading layer 1120 may be disposed between the second electrode 1142 and the second conductivity type semiconductor layer 1113.

The second electrode 1142 may be electrically connected to the upper surface of the second conductivity type semiconductor layer 1113 through a first opening h1 provided in the first passivation layer 1150. For example, the second electrode 1142 may be electrically connected to the second conductivity type semiconductor layer 1113 through the ohmic contact layer 1130 in a plurality of P regions, as shown in FIGS. 54 and 55.

According to the embodiment, as shown in FIGS. 54 and 55, the first electrode 1141 and the second electrode 1142 may be disposed spaced apart from each other.

In addition, the semiconductor device 1100 according to the embodiment may comprise a second passivation layer 1155, as shown in FIGS. 54 and 55. The second passivation layer 1155 may be disposed on the first electrode 1141 and the second electrode 1142. The second passivation layer 1155 may be disposed on the first passivation layer 1150.

The second passivation layer 1155 may comprise a fourth opening h4 exposing an upper surface of the first electrode 1141. The second passivation layer 1155 may comprise a plurality of fourth openings h4 exposing a plurality of NB regions of the first electrode 1141.

The second passivation layer 1155 may comprise a third opening h3 exposing an upper surface of the second electrode 1142. The second passivation layer 1155 may comprise a plurality of third openings h3 exposing a plurality of PB regions of the second electrode 1142.

In addition, the semiconductor device 1100 according to the embodiment may comprise a reflective layer 1160, as shown in FIGS. 54 and 55. The reflective layer 1160 may comprise a first reflective layer 1161, a second reflective layer 1162, and a third reflective layer 1163. The reflective layer 1160 may be disposed on the second passivation layer 1155. The reflective layer 1160 may be disposed on the first electrode 1141 and the second electrode 1142.

The first reflective layer 1161 may be disposed on the first electrode 1141 and the second electrode 1142. The first reflective layer 1161 may comprise a sixth opening h6 exposing an upper surface of the first electrode 1141. The first reflective layer 1161 may comprise a plurality of sixth openings h6 exposing a plurality of NB regions of the first electrode 1141. The first reflective layer 1161 may comprise a sixth opening h6 provided corresponding to a region where the fourth opening h4 of the second passivation layer 1155 is formed.

The second reflective layer 1162 may be disposed on the first electrode 1141 and the second electrode 1142. The second reflective layer 1162 may be disposed spaced apart from the first reflective layer 1161. The second reflective layer 1162 may comprise a fifth opening 115 exposing an upper surface of the second electrode 1142. The second reflective layer 1162 may comprise a plurality of fifth openings h5 exposing a plurality of PB regions of the second electrode 1142. The second reflective layer 1162 may comprise a fifth opening h5 provided corresponding to a region where the third opening h3 of the second passivation layer 1155 is formed.

In addition, the third reflective layer 1163 may be disposed on the first electrode 1141 and the second electrode 1142. The third reflective layer 1163 may be disposed between the first reflective layer 1161 and the second reflective layer 1162. For example, the third reflective layer 1163 may be connected to the first reflective layer 1161. Also, the third reflective layer 1163 may be connected to the second reflective layer 1162. The third reflective layer 1163 may be physically in direct contact with the first reflective layer 1161 and the second reflective layer 1162.

The reflective layer 1160 may be provided as an insulating reflective layer. For example, the reflective layer 1160 may be provided as a Distributed Bragg Reflector (DBR) layer or an Omni Directional Reflector (ODR) layer.

According to the embodiment, the first reflective layer 1161 may be disposed on a side surface and a portion of an upper surface of the first electrode 1141 so as to expose the upper surface of the first electrode 1141. The second reflective layer 1162 may be disposed on a side surface and a portion of an upper surface of the second electrode 1142 to expose the upper surface of the second electrode 1142.

Accordingly, the first reflective layer 1161 and the second reflective layer 1162 may reflect light emitted from the active layer 1112 of the light emitting structure 1110, thereby minimizing light absorption from a first bonding pad 1161 and a second bonding pad 1162, thereby improving luminous intensity Po.

For example, the first reflective layer 1161 and the second reflective layer 1162 may be made of an insulating material, and may be formed of a material having a high reflectivity, for example, such as a DBR structure in order to reflect light emitted from the active layer 1112.

The first reflective layer 1161 and the second reflective layer 1162 may have a DBR structure in which materials having different refractive indexes are repeatedly arranged. For example, the first reflective layer 1161 and the second reflective layer 1162 may be disposed in a single layer or a stacked structure comprising at least one of $TiO_2$, $SiO_2$, $Ta_2O_5$, and $HfO_2$.

In addition, according to another embodiment, it is not limited thereto, the first reflective layer 1161 and the second reflective layer 1162 may be freely provided in various configurations in order to adjust the reflectivity of the light emitted from the active layer 1112 according to the wavelength emitted from the active layer 1112.

The semiconductor device 1100 according to the embodiment may comprise a first bonding pad 1171 disposed on the first reflective layer 1161 as shown in FIGS. 54 and 55. In addition, the semiconductor device 1100 according to the embodiment may comprise a second bonding pad 1172 disposed on the second reflective layer 1162. The second bonding pad 1172 may be disposed spaced apart from the first bonding pad 1171.

The first bonding pad 1171 may contact the upper surface of the first electrode 1141 through the sixth opening h6 provided in the first reflective layer 1161 in a plurality of NB regions. The second bonding pad 1172 may contact the upper surface of the second electrode 1142 through the fifth opening h5 provided in the second reflective layer 1162 in a plurality of PB regions.

According to the semiconductor device 1100 of the embodiment, the first bonding pad 1171 and the first electrode 1141 can be contacted in a plurality of regions. Also, the second bonding pad 1172 and the second electrode 1142 can be contacted in a plurality of regions. Thus, according to the embodiment, power can be supplied through a plurality of regions, so that current spreading effect is occurred according to increase of the contact area and dispersion of the contact region, and there is an advantage that operation voltage can be reduced.

The semiconductor device according to the embodiment may be connected to an external power in a flip chip bonding manner. For example, in manufacturing a semiconductor device package, the upper surface of the first bonding pad 1171 and the upper surface of the second electrode pad 1172 may be disposed to be attached to a submount, a lead frame, or a circuit board.

When the semiconductor device according to the embodiment is mounted by a flip-chip bonding method and is implemented as a semiconductor device package, the light provided by the light emitting structure 1100 may be emitted through the substrate 1105. The light emitted from the light emitting structure 1100 may be reflected by the first reflective layer 1161 and the second reflective layer 1162 and may be emitted toward the substrate 1105.

Also, the light emitted from the light emitting structure 1100 may be emitted in the lateral direction of the light emitting structure 1100. Also, the light emitted from the light emitting structure 1100 may be transmitted to the outside through a region where the first bonding pad 1171 and the second bonding pad 1172 are not provided among the surface on which the first bonding pad 1171 and the second bonding pad 1172 are disposed.

Specifically, the light emitted from the light emitting structure 1100 may be transmitted to the outside through a region where the first reflective layer 1161, the second reflective layer 1162, and the third reflective layer 1163 are not provided among the surface on which the first bonding pad 1171 and the second bonding pad 1172 are disposed.

Accordingly, the semiconductor device 1100 of the embodiment can emit light in six directions surrounding the light emitting structure 1100, and the light intensity can be remarkably improved.

In addition, according to the semiconductor device and the semiconductor device package of the embodiments, since the first bonding pad 1171 and the second electrode pad 1172 having a large area can be directly bonded to the circuit board providing power, the chip bonding process can be performed easily and stably.

Meanwhile, according to the semiconductor device 1100 of the embodiment, as described with reference to FIG. 27, when viewed from above the semiconductor device 1100, a sum of the areas of the first bonding pad 1171 and the second bonding pad 1172 may be provided equal to or smaller than 60% of a total area of an upper surface of the semiconductor device 1100 on which the first bonding pad 1171 and the second bonding pad 1172 are disposed.

For example, the total area of the upper surface of the semiconductor device 1100 may correspond to an area defined by a lateral length and a longitudinal length of the lower surface of the first conductivity type semiconductor layer 1111 of the light emitting structure 1100. Also, the total area of the upper surface of the semiconductor device 1100 may correspond to the area of the upper surface or the lower surface of the substrate 1105.

By providing the sum of the areas of the first bonding pad 1171 and the second bonding pad 1172 equal to or smaller than 60% of the total area of the semiconductor device 1100, the amount of light emitted to the surface in which the first bonding pad 1171 and the second bonding pad 1172 are disposed can be increased. Thus, according to the embodiment, since the amount of light emitted through the six surface direction of the semiconductor device 1100 is increased, the light extraction efficiency can be improved and the light intensity Po can be increased.

In addition, when viewed from above the semiconductor device, the sum of the area of the first bonding pad 1171 and the area of the second bonding pad 1172 may be provided equal to or greater than 30% of the total area of the semiconductor device 1100.

By providing the sum of the areas of the first bonding pad 1171 and the second bonding pad 1172 equal to or greater than 30% of the total area of the semiconductor device 1100, stable mounting can be performed through the first bonding pad 1171 and the second bonding pad 1172.

In the semiconductor device 1100 according to the embodiment, the sum of the areas of the first bonding pad 1171 and the second bonding pad 1172 can be selected to be equal to or greater than 30% and equal to or smaller than 60% of the total area of the semiconductor device 1100 in consideration of light extraction efficiency and securing stability of bonding.

That is, when the sum of the areas of the first bonding pad 1171 and the second bonding pad 1172 is 30% or more to 100% or less of the total area of the semiconductor device 1100, the electrical characteristics can be ensured and the bonding force to be mounted on the semiconductor device package can be secured so that stable mounting can be performed.

In addition, when the sum of the areas of the first bonding pad 1171 and the second bonding pad 1172 is more than 0% to 60% or less of the total area of the semiconductor device 1100, the light extraction efficiency of the semiconductor device 1100 can be improved and the light intensity Po can be increased by increasing the amount of light emitted to the surface on which the first bonding pad 1171 and the second bonding pad 1172 are disposed.

In order to secure the electrical characteristics of the semiconductor device 1100 and the bonding force to be mounted on the semiconductor device package, and increase the light intensity, the sum of the areas of the first bonding pad 1171 and the second bonding pad 1172 is selected to be 30% or more to 60% or less of the total area of the semiconductor device 1100.

In addition, according to another embodiment, it is not limited thereto, in order to secure the electrical characteristics and bonding force of the semiconductor device 1100, the sum of the areas of the first bonding pad 1171 and the second bonding pad 1172 may be selected to be more than 60% to 100% or less, and in order to increase the light intensity, the sum of the areas of the first bonding pad 1171 and the second bonding pad 1172 may be selected to be more than 0% and less than 30%.

In addition, according to the semiconductor device 1100 of the embodiment, as shown in FIG. 27, the third reflective layer 1163 may be disposed between the first bonding pad 1171 and the second bonding pad 1172. For example, the length d of the third reflective layer 1163 along the major axis direction of the semiconductor device 1100 may be disposed to correspond to the distance between the first bonding pad 1171 and the second bonding pad 1172. Also, the third reflective layer 1163 may be provided at a length of f along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be provided equal to or greater than 10% and equal to or smaller than 25% of the entire upper surface of the semiconductor device 1100, for example.

When the area of the third reflective layer 1163 is 10% or more of the entire upper surface of the semiconductor device 1100, the package body disposed under the semiconductor device can be prevented from discolored or cracked, and when the area of the third reflective layer 1163 is 25% or less, it is advantageous to secure the light extraction efficiency to emit light to the six surfaces of the semiconductor device.

In addition, according to another embodiment, it may not be limited thereto, in order to secure to increase the light extraction efficiency, the area of the third reflective layer 1163 may be disposed more than 0% to less than 10% of the entire upper surface of the semiconductor device 1100, and the area of the third reflective layer 1163 may be disposed more than 25% to less than 100% of the entire upper surface of the semiconductor device 1100 in order to prevent from discoloration or cracking in the package body.

According to the semiconductor device 1100 of the embodiment, light generated in the light emitting structure 1100 may not be transmitted and emitted through a first region provided between the first bonding pad 1171 and the second bonding pad 1172. Here, the first region may be a region corresponding to an interval between the first bonding pad 1171 and the second bonding pad 1172. Also, the first region may correspond to the length d of the third reflective layer 1163 disposed in the major axis direction of the semiconductor device.

In addition, light generated in the light emitting structure 1110 may be transmitted and emitted through a second region provided between side surfaces of the semiconductor device 1100 in the major axis direction and the first bonding pad 1171 or the second bonding pad 1172 which are adjacent to the side surfaces in the major axis direction.

In addition, light generated in the light emitting structure may be transmitted and emitted through a third region provided between side surfaces of the semiconductor device 1100 in the minor axis direction and the first bonding pad 1171 or the second bonding pad 1172 which are adjacent to the side surfaces in the minor axis.

According to the embodiment, the size of the first reflective layer 1161 may be provided several micrometers larger than the size of the first bonding pad 1171. For example, the area of the first reflective layer 1161 may be provided sufficiently large to cover the area of the first bonding pad 1171. The length of one side of the first reflective layer 1161 may be provided greater than the length of one side of the first bonding pad 1171 by about 4 micrometers to about 10 micrometers, for example, in consideration of the process error.

In addition, the size of the second reflective layer 1162 may be provided several micrometers larger than the size of the second bonding pad 1172. For example, the area of the second reflective layer 1162 may be provided sufficiently large to cover the area of the second bonding pad 1172. The length of one side of the second reflective layer 1162 may be provided greater than the length of one side of the second bonding pad 1172 by about 4 micrometers to about 10 micrometers, for example, in consideration of the process error.

According to the embodiment, the light emitted from the light emitting structure 1100 may be reflected by the first reflective layer 1161 and the second reflective layer 1162 without being incident on the first bonding pad 1171 and the second bonding pad 1172. Accordingly, light loss of the light that is generated and emitted from the light emitting structure 1110, by being incident on the first bonding pad 1171 and the second bonding pad 1172, can be minimized.

In addition, according to the semiconductor device 1100 of the embodiment, since the third reflective layer 1163 is disposed between the first bonding pad 1171 and the second boding pad 1172, the light may be prevented from being emitted between the first bonding pad 1171 and the second bonding pad 1172.

As described above, the semiconductor device 1100 according to the embodiment can be mounted, for example, in a flip chip bonding manner and provided in the form of a semiconductor device package. At this time, when the package body on which the semiconductor device 1100 is mounted is provided with resin or the like, the package body may be discolored or cracked due to strong short wavelength light emitted from the semiconductor device 1100, in a region under the semiconductor device 1100.

However, according to the semiconductor device 1100 of the embodiment, since light can be prevented from being emitted between the regions where the first bonding pad 1171 and the second bonding pad 1172 are disposed, the package body that is disposed under the semiconductor device 1100 can be prevented from being discolored or cracked.

In addition, according to the semiconductor device 1100 of the embodiment, the interval d between the N electrode pad and the P electrode pad provided in the package body is taken into consideration, so that the width d of the third reflective layer 1163 may be selected to be minimized. By maximally ensuring the spacing b1 and b2 provided between the first bonding pad 1171 or the second bonding pad 1172 adjacent to the side surface of the semiconductor device 1100 in the major axis direction, the amount of light emitted to the sides of the first bonding pad 1171 and the second bonding pad 1172 can be improved.

According to the embodiment, the light generated in the light emitting structure 1100 can be transmitted and emitted in an area of more than 20% of the upper surface of the semiconductor device 1100 on which the first bonding pad 1171, the second bonding pad 1172, and the third reflective layer 1163 are disposed.

Thus, according to the embodiment, since the amount of light emitted in the six surface direction of the semiconductor device 1100 is increased, the light extraction efficiency can be improved and the light intensity Po can be increased. In addition, it is possible to prevent the package body disposed close to the lower surface of the semiconductor device 1100 from being discolored or cracked.

The semiconductor device according to the embodiment described above can be applied to a semiconductor device package. The semiconductor device according to the embodiment may be electrically connected to a substrate or a lead electrode through a flip chip bonding method, a die bonding method, a wire bonding method, or the like to be provided as a semiconductor device package.

Meanwhile, FIG. 55 is a view explaining a semiconductor device package according to an embodiment of the present invention. In describing the semiconductor device package according to the embodiment with reference to FIG. 55, description overlapping with those described above may be omitted.

The semiconductor device package according to the embodiment may comprise a package body 1205, a first package electrode 1211 and a second package electrode 1212 disposed on the package body 1205, a semiconductor device 1100 disposed on the package body 1205, and a molding part 1230 provided with a phosphor and disposed on the semiconductor device 1100. For example, the semiconductor device 1100 may be a semiconductor device according to the embodiment described with reference to FIGS. 1 to 54.

For example, the package body 1205 may be formed of at least one material of polyphthalamide (PPA), polychloro tri phenyl (PCT), liquid crystal polymer (LCP), polyamide 9T (PA9T), silicone, epoxy molding compound (EMC), a material comprising a metal, ceramic, a photo sensitive glass (PSG), sapphire ($Al_2O_3$), and a printed circuit board (PCB). In addition, the package body 205 may comprise a high refractive index filler such as $TiO_2$ and $SiO_2$.

The first package electrode 1211 and the second package electrode 1212 may comprise a conductive material. For example, the first package electrode 1211 and the second package electrode 1212 may comprise at least one of Ti, Cu, Ni, Au, Cr, Ta, Pt, Sn, Ag, P, Fe, Sn, Zn, and Al, and may be a single layer or multiple layers.

The semiconductor device 1100 may be electrically connected to the first package electrode 1211 and the second package electrode 1212. For example, the semiconductor device 1100 may be electrically connected to the first package electrode 1211 and the second package electrode 1212 via a first bump 1221 and a second bump 1222. The first bonding pad and the second bonding pad of the semiconductor device 1100 may be electrically connected to the first package electrode 1211 and the second package electrode 1212, respectively.

The first bump 221 and the second bump 222 may be formed of a metal having a high reflectivity of 80% or more, for example, at least one of Ag, Au, or Al, or an alloy thereof, thereby preventing light absorption by an electrode to improve light extraction efficiency. For example, the first bump 221 and the second bump 222 may be formed of at least one of Ti, Cu, Ni, Au, Cr, Ta, Pt, Sn, Ag, and P, or a selective alloy thereof.

In addition, the semiconductor device 1100 may be mounted on the first package electrode 1211 and the second package electrode 1212 by eutectic bonding without a bump.

As described above, the semiconductor device 1100 according to the embodiment can emit light in six directions.

In the semiconductor device 1100 according to the embodiment, as described with reference to FIGS. 1 to 54, the area of the first bonding pad and the area of the second bonding pad are selected to provide a sufficient bonding force with the first package electrode 1211 and the second package electrode 1212 In addition, in the semiconductor device 1100 according to the embodiment, the area of the first bonding pad and the area of the second bonding pad are selected to improve the light emitting efficiency in a downward direction as well as the bonding force, in consideration of the size of a region on which the first bonding pad and the second bonding pad are disposed, and through which light can be transmitted.

In addition, the light emitted from the light emitting structure may be emitted to the outside through a region where the first bonding pad and the second bonding pad are not provided, among the surface on which the first bonding pad and the second bonding pad are disposed. Specifically, the light emitted from the light emitting structure may be emitted to the outside through a region where the reflection layer is not provided, among the surface on which the first bonding pad and the second bonding pad are disposed.

Accordingly, the semiconductor device 1100 of the embodiment can emit light in six directions around the light emitting structure, and the light intensity can be remarkably improved.

Meanwhile, according to the semiconductor device of the embodiment, as described with reference to FIG. 27, when viewed from above the semiconductor device 1100, a sum of the areas of the first bonding pad and the second bonding pad may be provided equal to or smaller than 60% of a total area of an upper surface of the semiconductor device 1100 on which the first bonding pad and the second bonding pad are disposed.

By providing the sum of the areas of the first bonding pad and the second bonding pad equal to or smaller than 60% of the total area of the semiconductor device 1100, the amount of light emitted to the surface on which the first bonding pad and the second bonding pad are disposed can be increased. Thus, according to the embodiment, since the amount of light emitted through the six surface direction of the semiconductor device 1100 is increased, the light extraction efficiency can be improved and the light intensity Po can be increased.

In addition, when viewed from above the semiconductor device, the sum of the area of the first bonding pad and the area of the second bonding pad may be provided equal to or greater than 30% of the total area of the semiconductor device 1100.

By providing the sum of the areas of the first bonding pad and the second bonding pad equal to or greater than 30% of the total area of the semiconductor device 1100, stable mounting ca be performed through the first bonding pad and the second bonding pad.

In the semiconductor device 1100 according to the embodiment, the sum of the areas of the first bonding pad and the second bonding pad can be selected to be equal to or greater than 30% and equal to or smaller than 60% of the total area of the semiconductor device 1100 in consideration of light extraction efficiency and securing stability of bonding.

That is, when the sum of the areas of the first bonding pad 1171 and the second bonding pad 1172 is 30% or more to 100% or less of the total area of the semiconductor device 1100, the electrical characteristics can be ensured and the bonding force to be mounted on the semiconductor device package can be secured so that stable mounting can be performed.

In addition, when the sum of the areas of the first bonding pad 1171 and the second bonding pad 1172 is more than 0% to 60% or less of the total area of the semiconductor device 1100, the light extraction efficiency of the semiconductor device 1100 can be improved and the light intensity Po can be increased by increasing the amount of light emitted to the surface on which the first bonding pad 1171 and the second bonding pad 1172 are disposed.

In order to secure the electrical characteristics of the semiconductor device 1100 and the bonding force to be mounted on the semiconductor device package, and increase the light intensity, the sum of the areas of the first bonding pad 1171 and the second bonding pad 1172 is selected to be 30% or more to 60% or less of the total area of the semiconductor device 1100. In addition, according to another embodiment, it is not limited thereto, in order to secure the electrical characteristics and bonding force of the semiconductor device 1100, the sum of the areas of the first bonding pad 1171 and the second bonding pad 1172 may be selected to be more than 60% to 100% or less, and in order to increase the light intensity, the sum of the areas of the first bonding pad 1171 and the second bonding pad 1172 may be selected to be more than 0% and less than 30%.

In addition, according to the semiconductor device 1100 of the embodiment, as shown in FIG. 27, the third reflective layer 1163 may be disposed between the first bonding pad 1171 and the second bonding pad 1172. For example, the length d of the third reflective layer 1163 along the major axis direction of the semiconductor device 1100 may be disposed to correspond to the distance between the first bonding pad 1171 and the second bonding pad 1172. Also, the third reflective layer 1163 may be provided at a length of f along the minor axis direction of the semiconductor device 1100. The length f of the third reflective layer 1163 along the minor axis direction of the semiconductor device 1100 may correspond to the minor axis length of the semiconductor device 1100, for example. In addition, the area of the third reflective layer 1163 may be provided equal to or greater than 10% and equal to or smaller than 25% of the entire upper surface of the semiconductor device 1100, for example.

When the area of the third reflective layer 1163 is 10% or more of the entire upper surface of the semiconductor device 1100, the package body disposed under the semiconductor device can be prevented from discolored or cracked, and when the area of the third reflective layer 1163 is 25% or less, it is advantageous to secure the light extraction efficiency to emit light to the six surfaces of the semiconductor device.

In addition, according to another embodiment, it may not be limited thereto, in order to secure to increase the light extraction efficiency, the area of the third reflective layer 1163 may be disposed more than 0% to less than 10% of the entire upper surface of the semiconductor device 1100, and the area of the third reflective layer 1163 may be disposed more than 25% to less than 100% of the entire upper surface of the semiconductor device 1100 in order to prevent from discoloration or cracking in the package body.

According to the semiconductor device 1100 of the embodiment, light generated in the light emitting structure 1100 may not be transmitted and emitted through a first region provided between the first bonding pad and the second bonding pad. Here, the first region may be a region corresponding to an interval between the first bonding pad and the second bonding pad. Also, the first region may correspond to the length d of the third reflective layer 1163 disposed in the major axis direction of the semiconductor device.

In addition, light generated in the light emitting structure 1110 may be transmitted and emitted through a second region provided between side surfaces of the semiconductor device 1100 in the major axis direction and the first bonding pad or the second bonding pad which are adjacent to the side surfaces in the major axis direction.

In addition, light generated in the light emitting structure may be transmitted and emitted through a third region provided between side surfaces of the semiconductor device 1100 in the minor axis direction and the first bonding pad or the second bonding pad which are adjacent to the side surfaces in the minor axis.

In addition, according to the semiconductor device 1100 of the embodiment, since the third reflective layer 1163 is disposed between the first bonding pad 1171 and the second boding pad 1172, the light may be prevented from being emitted between the first bonding pad 1171 and the second bonding pad 1172.

Meanwhile, as described above, the semiconductor device 1100 according to the embodiment can be mounted, for example, in a flip chip bonding manner and provided in the form of a semiconductor device package. At this time, when the package body 1205 on which the semiconductor device 1100 is mounted is provided with resin or the like, as shown in FIG. 56, in a region under the semiconductor device 1100, in a portion of the package body 1205 disposed between the first package electrode 1211 on which the first bonding pad 1171 is mounted and the second package electrode 1212 on which the second bonding pad 1172 is mounted, the package body 1205 may be discolored or cracked due to strong short wavelength light emitted from the semiconductor device 1100.

However, according to the semiconductor device 1100 of the embodiment, since the third reflective layer 1163 is disposed between the first bonding pad 1171 and the second bonding pad 1172, light can be prevented from being emitted between the regions where the first bonding pad 1171 and the second bonding pad 1172 are disposed. Thus, according to the embodiment, even when the package body 1205 on which the semiconductor device 1100 is mounted is provided with a resin or the like, the package body 1205 that is disposed under the semiconductor device 1100 can be prevented from being discolored or cracked.

Meanwhile, a plurality of semiconductor device packages according to the embodiments described above may be arrayed on a substrate, and an optical members such as a light guide plate, a prism sheet, a diffusion sheet, and the like may be disposed on the optical path of the semiconductor device package. These semiconductor device packages, the substrate, and the optical members can function as light units.

In addition, the display device, the indicating device, and the lighting apparatus each comprising the semiconductor device package according to the embodiment can be realized.

Here, the display device may comprise a bottom cover, a reflection plate disposed on the bottom cover, a light emitting module that emits light and includes a semiconductor device, a light guide plate disposed in front of the reflector and guiding light emitted from the light emitting module forward, an optical sheet including prism sheets and disposed in front of the light guide plate, a display panel disposed in front of the optical sheet, an image signal output circuit which is connected to the display panel and supplies an image signal to the display panel, and a color filter disposed in front of the display panel. Here, the bottom cover, the reflection plate, the light emitting module, the light guide plate, and the optical sheet may form a backlight unit.

In addition, the lighting apparatus may comprise a light source module including a substrate and a semiconductor device according to an embodiment, a heat sink dissipating heat of the light source module, and a power supply unit processing or converting an electrical signal provided from the outside and providing it to the light source. For example, the lighting device may comprise a lamp, a head lamp, or a streetlight.

The head lamp may comprise a light emitting module including a semiconductor device disposed on a substrate, a reflector reflecting light emitted from the light emitting module in a predetermined direction, for example, forward, a lens refracting light reflected by the reflector forward, and a shade blocking or reflecting a part of the light that is reflected by the reflector and directed toward the lens to form a desired light distribution pattern by a designer.

Meanwhile, FIG. 57 is an exploded perspective view showing a lighting apparatus according to an embodiment.

The lighting apparatus according to the embodiment may comprise a cover 2100, a light source module 2200, a heat radiator 2400, a power supply unit 2600, an inner case 2700, and a socket 2800. Also, the lighting apparatus according to the embodiment may further comprise at least one of a member 2300 and a holder 2500. The light source module 2200 may comprise the semiconductor device or the semiconductor device package according to the embodiments.

The light source module 2200 may comprise a light source unit 2210, a connection plate 2230, and a connector 2250. The member 2300 is disposed on the upper surface of the heat radiator 2400 and comprises guide grooves 2310 through which the plurality of light sources 2210 and the connector 2250 are inserted.

The holder 2500 blocks the receiving groove 2719 of the insulating portion 2710 of the inner case 2700. Therefore, the power supply unit 2600 accommodated in the insulating portion 2710 of the inner case 2700 is sealed. The holder 2500 comprises a guide protrusion 2510.

The power supply unit 2600 may comprise a protrusion 2610, a guide 2630, a base 2650, and an extension 2670. The inner case 2700 may comprise a molding portion together with the power supply unit 2600. The molding portion is a hardened portion of the molding liquid so that the power supply unit 2600 can be fixed inside the inner case 2700.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

INDUSTRIAL APPLICABILITY

According to the semiconductor device, the method of manufacturing the semiconductor device, and the semiconductor device package of the embodiments, there is an advantage that light extraction efficiency and electrical characteristics can be improved.

According to the semiconductor device, the method of manufacturing the semiconductor device, and the semiconductor device package of the embodiments, there is an advantage that bonding strength between the package electrode and the semiconductor device can be improved.

According to the semiconductor device, the method of manufacturing the semiconductor device, and the semiconductor device package of the embodiments, there is an advantage that it is possible to prevent the current concentration phenomenon from occurring and improve the reliability.

According to the semiconductor device, the method of manufacturing the semiconductor device, and the semiconductor device package of the embodiments, there is an advantage that the electrode, the insulating reflective layer and the bonding pad can be disposed to suit the flip chip bonding method, thereby easily performing the bonding process, and improving light extraction efficiency by increasing the transmittance and reflectance of the emitted light.

According to the semiconductor device, the method of manufacturing the semiconductor device, and the semiconductor device package of the embodiments, there is an advantage that the package body can be prevented from being degraded by light emitted from the semiconductor device.

The invention claimed is:
1. A semiconductor device, comprising:
  a substrate;
  a light emitting structure disposed on the substrate and comprising a first conductivity type semiconductor layer and a second conductivity type semiconductor layer;
  a first electrode disposed on the first conductivity type semiconductor layer and electrically connected to the first conductivity type semiconductor layer;
  a second electrode disposed on the second conductivity type semiconductor layer and electrically connected to the second conductivity type semiconductor layer;
  a first insulating reflective layer disposed on the first electrode and the second electrode, and comprising a first opening exposing an upper surface of the first electrode;
  a second insulating reflective layer disposed on the first electrode and the second electrode, and disposed spaced apart from the first insulating reflective layer, and comprising a second opening exposing an upper surface of the second electrode;
a first bonding pad disposed on the first insulating reflective layer and electrically connected to the first electrode through the first opening; and
a second bonding pad disposed on the second insulating reflective layer and disposed spaced apart from the first bonding pad, and electrically connected to the second electrode through the second opening,
wherein, when viewed from above the semiconductor device, a sum of an area of the first bonding pad and an area of the second bonding pad is equal to or smaller than 70% of a total area of a lower surface of the substrate.

2. The semiconductor device according to claim 1, wherein, when viewed from above the semiconductor device, the sum of the area of the first bonding pad and the area of the second bonding pad is equal to or greater than 30% of the total area of the semiconductor device.

3. The semiconductor device according to claim 1, wherein the first bonding pad or the second bonding pad is provided along a major axis direction of the semiconductor device at a length of x and is provided along a minor axis direction of the semiconductor device at a length of y, and
wherein a ratio of x and y is provided in a range of 1:1.5 to 1:2.

4. The semiconductor device according to claim 1, wherein a distance between the first bonding pad and the second bonding pad is equal to or greater than 125 micrometers and equal to or less than 300 micrometers.

5. The semiconductor device according to claim 1, wherein the first bonding pad or the second bonding pad is disposed at a distance of b from an adjacent side surface disposed in a major axis direction of the semiconductor device, and at a distance of a from an adjacent side surface disposed in a minor axis direction of the semiconductor device, and
wherein the a is equal to or greater than 40 micrometers, and the b is equal to or greater than 40 micrometers.

6. The semiconductor device according to claim 1, wherein light generated in the light emitting structure is transmitted and emitted at an area of 30% or more of the upper surface of the semiconductor device on which the first bonding pad and the second bonding pad are disposed.

7. The semiconductor device according to claim 6, wherein the light generated in the light emitting structure is transmitted and emitted through the upper surface, a lower surface, and four lateral directions of the semiconductor device.

8. The semiconductor device according to claim 1, wherein light generated in the light emitting structure is transmitted and emitted in a first region, a second region, and a third region, the first region provided between the first bonding pad and the second bonding pad, the second region provided between side surfaces of the semiconductor device in a major axis direction and the first bonding pad or the second bonding pad which are adjacent to the side surfaces in the major axis direction, and the third region provided between side surfaces of the semiconductor device in a minor axis direction and the first bonding pad or the second bonding pad which are adjacent to the side surfaces in the minor axis.

9. A light emitting device, comprising:
a substrate;
a semiconductor structure disposed on the substrate, and comprising a first conductivity type semiconductor layer, an active layer disposed on the first conductivity type semiconductor layer, and a second conductivity type semiconductor layer disposed on the active layer;
a first electrode contacting the first conductivity type semiconductor layer;
a second electrode contacting the second conductivity type semiconductor layer;
a reflective layer disposed on the semiconductor structure; and
a first bonding pad and a second bonding pad disposed on the reflective layer and disposed spaced apart from each other,
wherein the substrate comprises an upper surface on which the semiconductor structure is disposed, a lower surface facing the upper surface, and a side surface between the upper surface and the lower surface,
wherein the reflective layer comprises a first region vertically overlapped with the first bonding pad, a second region vertically overlapped with the second bonding pad, and a third region between the first region and the second region, and
wherein an outer side surface of the third region of the reflective layer is disposed closer to the side surface of the substrate than an outer side surface of the first region and an outer side surface of the second region.

10. The light emitting structure according to claim 9, wherein the reflective layer comprises a plurality of first through holes and a plurality of second through holes,
wherein the first bonding pad is electrically connected with the first electrode through the plurality of first through holes, and
wherein the second bonding pad is electrically connected with the second electrode through the plurality of second through holes.

11. The light emitting structure according to claim 10, wherein a number of the plurality of first through holes of the reflective layer and a number of the plurality of second through holes of the reflective layer are different.

12. The light emitting structure according to claim 11, wherein the number of the plurality of second through holes of the reflective layer is greater than the number of the plurality of first through holes of the reflective layer.

13. The light emitting structure according to claim 10, further comprising a current spreading layer disposed between the second electrode and the semiconductor structure,
wherein the first electrode comprises a plurality of first branch electrodes disposed on the reflective layer, and
wherein the second electrode comprises a plurality of second branch electrodes disposed on the reflective layer.

14. The light emitting structure according to claim 13, wherein the plurality of the second through holes of the reflective layer vertically overlap with the current spreading layer, and
wherein the plurality of the second through holes each comprises a width smaller than a width of the current spreading layer.

15. The light emitting structure according to claim 13, wherein a number of the plurality of second branch electrodes is greater than a number of the plurality of first branch electrodes.

16. The light emitting structure according to claim 15, wherein the plurality of first branch electrodes are disposed between the plurality of second branch electrodes, respectively, and
wherein the current spreading layer comprises an oxide or a nitride.

17. The light emitting structure according to claim 9, wherein the first region, the second region, and the third region of the reflective layer are connected each other, and
wherein an outer side surface of the first region is disposed closer to an outer side surface of the first bonding pad than an outer side surface of the third region.

18. The light emitting structure according to claim 12, wherein the substrate comprises a first side surface and a second side surface facing each other, and comprises a third side surface and a fourth side surface perpendicular with the first and second side surfaces, respectively, and facing each other,
wherein an outer side surface of the reflective layer comprises a first outer side surface disposed close to the first side surface of the substrate, a second outer side surface disposed close to the second side surface of the substrate, a third outer side surface disposed close to the third side surface of the substrate, and a fourth outer side surface disposed close to the fourth side surface of the substrate, and
wherein the first outer side surface and the second outer side surface of the reflective layer each comprises a protruding surface protruded toward the first side surface and the second side surface of the substrate, respectively.

19. The light emitting structure according to claim 9, wherein the reflective layer comprises an insulating material or a metal material.

* * * * *